US011522139B2

(12) United States Patent
Yoon et al.

(10) Patent No.: US 11,522,139 B2
(45) Date of Patent: Dec. 6, 2022

(54) ORGANIC LIGHT EMITTING DIODE

(71) Applicants: LG Display Co., Ltd., Seoul (KR); LG Chem, Ltd., Seoul (KR)

(72) Inventors: Seunghee Yoon, Seoul (KR); Jungkeun Kim, Seoul (KR); Jicheol Shin, Seoul (KR); Jeongdae Seo, Incheon (KR); Seonkeun Yoo, Gunpo-si (KR); Joon Yoon, Daejeon (KR); Wan Pyo Hong, Daejeon (KR); Joo Yong Yoon, Daejeon (KR)

(73) Assignees: LG DISPLAY CO., LTD., Seoul (KR); LG CHEM, LTD., Seoul (KR)

( * ) Notice: Subject to any disclaimer, the term of this patent is extended or adjusted under 35 U.S.C. 154(b) by 780 days.

(21) Appl. No.: 16/229,890

(22) Filed: Dec. 21, 2018

(65) Prior Publication Data

US 2019/0207123 A1 Jul. 4, 2019

(30) Foreign Application Priority Data

Dec. 28, 2017 (KR) ........................ 10-2017-0183150

(51) Int. Cl.
*H01L 51/00* (2006.01)
*H01L 51/52* (2006.01)
(Continued)

(52) U.S. Cl.
CPC ...... *H01L 51/0072* (2013.01); *H01L 27/3209* (2013.01); *H01L 51/0051* (2013.01);
(Continued)

(58) Field of Classification Search
CPC ............... H01L 51/504; H01L 51/5044; H01L 51/0052
See application file for complete search history.

(56) References Cited

U.S. PATENT DOCUMENTS 8,084,630 B2 12/2011 Kansal et al.
RE44,304 E * 6/2013 Marks ................ H01L 51/0055
528/380
(Continued)

FOREIGN PATENT DOCUMENTS

CN 101671323 A 3/2010
CN 105321984 A 2/2016
(Continued)

*Primary Examiner* — Sean M DeGuire
(74) *Attorney, Agent, or Firm* — Seed IP Law Group LLP

(57) ABSTRACT

Disclosed herein are an organic light emitting diode including: at least two light emitting stacks interposed between an anode and a cathode and including at least one light emitting material layer; and a charge generation layer interposed between the light emitting stacks. The charge generation layer includes an N-type charge generation layer and a P-type charge generation layer, wherein the N-type charge generation layer and the P-type charge generation layer are stacked in such direction for the N-type charge generation layer to face the anode and for the P-type charge generation layer to face the cathode. The N-type charge generation layer includes a compound represented by Formula 1. The P-type charge generation layer includes any one selected from the group consisting of a compound represented by Formula 2, a compound represented by Formula 3, and a combination thereof. The material for N-type charge generation layers and the material for P-type charge generation layers of the disclosure can secure low driving voltage and long lifespan of an organic light emitting diode when used in the organic light emitting diode. Compounds of Formulae 1, 2, and 3 are as defined herein.

7 Claims, 6 Drawing Sheets

100

(51) Int. Cl.
*H01L 51/50* (2006.01)
*H01L 27/32* (2006.01)

(52) U.S. Cl.
CPC ...... *H01L 51/0052* (2013.01); *H01L 51/0054* (2013.01); *H01L 51/0067* (2013.01); *H01L 51/0073* (2013.01); *H01L 51/0074* (2013.01); *H01L 51/5004* (2013.01); *H01L 51/504* (2013.01); *H01L 51/5044* (2013.01); *H01L 51/5278* (2013.01); *H01L 51/0094* (2013.01); *H01L 51/5072* (2013.01)

(56) References Cited

U.S. PATENT DOCUMENTS

| | | | | |
|---|---|---|---|---|
| 10,096,782 | B2 | 10/2018 | Yoo et al. | |
| 2014/0117337 | A1* | 5/2014 | Jung | H01L 51/5278 257/40 |
| 2014/0117338 | A1* | 5/2014 | Cho | H01L 51/5278 257/40 |
| 2016/0043327 | A1* | 2/2016 | Yoo | H01L 51/0058 257/40 |
| 2017/0294587 | A1* | 10/2017 | Kim | H01L 51/0061 |
| 2018/0019407 | A1 | 1/2018 | Sakaino et al. | |

FOREIGN PATENT DOCUMENTS

| | | | |
|---|---|---|---|
| CN | 105679950 | A | 6/2016 |
| CN | 107207503 | A | 9/2017 |
| KR | 10-2016-0018332 | A | 2/2016 |
| WO | 2008/151170 | A2 | 12/2008 |

* cited by examiner

ORGANIC LIGHT EMITTING DIODE

BACKGROUND

Technical Field

The present disclosure relates to an organic light emitting diode.

Description of the Related Art

Recently, there is increasing interest in flat display elements occupying a small space, with increasing size of displays. A technology of an organic light emitting display including organic light emitting diodes (OLEDs) as the flat display elements has been rapidly developed in the art.

An OLED emits light through conversion of energy of excitons created by pairs of electrons and holes generated upon injection of charges into an organic light emitting layer formed between an anode and a cathode. As compared with exiting display techniques, the organic light emitting diode has various advantages such as low voltage operation, low power consumption, good color reproduction, and various applications through application of a flexible substrate.

In a typical white organic light emitting diode (WOLED), a difference in energy level between functional layers constituting a blue light emitting layer deteriorates efficiency in injection of electrons or holes at an interface between the functional layers, thereby having a negative influence on performance and lifespan of the WOLED.

In use of a tandem OLED, the driving voltage of the tandem OLED can be higher than the sum of the driving voltages of light emitting stacks, or efficiency of the tandem OLED can be lower than that of a mono OLED. When an N-type charge generation layer is doped with an alkali metal or an alkali earth metal, a material of the N-type charge generation layer is bonded to the metal to form a gap state. Such a gap state reduces a difference in energy level between a P-type charge generation layer and the N-type charge generation layer, thereby facilitating electron injection into the N-type charge generation layer. However, due to migration of the alkali metal upon operation of the tandem OLED, electrons cannot be efficiently injected from the N-type charge generation layer to an electron transport layer (ETL), causing deterioration in performance and lifespan of the tandem OLED.

In the tandem OLED including the alkali metal or alkali earth metal-doped N-type charge generation layer, the alkali metal or the alkali earth metal of the N-type charge generation layer migrates to the electron transport layer (ETL) together with electrons upon operation of the tandem OLED. As a result, as the amount of the alkali metal or the alkali earth metal at the interface between the N-type charge generation layer and the electron transport layer (ETL) increases and the amount of alkali metal or the alkali earth metal at the interface between the P-type charge generation layer and the N-type charge generation layer decreases, the amount of electrons injected into the electron transport layer (ETL) is reduced, thereby gradually increasing driving voltage of the tandem OLED while affecting lifespan of the tandem OLED.

In a single OLED, an alkali metal or an alkali earth metal of an electron injection layer (EIL) migrates to an electron transport layer (ETL) together with electrons upon operation of the single OLED, like in the tandem OLED. As a result, as the amount of the alkali metal or the alkali earth metal at the interface between the electron injection layer (EIL) and the electron transport layer (ETL) increases and the amount of alkali metal or the alkali earth metal in the electron injection layer (EIL) decreases, the number of electrons injected into the electron transport layer (ETL) is reduced, thereby gradually increasing driving voltage of the single OLED while affecting lifespan of the single OLED.

As the amount of current flowing through the OLED increases, the OLED is likely to be decomposed by triplet-triplet or triplet-polaron interaction caused by formation of a large number of triplet excitons in a phosphorescent light emitting layer. As a result, the OLED exhibits poor stability and is thus shortened in lifespan.

BRIEF SUMMARY

It is an aspect of the present disclosure to provide an organic light emitting diode which has improved properties in terms of driving voltage and lifespan.

In accordance with one aspect of the present disclosure, there is provided an organic light emitting diode including: at least two light emitting stacks interposed between an anode and a cathode and including at least one light emitting material layer; and a charge generation layer interposed between the light emitting stacks.

The charge generation layer includes an N-type charge generation layer and a P-type charge generation layer, wherein the N-type charge generation layer and the P-type charge generation layer are stacked in such direction for the N-type charge generation layer to face the anode and for the P-type charge generation layer to face the cathode.

The N-type charge generation layer includes a compound represented by Formula 1.

The P-type charge generation layer includes any one selected from the group consisting of a compound represented by Formula 2, a compound represented by Formula 3, and a combination thereof.

[Formula 1]

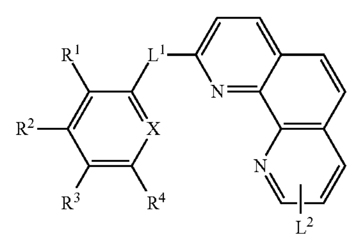

wherein X is $NR^5$, $CR^6$, S, O, or Se; $R^5$ is hydrogen, deuterium, halogen, —P(═O)$R^8R^9$, a substituted or unsubstituted $C_6$ to $C_{60}$ monocyclic or polycyclic aryl group, a substituted or unsubstituted $C_2$ to $C_{60}$ monocyclic or polycyclic heteroaryl group, or an amine group substituted or unsubstituted with a substituted or unsubstituted $C_1$ to $C_{20}$ alkyl group, a substituted or unsubstituted $C_6$ to $C_{60}$ monocyclic or polycyclic aryl group, or a substituted or unsubstituted $C_2$ to $C_{60}$ monocyclic or polycyclic heteroaryl group; $L^2$, $R^6$, $R^8$, and $R^9$ are each independently hydrogen, a substituted or unsubstituted $C_1$ to $C_{60}$ linear or branched alkyl group, a substituted or unsubstituted $C_3$ to $C_{60}$ monocyclic or polycyclic cycloalkyl group, a substituted or unsubstituted $C_6$ to $C_{60}$ monocyclic or polycyclic aryl group, or a substituted or unsubstituted $C_2$ to $C_{60}$ monocyclic or polycyclic heteroaryl group;

$L^1$ is selected from the group consisting of a substituted or unsubstituted $C_5$ to $C_{60}$ monocyclic or polycyclic arylene group, a substituted or unsubstituted $C_2$ to $C_{60}$ monocyclic or polycyclic heteroarylene group, a substituted or unsubstituted $C_1$ to $C_{60}$ linear or branched alkylene group, a substituted or unsubstituted divalent amine group, and combinations thereof;

$R^1$ and $R^2$ are each independently selected from the group consisting of hydrogen, a substituted or unsubstituted $C_1$ to $C_{60}$ linear or branched alkyl group, a substituted or unsubstituted amine group, and combinations thereof, or are connected to each other to form a condensed ring;

$R^3$ and $R^4$ are each independently selected from the group consisting of hydrogen, a substituted or unsubstituted $C_1$ to $C_{60}$ linear or branched alkyl group, a substituted or unsubstituted amine group, and combinations thereof, or are connected to each other to form a condensed ring;

when $R^1$ and $R^3$ do not form condensed rings together with $R^2$ and $R^4$, respectively, $R^2$ may form a condensed ring together with $R^3$;

the condensed ring formed by $R^1$ and $R^2$ is a substituted or unsubstituted monocyclic or polycyclic $C_6$ to $C_{60}$ aryl group or a substituted or unsubstituted monocyclic or polycyclic $C_2$ to $C_{60}$ heteroaryl group, wherein the condensed ring is substituted;

the condensed ring formed by $R^2$ and $R^3$ is a substituted or unsubstituted monocyclic or polycyclic $C_6$ to $C_{60}$ aryl group or a substituted or unsubstituted monocyclic or polycyclic $C_2$ to $C_{60}$ heteroaryl group, wherein the condensed ring is substituted; and the condensed ring formed by $R^3$ and $R^4$ is a substituted or unsubstituted monocyclic or polycyclic $C_6$ to $C_{60}$ aryl group or a substituted or unsubstituted monocyclic or polycyclic $C_2$ to $C_{60}$ heteroaryl group, wherein the condensed ring is substituted.

[Formula 2]

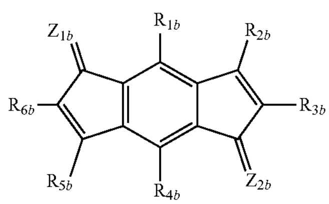

[Formula 3]

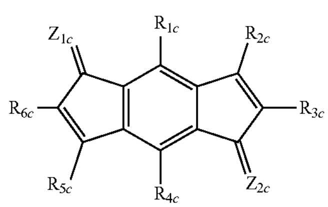

wherein $R_1$, $R_2$, $R_3$, $R_4$, $R_5$, and $R_6$ are each independently hydrogen, a substituted or unsubstituted $C_6$ to $C_{12}$ aryl group, a substituted or unsubstituted $C_2$ to $C_{12}$ heteroaryl group, a substituted or unsubstituted $C_1$ to $C_{12}$ alkyl group, a substituted or unsubstituted $C_1$ to $C_{12}$ alkoxy group, a substituted or unsubstituted $C_1$ to $C_{12}$ ether group, a cyano group, a fluorine group, a trifluoromethyl group, a trifluoromethoxy group, or a trimethylsilyl group, and at least one of $R_1$, $R_2$, $R_3$, $R_4$, $R_5$, and $R_6$ includes a cyano group;

$Z_1$ and $Z_2$ are each independently represented by Formula 4:

[Formula 4]

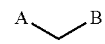

wherein A and B are each independently hydrogen, a substituted or unsubstituted $C_6$ to $C_{12}$ aryl group, a $C_3$ to $C_{12}$ heteroaryl group, a $C_1$ to $C_{12}$ alkyl group, a $C_1$ to $C_{12}$ alkoxy group, a $C_1$ to $C_{12}$ ether group, a cyano group, a fluorine group, a trifluoromethyl group, a trifluoromethoxy group, or a trimethylsilyl group.

Substituents in Formula 2 and Formula 3 are selected independently of one another.

The present disclosure provides an organic light emitting diode which has improved properties in terms of driving voltage and lifespan.

LIST OF REFERENCE NUMERALS

Figure 1:
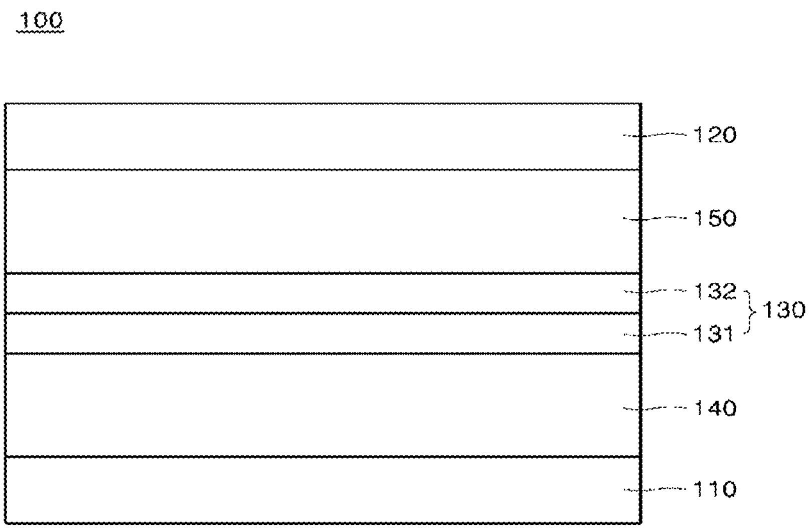
FIG. 1 is a schematic sectional view of a tandem organic light emitting diode having two light emitting stacks according to a first exemplary embodiment of the present disclosure.

100, 200: organic light emitting diode;
110, 210: first electrode;
120, 220: second electrode;
140, 240: first light emitting stack (first light emitting unit);
150, 250: second light emitting stack (second light emitting unit);
130, 230, 260: charge generation layer;
241, 251: light emitting material layer;
242, 252: electron transport layer;
131, 231, 261: N-type charge generation layer; and
132, 232, 262: P-type charge generation layer.

DETAILED DESCRIPTION

Hereinafter, embodiments of the present disclosure will be described in detail with reference to the accompanying drawings such that the technical idea of the present disclosure can be easily realized by those skilled in the art. It should be understood that the present disclosure is not limited to the following embodiments and may be embodied in different ways.

In the drawings, portions irrelevant to the description will be omitted for clarity and like components will be denoted by like reference numerals throughout the specification. In addition, description of known functions and constructions which may unnecessarily obscure the subject matter of the present disclosure will be omitted.

It will be understood that, when an element such as a layer, film, region or substrate is referred to as being placed "above"/"below" or "on"/"under" another element, it can be directly placed on the other element, or intervening layer(s) may also be present. It will be understood that, although the terms "first", "second", "A", "B", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element or component discussed below could also be termed a "second" element or component, or vice versa, without departing from the scope of the present disclosure. When an element or layer is referred to as being "on," "connected to," or "coupled to" another element or layer, it may be directly on, connected to, or coupled to the other element or layer or intervening elements or layers may be present. However, when an element or layer is referred to as being "directly on," "directly connected to," or "directly coupled to" another element or layer, there are no intervening elements or layers present.

As used herein, unless otherwise stated, the term "substituted" means that a hydrogen atom of a functional group is substituted. Here, the hydrogen atom includes light hydrogen, deuterium, and tritium.

Herein, a substituent for the hydrogen atom may be any one selected from the group consisting of an unsubstituted or halogen-substituted $C_1$ to $C_{20}$ alkyl group, an unsubstituted or halogen-substituted $C_1$ to $C_{20}$ alkoxy group, halogen, a cyano group, a carboxyl group, a carbonyl group, an amine group, a $C_1$ to $C_{20}$ alkylamine group, a nitro group, a hydrazyl group, a sulfonic acid group, a $C_1$ to $C_{20}$ alkylsilyl group, a $C_1$ to $C_{20}$ alkoxysilyl group, a $C_3$ to $C_{30}$ cycloalkylsilyl group, a $C_5$ to $C_{30}$ arylsilyl group, an unsubstituted or substituted $C_5$ to $C_{30}$ aryl group, a $C_4$ to $C_{30}$ heteroaryl group, and combinations thereof, without being limited thereto.

As used herein, unless otherwise stated, the term "hetero" in the terms "heteroaromatic ring", "heterocycloalkylene group", "heteroarylene group", "heteroarylalkylene group", "heterooxyarylene group", "heterocycloalkyl group", "heteroaryl group", "heteroarylalkyl group", "heterooxyaryl group", "heteroarylamine group", and the like means that at least one (for example, 1 to 5) of carbon atoms constituting an aromatic or alicyclic ring is substituted with at least one hetero atom selected from the group consisting of N, O, S, and combinations thereof.

As used herein, in definition of the substituent, the term "combinations thereof" means that two or more substituents are bonded to one another via a linking group or that two or more substituents are condensed with one another.

In accordance with one aspect of the present disclosure, there is provided an organic light emitting diode including: at least two light emitting stacks interposed between an anode and a cathode and including at least one light emitting material layer; and a charge generation layer interposed between the light emitting stacks.

The charge generation layer includes an N-type charge generation layer and a P-type charge generation layer, wherein the N-type charge generation layer and the P-type charge generation layer are stacked in such direction for the N-type charge generation layer to face the anode and for the P-type charge generation layer to face the cathode.

The N-type charge generation layer includes a compound represented by Formula 1:

[Formula 1]

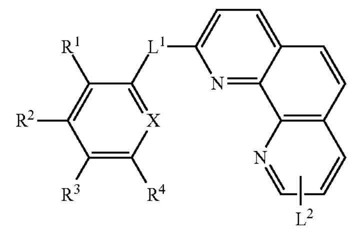

wherein X is $NR^5$, $CR^6$, S, O, or Se; $R^5$ is hydrogen, deuterium, halogen, —P(═O)$R^8R^9$, a substituted or unsubstituted $C_6$ to $C_{60}$ monocyclic or polycyclic aryl group, a substituted or unsubstituted $C_2$ to $C_{60}$ monocyclic or polycyclic heteroaryl group, or an amine group substituted or unsubstituted with a substituted or unsubstituted $C_1$ to $C_{20}$ alkyl group, a substituted or unsubstituted $C_6$ to $C_{60}$ monocyclic or polycyclic aryl group, or a substituted or unsubstituted $C_2$ to $C_{60}$ monocyclic or polycyclic heteroaryl group; $L^2$, $R^6$, $R^8$, are each independently hydrogen, a substituted or unsubstituted $C_1$ to $C_{60}$ linear or branched alkyl group, a substituted or unsubstituted $C_3$ to $C_{60}$ monocyclic or polycyclic cycloalkyl group, a substituted or unsubstituted $C_6$ to $C_{60}$ monocyclic or polycyclic aryl group, or a substituted or unsubstituted $C_2$ to $C_{60}$ monocyclic or polycyclic heteroaryl group;

$L^1$ is selected from the group consisting of a substituted or unsubstituted $C_5$ to $C_{60}$ monocyclic or polycyclic arylene group, a substituted or unsubstituted $C_2$ to $C_{60}$ monocyclic or polycyclic heteroarylene group, a substituted or unsubstituted $C_1$ to $C_{60}$ linear or branched alkylene group, a substituted or unsubstituted divalent amine group, and combinations thereof;

$R^1$ and $R^2$ are each independently selected from the group consisting of hydrogen, a substituted or unsubstituted $C_1$ to $C_{60}$ linear or branched alkyl group, a substituted or unsubstituted amine group, and combinations thereof, or are connected to each other to form a condensed ring;

$R^3$ and $R^4$ are each independently selected from the group consisting of hydrogen, a substituted or unsubstituted $C_1$ to $C_{60}$ linear or branched alkyl group, a substituted or unsubstituted amine group, and combinations thereof, or are connected to each other to form a condensed ring;

when $R^1$ and $R^3$ do not form condensed rings together with $R^2$ and $R^4$, respectively, $R^2$ may form a condensed ring together with $R^3$;

the condensed ring formed by $R^1$ and $R^2$ is a substituted or unsubstituted monocyclic or polycyclic $C_6$ to $C_{60}$ aryl group or a substituted or unsubstituted monocyclic or polycyclic $C_2$ to $C_{60}$ heteroaryl group, wherein the condensed ring is substituted;

the condensed ring formed by $R^2$ and $R^3$ is a substituted or unsubstituted monocyclic or polycyclic $C_6$ to $C_{60}$ aryl group or a substituted or unsubstituted monocyclic or polycyclic $C_2$ to $C_{60}$ heteroaryl group, wherein the condensed ring is substituted; and the condensed ring formed by $R^3$ and $R^4$ is a substituted or unsubstituted monocyclic or polycyclic $C_6$ to $C_{60}$ aryl group or a substituted or unsubstituted monocyclic or polycyclic $C_2$ to $C_{60}$ heteroaryl group, wherein the condensed ring is substituted.

Specifically, the compound represented by Formula 1 may be any one of compounds represented by the following formulae:
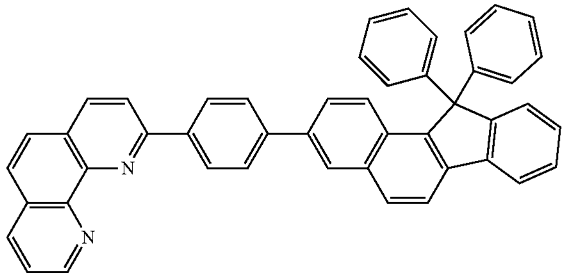
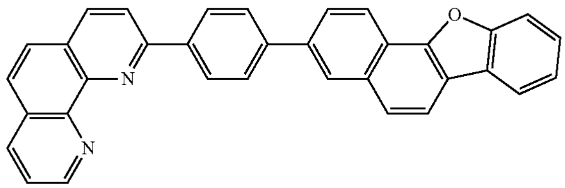
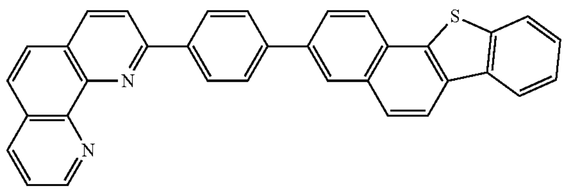
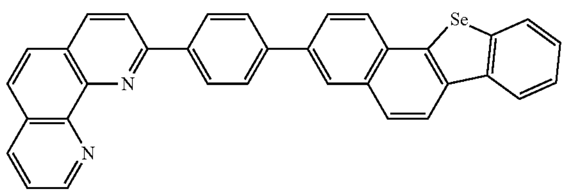
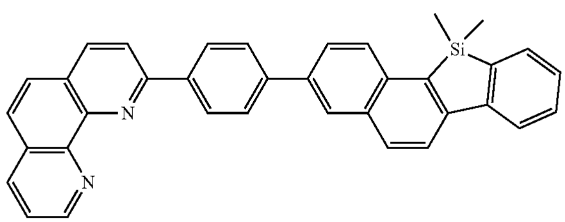
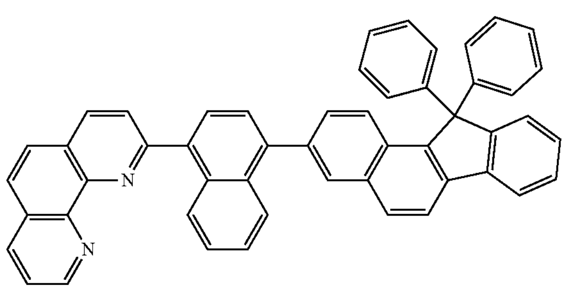
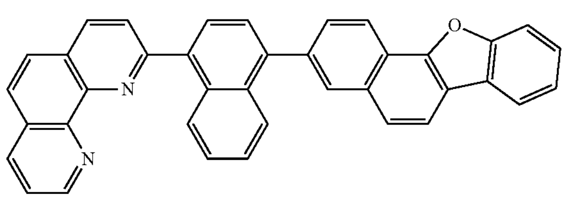
-continued
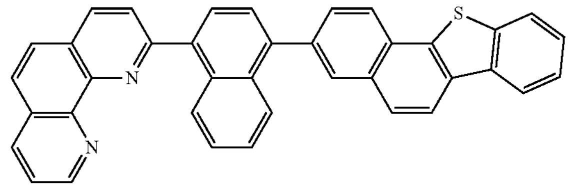
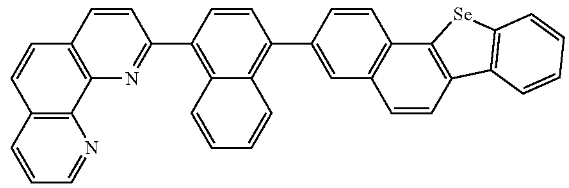
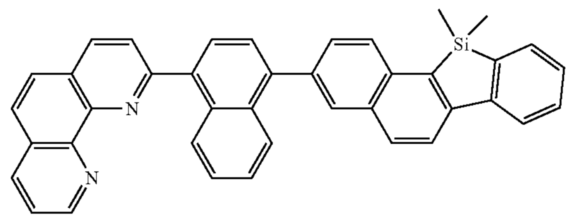
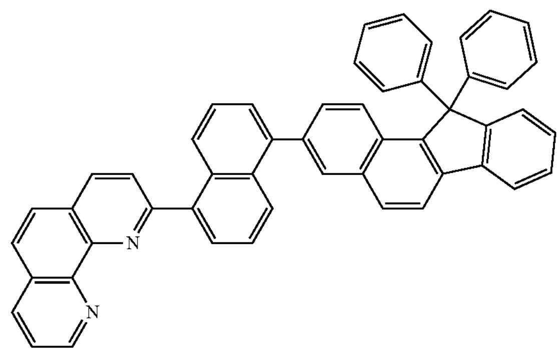
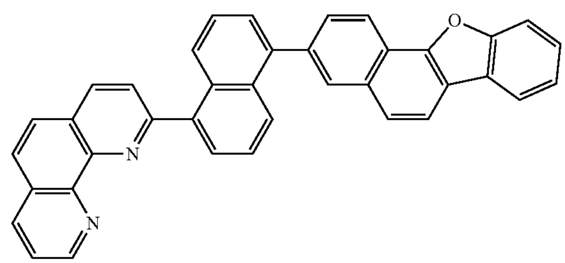
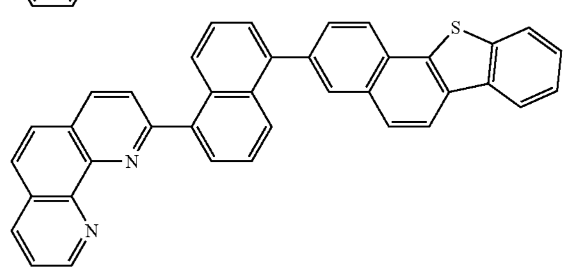
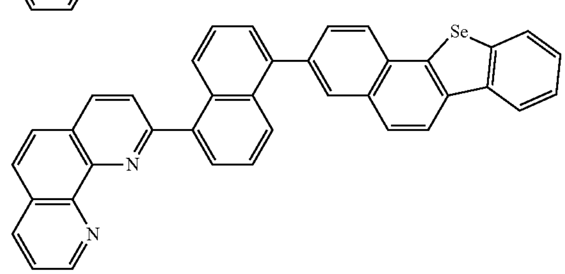

-continued
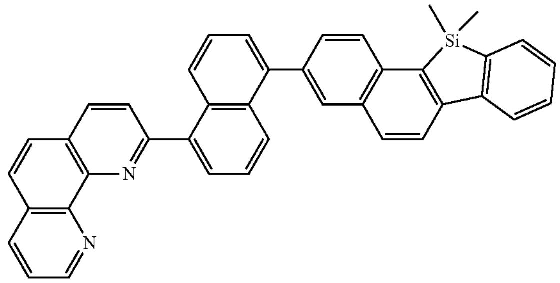
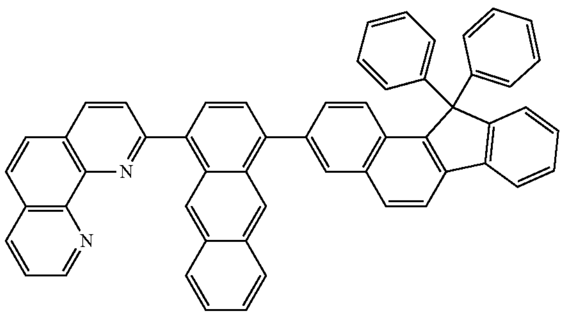
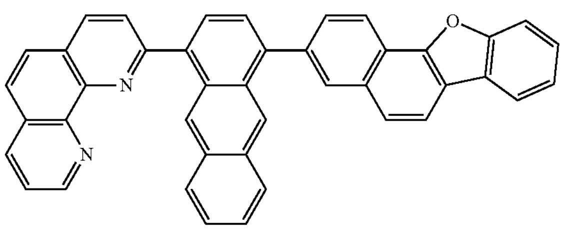
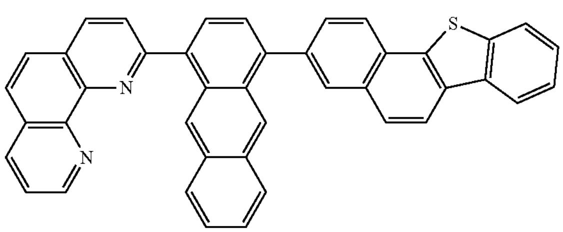
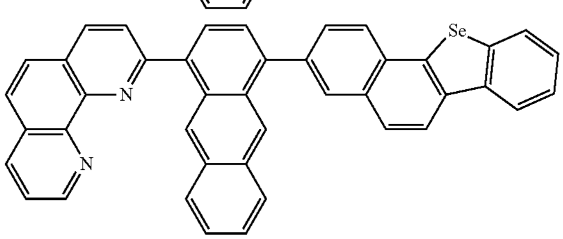
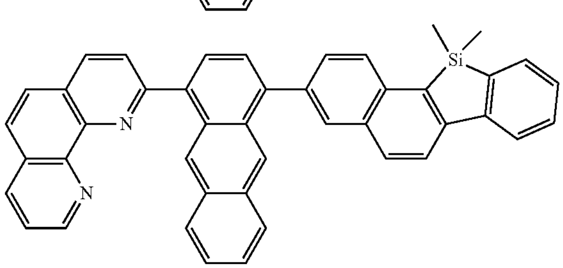
-continued
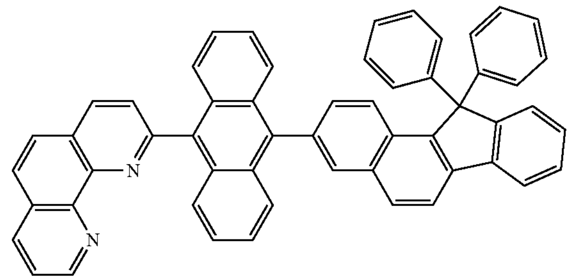
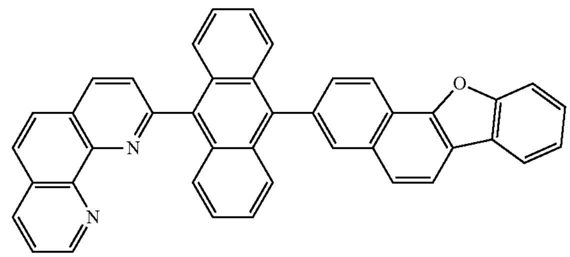
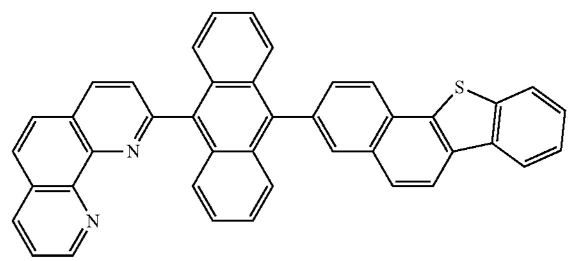
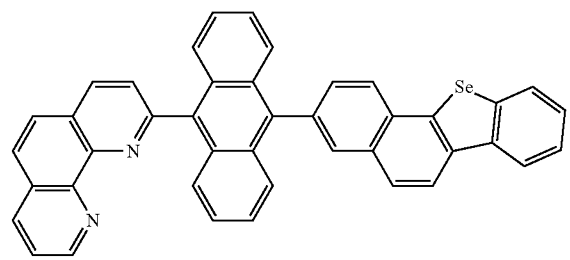
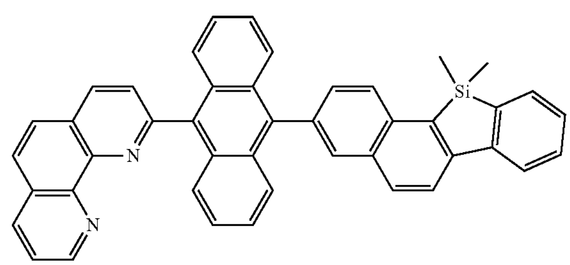
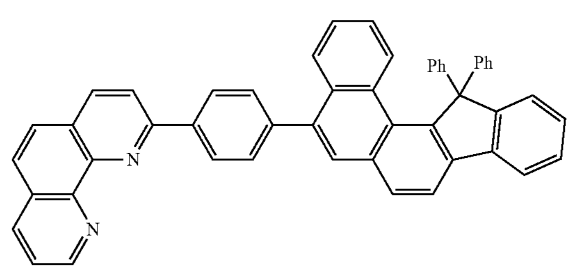

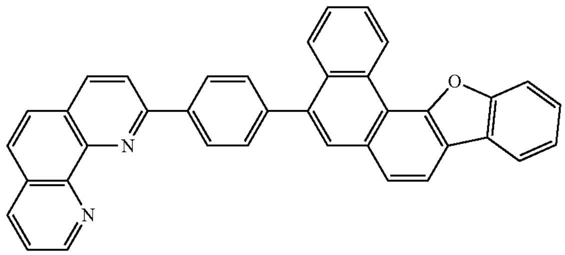
O
N
N
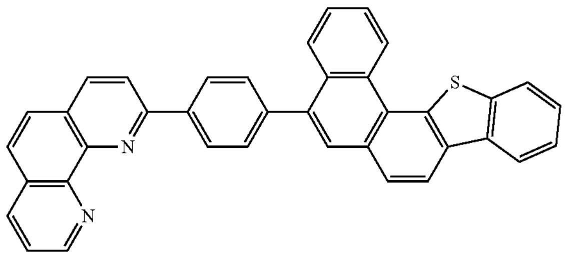
S
N
N
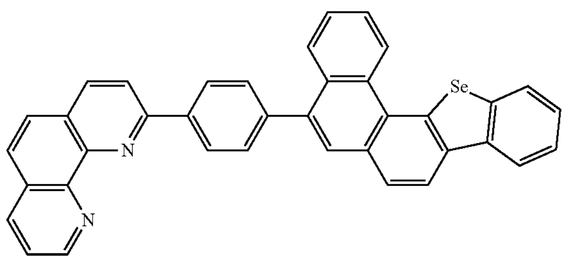
Se
N
N
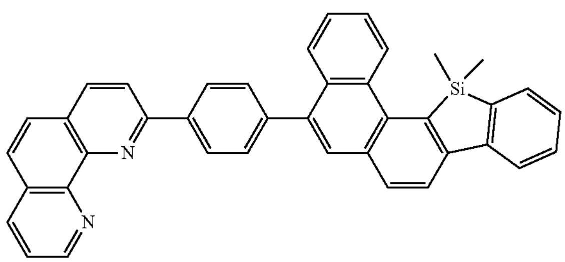
Si
N
N
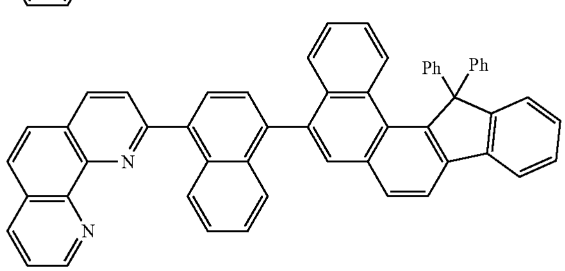
Ph
Ph
N
N
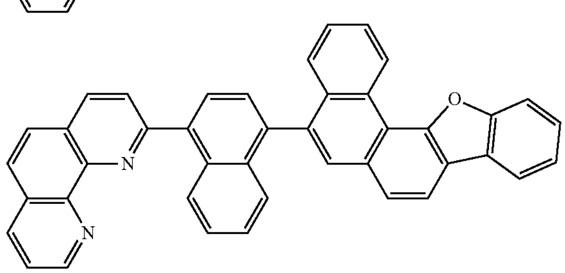
O
N
N
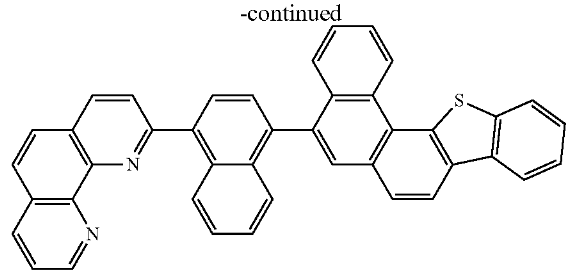
S
N
N
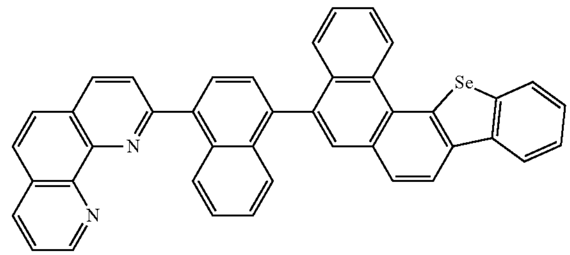
Se
N
N
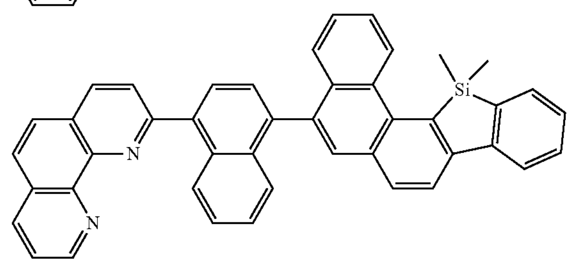
Si
N
N
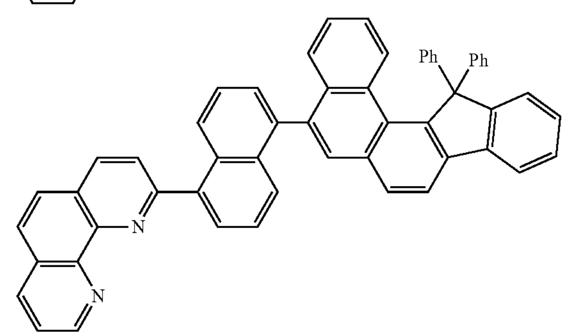
Ph
Ph
N
N
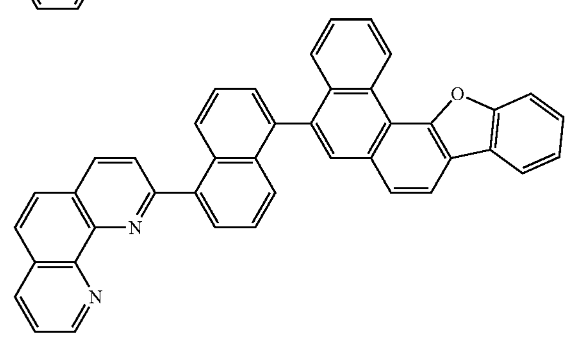
O
N
N
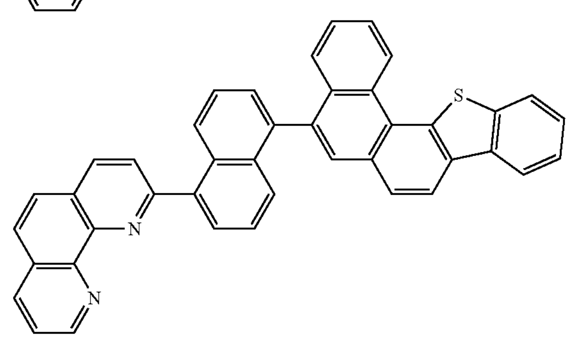
S
N
N -continued
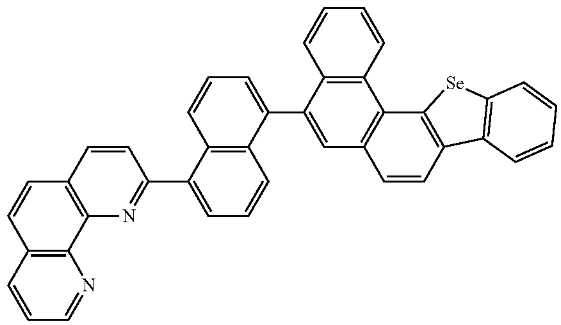
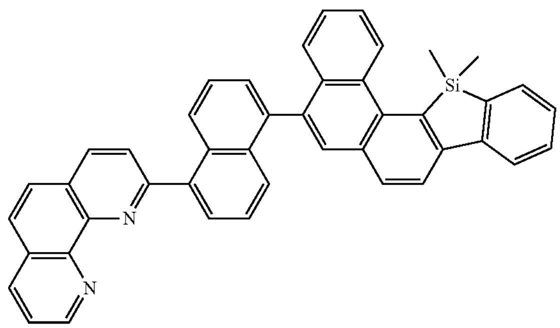
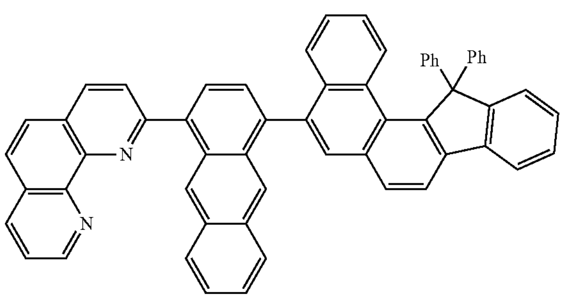
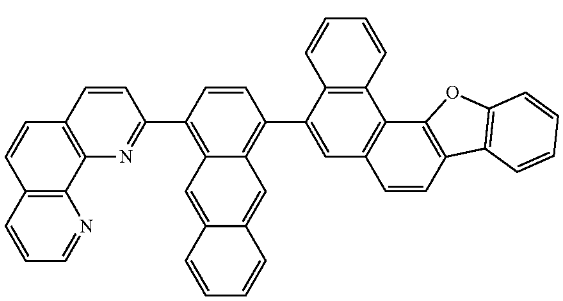
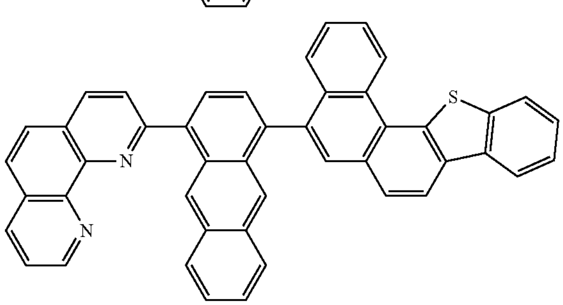
-continued
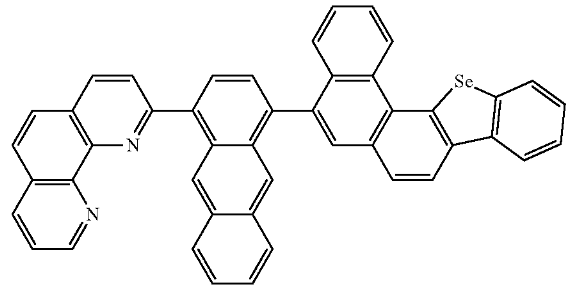
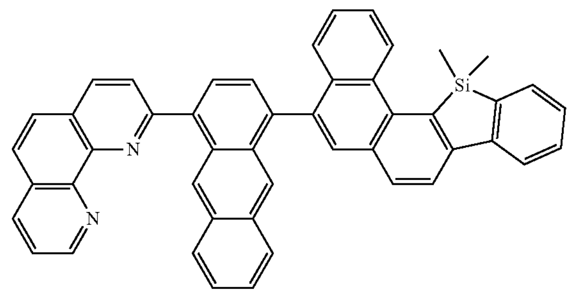
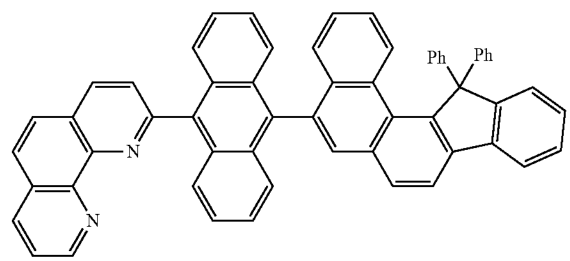
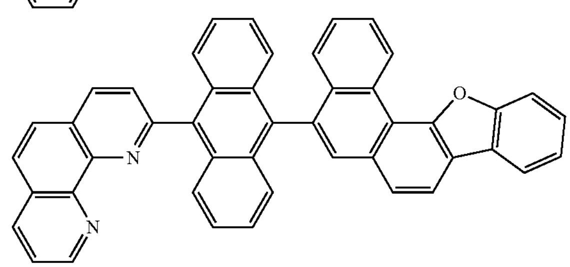
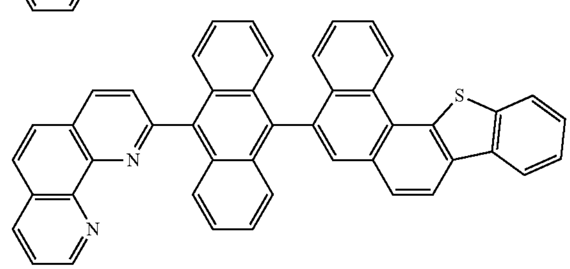
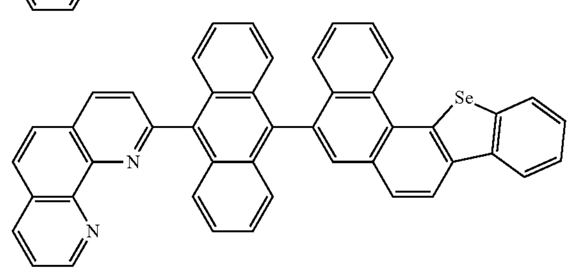

-continued
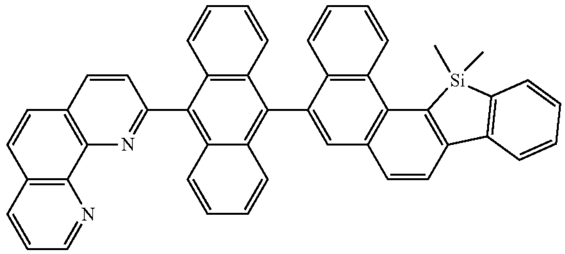
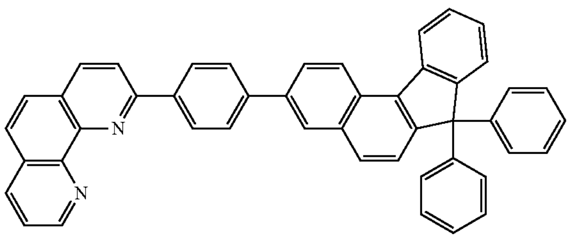
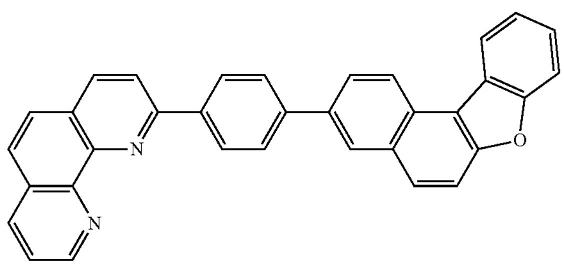
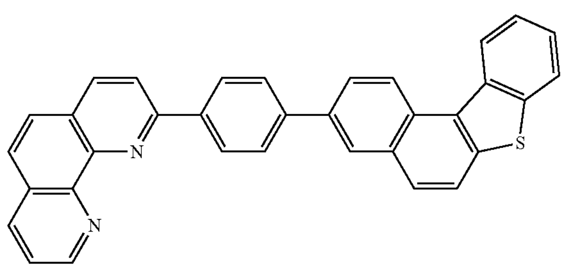
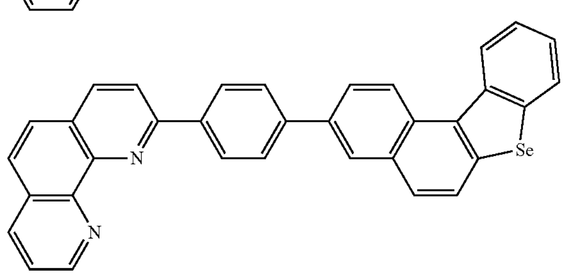
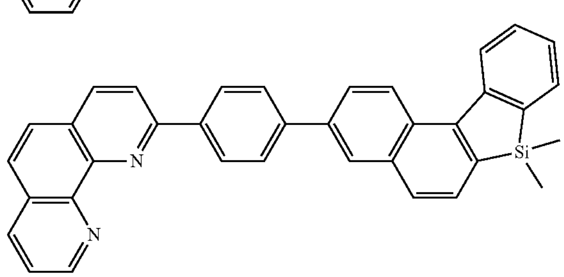
-continued
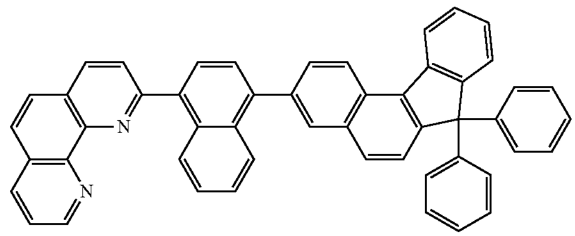
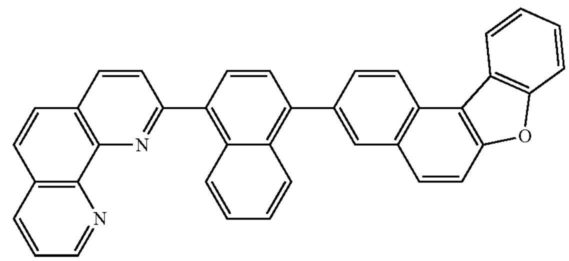
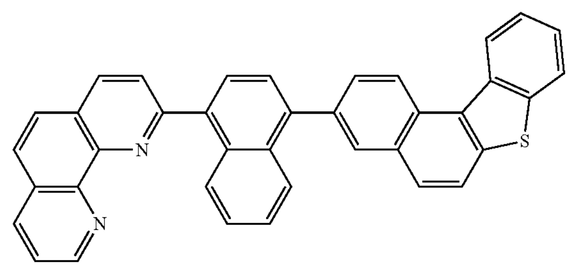
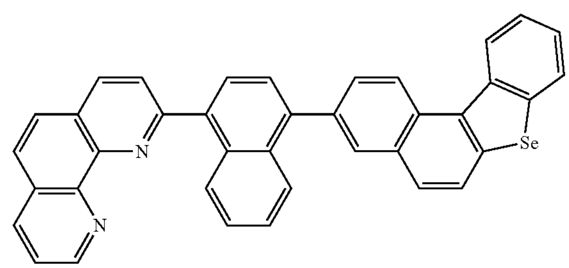
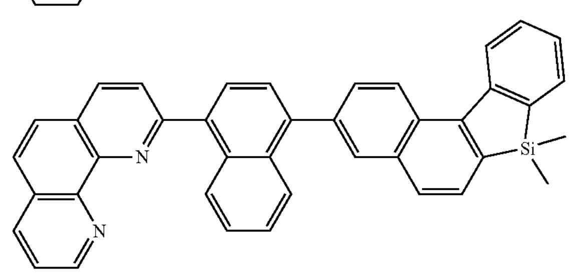
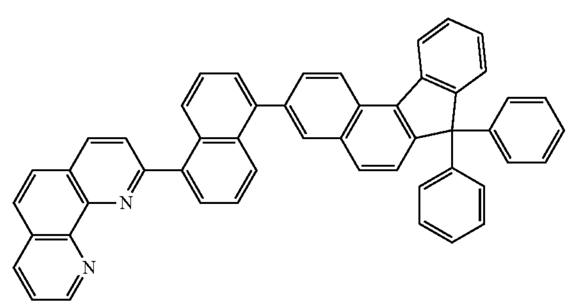

-continued
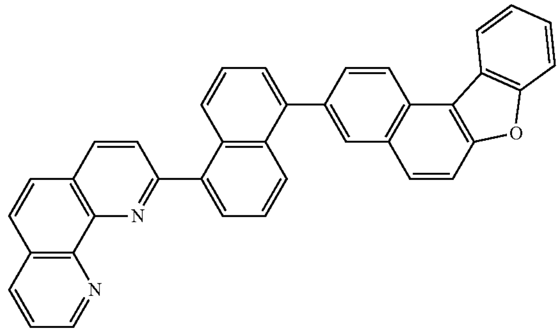
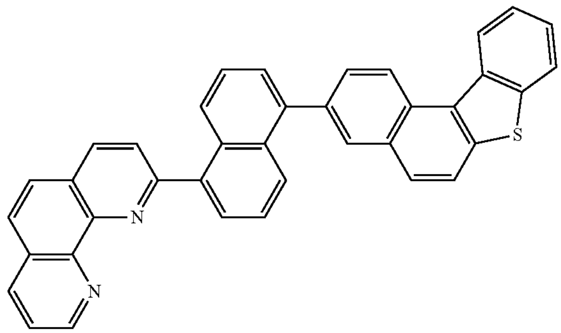
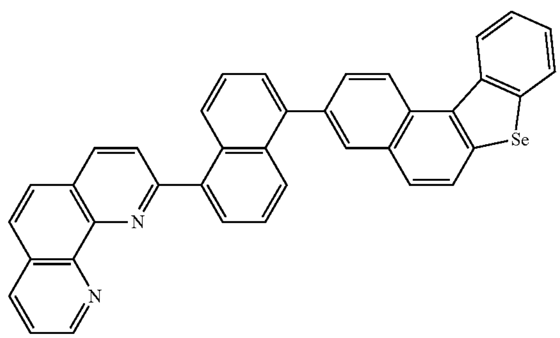
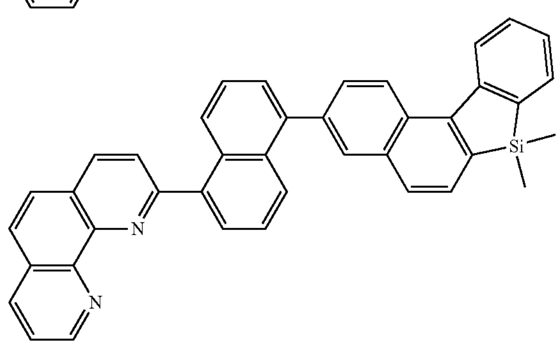
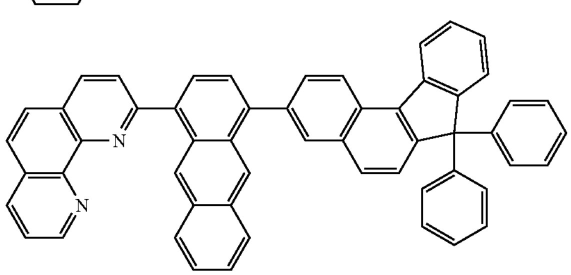
-continued
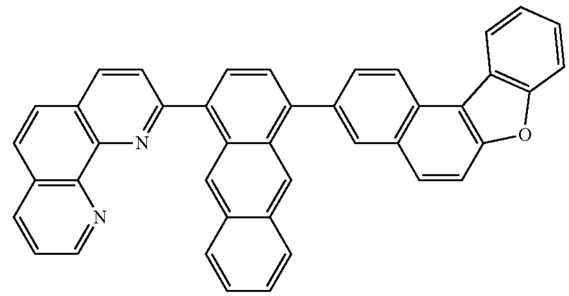
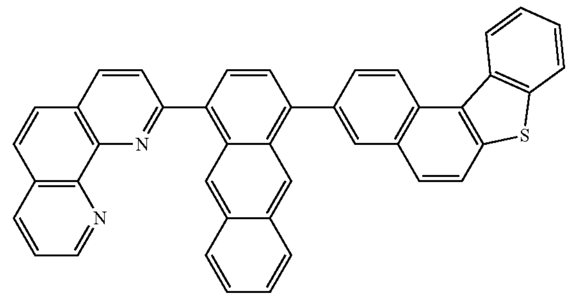
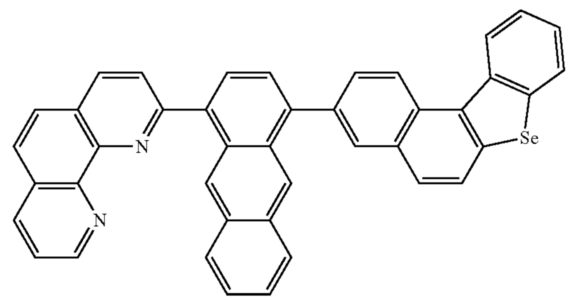
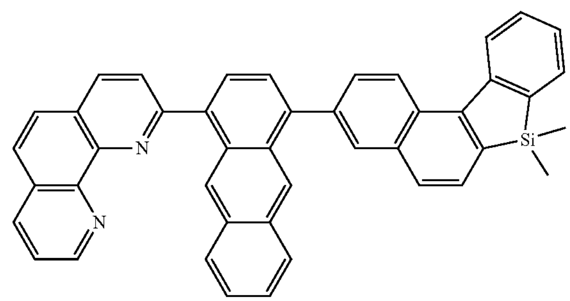
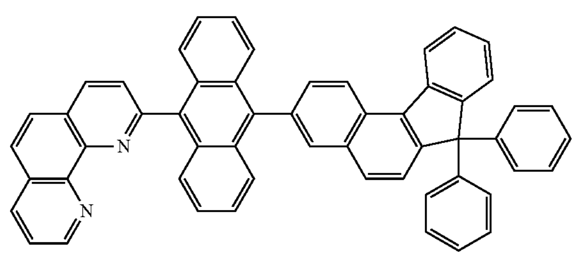
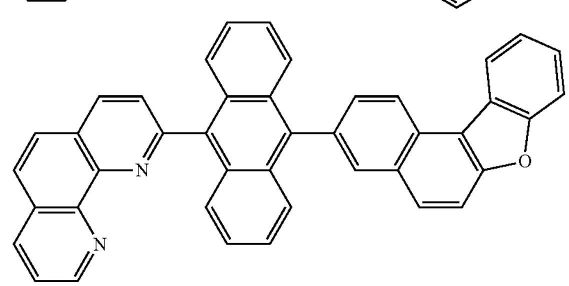

-continued
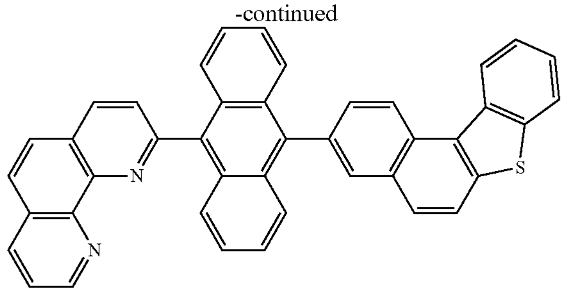
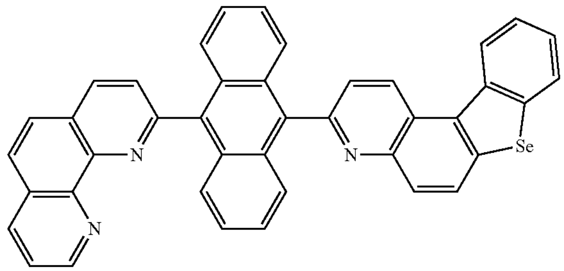
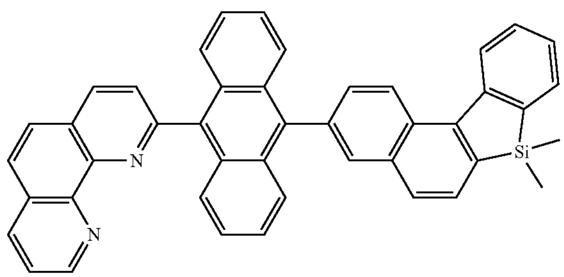
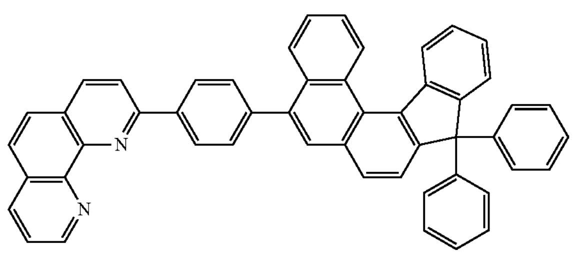
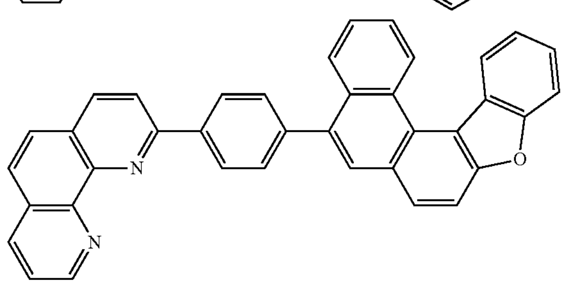
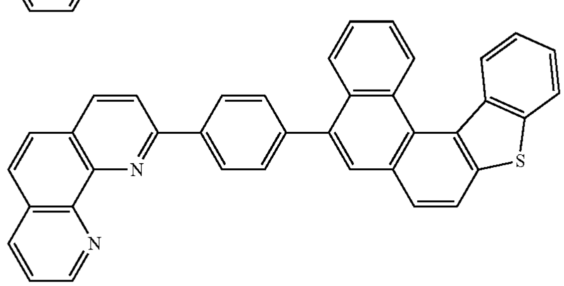
-continued
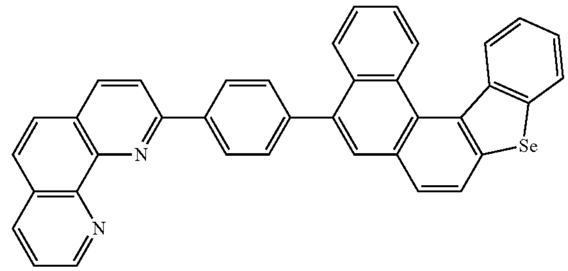
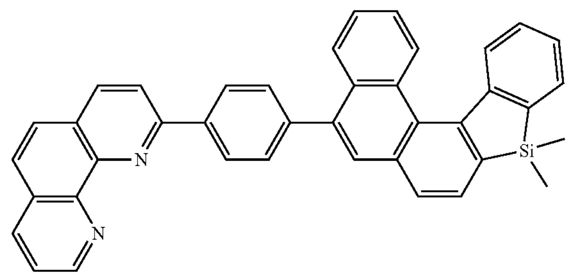
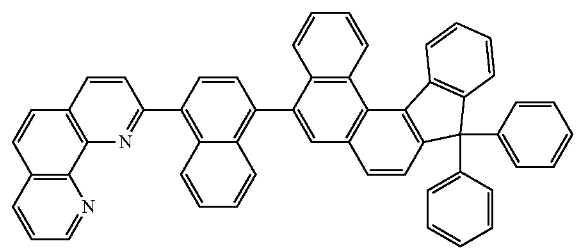
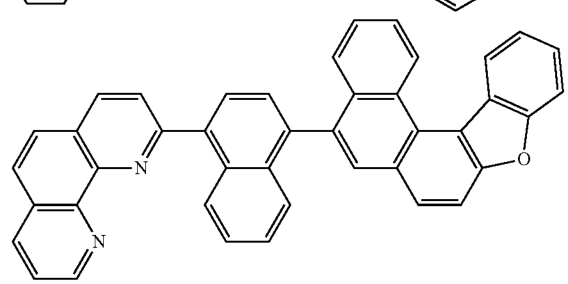
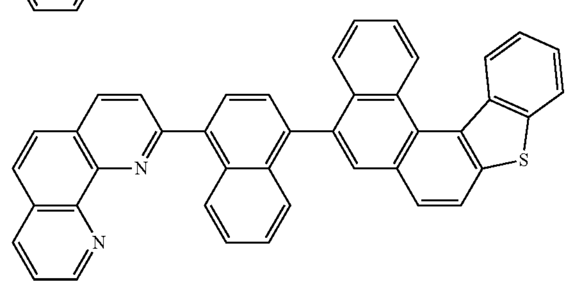
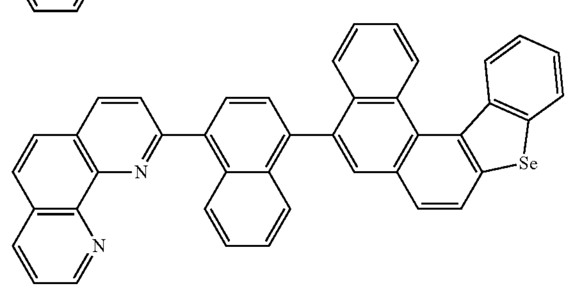

-continued
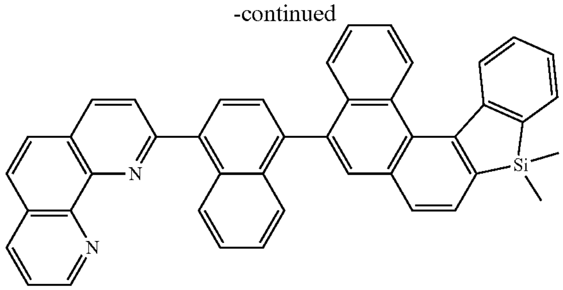
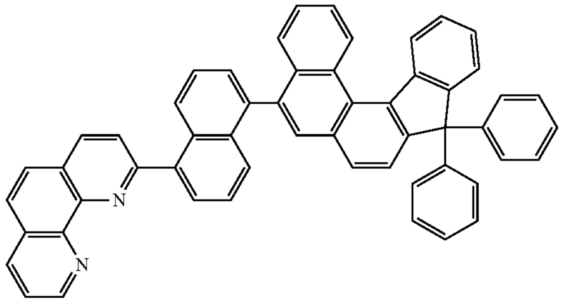
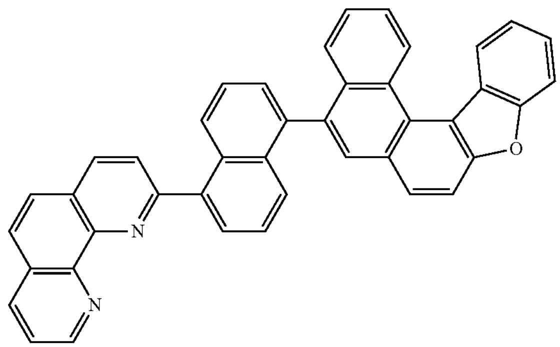
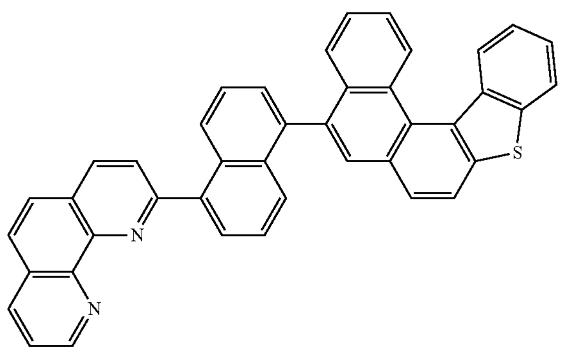
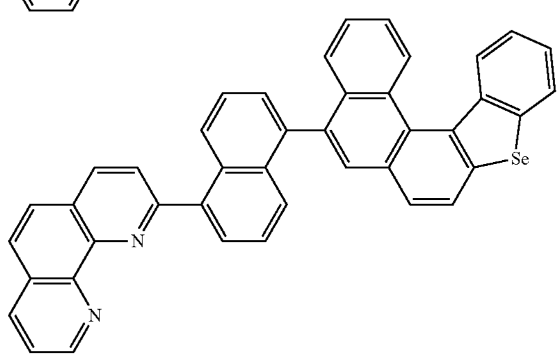
-continued
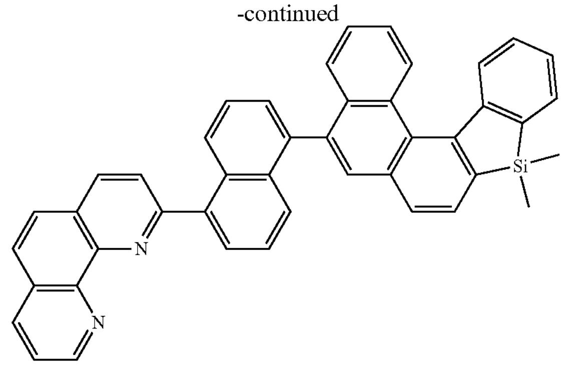
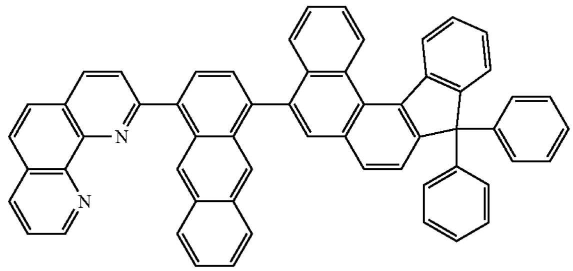
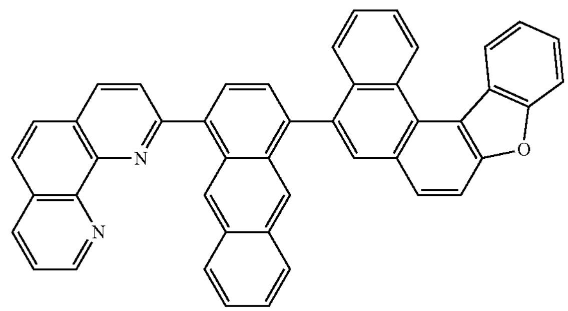
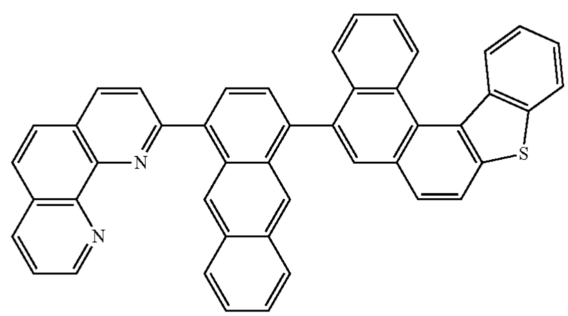
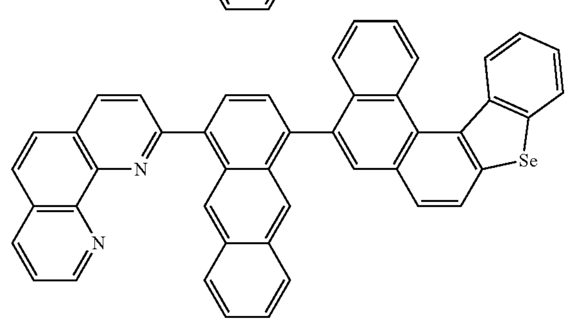

-continued
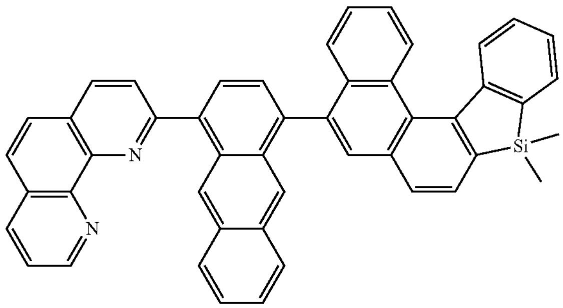
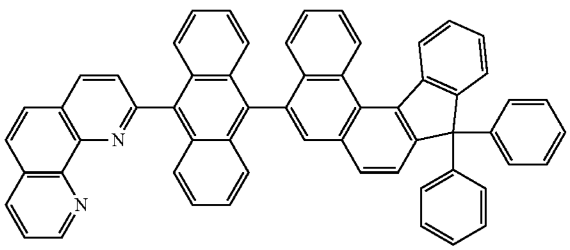
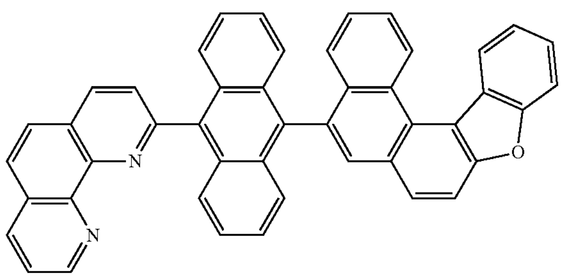
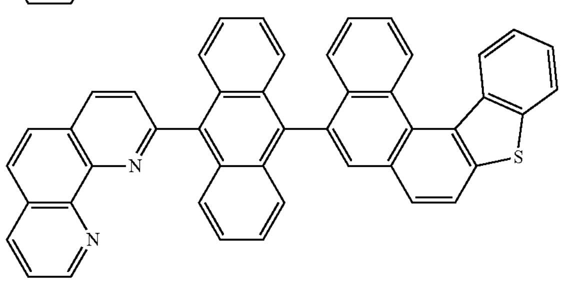
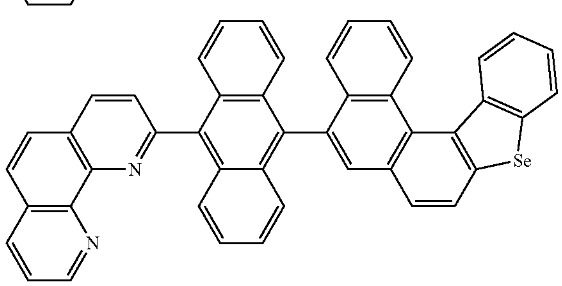
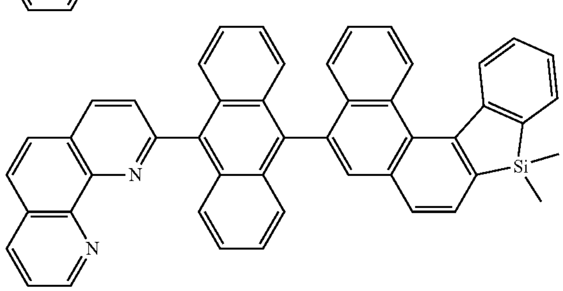
-continued
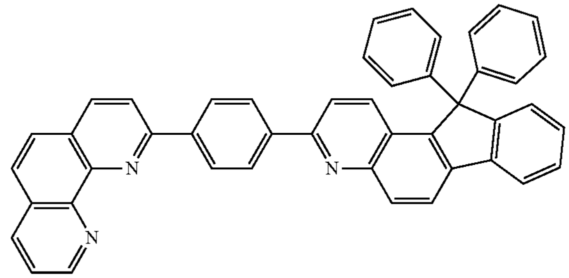
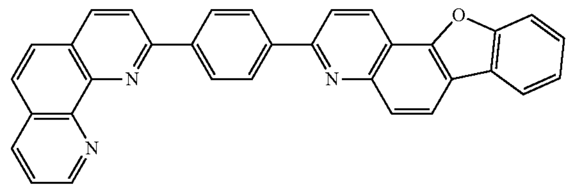
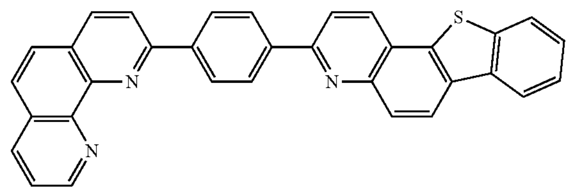
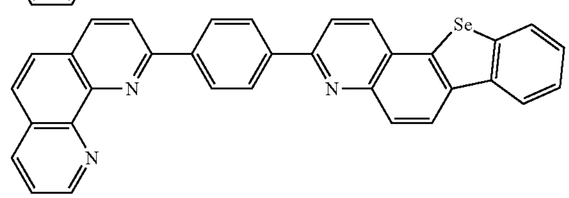
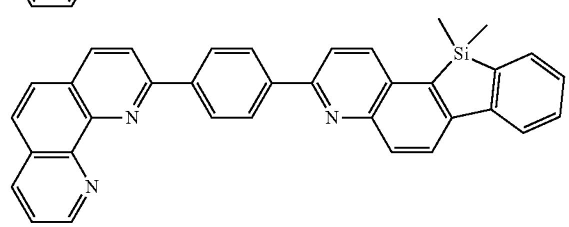
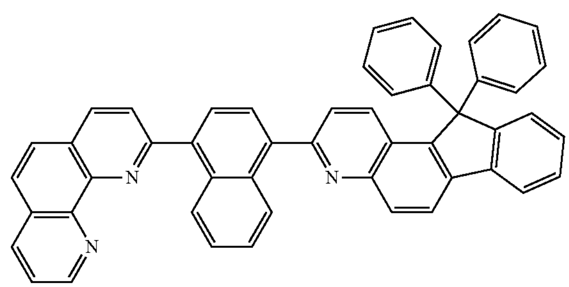
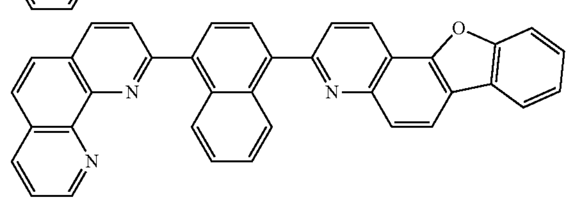
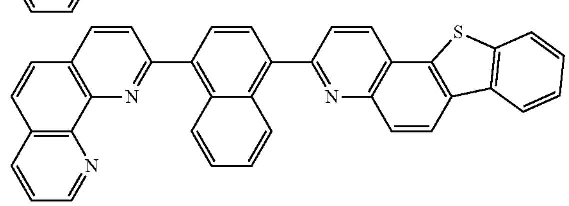

-continued
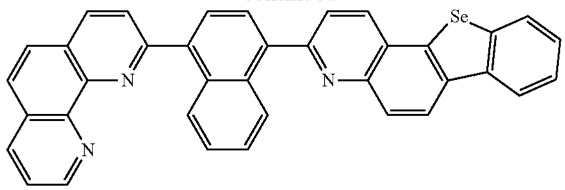
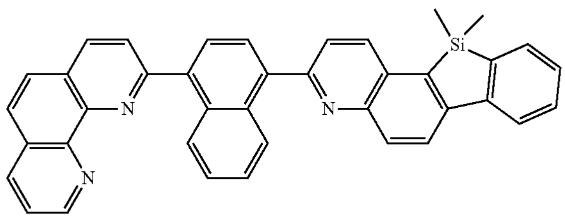
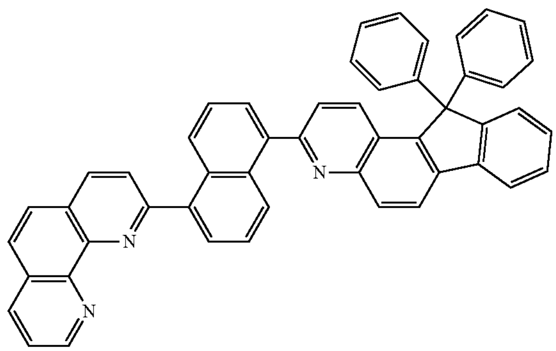
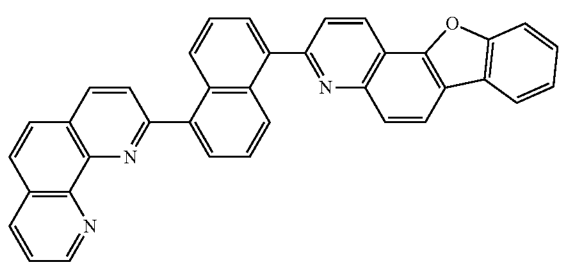
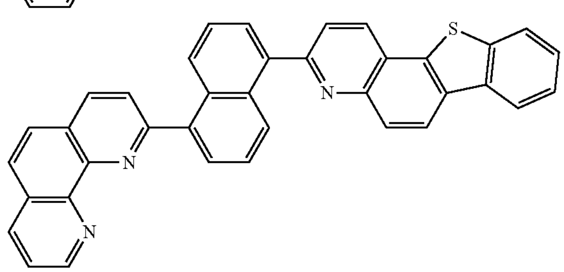
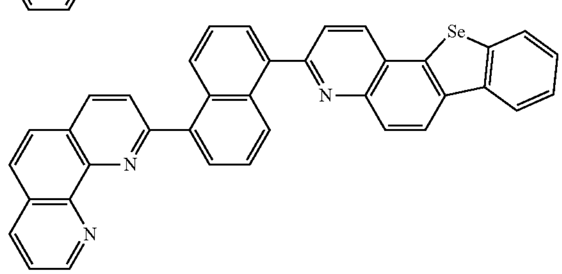
-continued
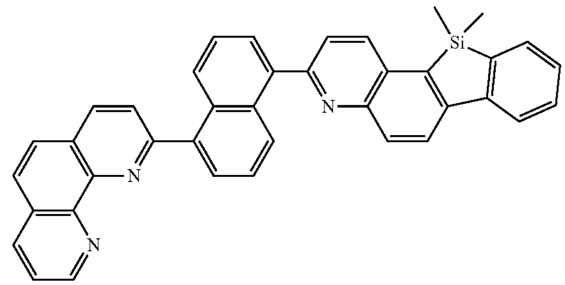
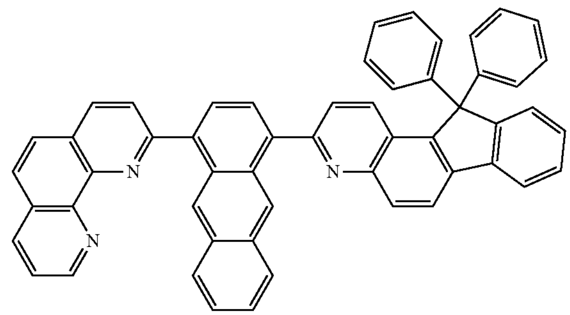
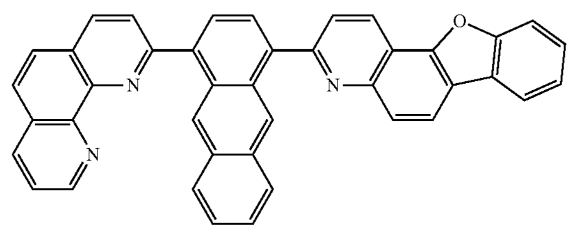
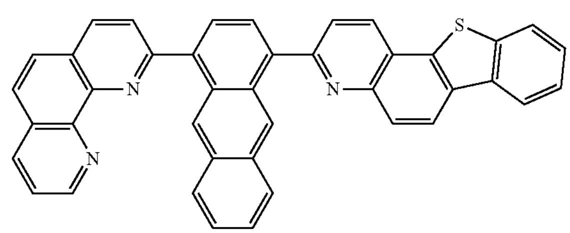
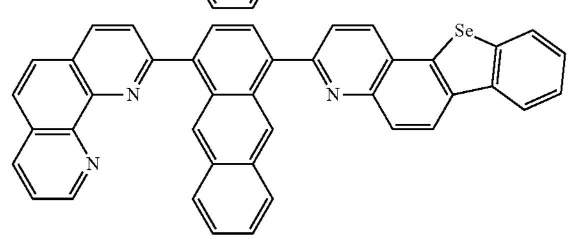
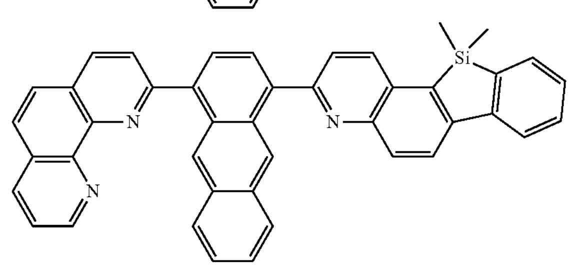

-continued
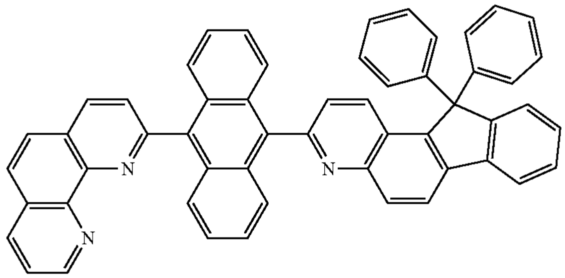
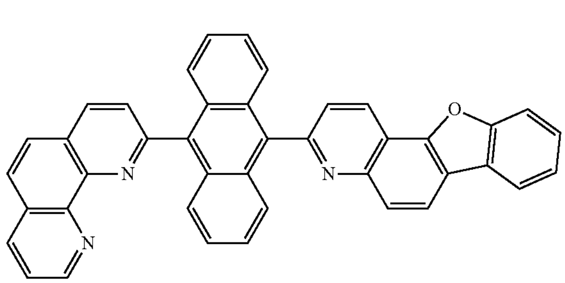
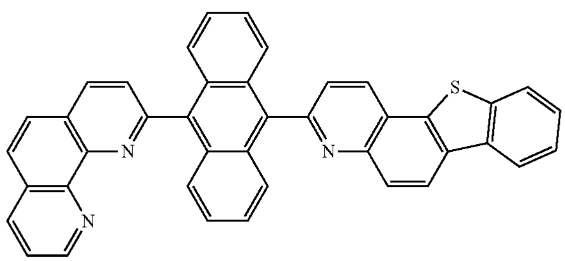
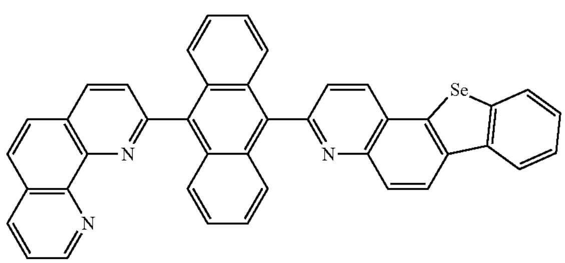
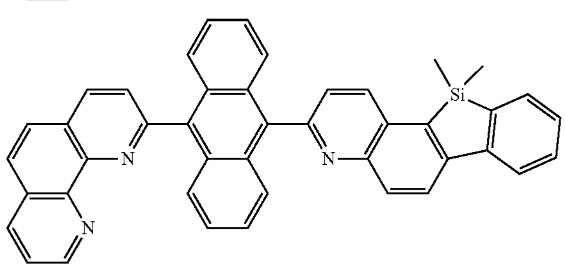
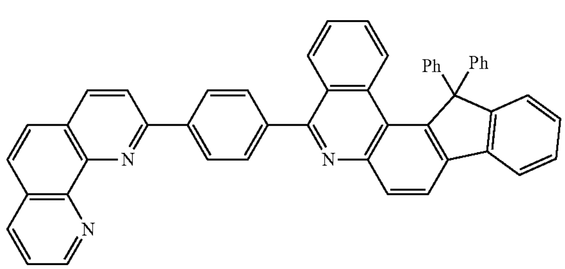
-continued
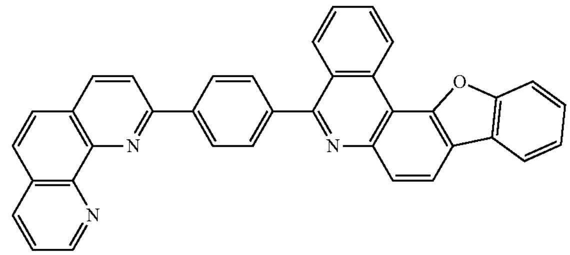
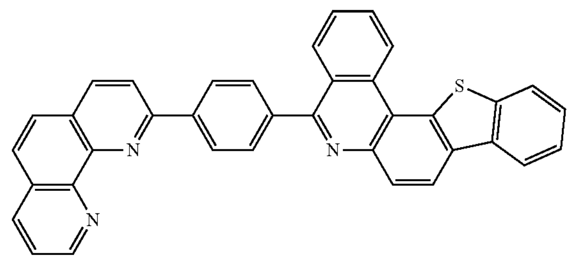
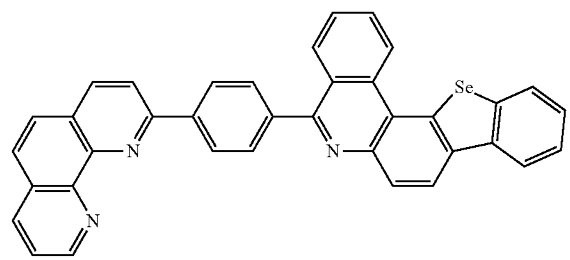
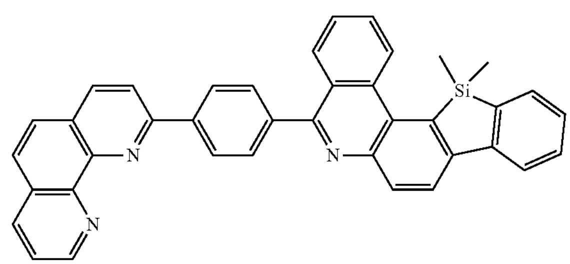
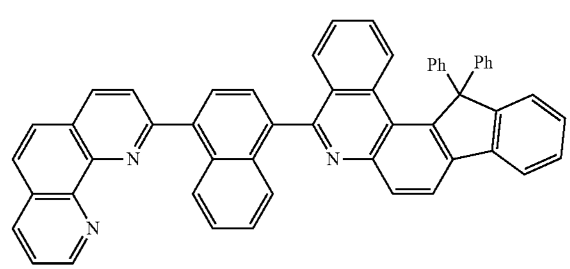
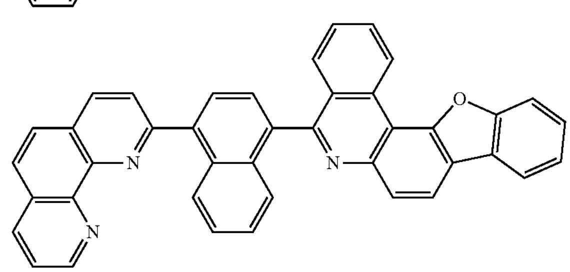

-continued
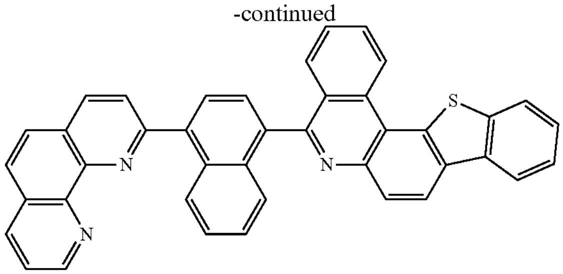
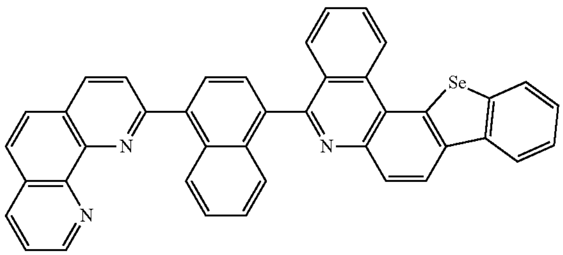
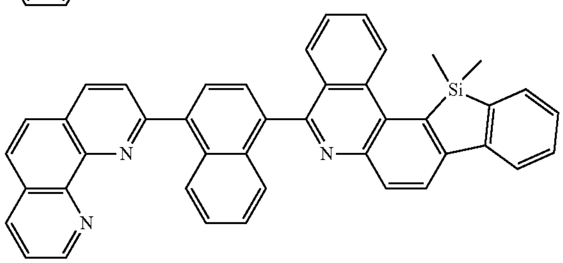
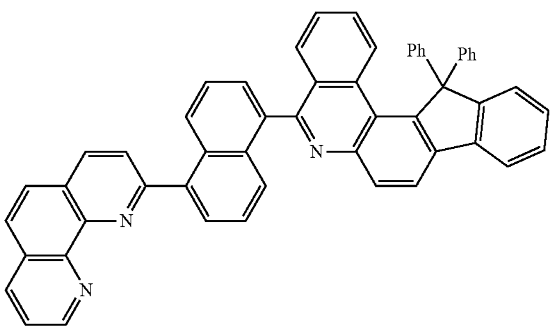
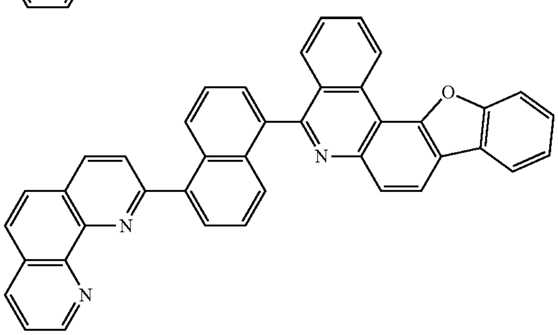
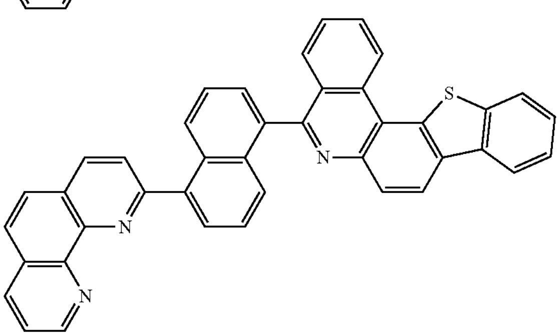
-continued
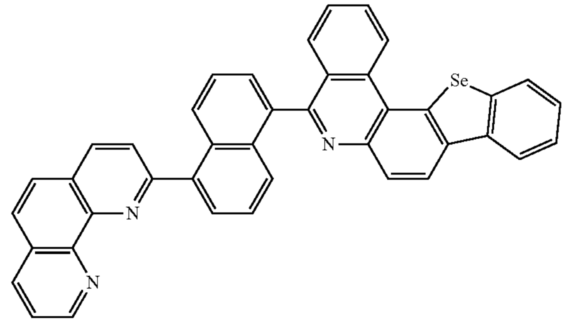
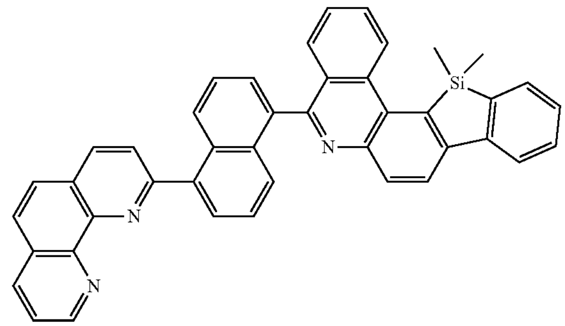
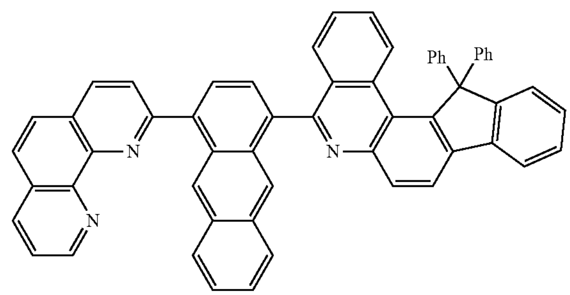
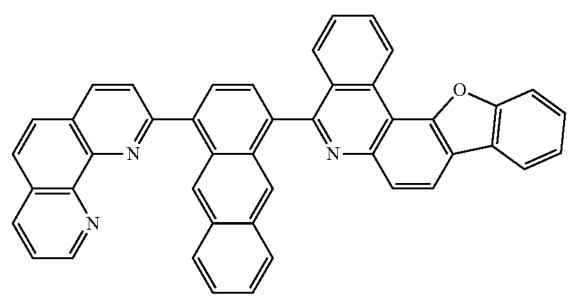
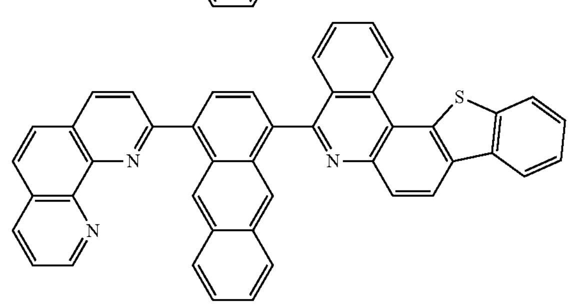

-continued
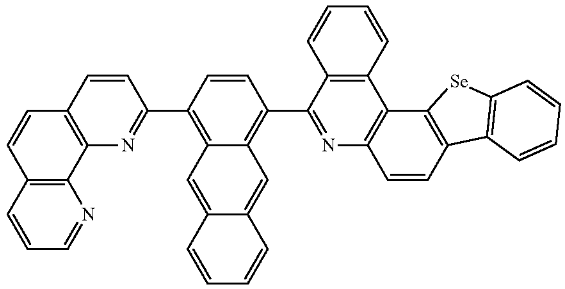
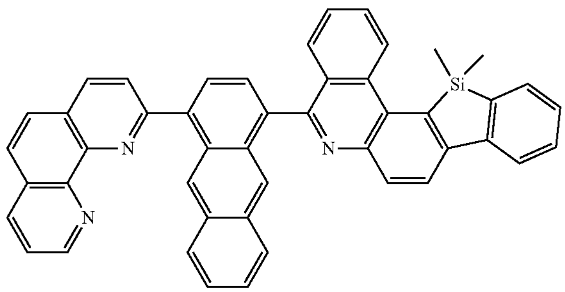
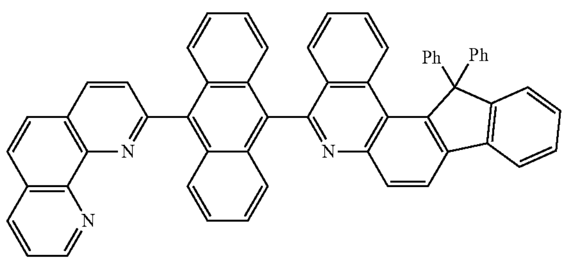
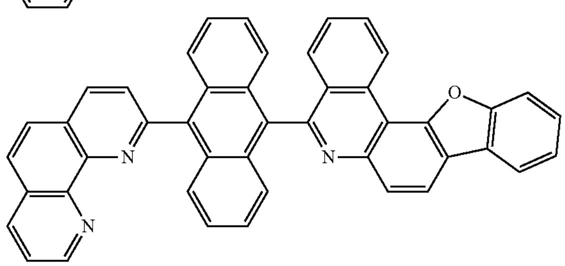
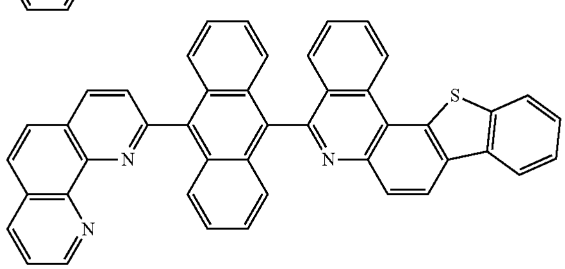
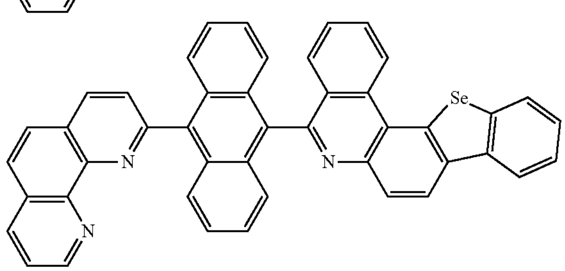
-continued
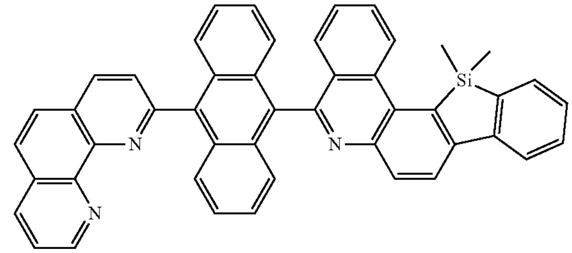
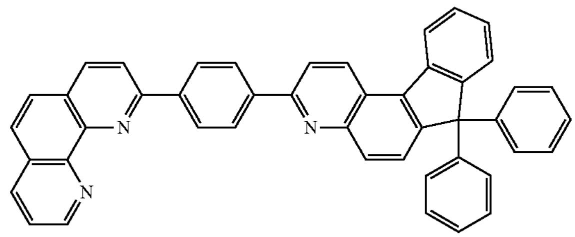
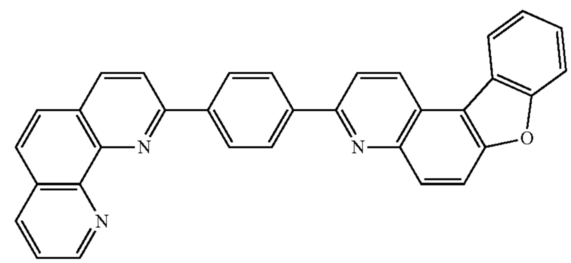
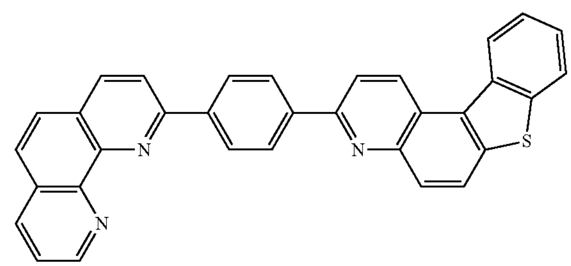
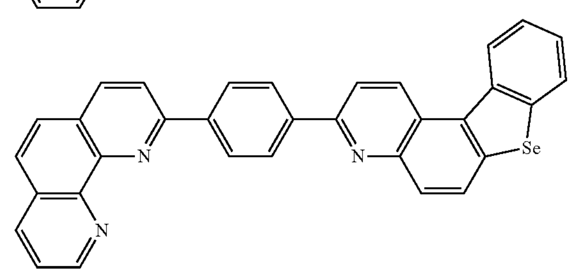
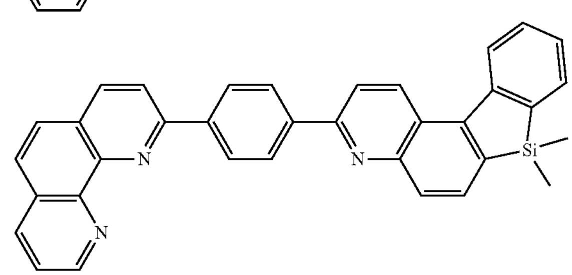

-continued
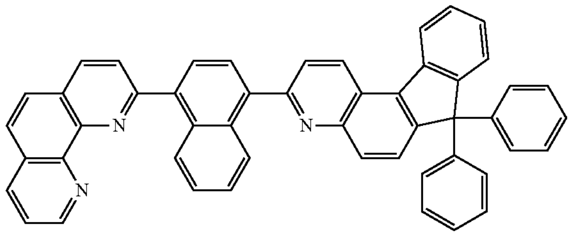
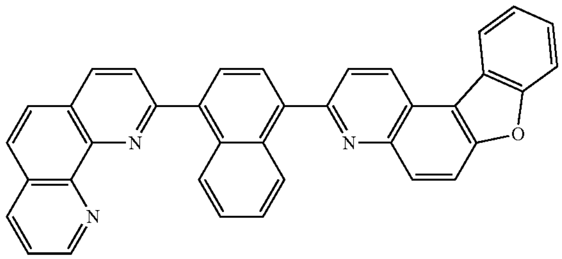
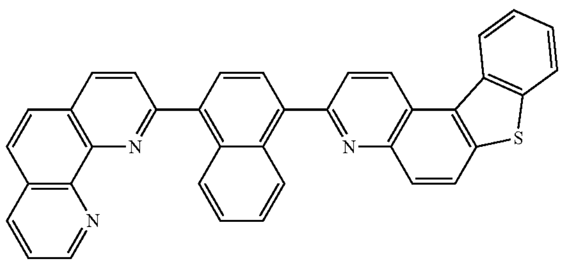
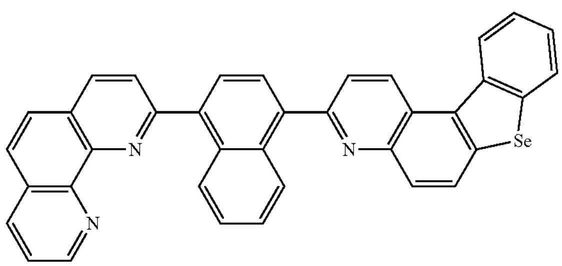
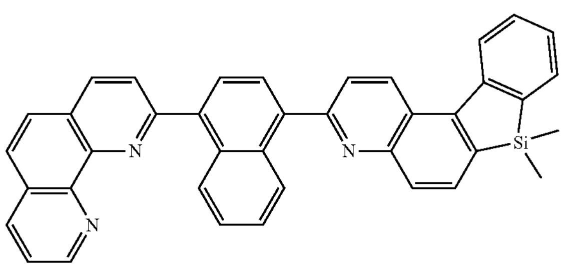
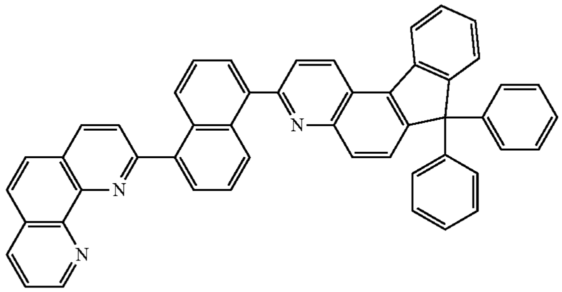
-continued
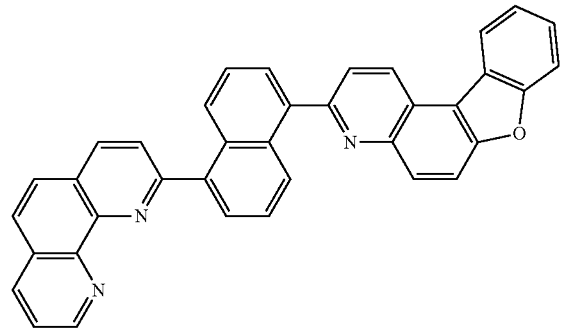
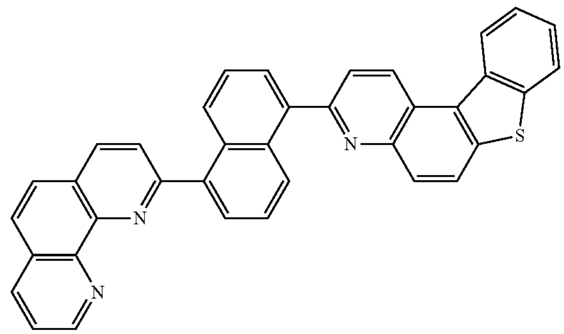
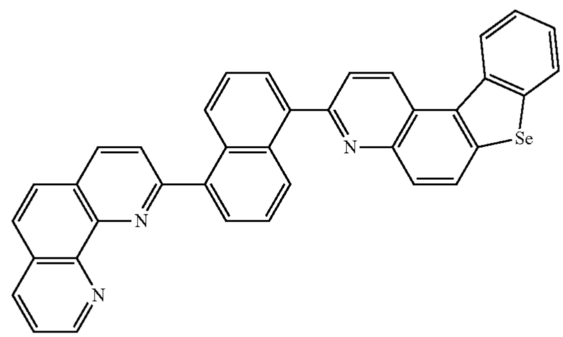
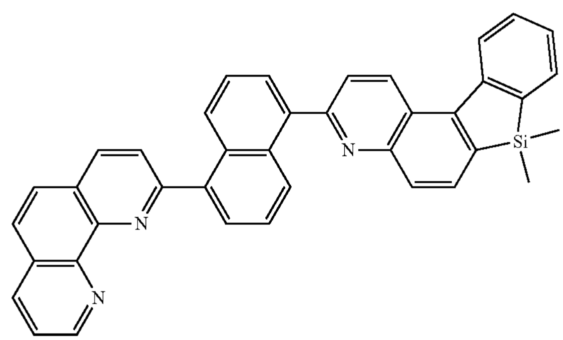
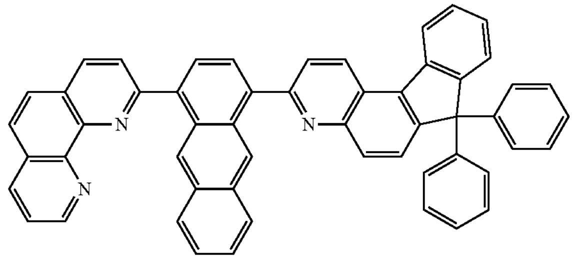

-continued
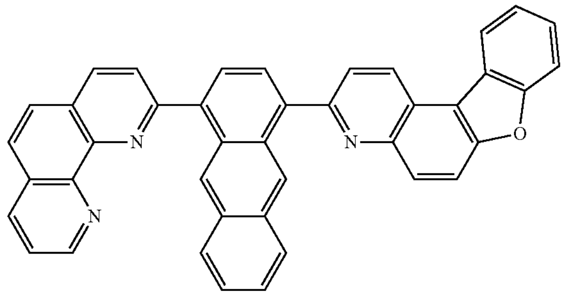
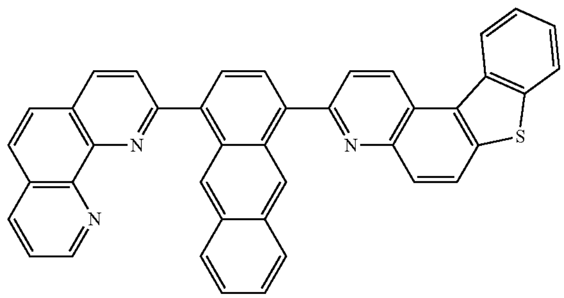
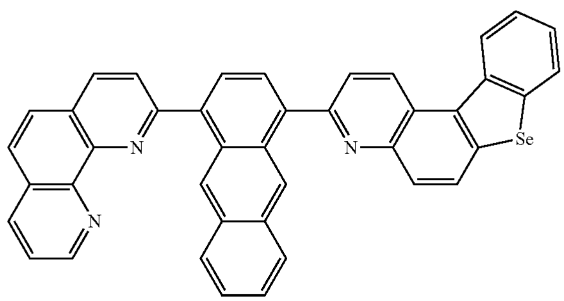
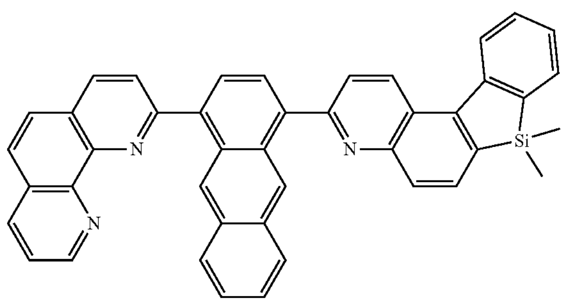
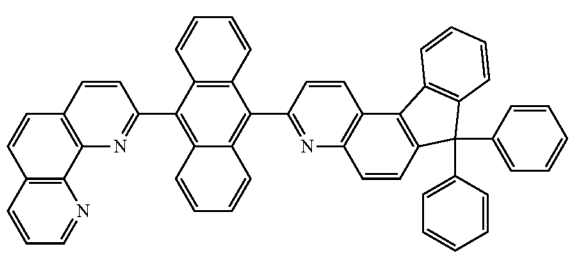
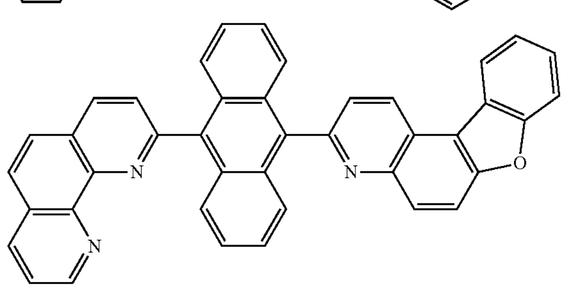
-continued
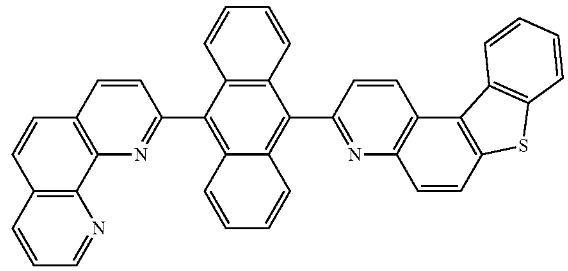
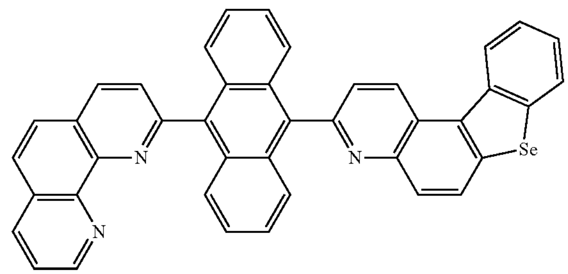
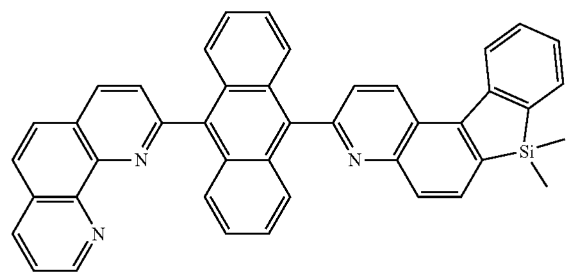
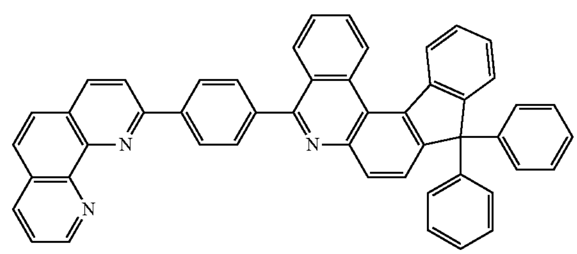
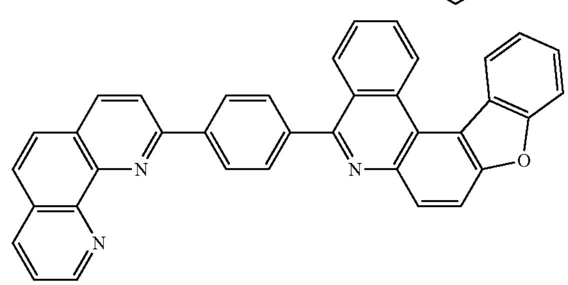
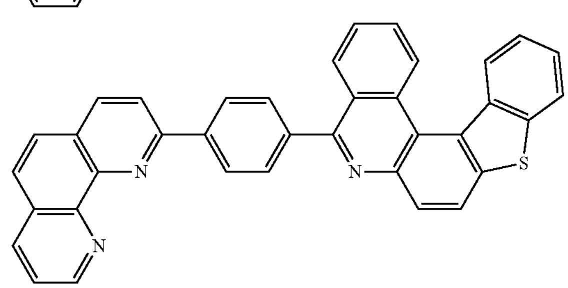

-continued
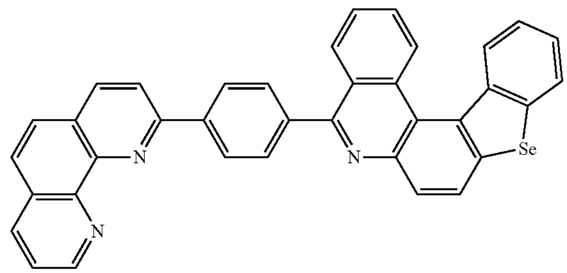
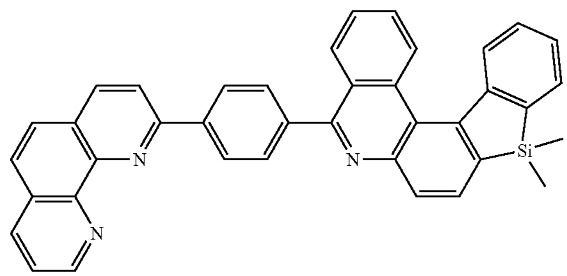
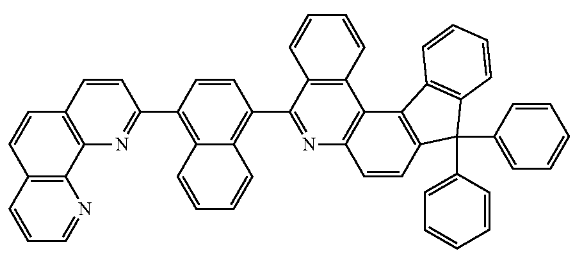
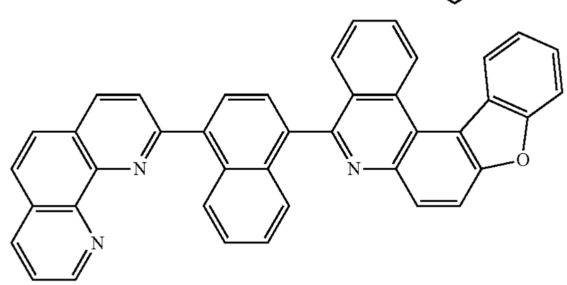
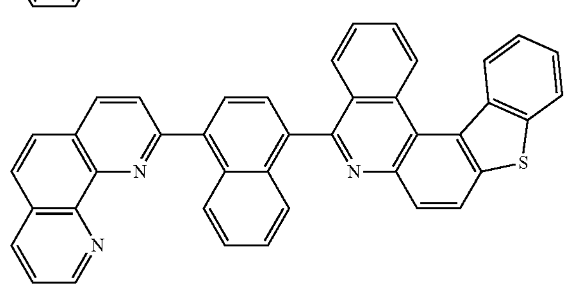
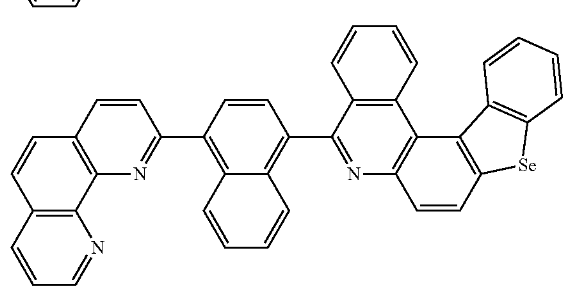
-continued
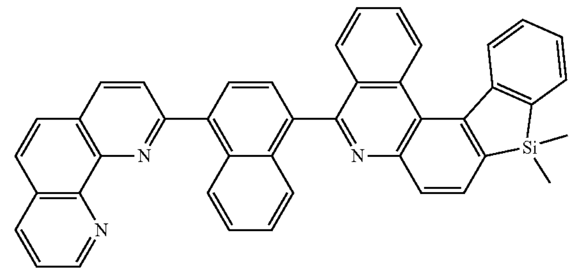
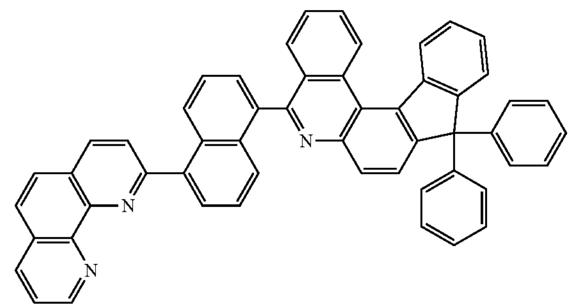
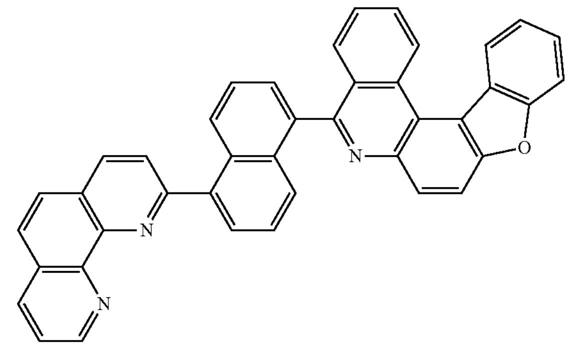
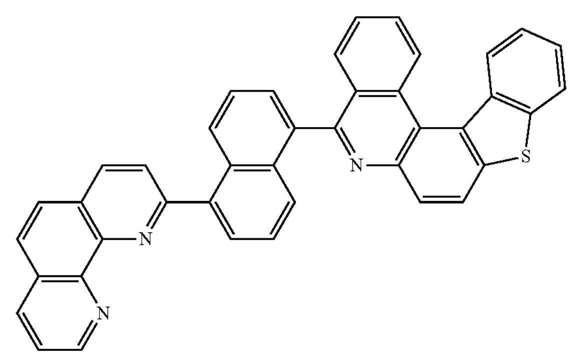
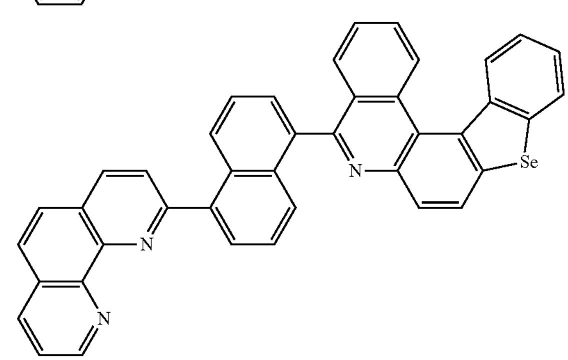

-continued
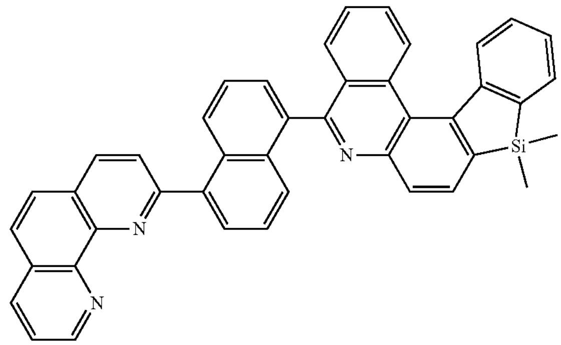
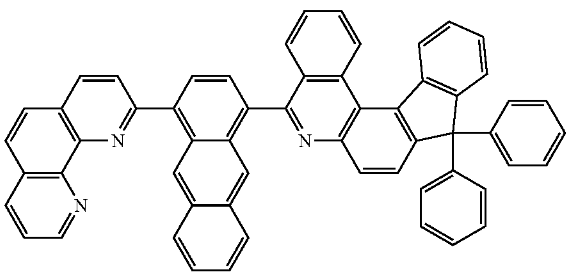
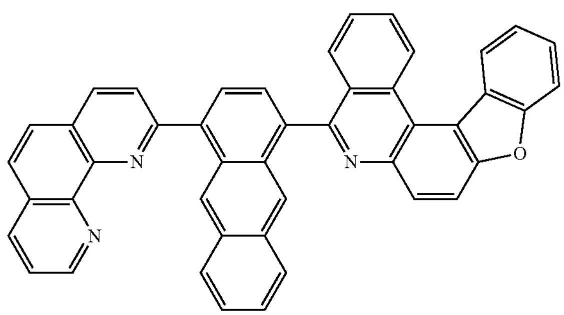
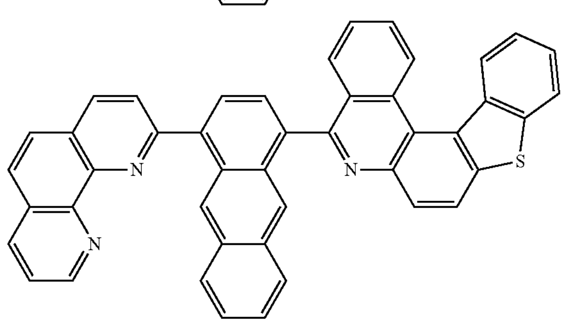
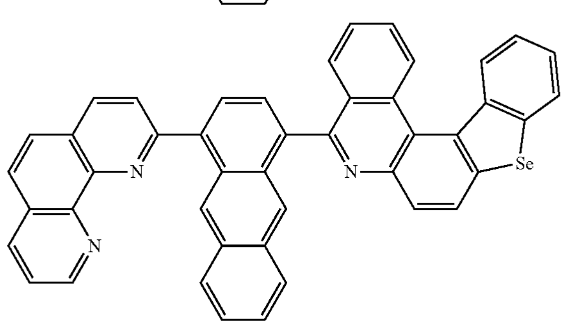
-continued
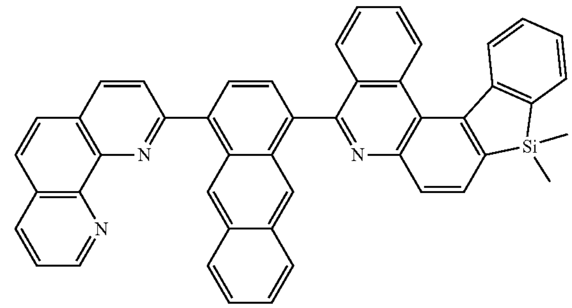
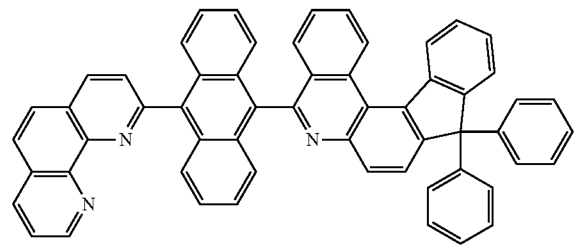
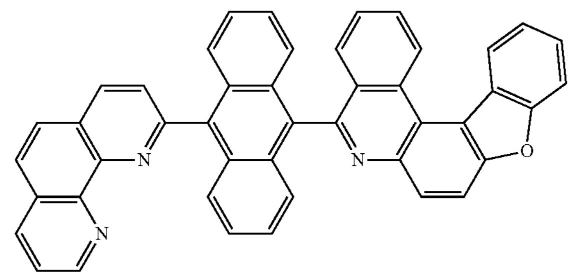
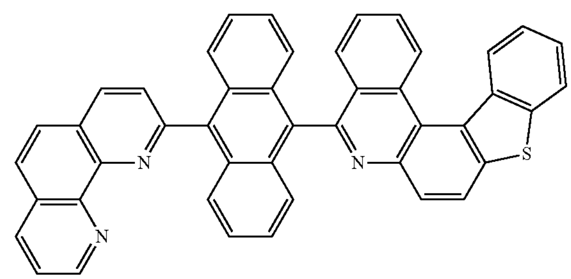
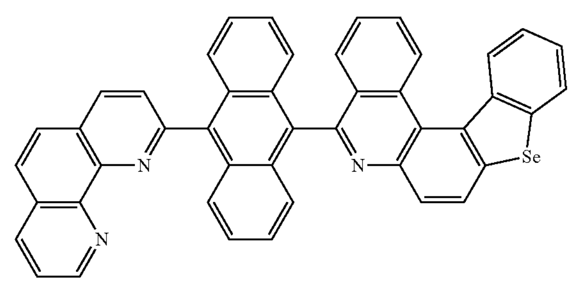
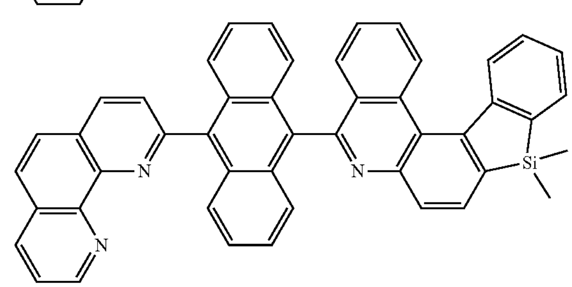

-continued
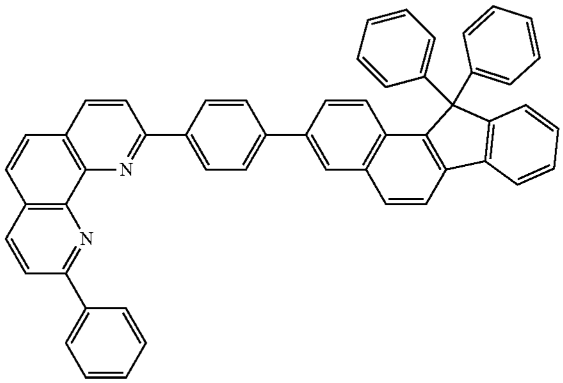
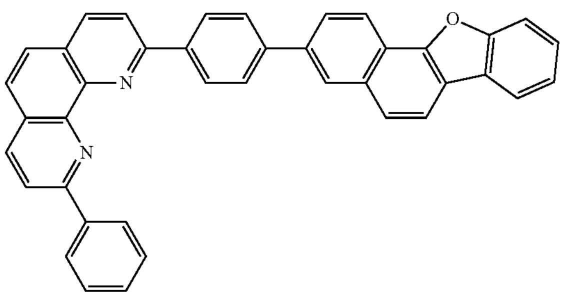
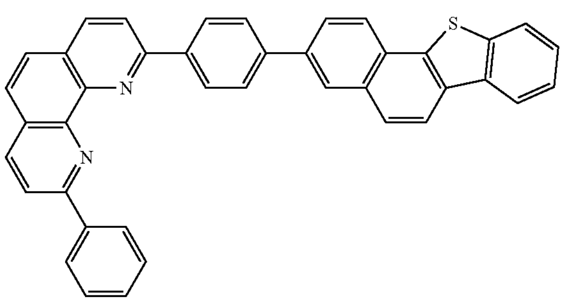
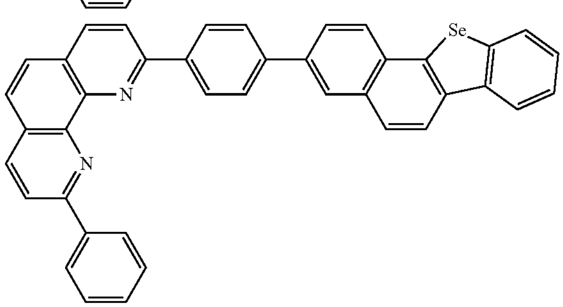
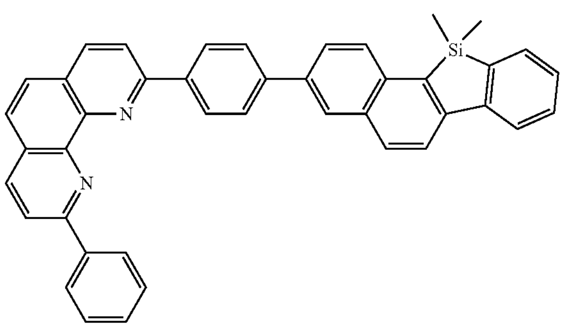
-continued
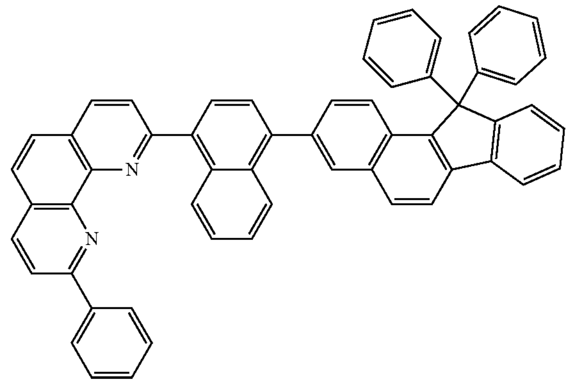
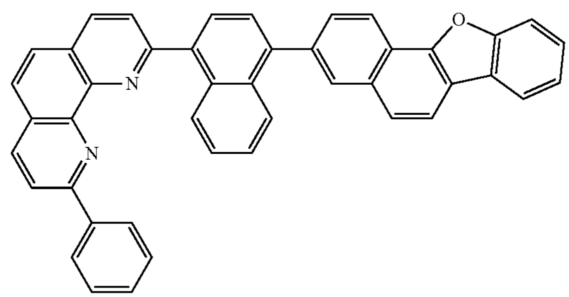
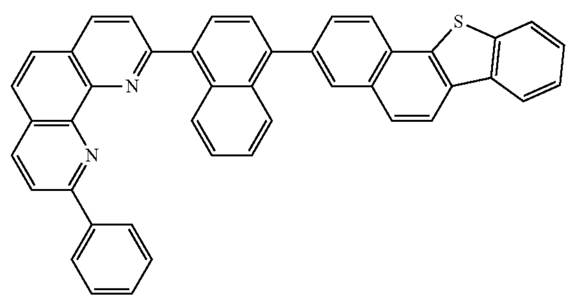
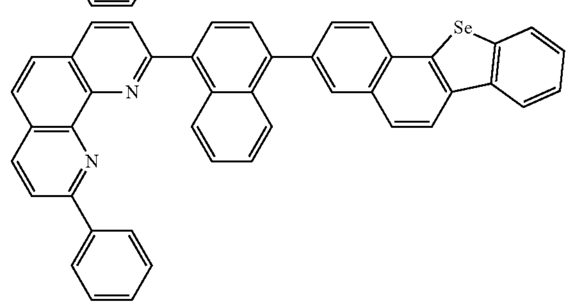
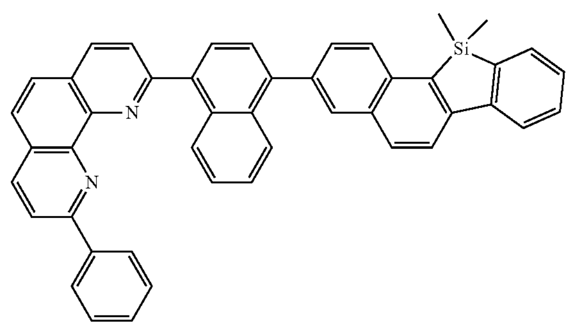

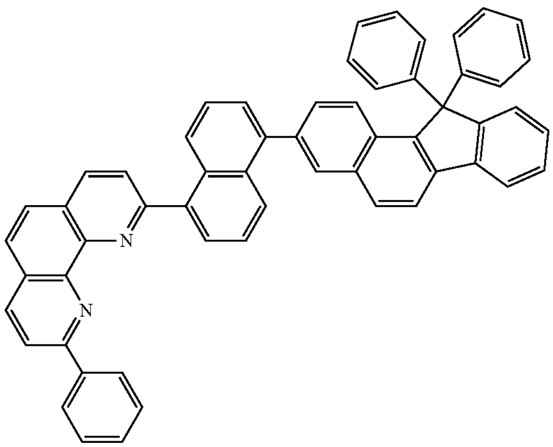
N
N
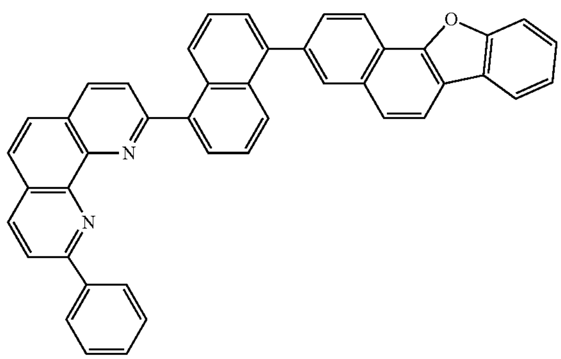
O
N
N
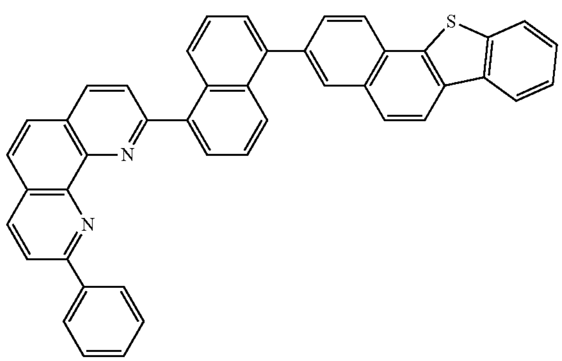
S
N
N
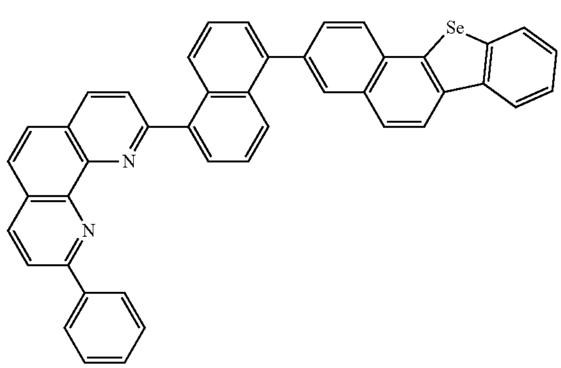
Se
N
N
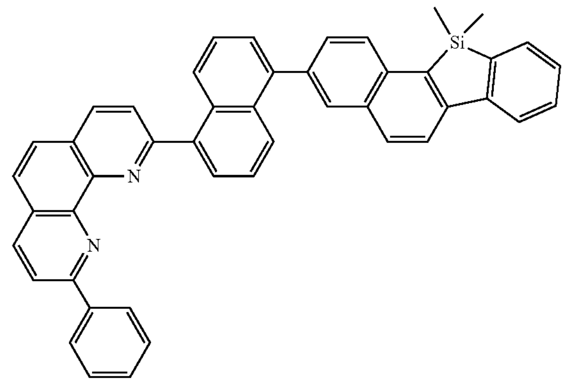
Si
N
N
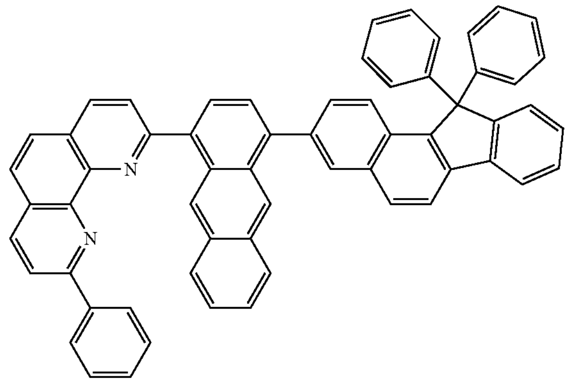
N
N
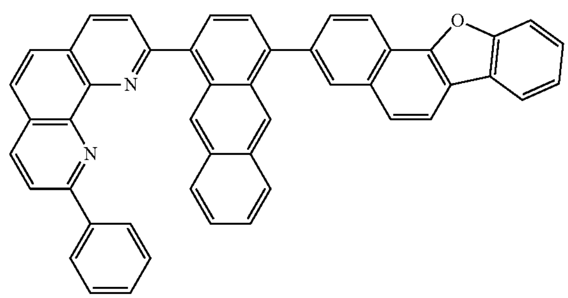
O
N
N
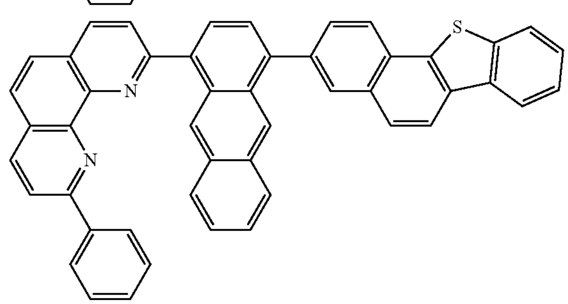
S
N
N
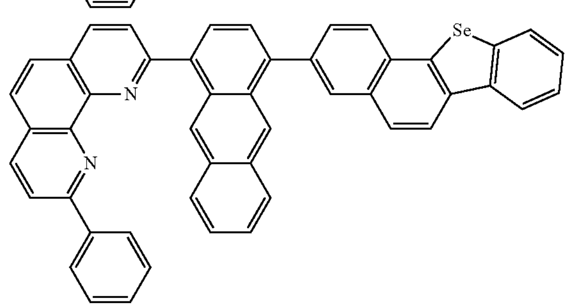
Se
N
N -continued
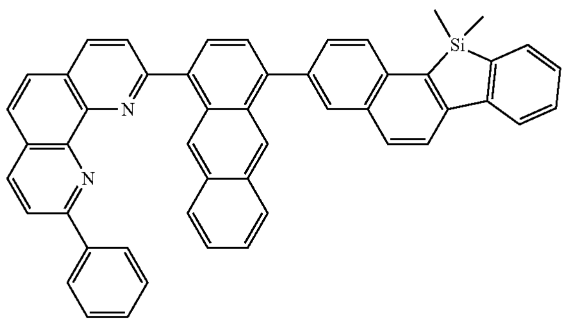
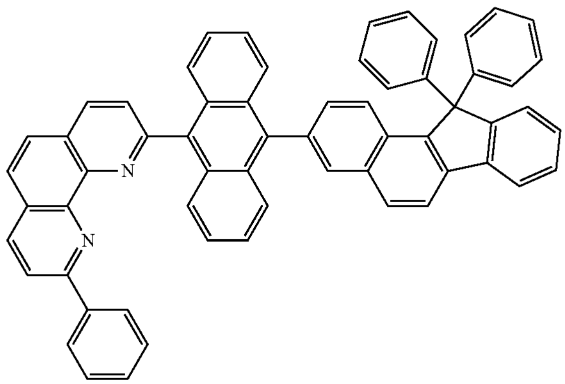
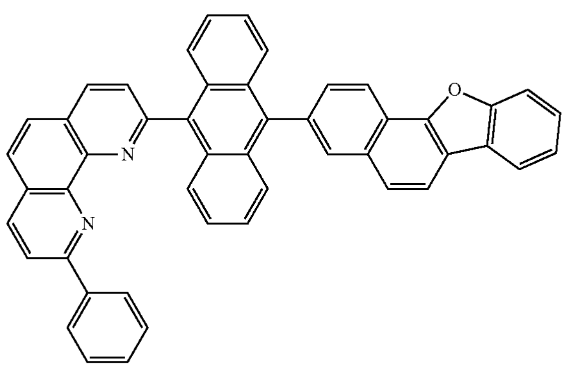
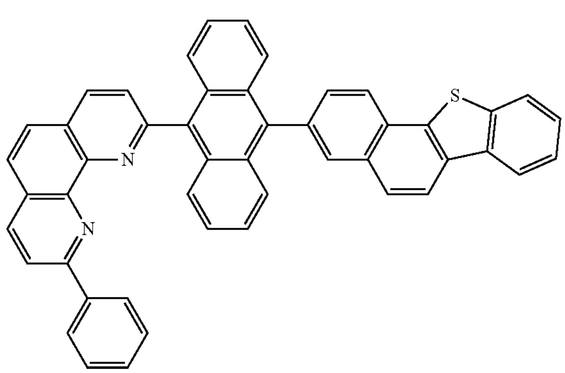
-continued
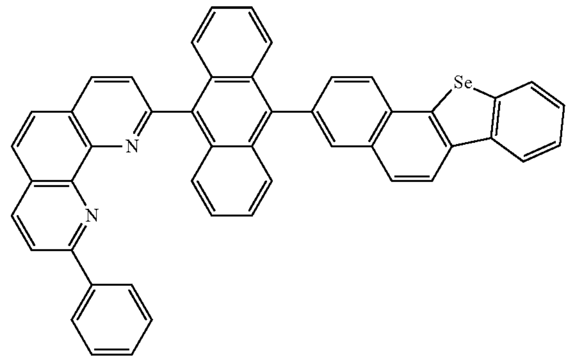
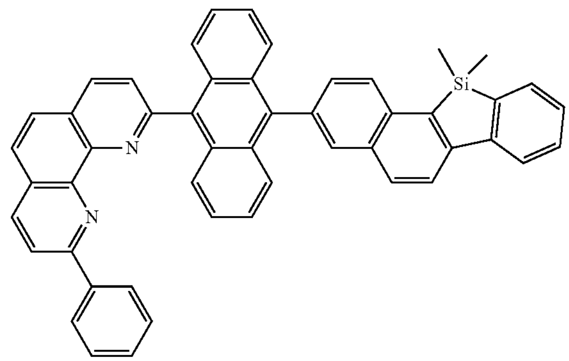
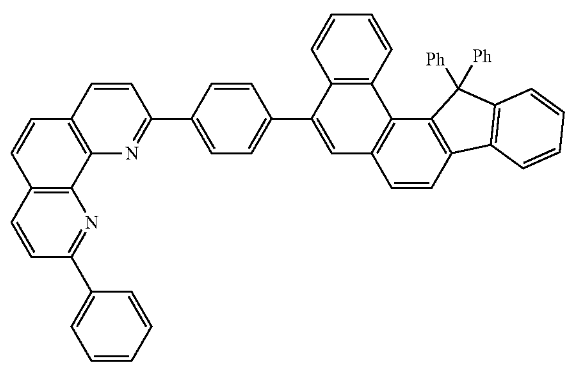
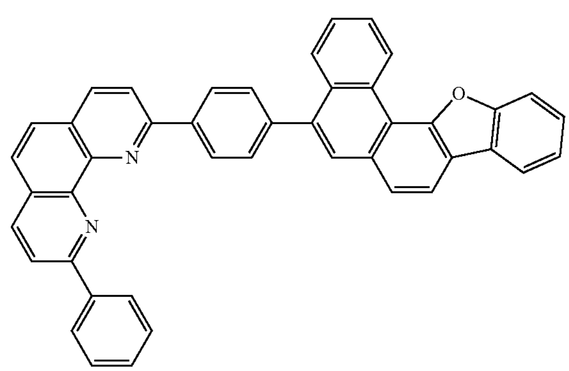

-continued
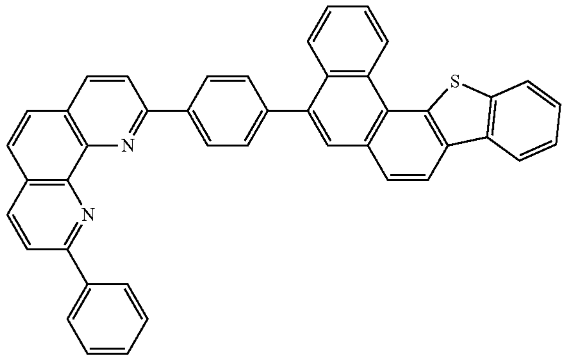
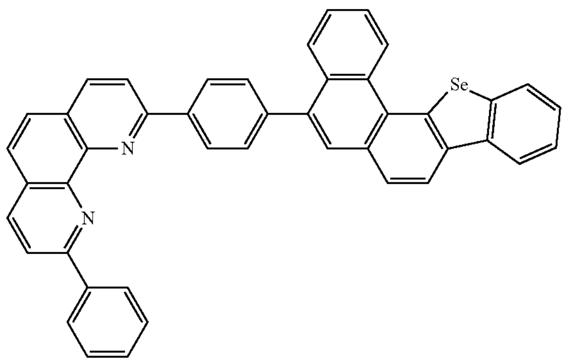
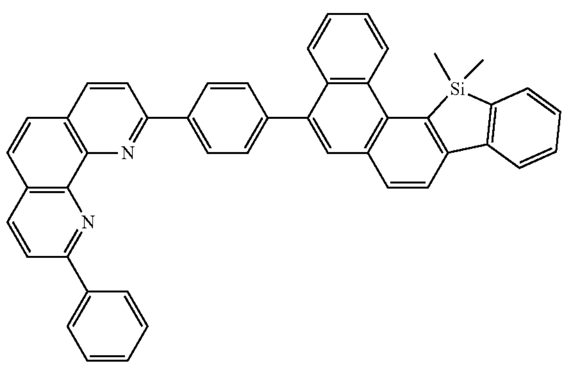
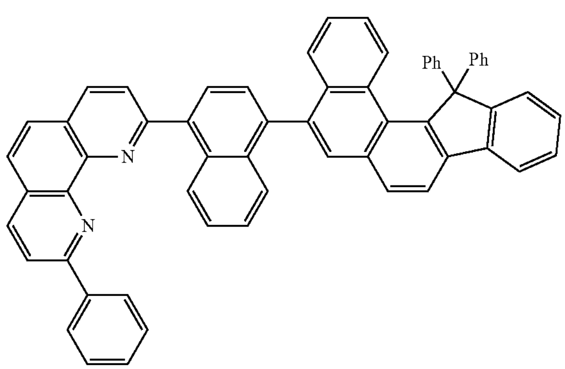
-continued
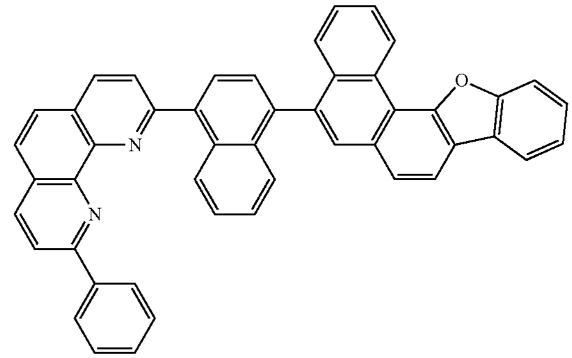
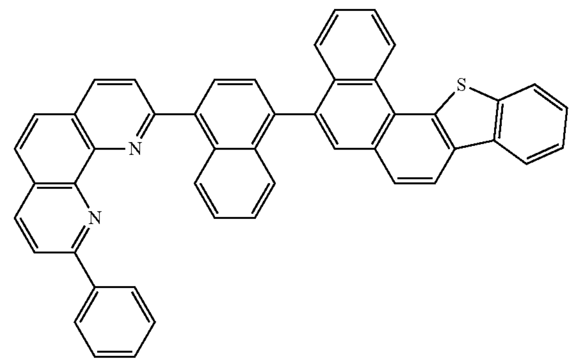
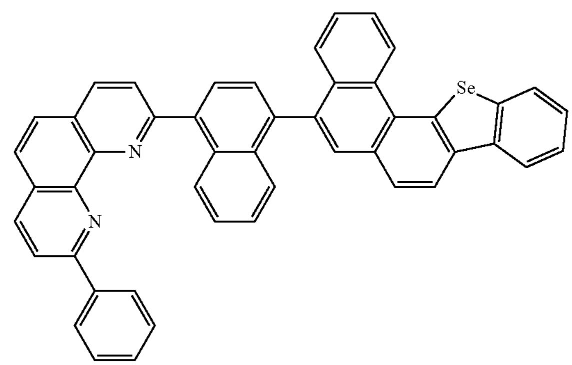
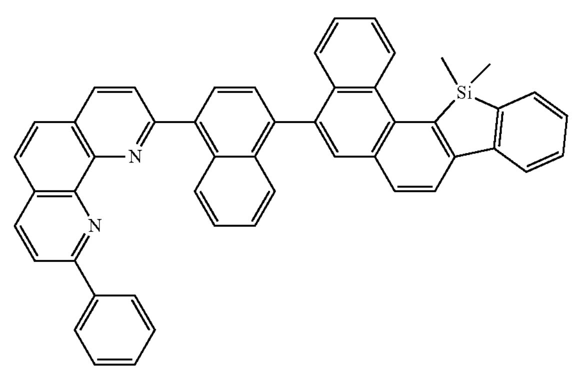

-continued
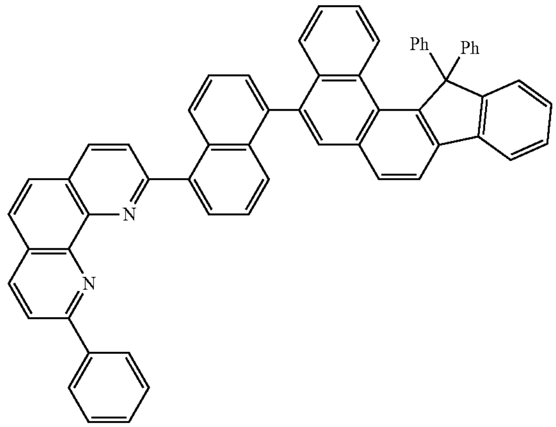
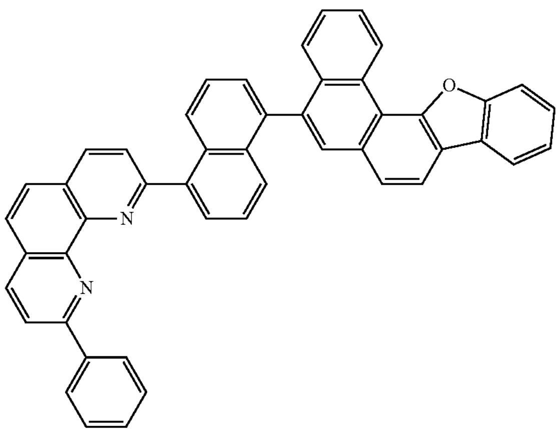
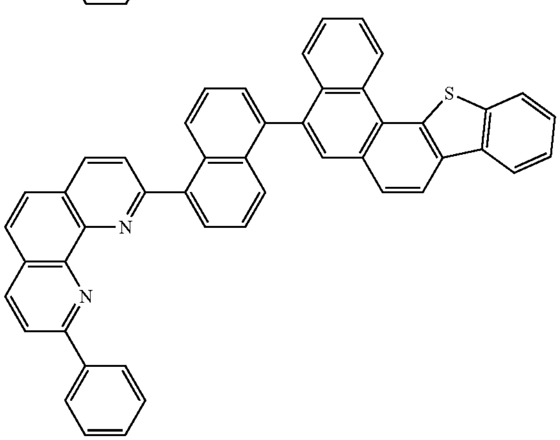
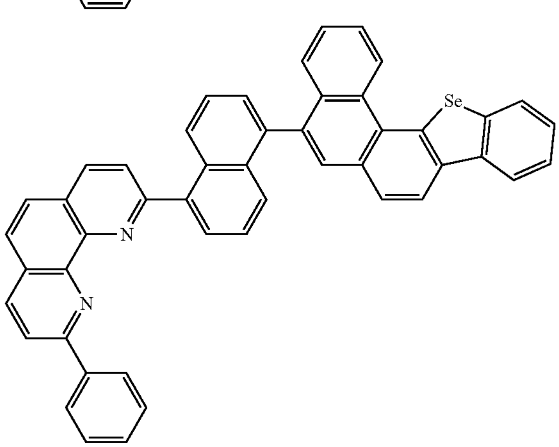
-continued
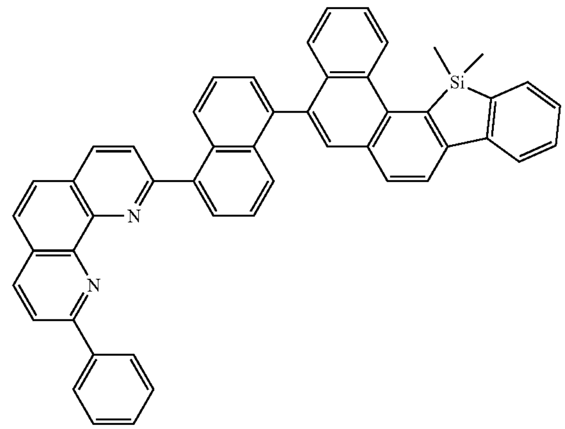
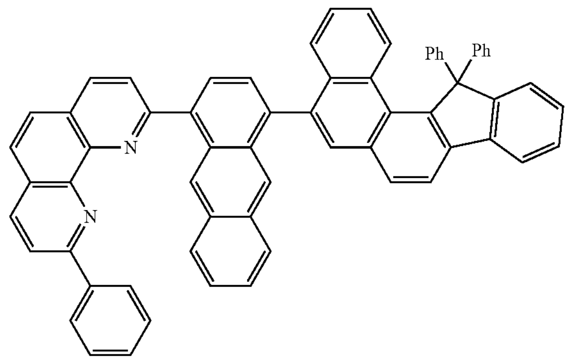
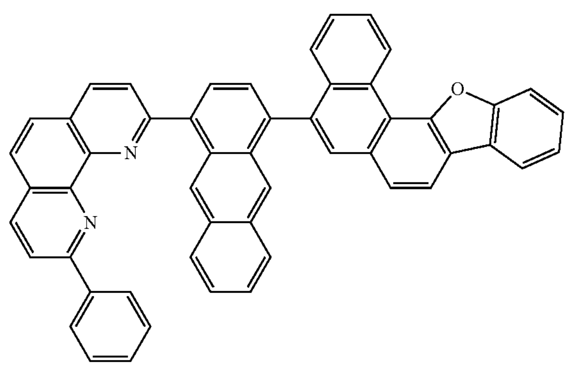
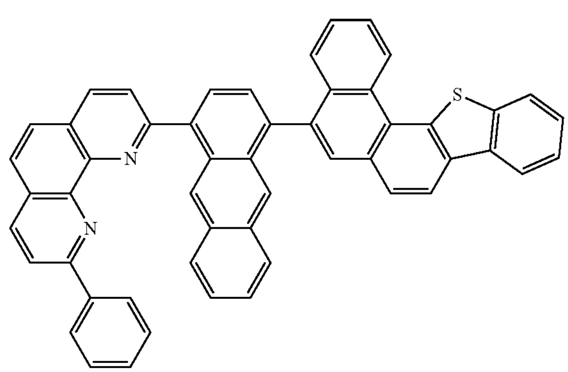

-continued
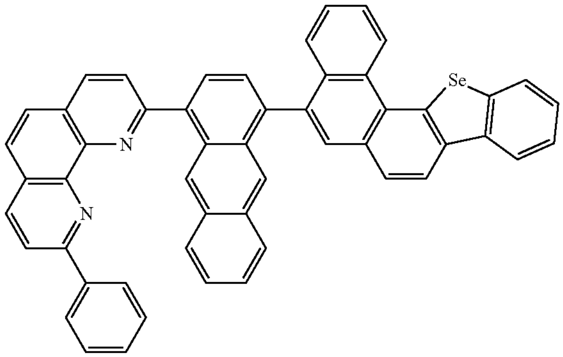
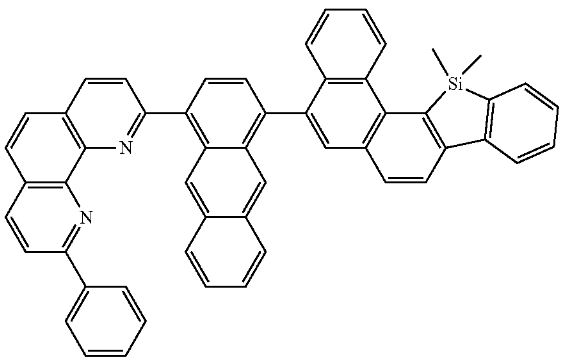
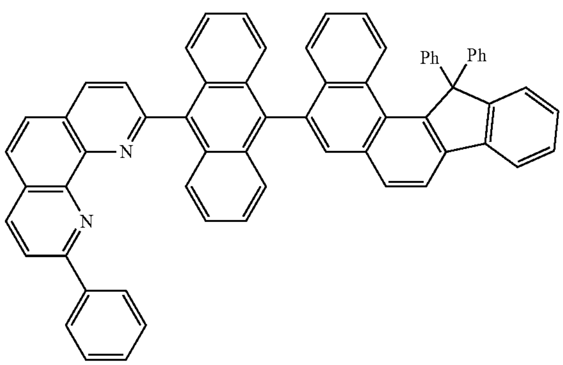
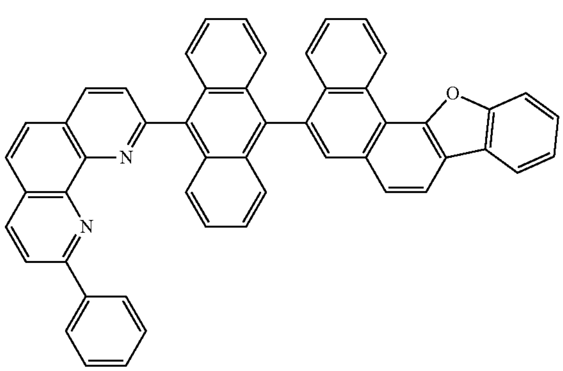
-continued
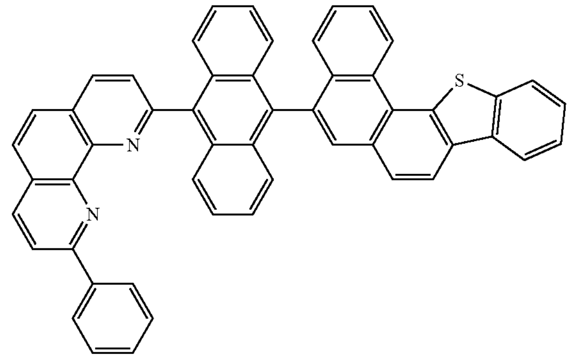
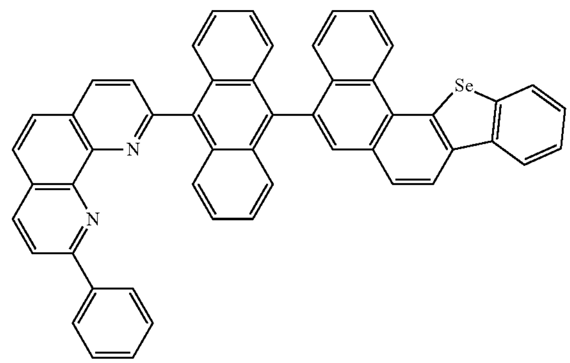
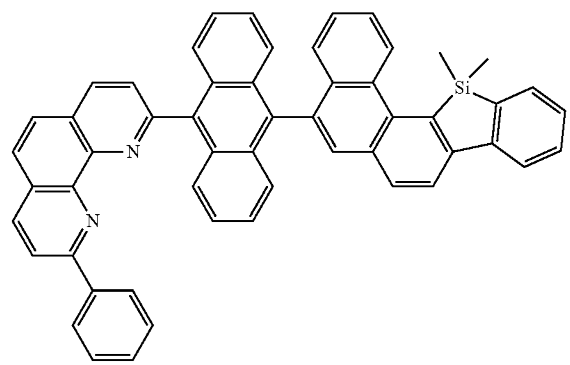
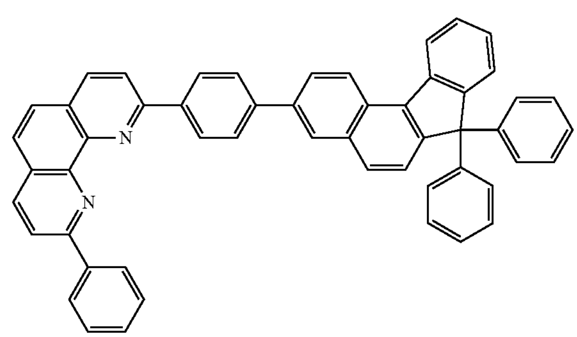

-continued
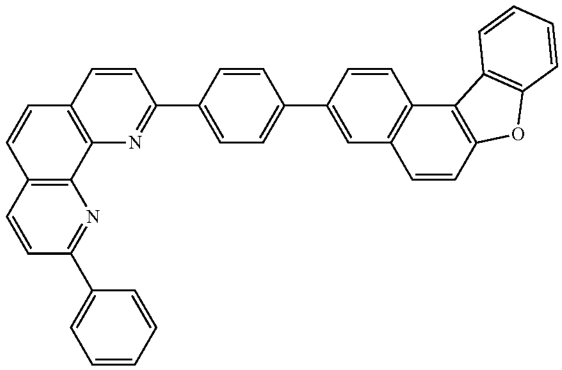
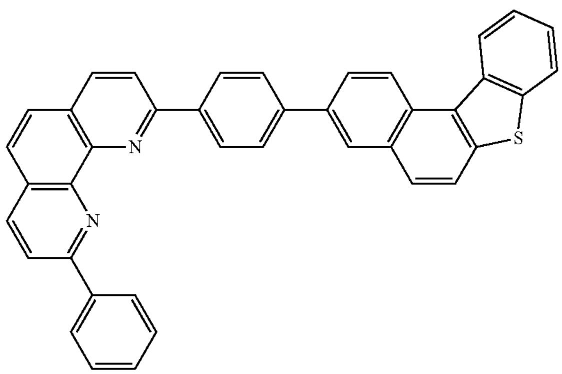
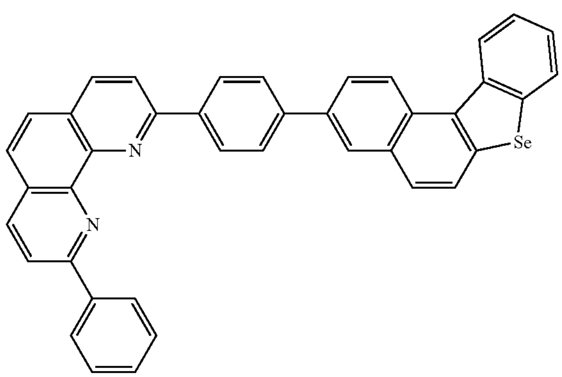
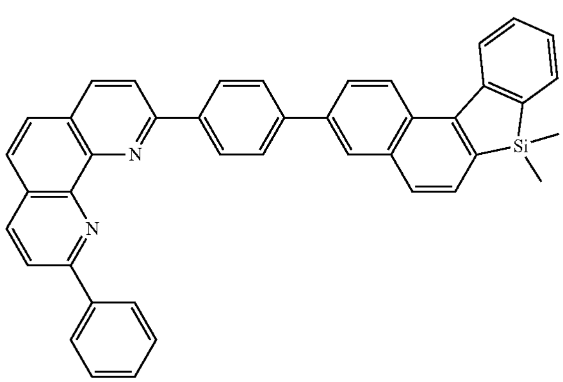
-continued
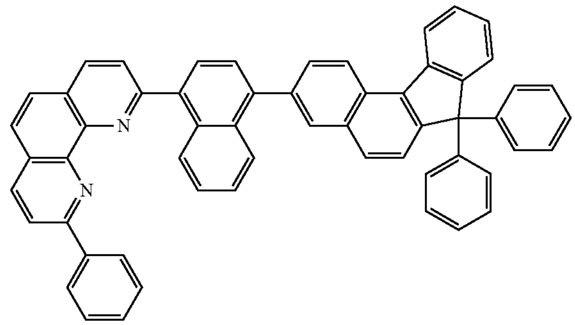
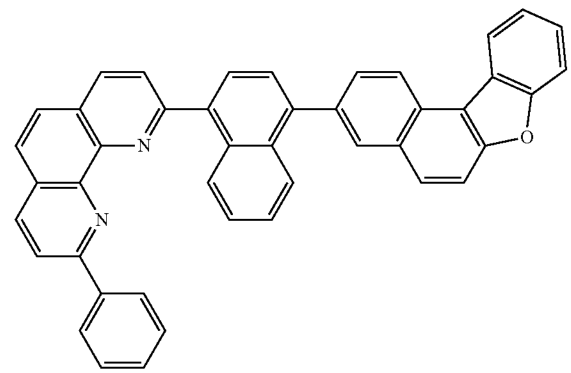
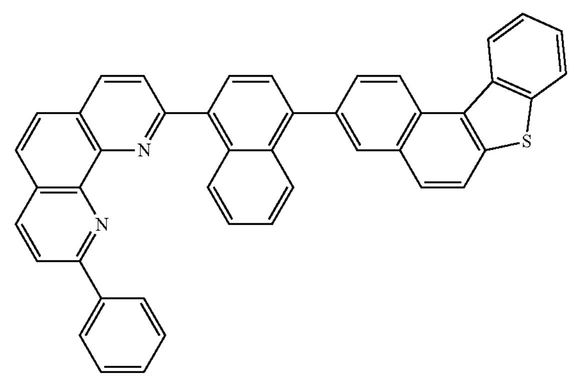
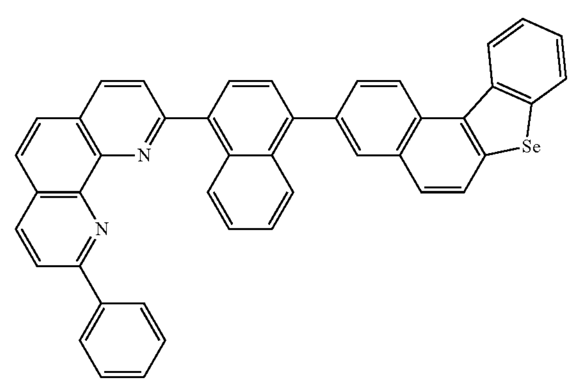

-continued
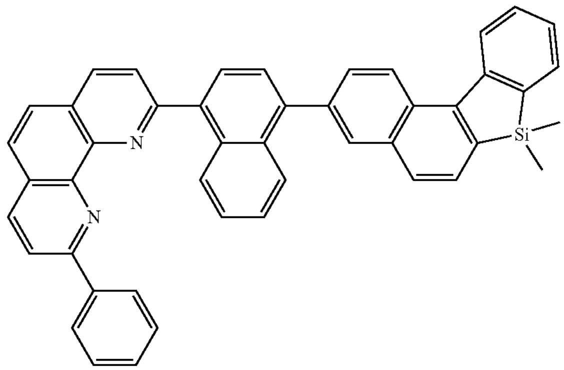
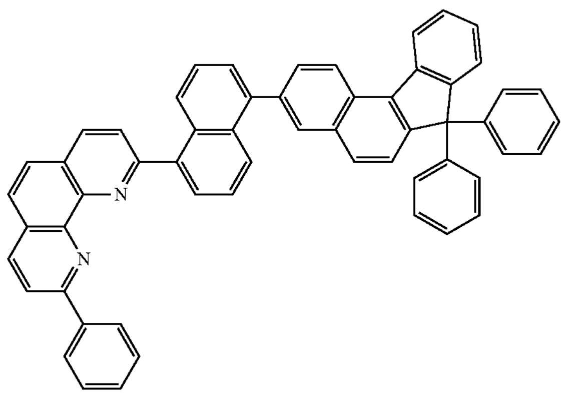
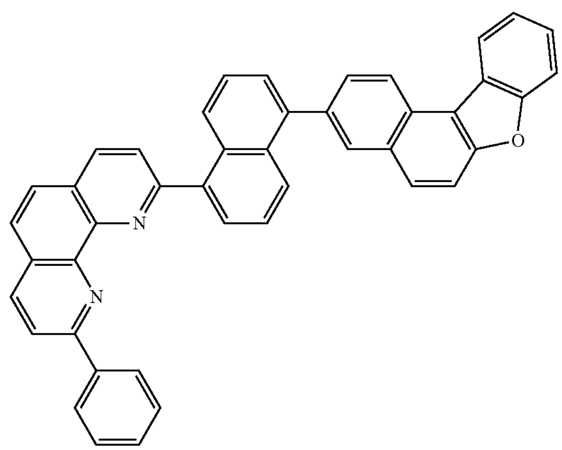
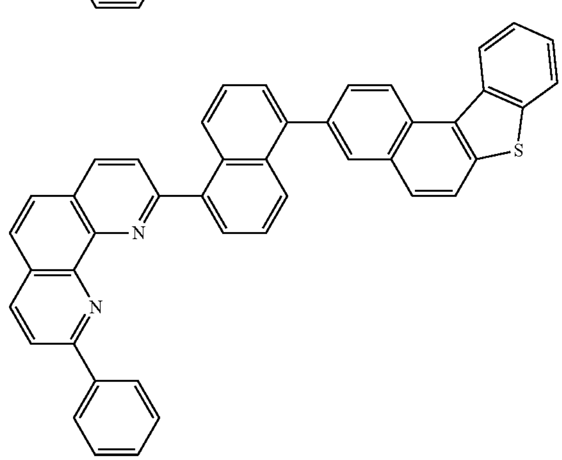
-continued
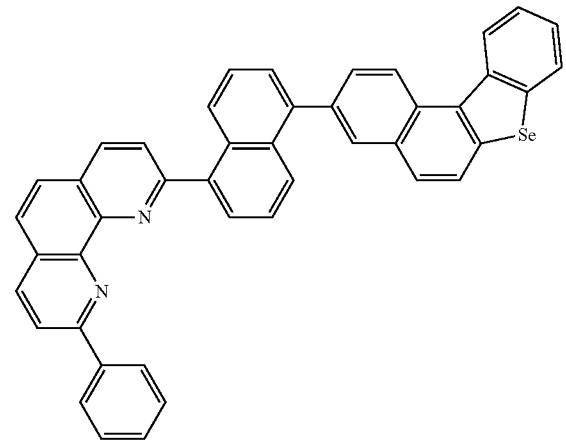
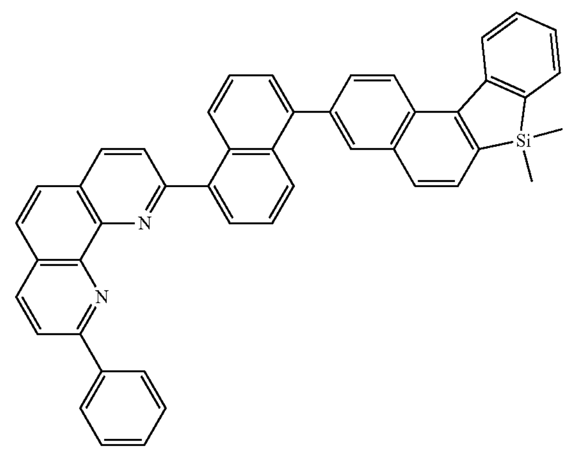
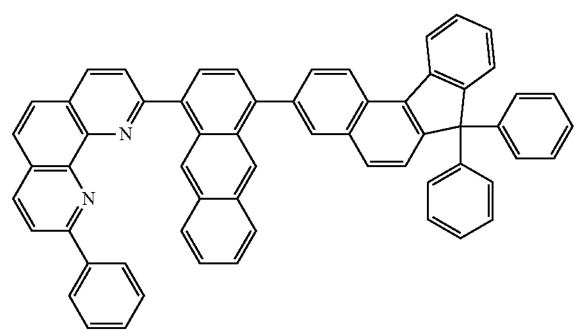
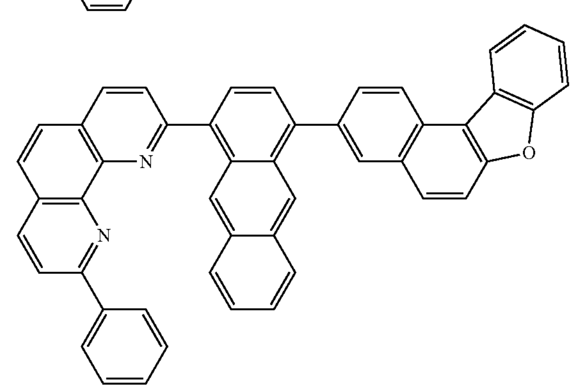

-continued
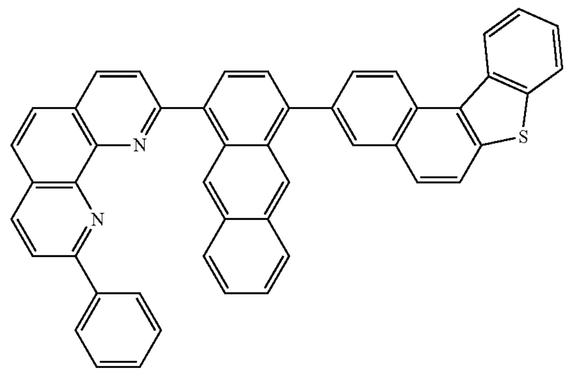
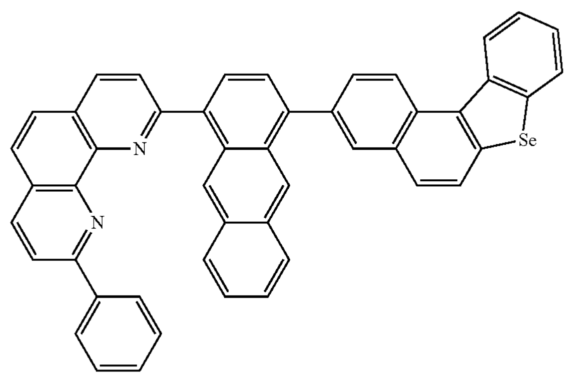
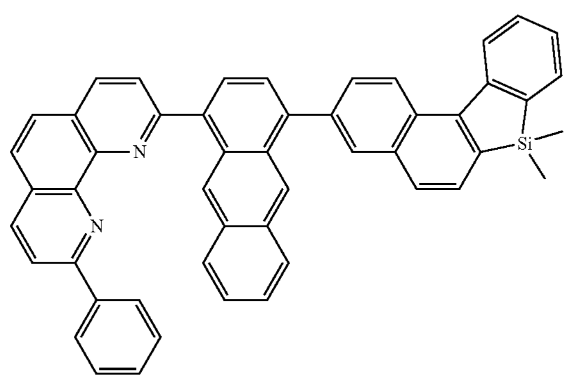
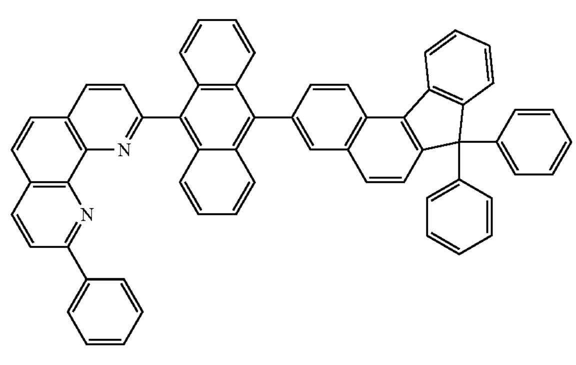
-continued
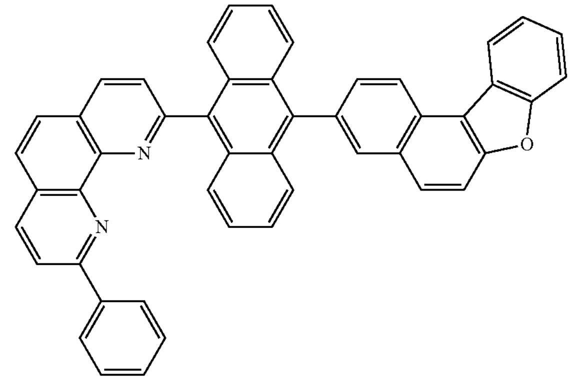
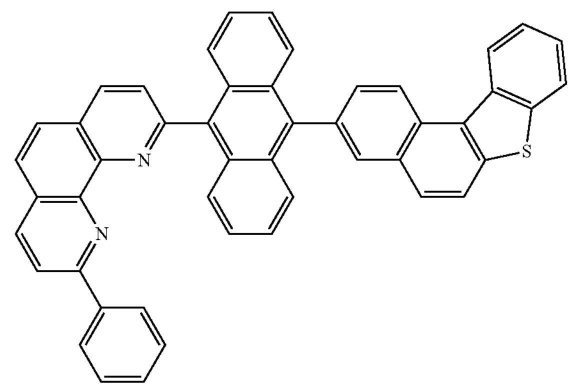
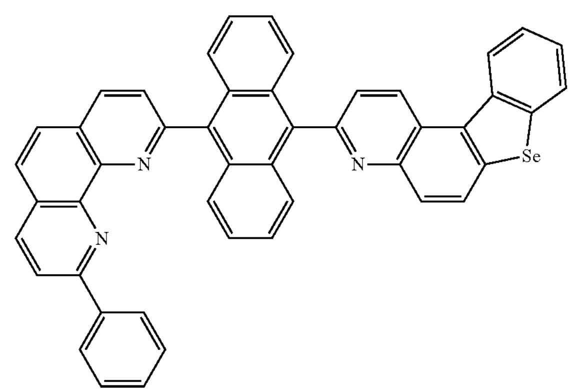
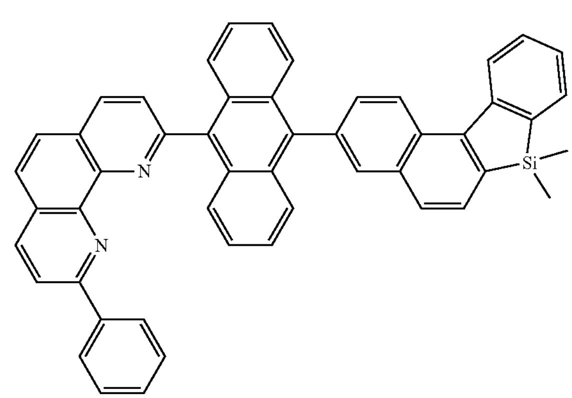

-continued
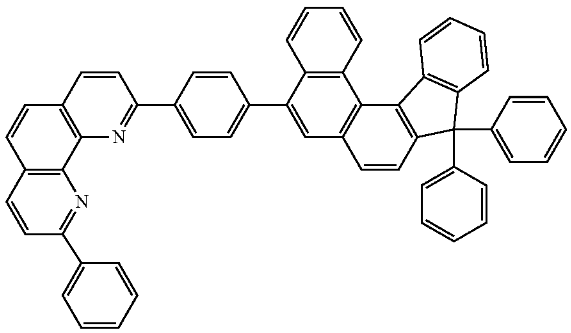
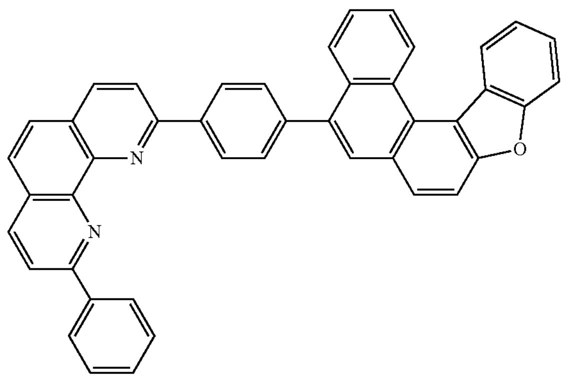
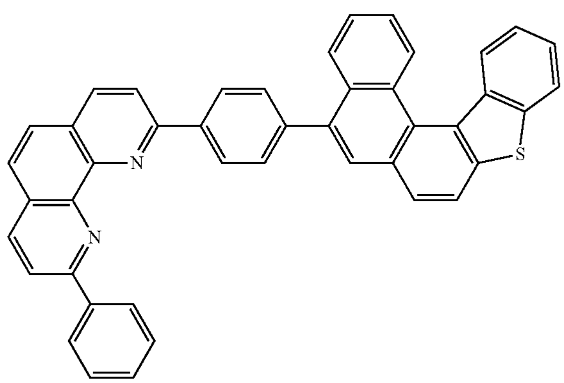
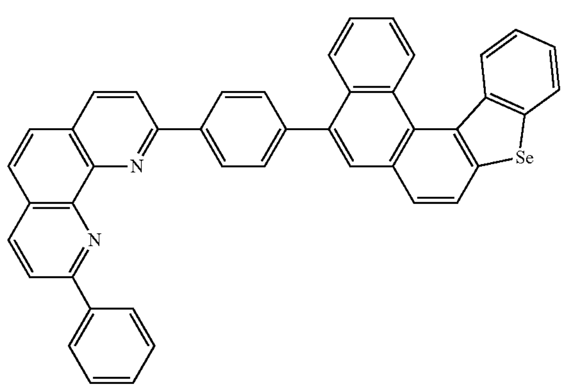
-continued
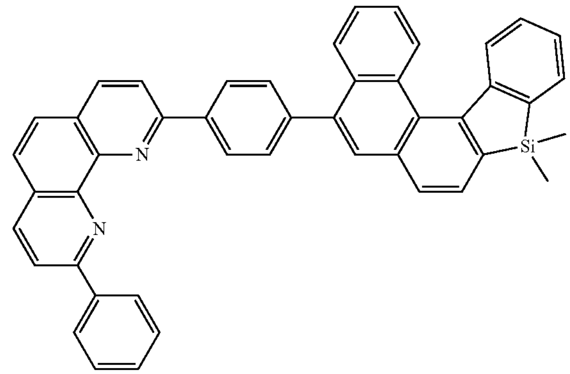
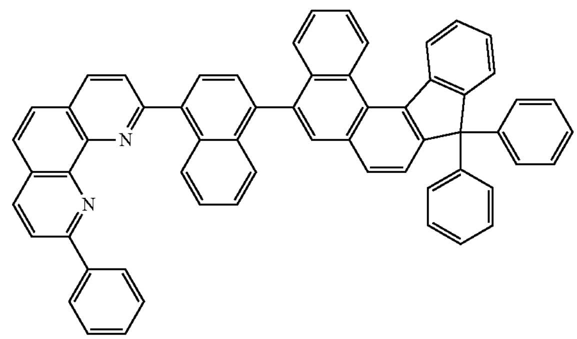
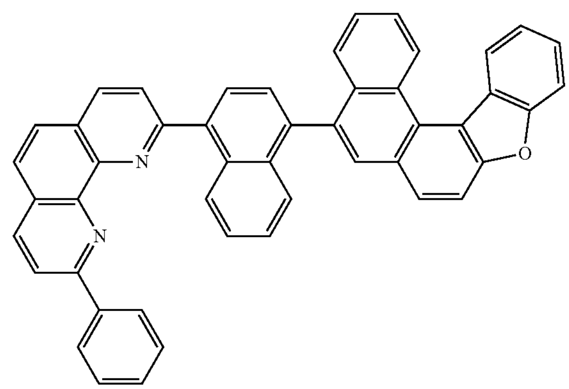
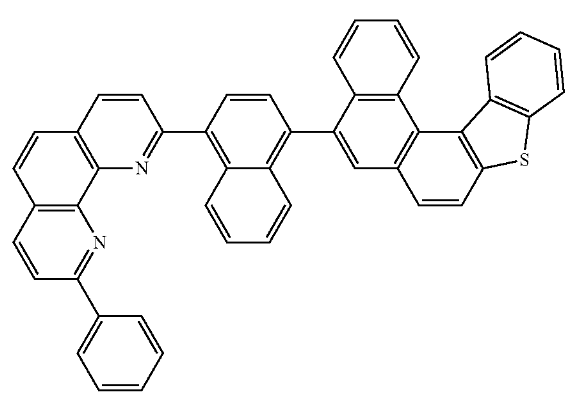

-continued
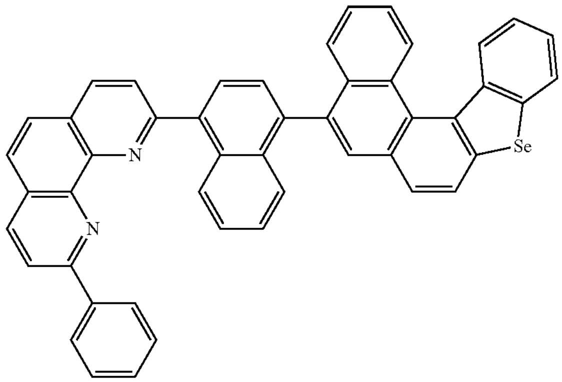
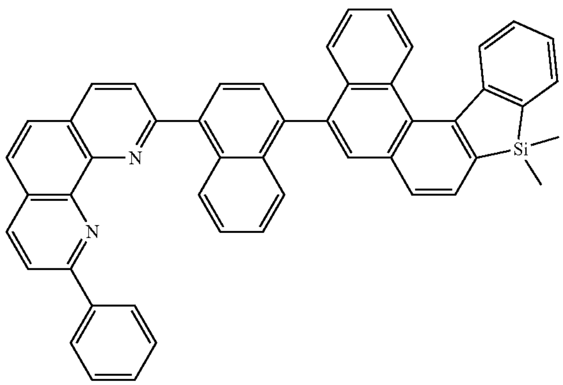
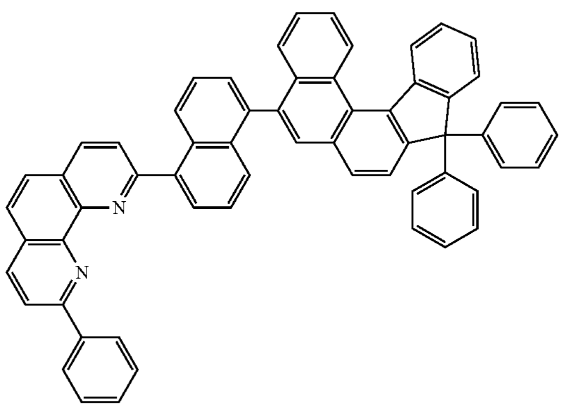
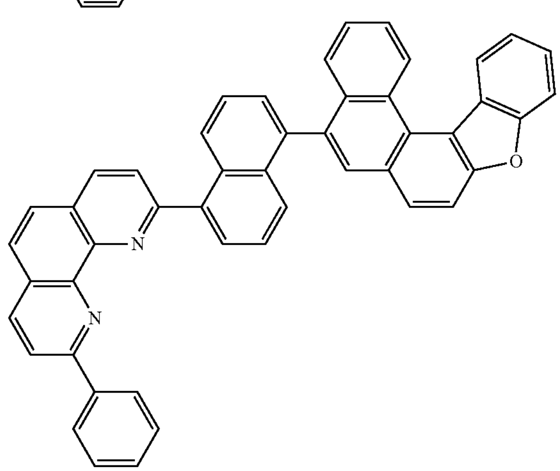
-continued
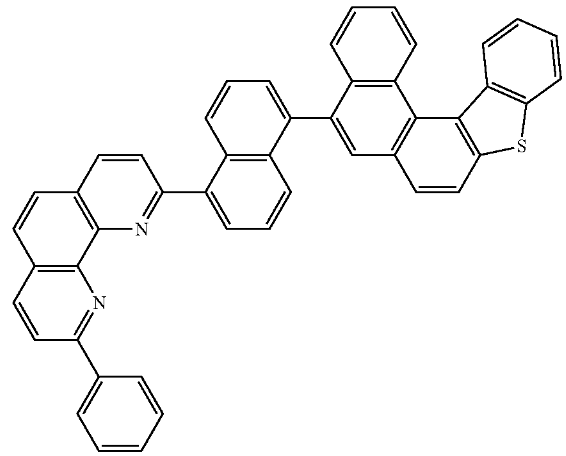
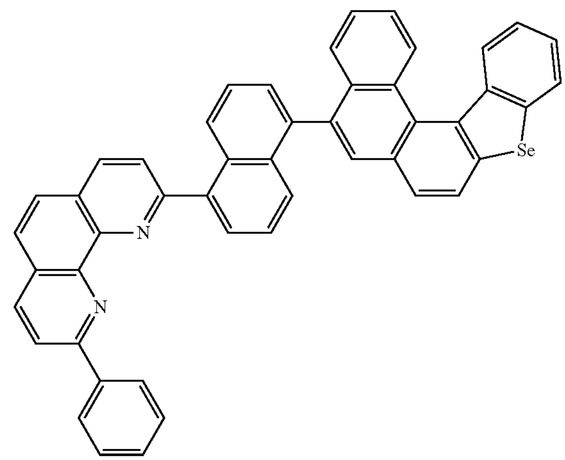
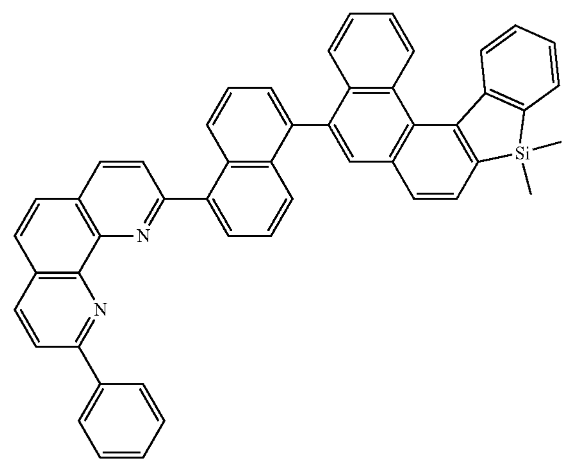
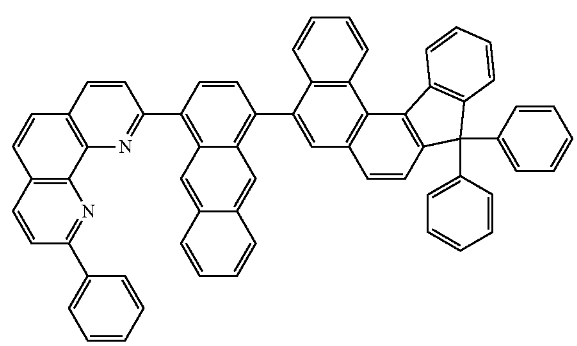

-continued
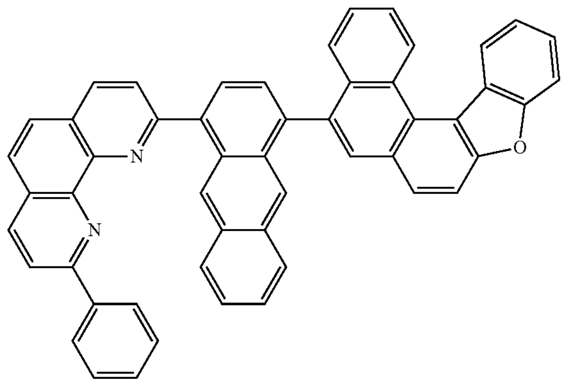
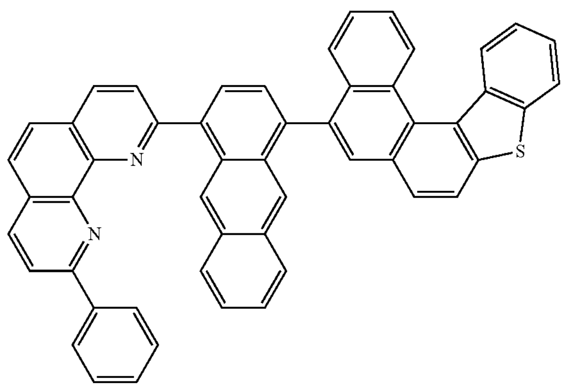
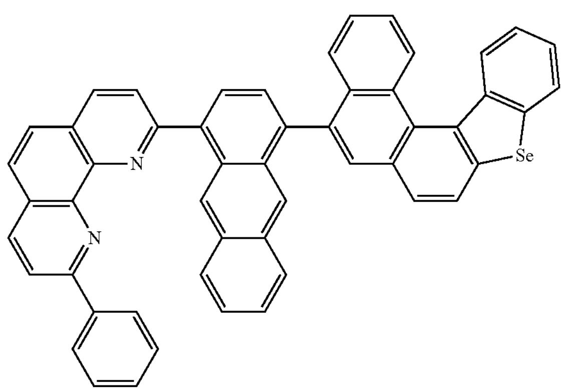
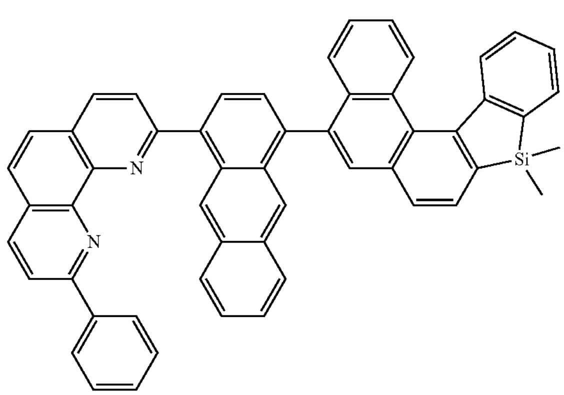
-continued
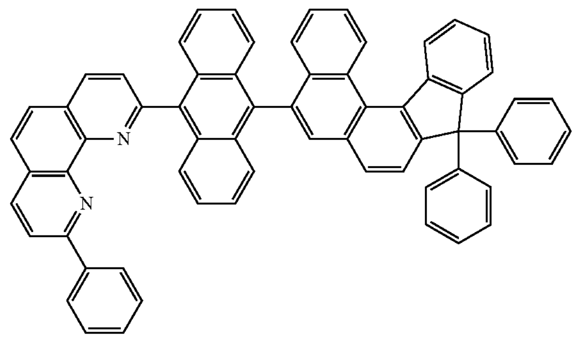
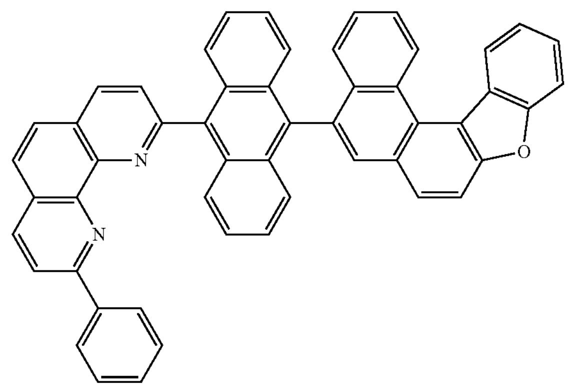
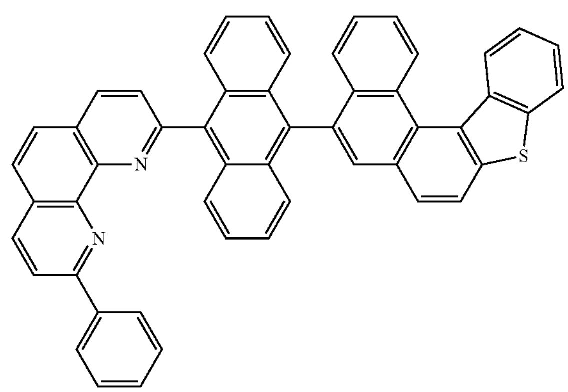
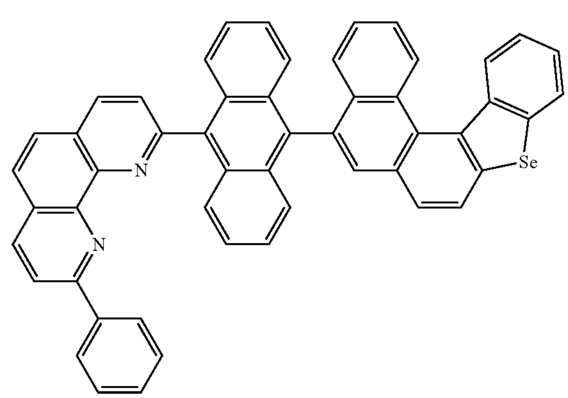

-continued
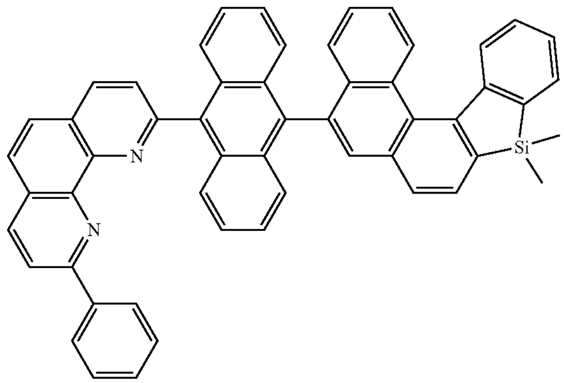
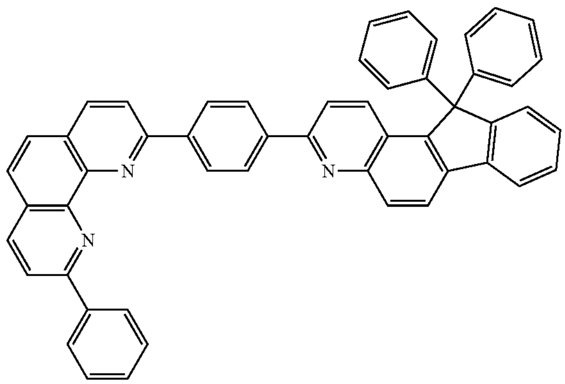
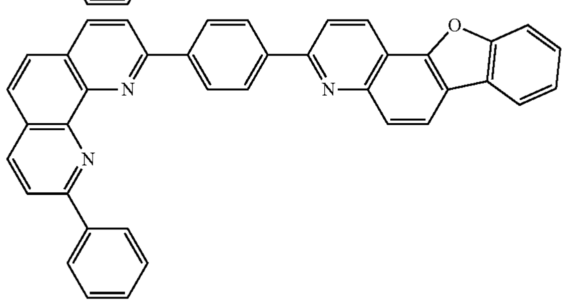
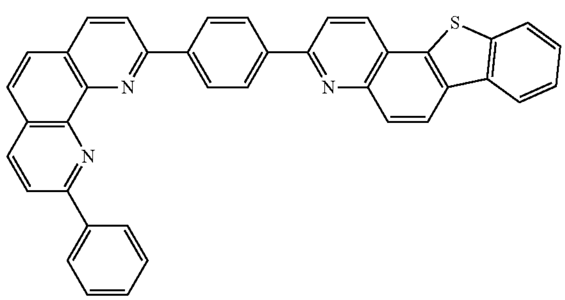
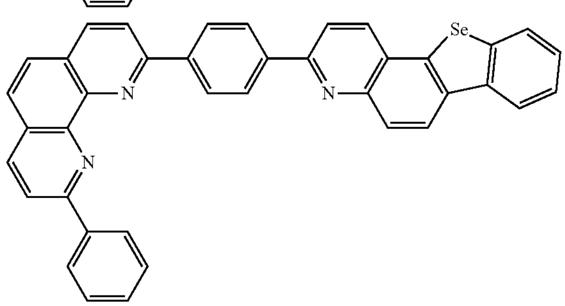
-continued
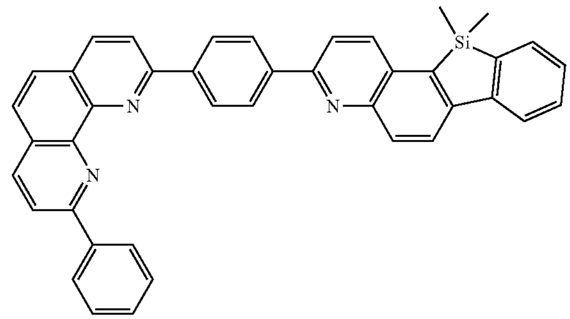
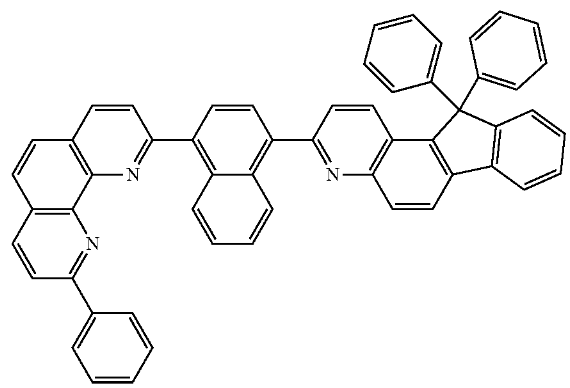
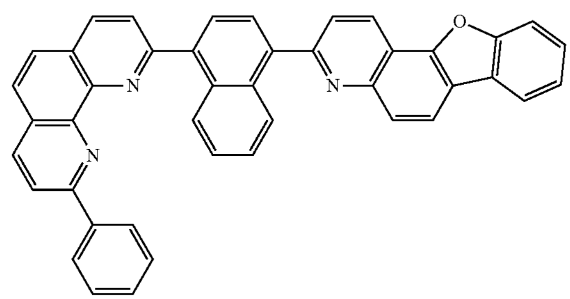
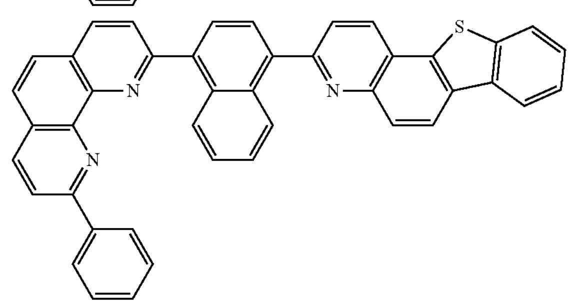
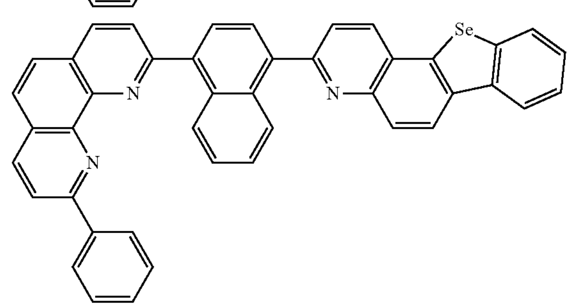

-continued
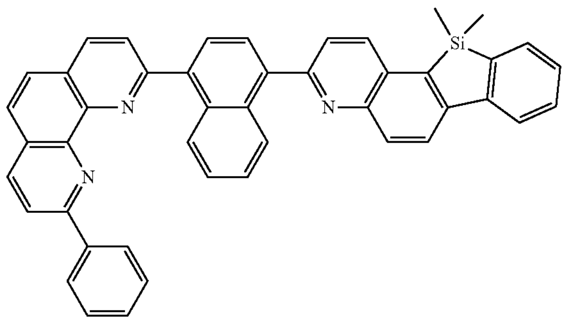
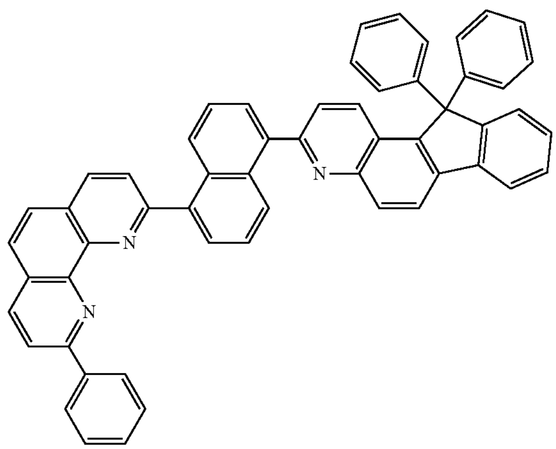
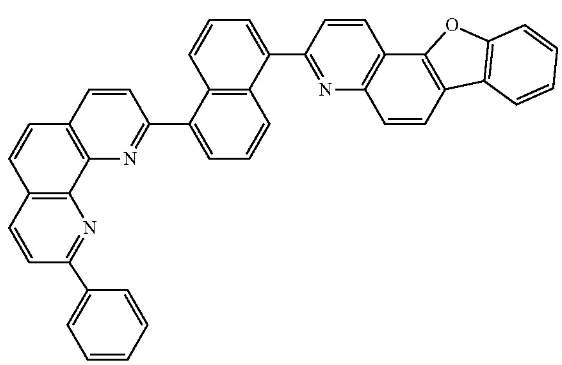
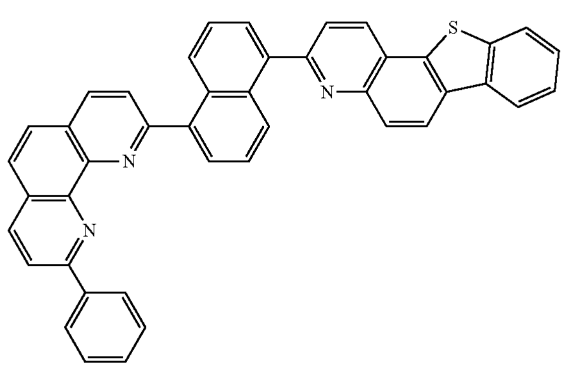
-continued
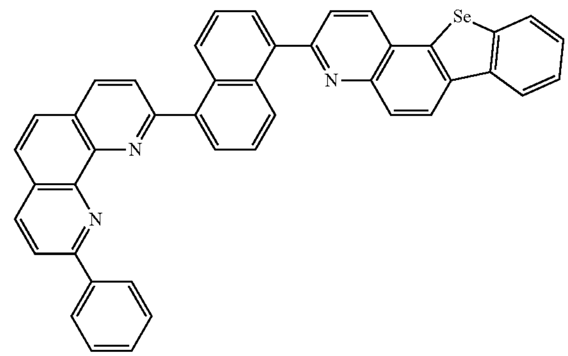
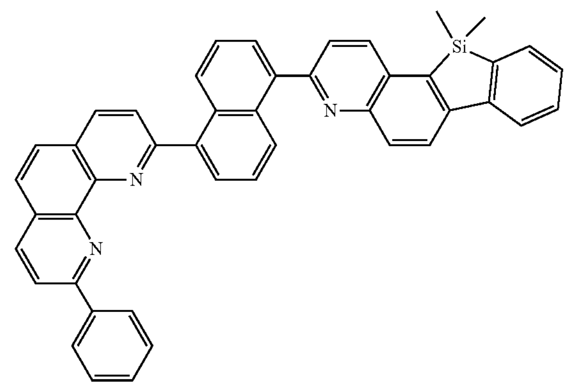
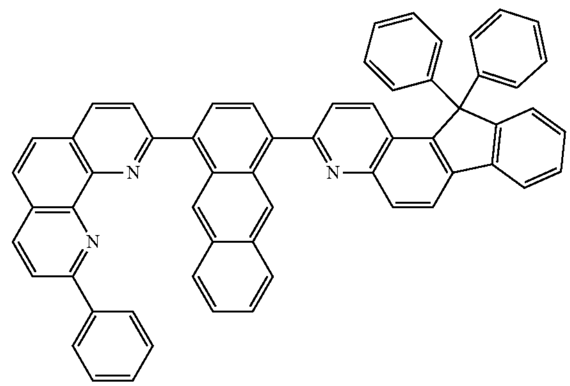
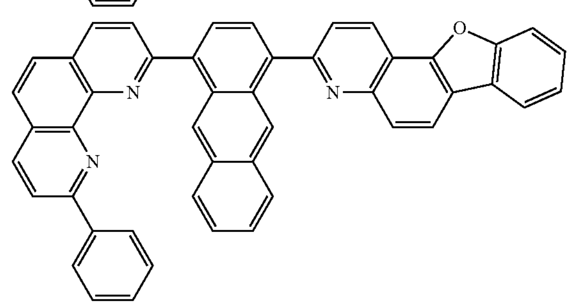
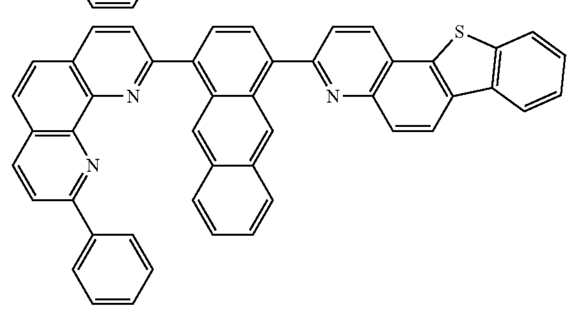

-continued
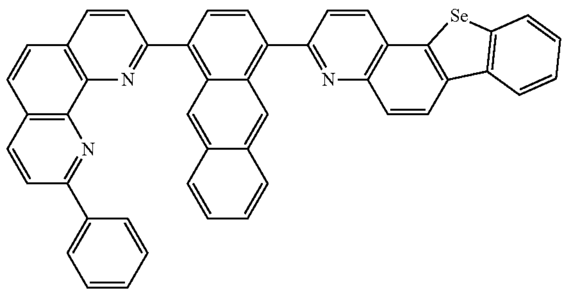
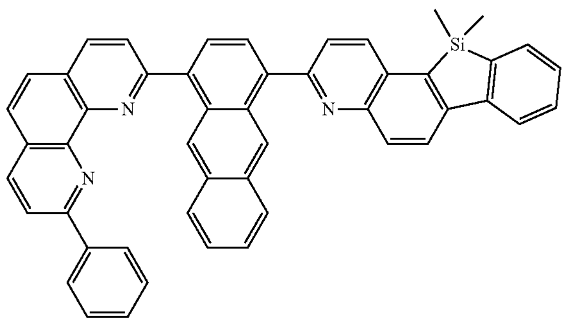
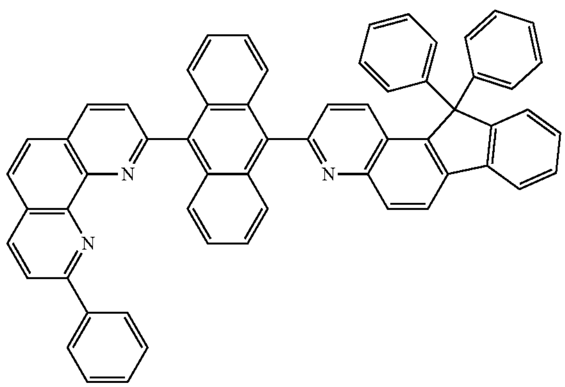
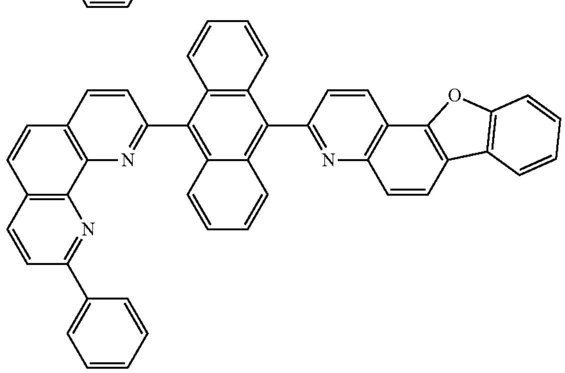
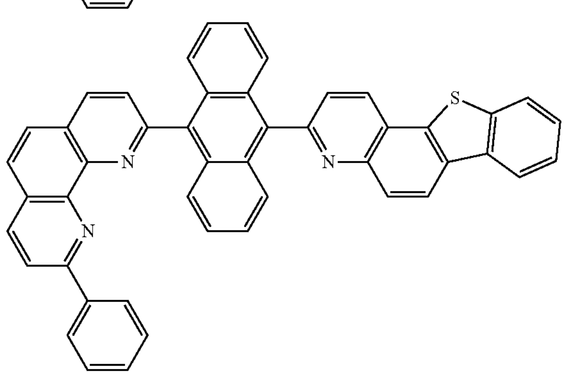
-continued
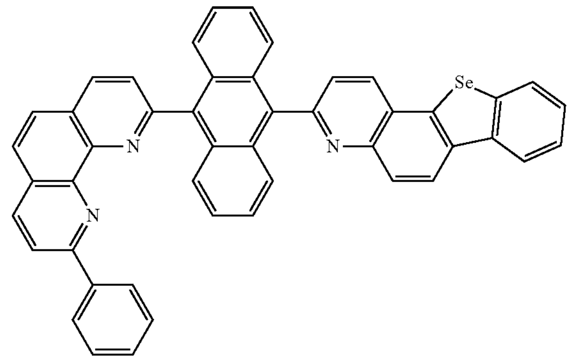
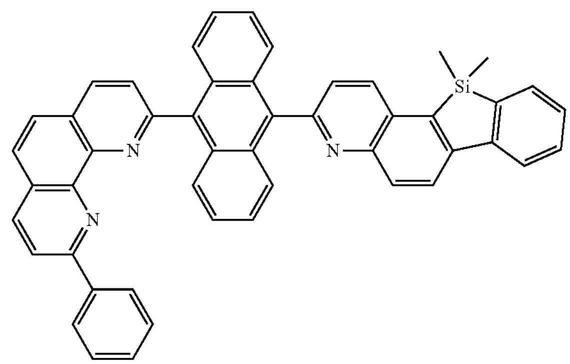
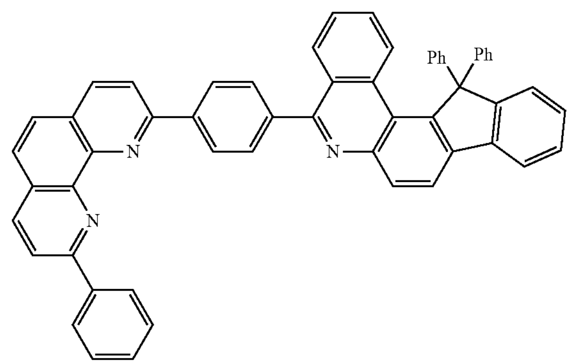
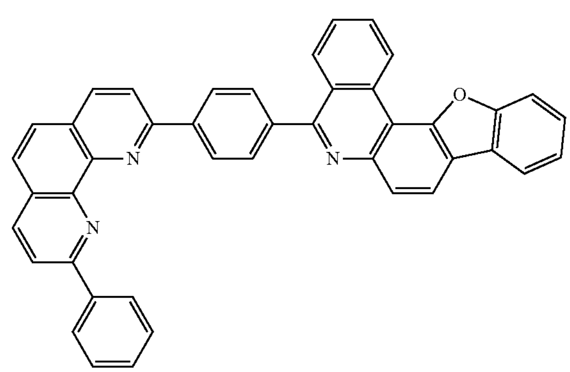

-continued
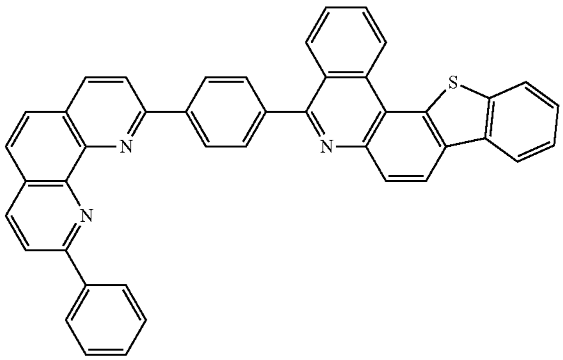
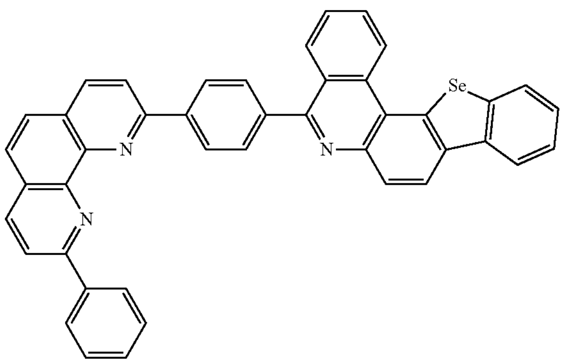
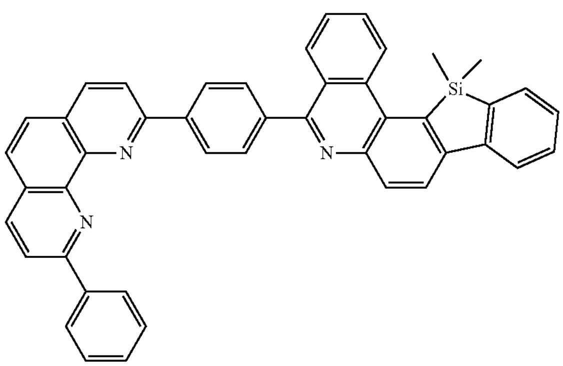
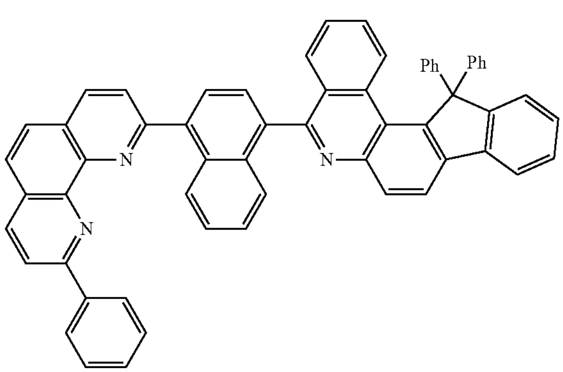
-continued
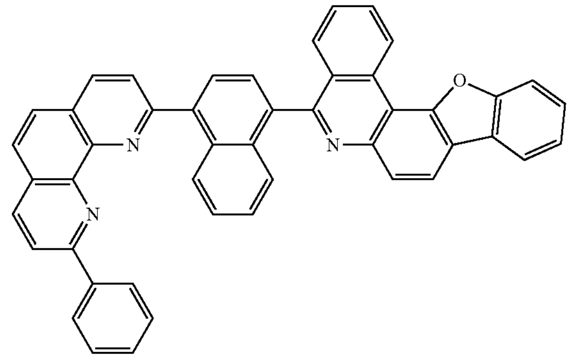
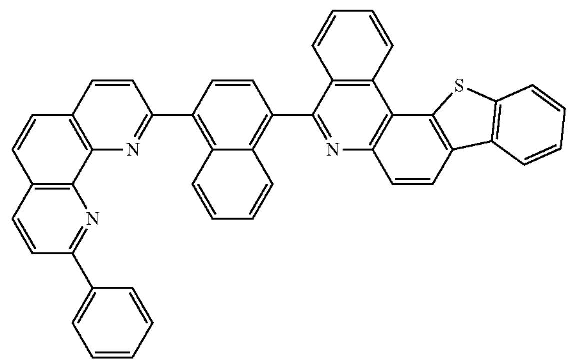
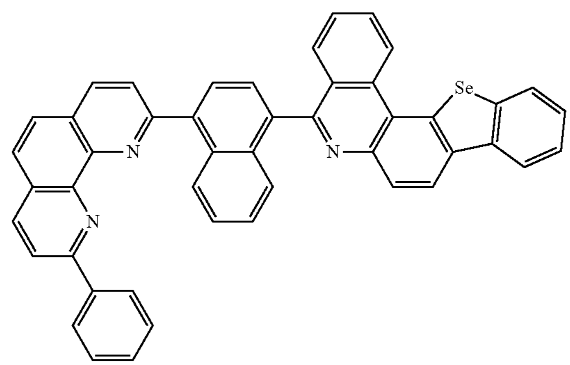
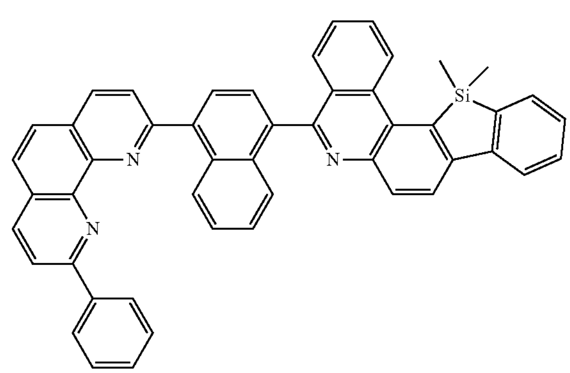

-continued
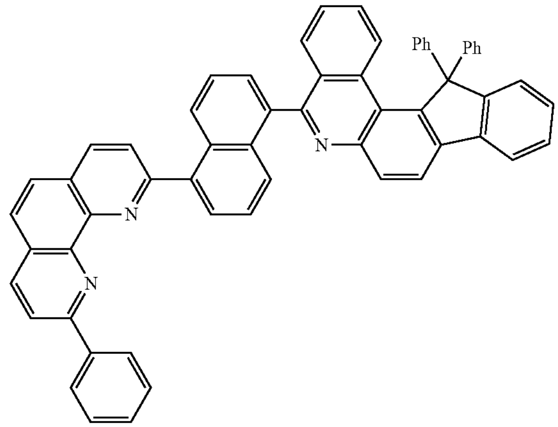
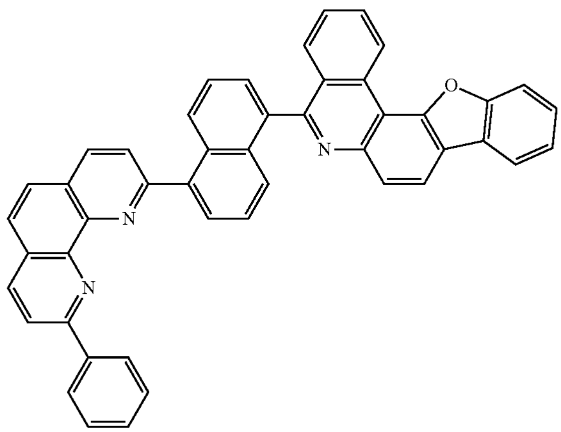
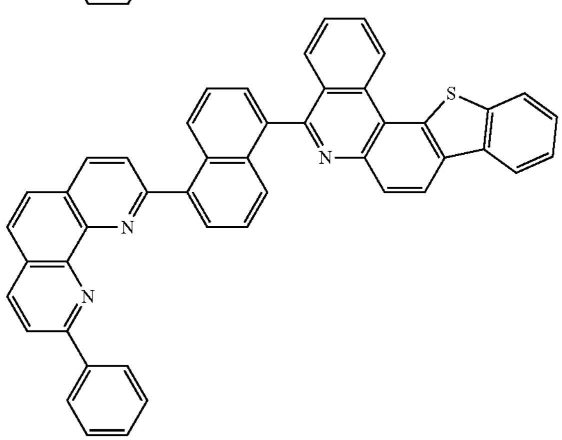
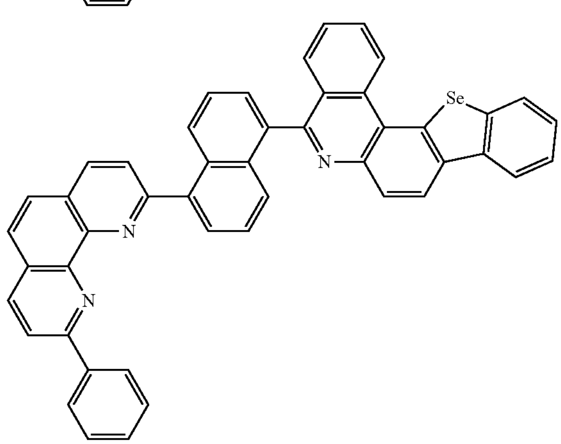
-continued
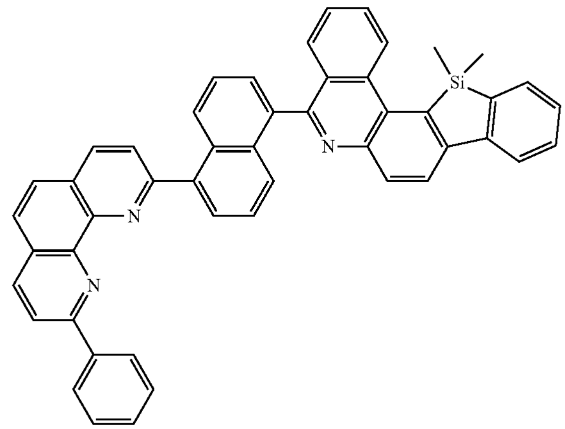
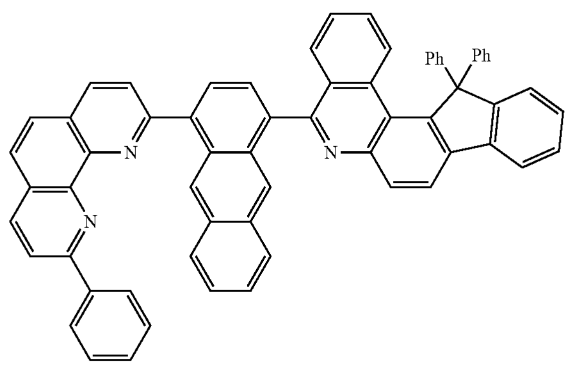
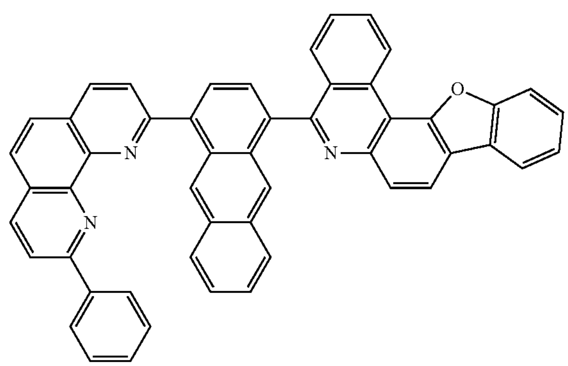
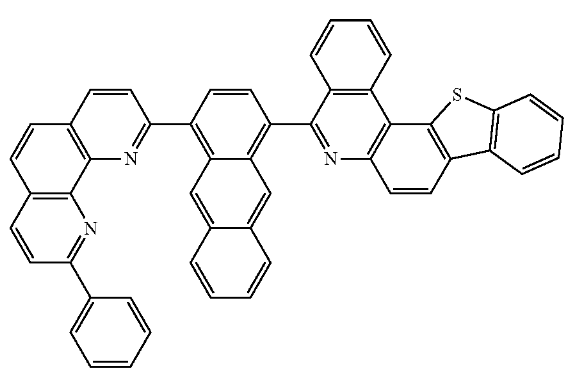

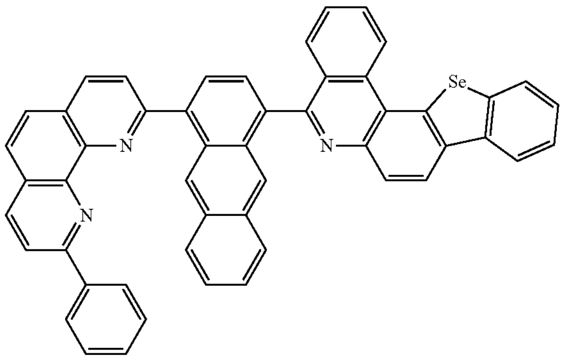
Se
N
N
N
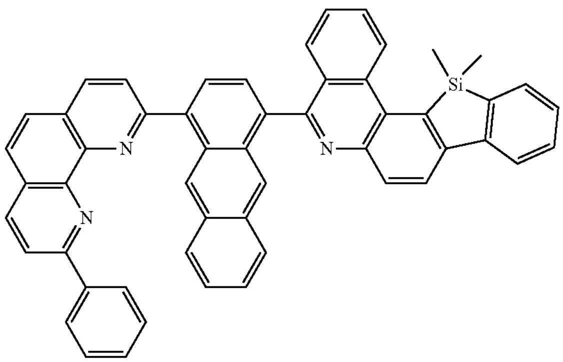
Si
N
N
N
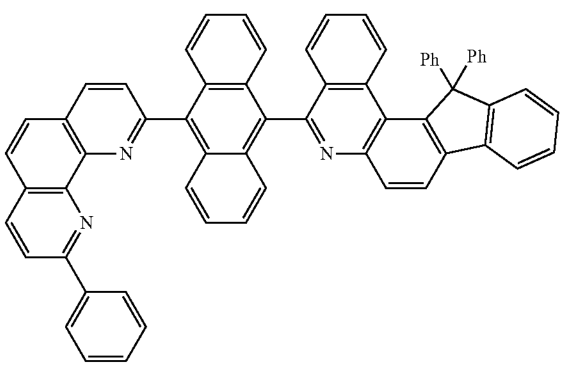
Ph
Ph
N
N
N
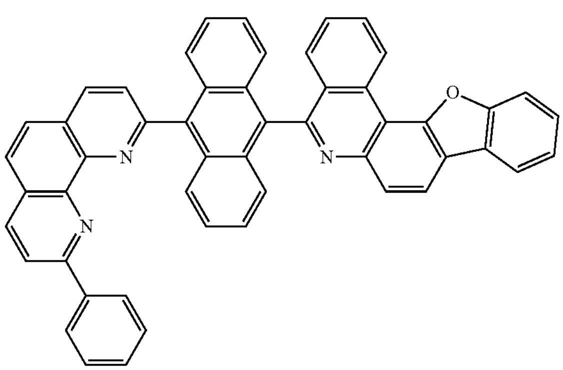
O
N
N
N
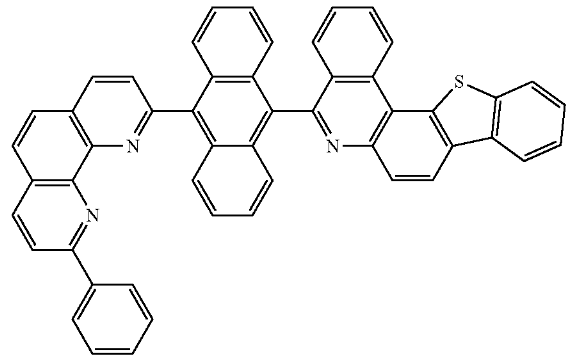
S
N
N
N
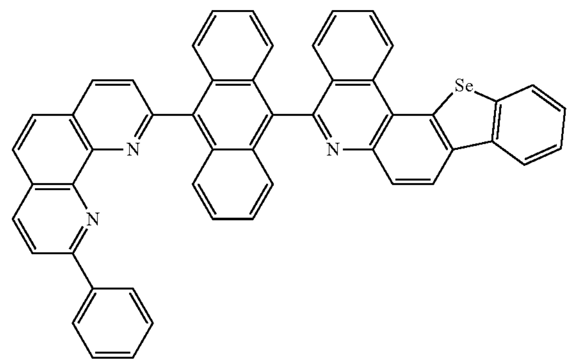
Se
N
N
N
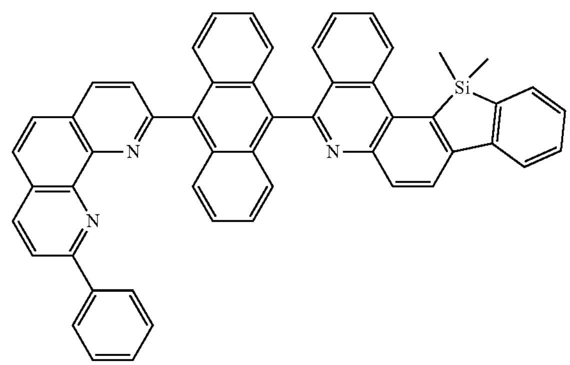
Si
N
N
N
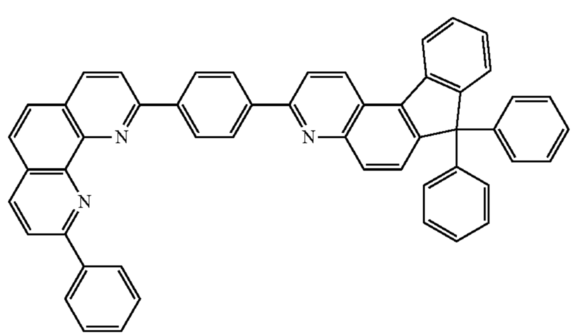
N
N
N -continued
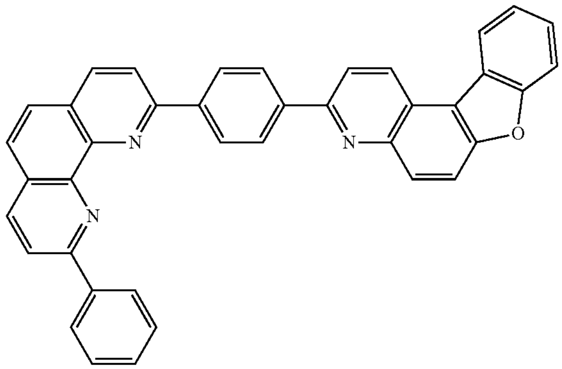
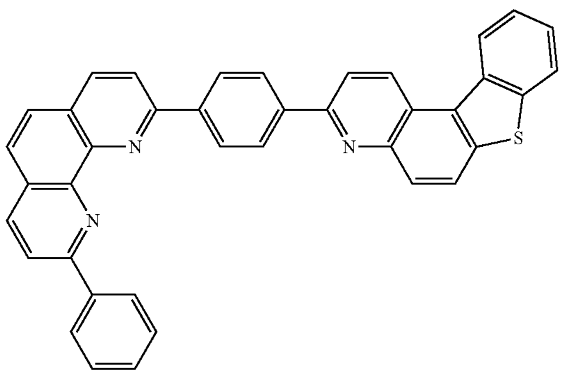
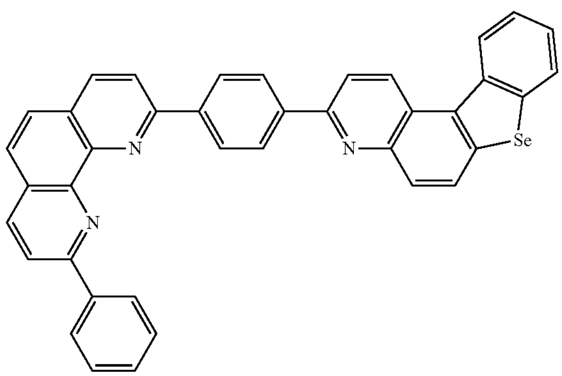
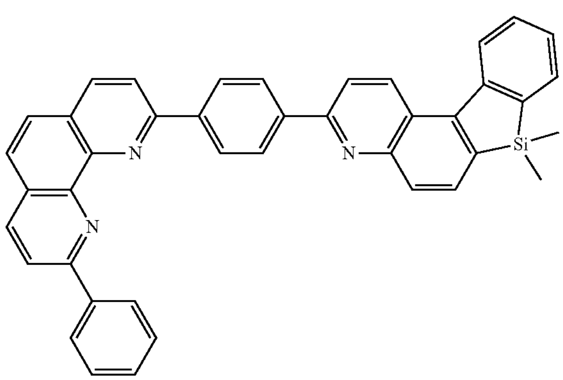
-continued
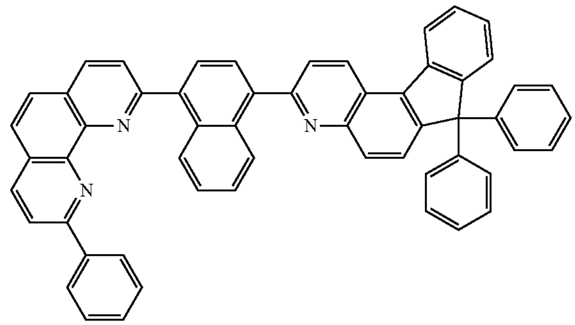
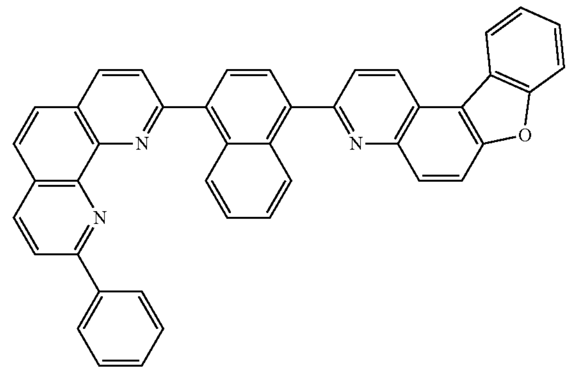
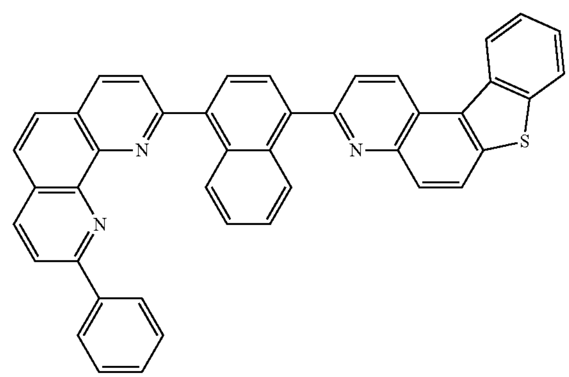
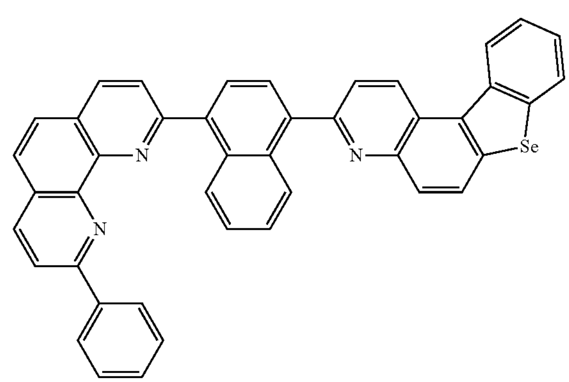

-continued
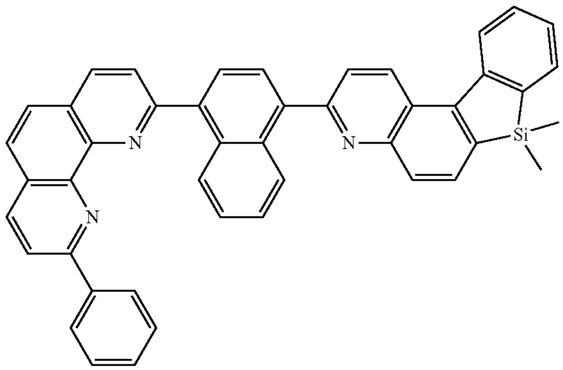
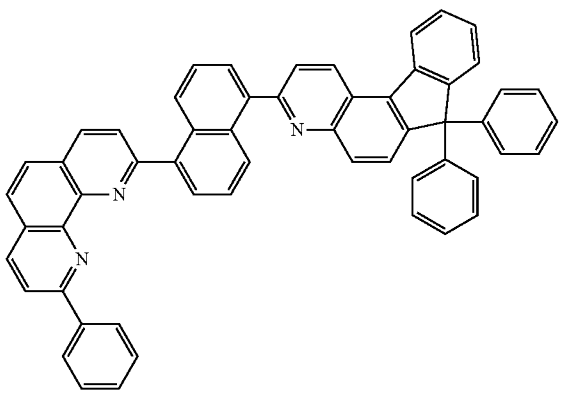
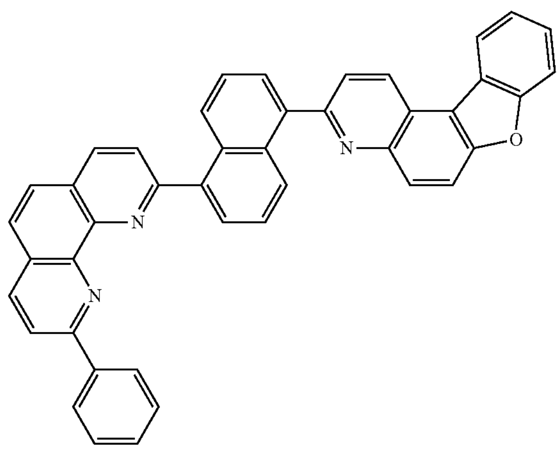
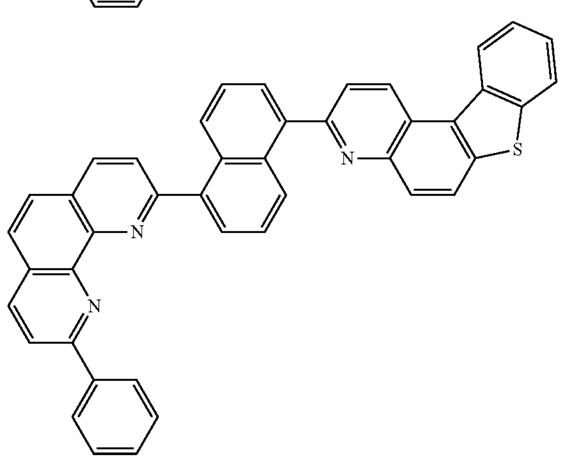
-continued
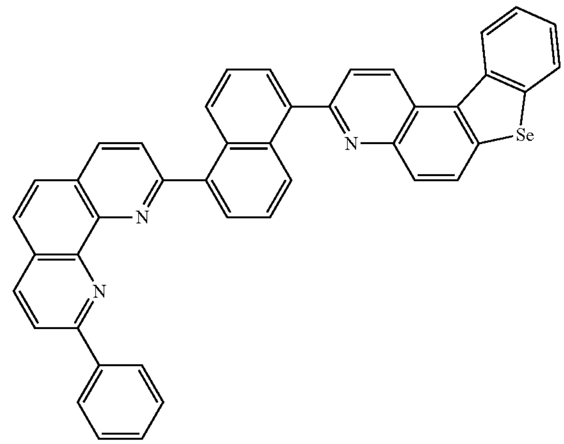
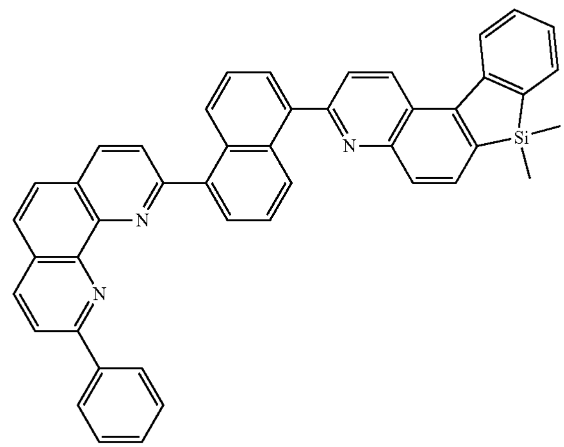
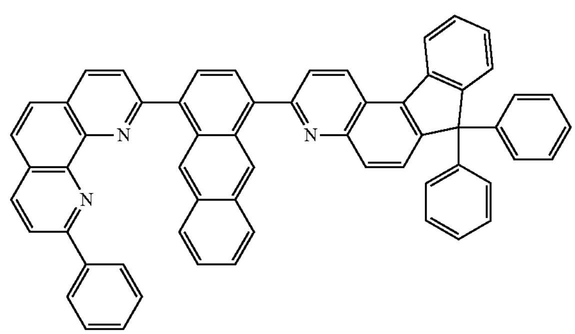
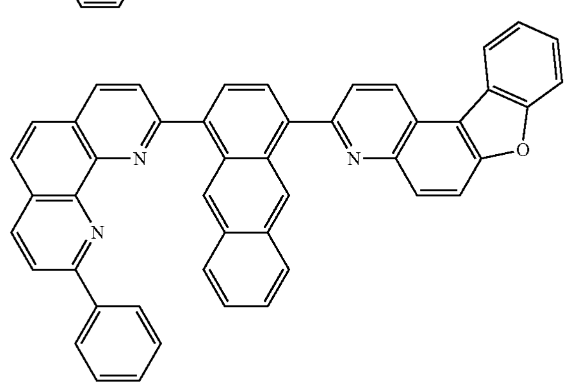

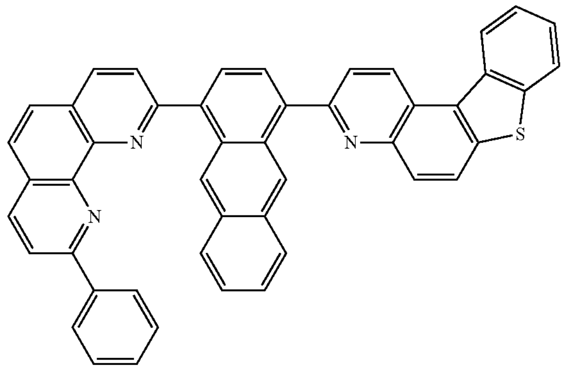
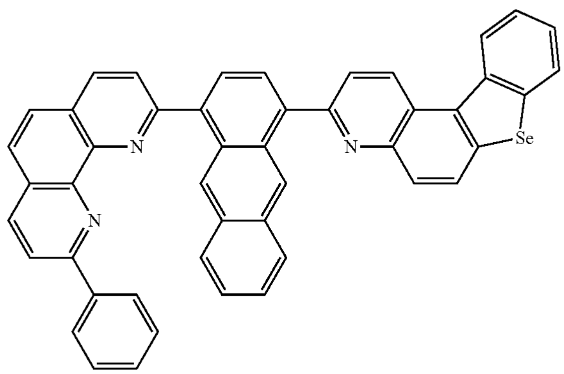
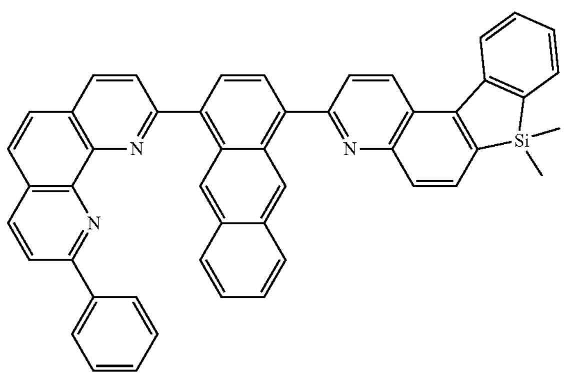
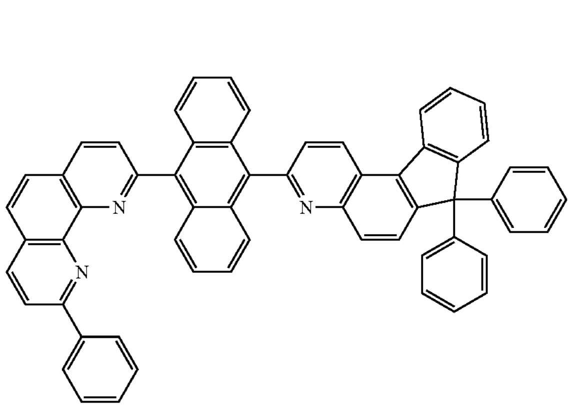
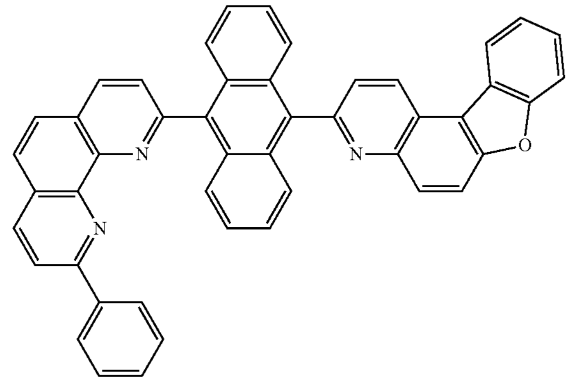
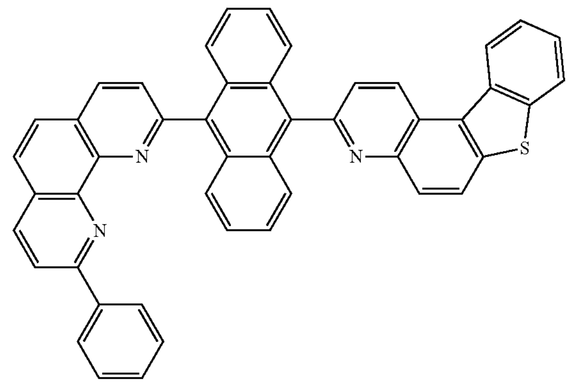
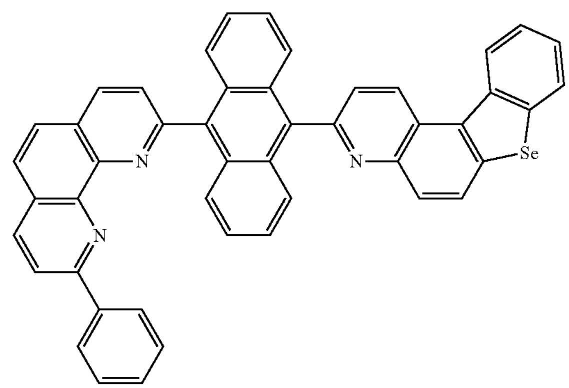
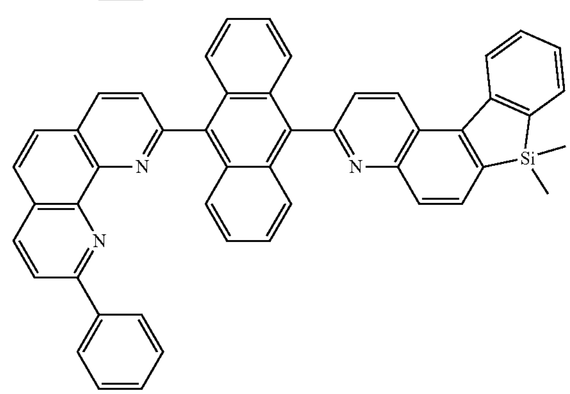

-continued
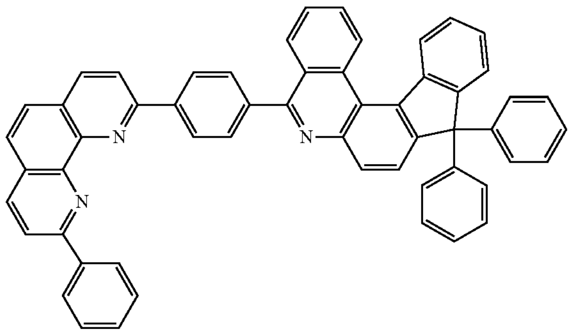
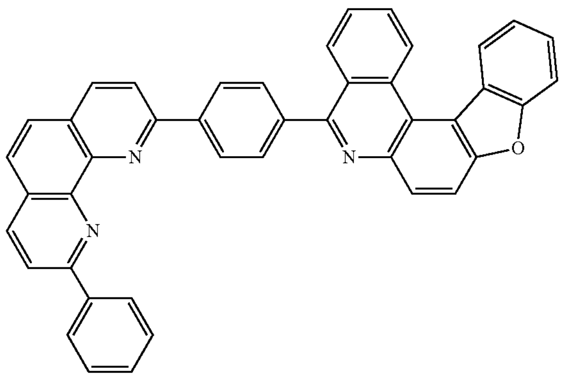
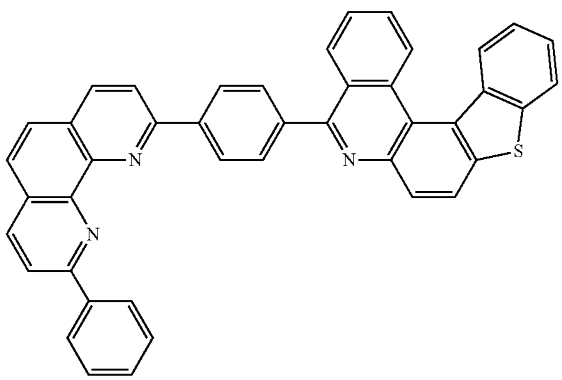
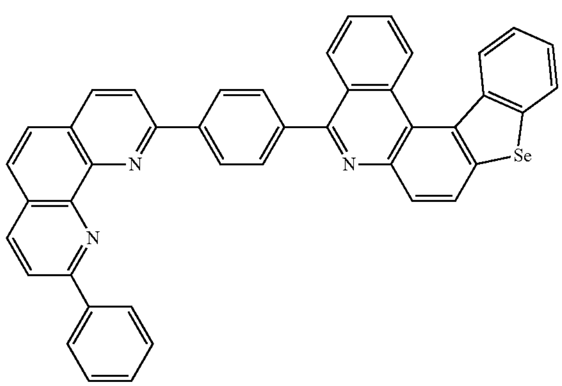
-continued
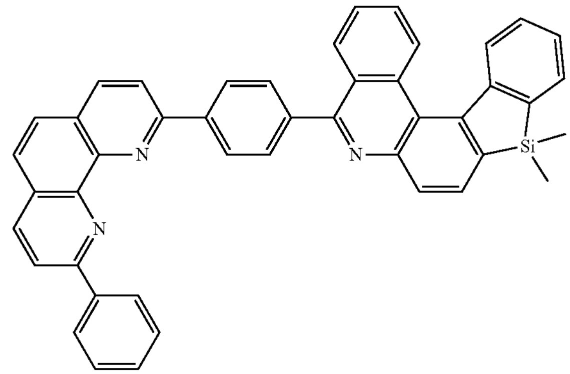
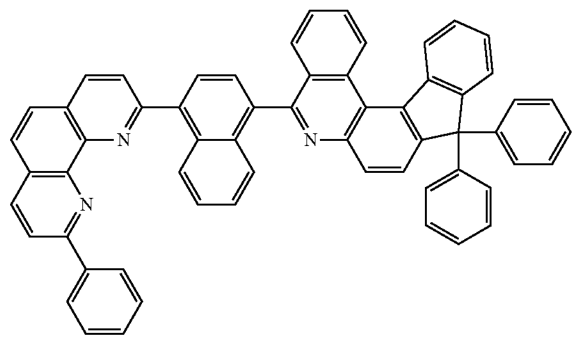
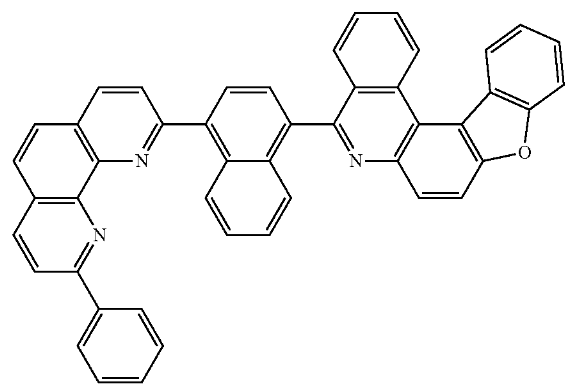
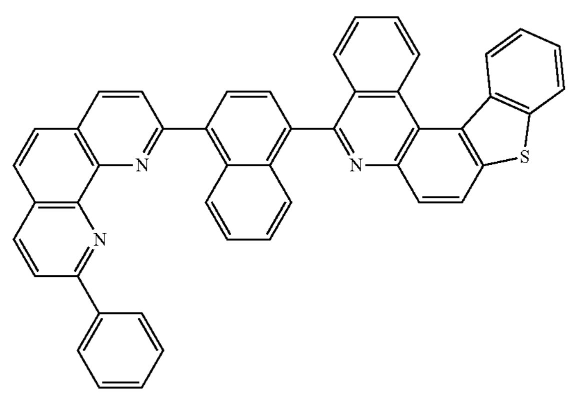

-continued
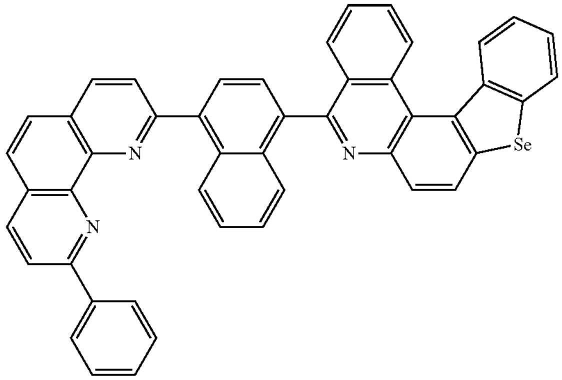
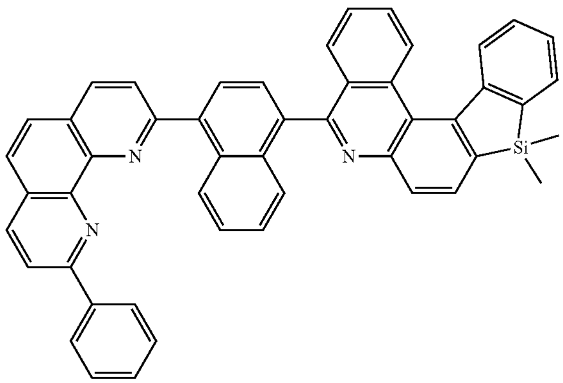
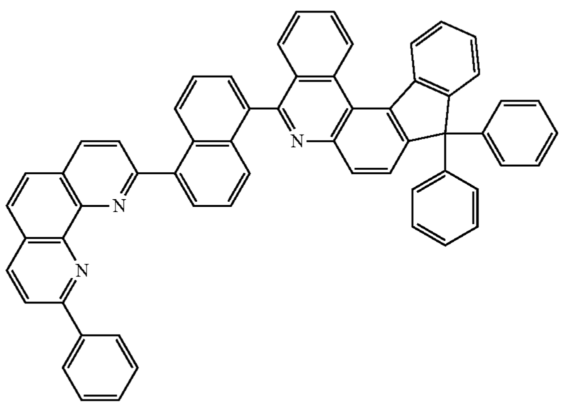
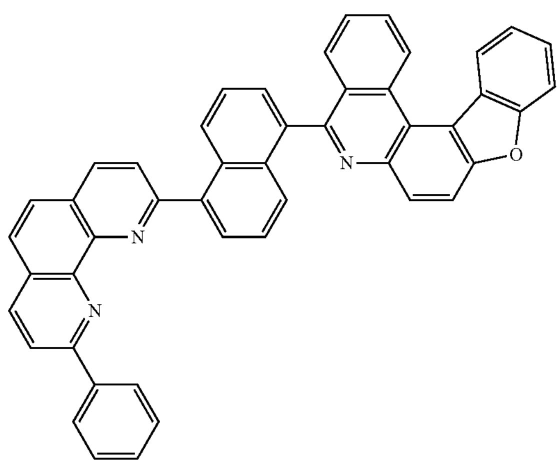
-continued
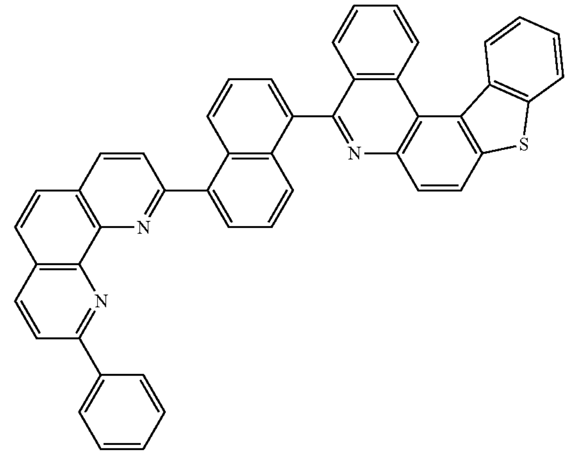
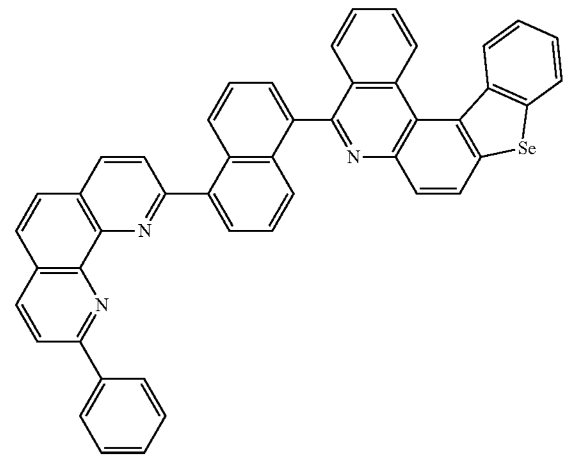
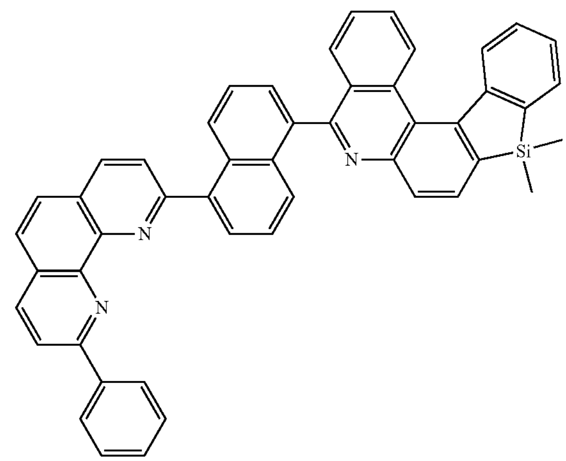
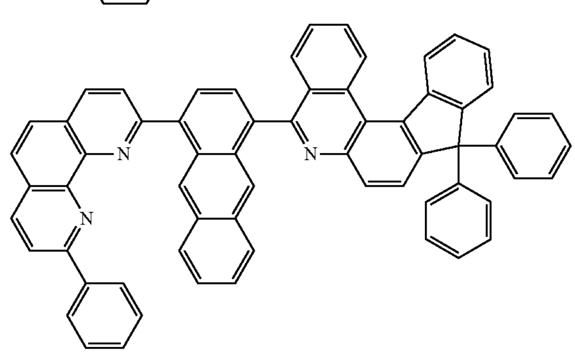

-continued
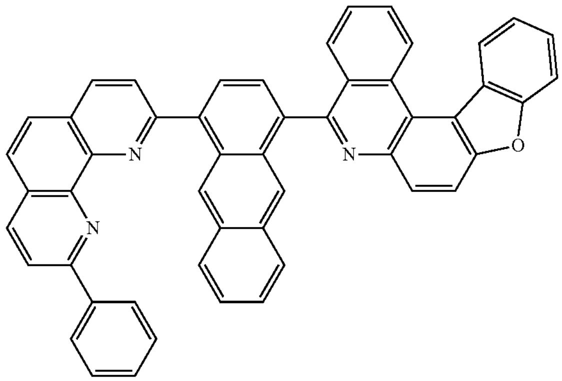
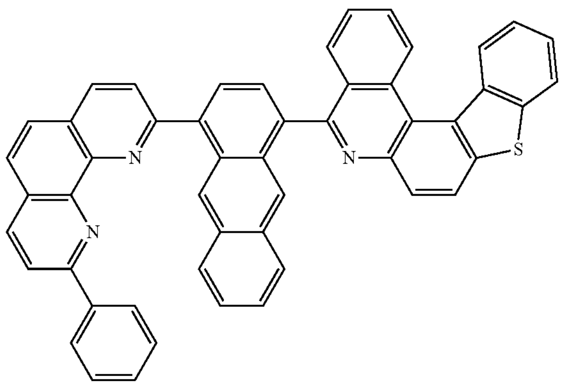
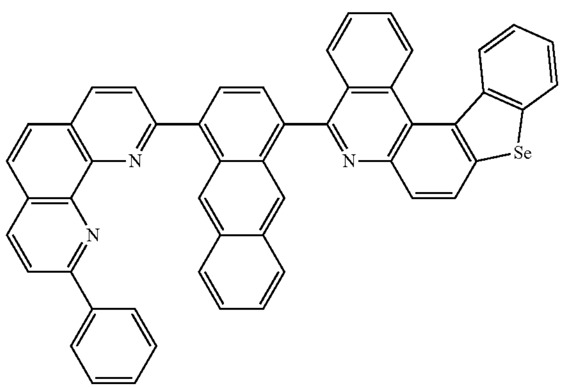
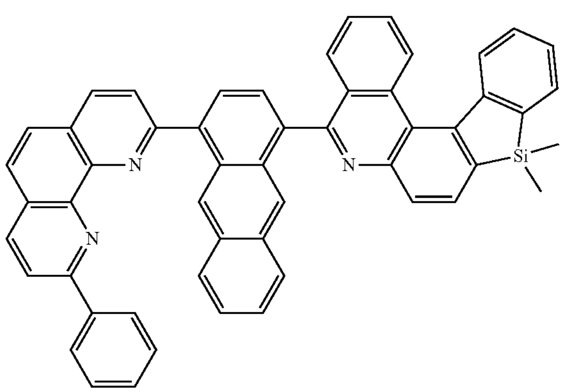
-continued
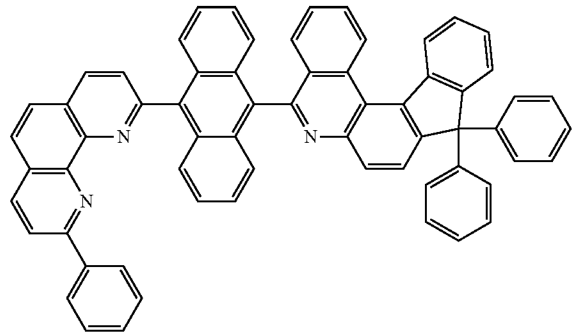
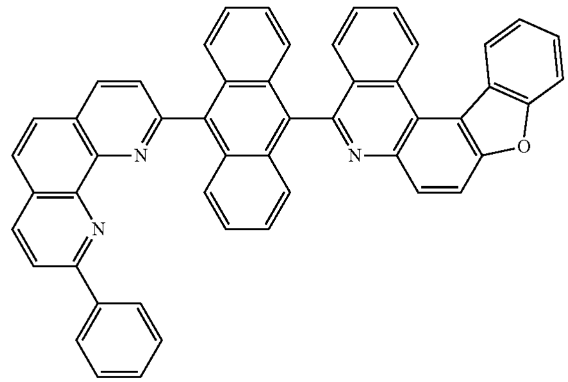
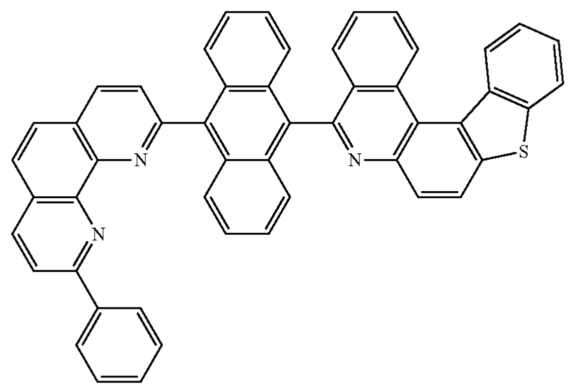
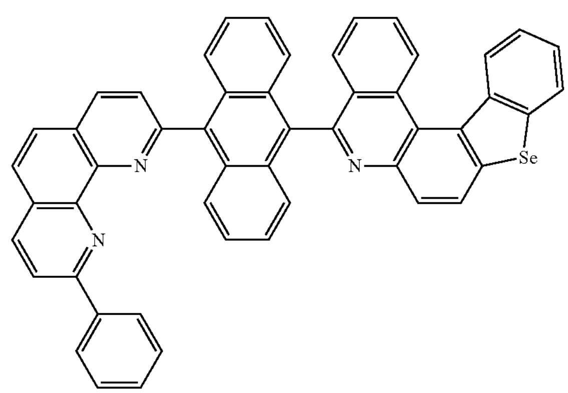

-continued

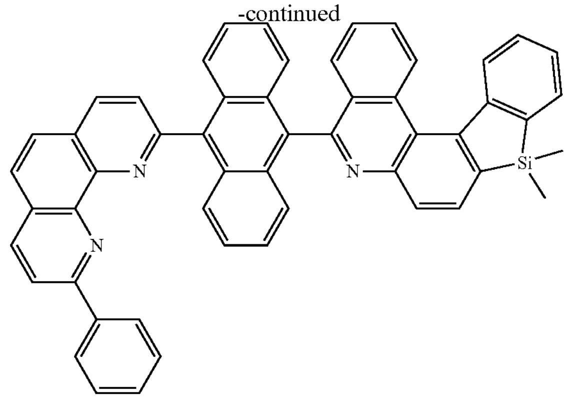

The P-type charge generation layer may include any one selected from the group consisting of a compound represented by Formula 2, a compound represented by Formula 3, and a combination thereof.

<Formula 2>

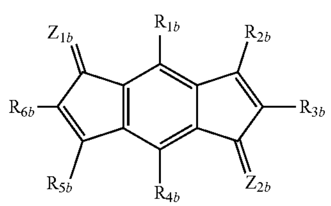

<Formula 3>

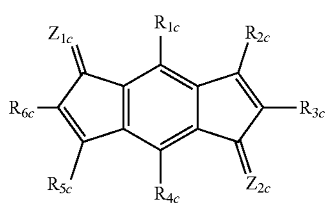

wherein $R_1$, $R_2$, $R_3$, $R_4$, $R_5$, and $R_6$ are each independently hydrogen, a substituted or unsubstituted $C_6$ to $C_{12}$ aryl group, a substituted or unsubstituted $C_2$ to $C_{12}$ heteroaryl group, a substituted or unsubstituted $C_1$ to $C_{12}$ alkyl group, a substituted or unsubstituted $C_1$ to $C_{12}$ alkoxy group, a substituted or unsubstituted $C_1$ to $C_{12}$ ether group, a cyano group, a fluorine group, a trifluoromethyl group, a trifluoromethoxy group, or a trimethylsilyl group, and at least one of $R_1$, $R_2$, $R_3$, $R_4$, $R_5$, and $R_6$ including a cyano group;

$Z_1$ and $Z_2$ are each independently represented by Formula 4:

<Formula 4>

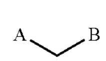

wherein A and B are each independently hydrogen, a substituted or unsubstituted $C_6$ to $C_{12}$ aryl group, a $C_3$ to $C_{12}$ heteroaryl group, a $C_1$ to $C_{12}$ alkyl group, a $C_1$ to $C_{12}$ alkoxy group, a $C_1$ to $C_{12}$ ether group, a cyano group, a fluorine group, a trifluoromethyl group, a trifluoromethoxy group, or a trimethylsilyl group.

Substituents in Formula 2 and Formula 3 are selected independently of one another.

For example, substituents of $R_1$ of Formula 2 and $R_1$ of Formula 3 are selected independently of one another.

In Formula 1 to Formula 4, a substituent for each of the aryl group, the heteroaryl group, the alkyl group, the alkoxy group, and the ether group may be any one selected from the group consisting of a $C_1$ to $C_{12}$ alkyl group, a $C_6$ to $C_{15}$ aryl group, a $C_3$ to $C_{15}$ heteroaryl group, a cyano group, a fluorine group, a trifluoromethyl group, a trifluoromethoxy group, a trimethylsilyl group, and combinations thereof.

Specifically, the compound represented by Formula 2 may be a compound represented by the following formulae:

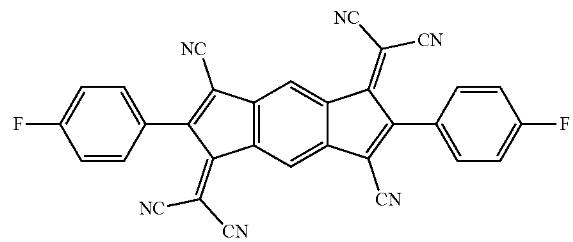

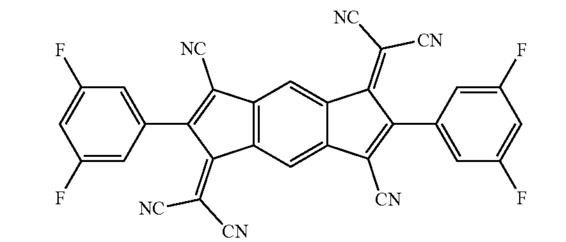

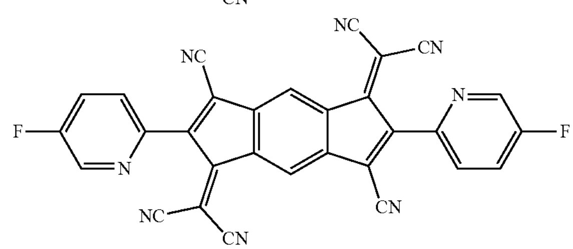

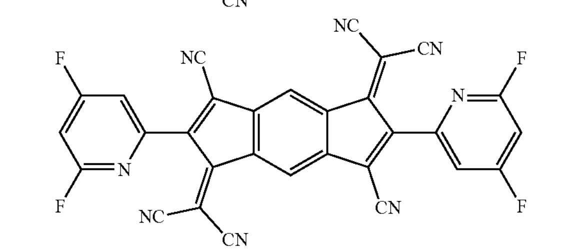

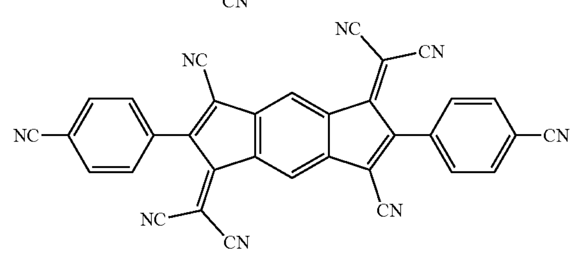

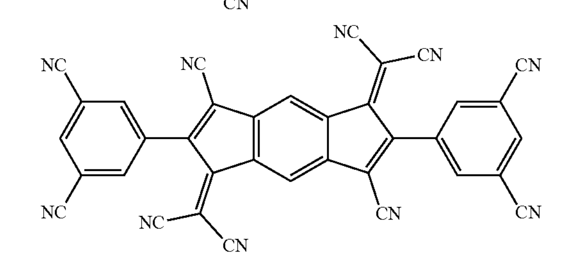

-continued
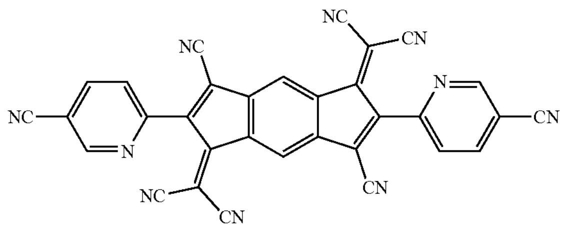
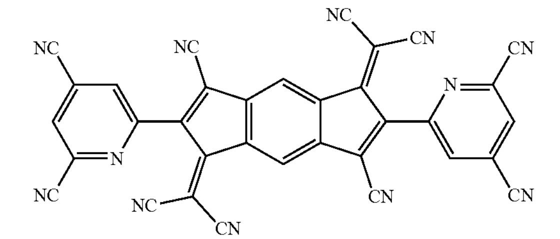
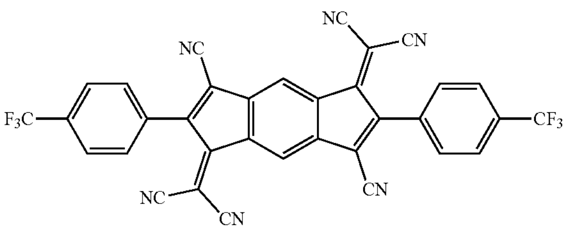
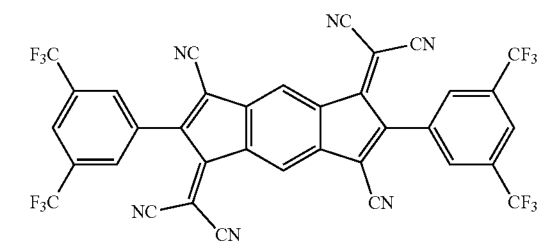
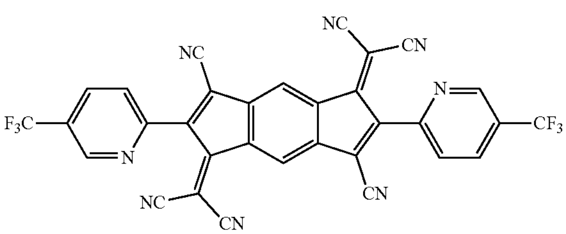
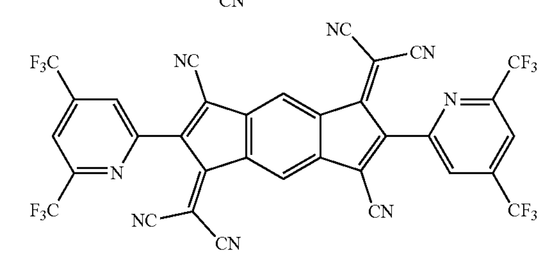
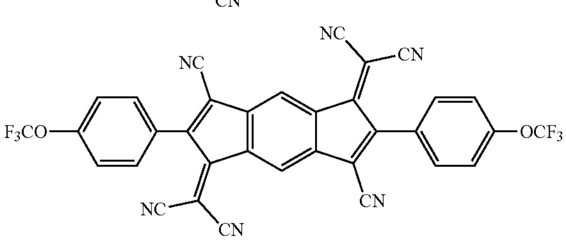
-continued
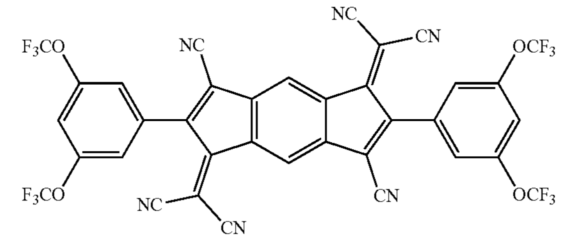
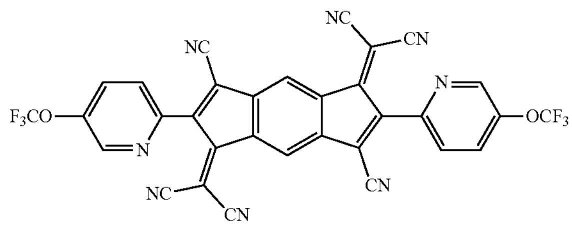
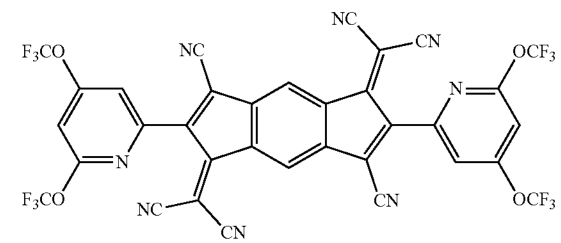
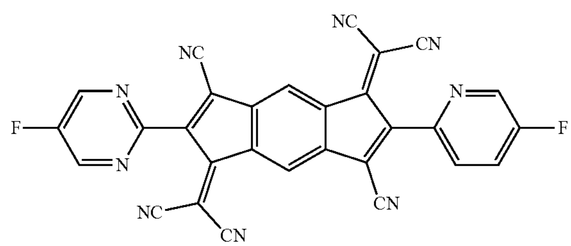
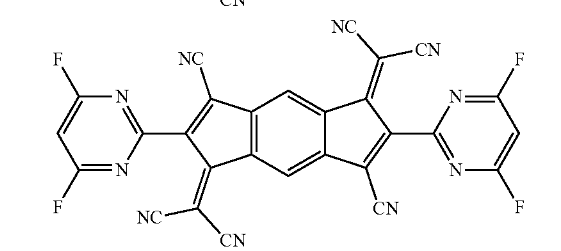
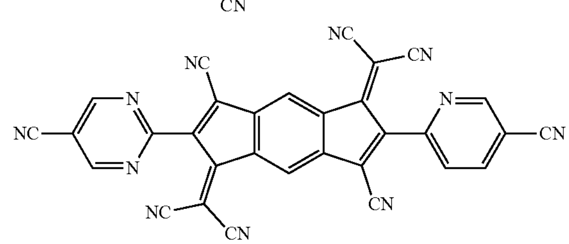
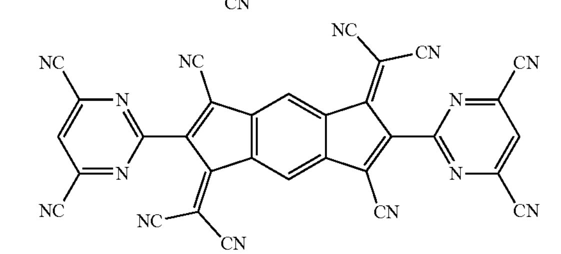

-continued
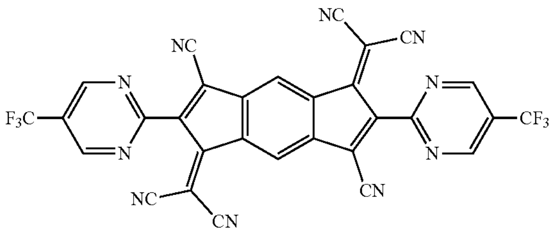
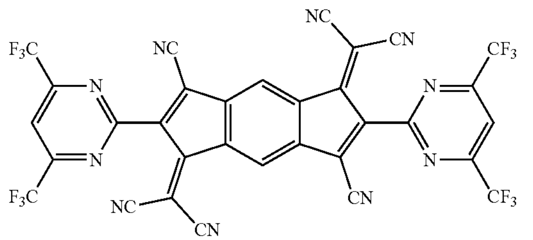
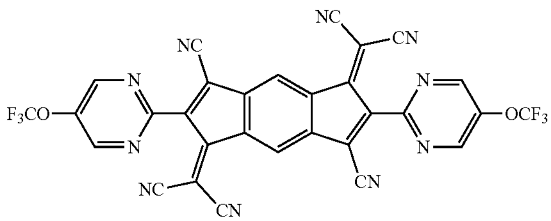
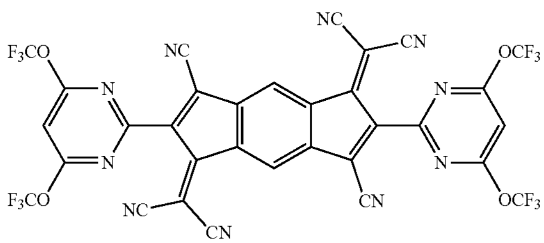
Specifically, the compound represented by Formula 3 may be a compound represented by the following formulae:
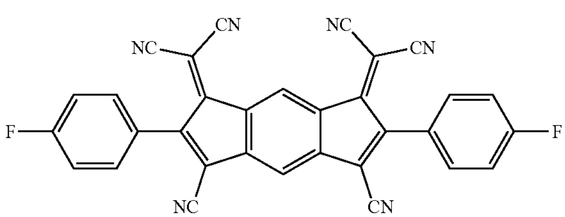
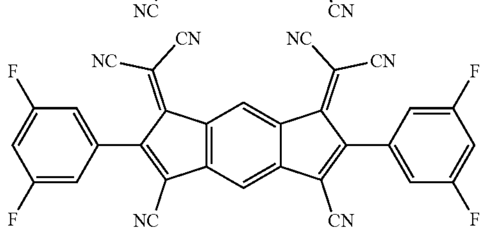
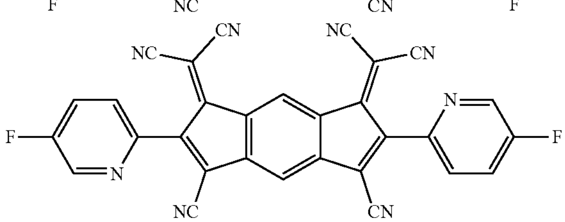
-continued
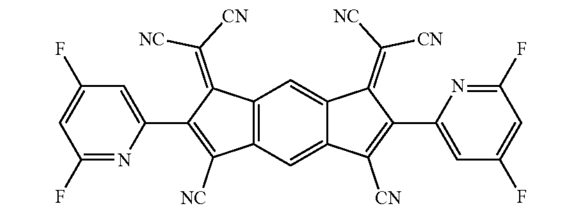
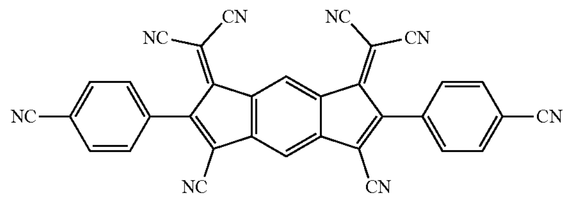
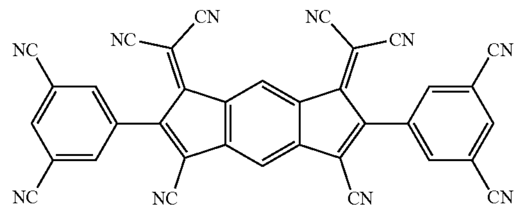
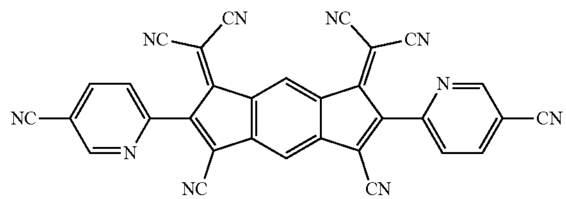
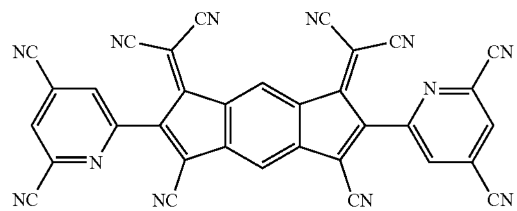
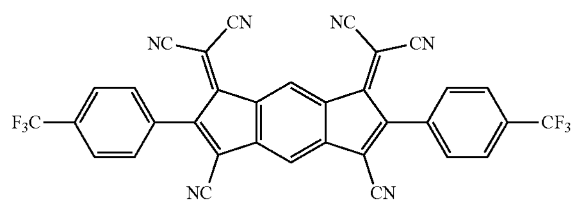
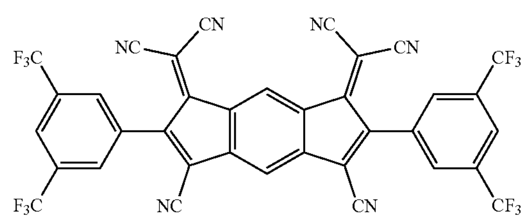
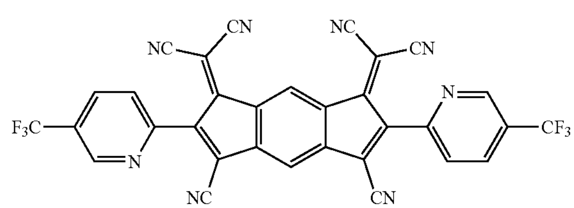

-continued

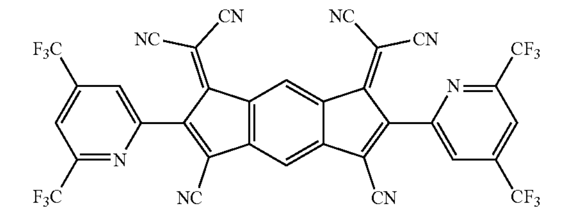

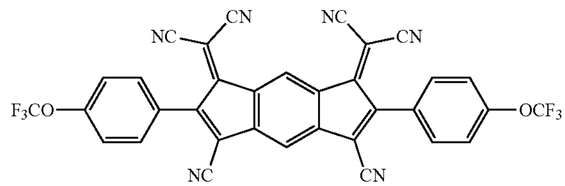

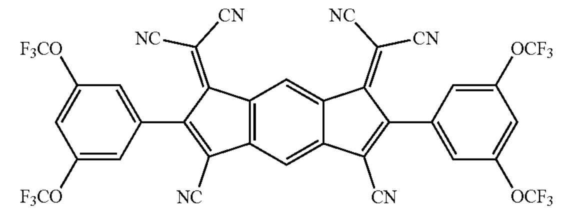

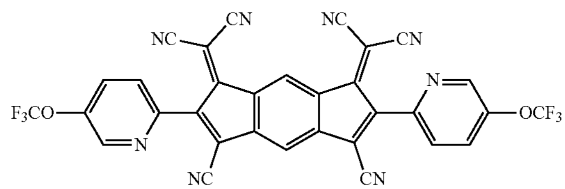

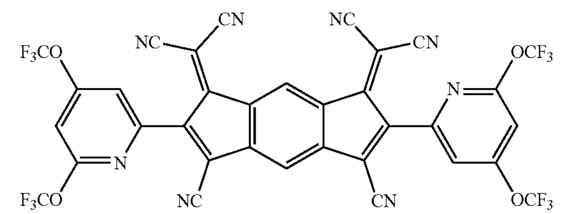

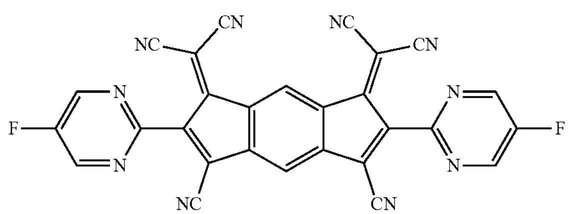

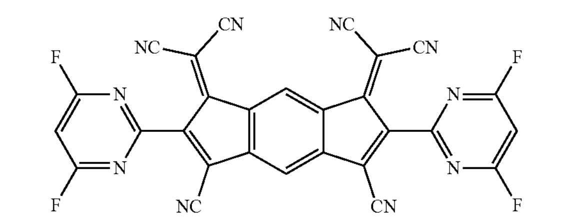

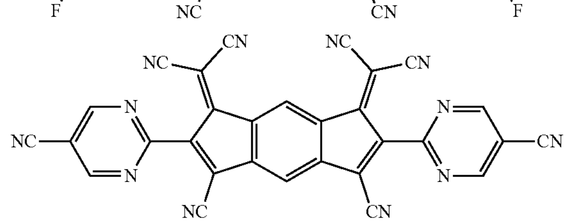

-continued

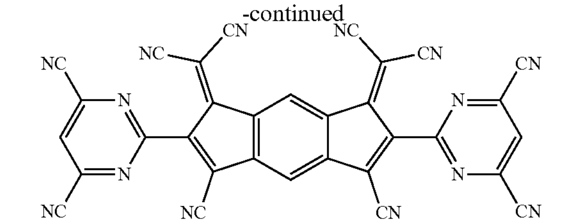

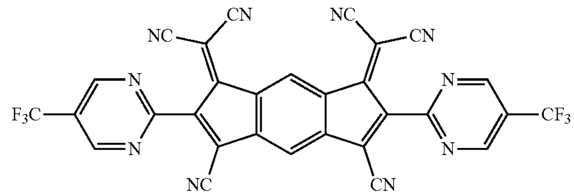

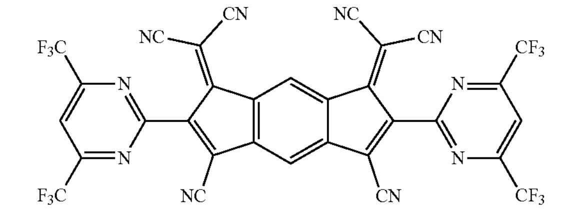

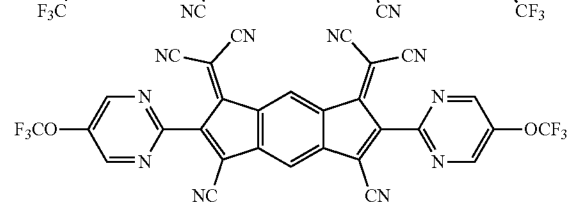

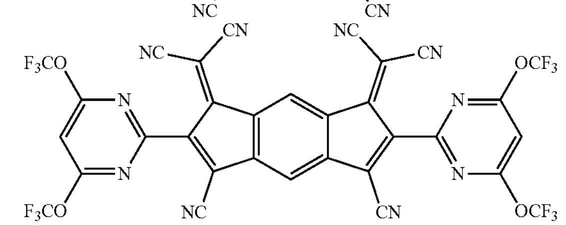

The organic light emitting diode including the N-type charge generation layer and the P-type charge generation layer as set forth above can be controlled in charge balance between the light emitting stacks, thereby having reduced driving voltage and increased lifespan.

FIG. 1 is a schematic sectional view of a tandem organic light emitting diode including two light emitting stacks according to a first exemplary embodiment of the present disclosure.

Referring to FIG. 1, an organic light emitting diode 100 according to the first embodiment includes a first electrode 110, a second electrode 120, a first light emitting stack (ST1) 140 interposed between the first electrode 110 and the second electrode 120 and including a first light emitting material layer (not shown), a second light emitting stack (ST2) 150 interposed between the first light emitting stack 140 and the second electrode 120 and including a second light emitting material layer (not shown), and a charge generation layer (CGL) 130 interposed between the first and second light emitting stacks 140, 150.

The first electrode 110 is an anode through which holes are injected into the organic light emitting diode, and may be formed of a conductive material having high work function, for example, any one of indium tin oxide (ITO), indium zinc oxide (IZO), and zinc oxide (ZnO).

The second electrode 120 is a cathode through which electrons are injected into the organic light emitting diode, and may be formed of a conductive material having low work function, for example, any one of aluminum (Al), magnesium (Mg), and aluminum-magnesium alloys (AlMg).

Each of the light emitting stacks 140, 150 may include one selected from the group consisting of a hole injection layer (HIL), a hole transport layer (HTL), an electron transport layer (ETL), an electron injection layer (EIL), and combinations thereof, and may further include known functional layers, as needed.

Figure 2:
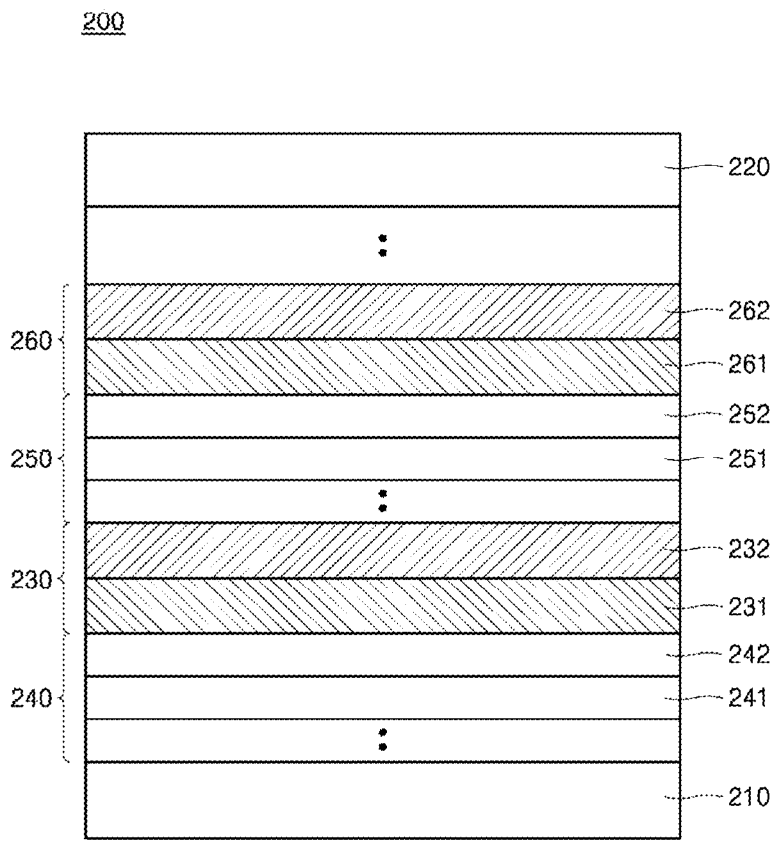
FIG. 2 is a schematic sectional view of a tandem organic light emitting diode having at least two light emitting stacks according to a second exemplary embodiment of the present disclosure.

FIG. 2 is a schematic sectional view of a tandem organic light emitting diode including at least two light emitting stacks according to a second exemplary embodiment of the present disclosure.

Referring to FIG. 2, an organic light emitting diode 200 according to this embodiment may include: a first electrode 210 and a second electrode 220 facing each other; a first light emitting stack (ST1) 240 and a second light emitting stack (ST2) 250 interposed between the first electrode 210 and the second electrode 220; and a first charge generation layer (CGL1) 230 and a second charge generation layer (CGL2) 260. The organic light emitting diode 200 may further include one or more additional light emitting stacks between the second charge generation layer (CGL2) 260 and the second electrode 220. If applicable, the organic light emitting diode 200 may further include an additional charge generation layer between the additional light emitting stacks.

As shown in FIG. 2, the first light emitting stack (ST1) 240 includes a first light emitting material layer (EML) 241 and a first electron transport layer (ETL) 242 and the second light emitting stack (ST2) 250 includes a second light emitting material layer (EML) 251 and a second electron transport layer (ETL) 252.

Each of the first and second light emitting stacks 240, 250 may further include one selected from among a hole injection layer (HIL), a hole transport layer (HTL), an electron transport layer (ETL), an electron injection layer (EIL), and combinations thereof, and may further include known functional layers, as needed.

Herein, the terms “first”, “second”, etc. are added to designate layers included in each of plural light emitting stacks, and may be omitted in order to explain common functions of the layers.

The hole injection layer (HIL) serves to facilitate injection of holes and may be formed of any one selected from the group consisting of copper phthalocyanine (CuPc), poly(3,4)-ethylenedioxythiophene (PEDOT), polyaniline (PANI), N,N'-dinaphthyl-N,N'-diphenyl benzidine (NPD), and combinations thereof, without being limited thereto.

The hole transport layer may include a material electrochemically stabilized when positively ionized (i.e., upon losing electrons), as a hole transport material. Alternatively, the hole transport material may be a material that generates stable radical cations. Alternatively, the hole transport material may be a material that contains an aromatic amine and thus can be easily positively ionized. For example, the hole transport layer may include any one selected from the group consisting of N,N'-dinaphthyl-N,N'-diphenyl benzidine (N,N'-bis(naphthalene-1-yl)-N,N'-bis(phenyl)-2,2'-dimethyl benzidine, NPD), N,N'-bis-(3-methylphenyl)-N,N'-bis-(phenyl)-benzidine (TPD), 2,2',7,7'-tetrakis(N,N-dimethylamino)-9,9-spirofluorene (spiro-TAD), 4,4',4-tris(N-3-methylphenyl-N-phenylamino)-triphenylamine (MTDATA), and combinations thereof, without being limited thereto.

The light emitting material layer (EML) 241 or 251 may emit red (R), green (G), or blue (B) light and may be formed of a phosphor or a fluorescent material.

When the light emitting material layer (EML) 241 or 251 is configured to emit red light, the light emitting material layer may be formed of a phosphor that includes a host material including carbazole biphenyl (CBP) or 1,3-bis (carbazol-9-yl) benzene (mCP) and a dopant material selected from the group consisting of bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), octaethylporphyrin platinum (PtOEP), and combinations thereof, or may be formed of a fluorescent material including PBD:Eu$(DBM)_3$(Phen) or perylene, without being limited thereto.

When the light emitting material layer (EML) 241 or 251 is configured to emit green light, the light emitting material layer may be formed of a phosphor that includes a host material including CBP or mCP and a dopant material including fac-tris(2-phenylpyridine)iridium ($Ir(ppy)_3$), or may be formed of a fluorescent material including tris(8-hydroxyquinolino)aluminum (Alq3), without being limited thereto.

When the light emitting material layer (EML) 241 or 251 is configured to emit blue light, the light emitting material layer may be formed of a phosphor that includes a host material including CBP or mCP and a dopant material including $(4,6\text{-}F2ppy)_2$Irpic or may be formed of a fluorescent material including any one selected from the group consisting of spiro-DPVBi, spiro-6P, distyrylbenzene (DSB), distyrylarylene (DSA), PFO-based polymers, PPV-based polymers, and combinations thereof, without being limited thereto.

The electron transport layer (ETL) 242 or 252 receives electrons from the second electrode 220. The electron transport layer (ETL) 242 or 252 transfers the received electrons to the light emitting material layer 241 or 251. The electron transport layer (ETL) 242 or 252 may be formed of an electron transport material. The electron transport material may be a material electrochemically stabilized when negatively ionized (i.e., upon gaining electrons). Alternatively, the electron transport material may be a material that generates stable radical anions. Alternatively, the electron transport material may be a material that contains a heterocyclic ring and thus can be easily negatively ionized by heteroatoms. For example, the electron transport material may include any one selected from among tris(8-hydroxyquinolino)aluminum (Alq3), 8-hydroxyquinolinolatolithium (Liq), 2-(4-biphenylyl)-5-(4-tert-butylphenyl)-1,3,4oxadiazole (PBD), 3-(4-biphenyl)4-phenyl-5-tert-butylphenyl-1,2,4-triazole (TAZ), spiro-PBD, bis(2-methyl-8-quinolinolate)-4-(phenylphenolato)aluminium (BAlq), SAlq, 2,2',2-(1,3,5-benzinetriyl)-tris(1-phenyl-1-H-benzimidazole) (TPBi), oxadiazole, triazole, phenanthroline, benzoxazole, and benzthiazole, without being limited thereto.

The electron injection layer (EIL) serves to facilitate injection of electrons and may include any one selected from the group consisting of tris(8-hydroxyquinolino)aluminum (Alq3), PBD, TAZ, spiro-PBD, BAlq, SAlq, and combinations thereof, without being limited thereto. Alternatively, the electron injection layer (EIL) may be formed of a metal compound, which may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, without being limited thereto.

In the tandem organic light emitting diode 200, the charge generation layer (CGL) 230 or 260 is interposed between the light emitting stacks to improve current efficiency in the light emitting material layer (EML) 241 or 251 while securing efficient distribution of charges. That is, the first charge generation layer (CGL) 230 is interposed between the first light emitting stack 240 and the second light emitting stack 250, and the first light emitting stack 240 is connected to the second light emitting stack 250 by the first charge generation layer 230. In addition, the second charge generation layer (CGL) 260 is interposed between the second light emitting stack 250 and the additional light emitting stack (not shown), and the second light emitting stack 250 is connected to the additional light emitting stack (not shown) by the second charge generation layer 260. The charge generation layer (CGL) 230 or 260 may be a PN junction charge generation layer in which an N-type charge generation layer (N-CGL) 231 or 261 adjoins a P-type charge generation layer (P-CGL) 232 or 262.

The N-type charge generation layer (N-CGL) 231 or 261 is interposed between the electron transport layer 242 or 252 and the hole transport layer (not shown), and the P-type charge generation layer (P-CGL) 232 or 262 is interposed between the N-type charge generation layer (N-CGL) 231 or 261 and the hole transport layer (not shown). The charge generation layer (CGL) 230 or 260 generates charges or divides the charges into holes and electrons to supply the holes and electrons to the first and second light emitting stacks 240, 250.

For example, the N-type charge generation layer (N-CGL) 231 supplies electrons to the first electron transport layer 242 of the first light emitting stack (ST1) 240, and the first electron transport layer 242 supplies electrons to the first light emitting material layer 241 adjacent to the first electrode 210. The P-type charge generation layer (P-CGL) 232 supplies holes to the second hole transport layer (not shown) of the second light emitting stack (ST2) 250, and the second hole transport layer (not shown) supplies holes to the second light emitting material layer 251.

As described above, the N-type charge generation layer (N-CGL) 231 or 261 includes the compound represented by Formula 1. Optionally, the N-type charge generation layer (N-CGL) 231 or 261 may be doped with an alkali metal or alkali earth metal compound to improve electron injection into the N-type charge generation layer (N-CGL) 231 or 261.

In addition, use of the compound represented by Formula 1 in the N-type charge generation layer (N-CGL) 231 or 261 can provide efficient transfer of electrons from the N-type charge generation layer (N-CGL) 231 or 261 to the electron transport layer (ETL) 242 or 252.

In one embodiment, the N-type charge generation layer (N-CGL) 231 or 261 may be doped with 0.1 wt % to 5 wt % of one material selected from the group consisting of an alkali metal, an alkali earth metal, and combinations thereof.

In addition, the P-type charge generation layer (P-CGL) 232 or 262 may be formed of a metal or a P-doped organic material. Here, the metal may include at least one selected from the group consisting of Al, Cu, Fe, Pb, Zn, Au, Pt, W, In, Mo, Ni, Ti, and alloys thereof. As described above, the P-type charge generation layer (P-CGL) 232 or 262 may include one material selected from the group consisting of the compound represented by Formula 2, the compound represented by Formula 3, and a combination thereof, as a dopant. Alternatively, the P-type charge generation layer (P-CGL) 232 or 262 may be composed of a single layer, which is formed of the compound represented by Formula 2 or the compound represented by Formula 3 alone.

In one embodiment, the P-type charge generation layer (P-CGL) 232 or 262 may include 1 wt % to 40 wt % of one material selected from the group consisting of the compound represented by Formula 2, the compound represented by Formula 3, and a combination thereof. Within this range, the P-type charge generation layer can exhibit improved efficiency and lifespan, as compared with existing P-type charge generation layers, while reducing driving voltage of the organic light emitting diode.

In another embodiment, the P-type charge generation layer may be formed of the compound represented by Formula 2 or the compound represented by Formula 3 alone.

A difference in LUMO energy level between the N-type charge generation layer including the compound represented by Formula 1 and the P-type charge generation layer including one material selected from the group consisting of the compound represented by Formula 2, the compound represented by Formula 3, and a combination thereof may range from 2.5 eV to 4.5 eV. Within this range of LUMO energy level difference, the P-type charge generation layer can be properly operated.

The N-type charge generation layer (N-CGL) 231 or 261 may have a thickness of 0.01% to 10% the overall thickness of the organic light emitting diode, and the P-type charge generation layer (P-CGL) 232 or 262 may have a thickness of 0.005% to 10% the overall thickness of the organic light emitting diode. Within these ranges, the organic light emitting diode can be efficiently operated.

The organic light emitting diode according to the present disclosure may be used in organic light emitting displays, lighting apparatuses using organic light emitting diodes, and the like.

Next, the present disclosure will be described in more detail with reference to examples. However, it should be noted that these examples are provided for illustration only and should not be construed in any way as limiting the disclosure.

EXAMPLES

Preparative Example 1

Preparation of Compound [1] (N-CGL)

Compound [1]

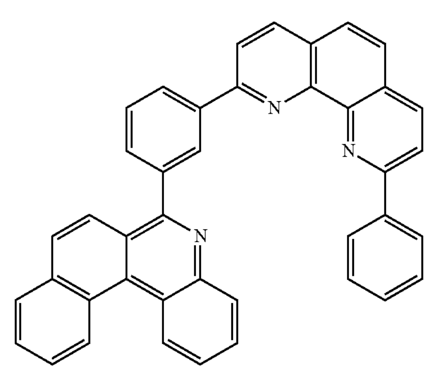

Compound [1] was prepared according to Reaction Formula 1:

[Reaction Formula 1]

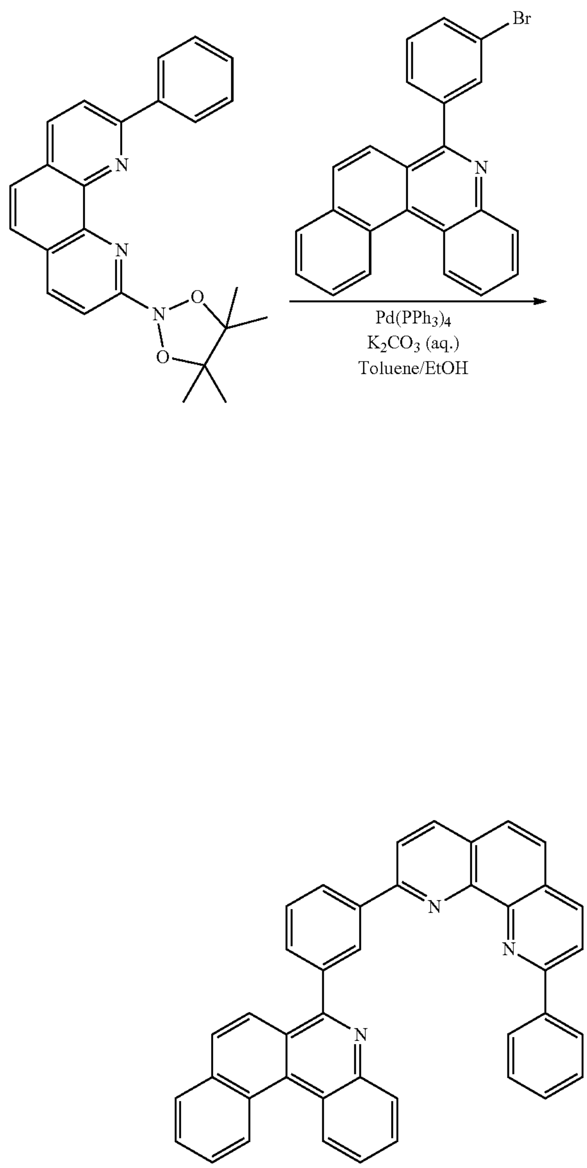

Into a flask under a nitrogen atmosphere, 2-(4,4,5,5-tetramethyl-1,3,2-dioxaborolan-2-yl)-9-phenyl-1,10-phenanthroline (5 g, 13.08 mmol), 6-(3-bromophenyl)benzo[k]phenanthridine (4.45 g, 11.6 mmol), tetrakis(triphenylphosphine) palladium (0) ($Pd(PPh_3)_4$) (0.53 g, 0.46 mmol), 4M potassium carbonate aqueous solution (10 ml), toluene (30 ml), and ethanol (10 ml) were placed, followed by stirring under reflux for 12 hours. After completion of reaction, $H_2O$ (50 ml) was added, followed by filtration under reduced pressure subsequent to stirring for 3 hours, and then separation of the resulting product was performed by column chromatography using methylene chloride (MC) and hexane as an eluent, followed by recrystallization from MC, thereby obtaining Compound [1] (5.30 g, yield: 77.01%).

Preparative Example 2

Preparation of Compound [2] (N-CGL)

Compound [2]

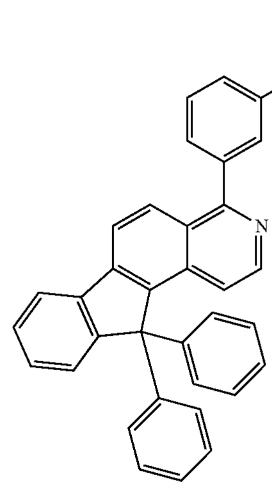

Compound [2] was prepared according to Reaction Formula 2:

[Reaction Formula 2]

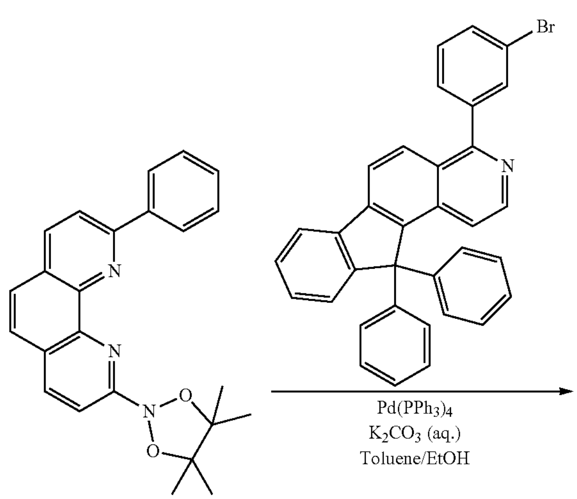

-continued

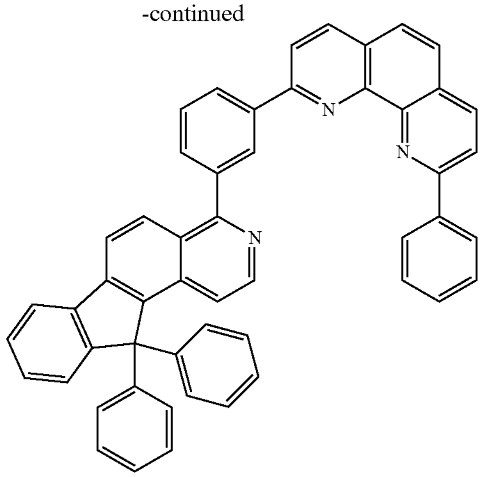

Into a flask under a nitrogen atmosphere, 2-(4,4,5,5-tetramethyl-1,3,2-dioxaborolan-2-yl)-9-phenyl-1,10-phenanthroline (5 g, 13.08 mmol), 4-(3-bromophenyl)-11,11-diphenyl-11H-indeno[2,1-f]isoquinoline (6.03 g, 11.6 mmol), tetrakis(triphenylphosphine) palladium (0) (Pd $(PPh_3)_4$) (0.53 g, 0.46 mmol), 4M potassium carbonate aqueous solution (10 ml), toluene (30 ml), and ethanol (10 ml) were placed, followed by stirring under reflux for 12 hours. After completion of reaction, $H_2O$ (50 ml) was added, followed by filtration under reduced pressure subsequent to stirring for 3 hours, and then separation of the resulting product was performed by column chromatography using methylene chloride (MC) and hexane as an eluent, followed by recrystallization from MC, thereby obtaining Compound [2] (5.30 g, yield: 70.95%).

Preparative Example 3

Preparation of Compound [3] (P-CGL)

Compound [3]

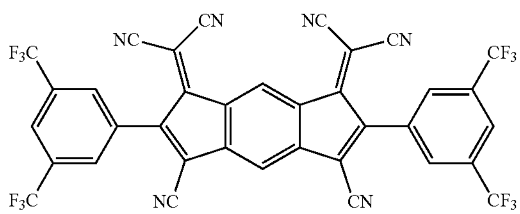

Compound [3] was prepared according to Reaction Formula 3 and Reaction Formula 4.

[Reaction Formula 3]

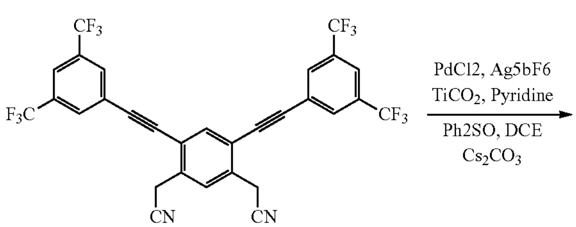

-continued

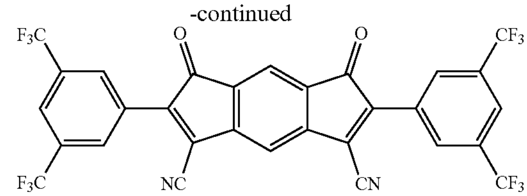

In a 250 mL two-neck flask, material A (0.034 mol), palladium chloride ($PdCl_2$) (6.8 mmol), silver hexafluoroantimonate ($AgSbF_6$) (10.2 mmol), and diphenylsulfoxide ($Ph_2SO$) (0.2 mol) were dissolved in dichloroethylene (DCE), followed by stirring at 60° C. for 24 hours, and then cesium carbonate ($Cs_2CO_3$) (0.085 mol) was added to the solution, followed by stirring for 12 hours. After completion of reaction, extraction with dichloromethane ($CH_2Cl_2$) was performed, followed by completely volatilizing dichloromethane ($CH_2Cl_2$), and then the resulting product was put into 35% hydrochloric acid (HCl), followed by stirring for 2 hours. Then, extraction with a dichloromethane/ammonium chloride aqueous solution ($CH_2Cl_2$/aq.$NH_4Cl$) was performed, followed by drying an organic material layer over magnesium sulfate ($MgSO_4$), and then an intermediate solid (8.2 g, yield: 36.5%) was obtained by column chromatography.

[Reaction Formula 4]

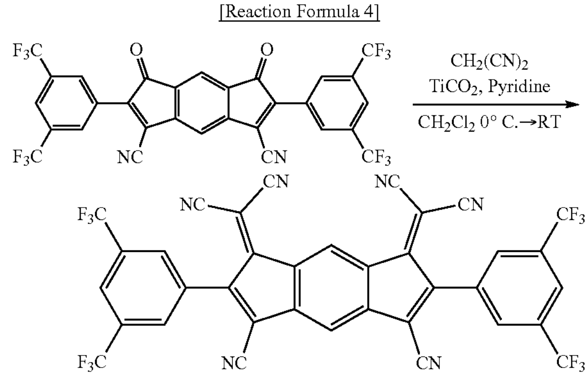

Into a 100 ml two-neck flask, 2,6-bis(3,5-bis(trifluoromethyl)phenyl)-3,5-dihydro-3,5-dioxos-indacene-1,7-dicarbonitrile (0.01 mol), malononitrile (0.062 mol), and dichloromethane ($CH_2Cl_2$) were placed, followed by stirring under an argon atmosphere for 30 minutes. Then, titanium tetrachloride ($TiCl_4$) (0.062 mol) was slowly added, followed by stirring at room temperature subsequent to addition of pyridine (0.1 mol). Then, extraction with a dichloromethane/ammonium chloride aqueous solution ($CH_2Cl_2$/aq.$NH_4Cl$) was performed, followed by drying an organic material layer over magnesium sulfate ($MgSO_4$), and then Compound [3] in solid state (2.1 g, yield: 27.75%) was obtained by column chromatography.

Comparative Example 1

In a vacuum chamber at a pressure of $5\times10^{-8}$ to $7\times10^{-8}$ torr, a tandem organic light emitting diode was fabricated by sequentially depositing the following layers on an ITO substrate:

A hole transport layer (NPD doped with 10 wt % of F4-TCNQ, 100 Å), a first hole transport layer (NPD, 1200 Å), a first light emitting material layer (blue light emitting material layer;

anthracene-based host doped with 4 wt % of pyrene dopant, 200 Å), a first electron transport layer (1,3,5-tri[(3-pyridyl)-phen-3-yl]benzene (TmPyPB), 100 Å), a first N-type charge generation layer (Bphen doped with 2 wt % of $L^1$; 100 Å), a first P-type charge generation layer (HATCN, 200 Å), a second hole transport layer (NPD, 200 Å), a second light emitting material layer (yellow light emitting material layer; CBP-based host doped with 10% of Ir complex, 200 Å), a second electron transport layer ($Alq_3$, 100 Å), a second N-type charge generation layer (Bphen doped with 2 wt % of $L^1$; 100 Å), a second P-type charge generation layer (HATCN, 200 Å), a third hole transport layer (NPD, 200 Å), a third light emitting material layer (blue light emitting material layer, CBP-based host doped with Ir complex, 200 Å), a third electron transport layer (TmPyPB, 100 Å), an electron injection layer (LiF, 10 Å), and a cathode (aluminum; 2000 Å).

<Bphen>

4,7-diphenyl-1,10-phenanthroline

<HATCN>

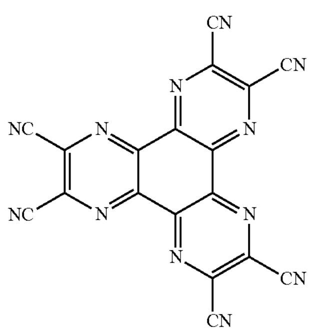 [SMILES: N#Cc1nc2c3nc(C#N)c(C#N)nc3c3nc(C#N)c(C#N)nc3c2nc1C#N]

Comparative Example 2

A tandem organic light emitting diode was fabricated in the same manner as in Comparative Example 1 except that, as a host for the first and second N-type charge generation layers, Compound [1] was used instead of Bphen.

Comparative Example 3

A tandem organic light emitting diode was fabricated in the same manner as in Comparative Example 1 except that, as a host for the first and second P-type charge generation layers, Compound [3] was used instead of HATCN.

Comparative Example 4

A tandem organic light emitting diode was fabricated in the same manner as in Comparative Example 1 except that, as a host for the first and second N-type charge generation layers, Compound [2] was used instead of Bphen.

Example 1

A tandem organic light emitting diode was fabricated in the same manner as in Comparative Example 1 except that, as a host for the first and second N-type charge generation layers, Compound [1] was used instead of Bphen and, as a host for the first and second P-type charge generation layers, Compound [3] was used instead of HATCN.

Example 2

A tandem organic light emitting diode was fabricated in the same manner as in Comparative Example 1 except that, as a host for the first and second N-type charge generation layers, Compound [2] was used instead of Bphen and, as a host for the first and second P-type charge generation layers, Compound [3] was used instead of HATCN.

(Evaluation)

In evaluation of driving voltage, a difference between a value measured on each of Examples 1 to 2 and Comparative Examples 2 to 4 and a value measured on Comparative Example 1 was calculated. Results are shown in Tables 1 and 2.

In evaluation of luminance-external quantum efficiency (EQE), a value measured on Comparative Example 1 was set as 100% and a value measured on each of Examples 1 to 2 and Comparative Examples 2 to 4 was converted relative value thereto. Results are shown in Tables 1 and 2.

In evaluation of lifespan, the time ($T_{95}$) taken for the luminance (L) of each of Examples 1 to 2 and Comparative Examples 1 to 4 to reach 95% of initial luminance thereof ($L_0$, 3,000 nit) was measured. A value measured on Comparative Example 1 was set as 100% and the other measured values were converted relative value thereto. Results are shown in Tables 1 and 2.

Experimental Example 1

Evaluation of Characteristics of Organic Light Emitting Diode

Operation characteristics of the tandem organic light emitting diodes fabricated in Example 1 and Comparative Examples 1 to 3 were evaluated.

Results are shown in Table 1.

TABLE 1

| | Current density @10 mA/cm$^2$ | | | |
|---|---|---|---|---|
| Item | Driving voltage (V) | | EQE (%) | $T_{95}$ (%) |
| Comparative Example 1 | — | — | — | — |
| Comparative Example 2 | −0.20 | −0.10 | 100 | 123 |
| Comparative Example 3 | −0.19 | −0.35 | 101 | 126 |
| Example 1 | −0.31 | −0.48 | 100 | 143 |

Figure 3:
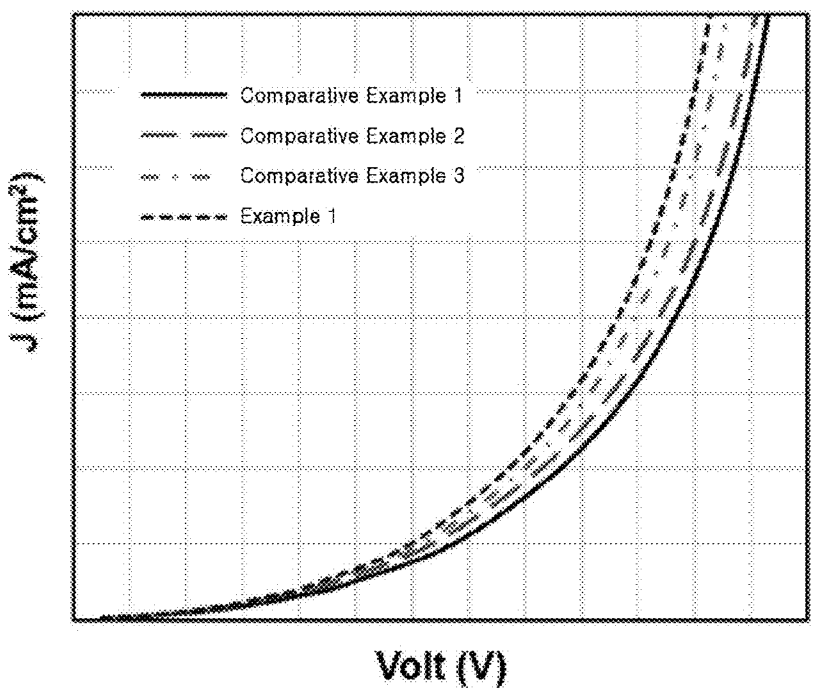
FIG. 3 to FIG. 5 are graphs showing results of determining current density, current efficiency, external quantum efficiency (EQE), and lifespan of tandem organic light emitting diodes fabricated in Example 1 and Comparative Examples 1 to 3.
Figure 4:
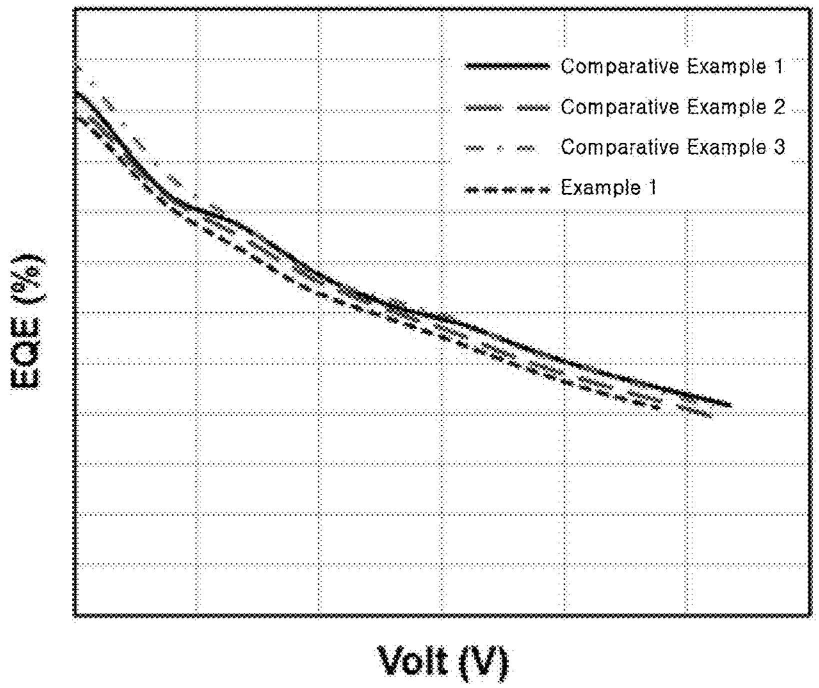
Figure 5:
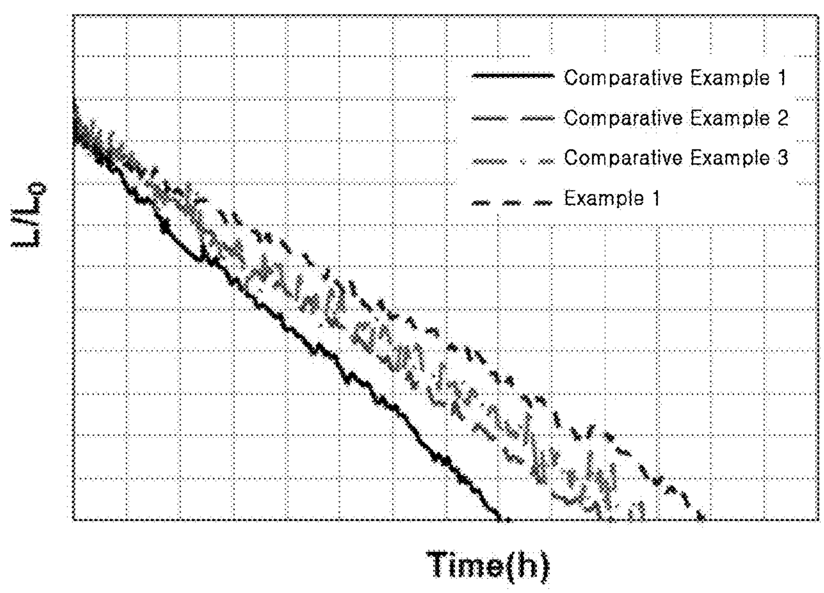

FIG. 3 to FIG. 5 are graphs showing results of Experimental Example 1 in which the organic light emitting diodes fabricated in Example 1 and Comparative Examples 1 to 3 were evaluated as to voltage-current density, luminance-external quantum efficiency (EQE), and lifespan.

Experimental Example 2

Evaluation of Characteristics of Organic Light Emitting Diode

Operation characteristics of the tandem organic light emitting diodes fabricated in Example 2 and Comparative Examples 1, 3, and 4 were evaluated.

Results are shown in Table 2.

TABLE 2

| | Current density @10 mA/cm$^2$ | | | |
|---|---|---|---|---|
| Item | Driving voltage (V) | | EQE (%) | $T_{95}$ (%) |
| Comparative Example 1 | — | — | — | — |
| Comparative Example 3 | −0.20 | −0.38 | 101 | 118 |
| Comparative Example 4 | −0.12 | −0.07 | 98 | 102 |
| Example 2 | −0.37 | −0.45 | 100 | 140 |

Figure 6:
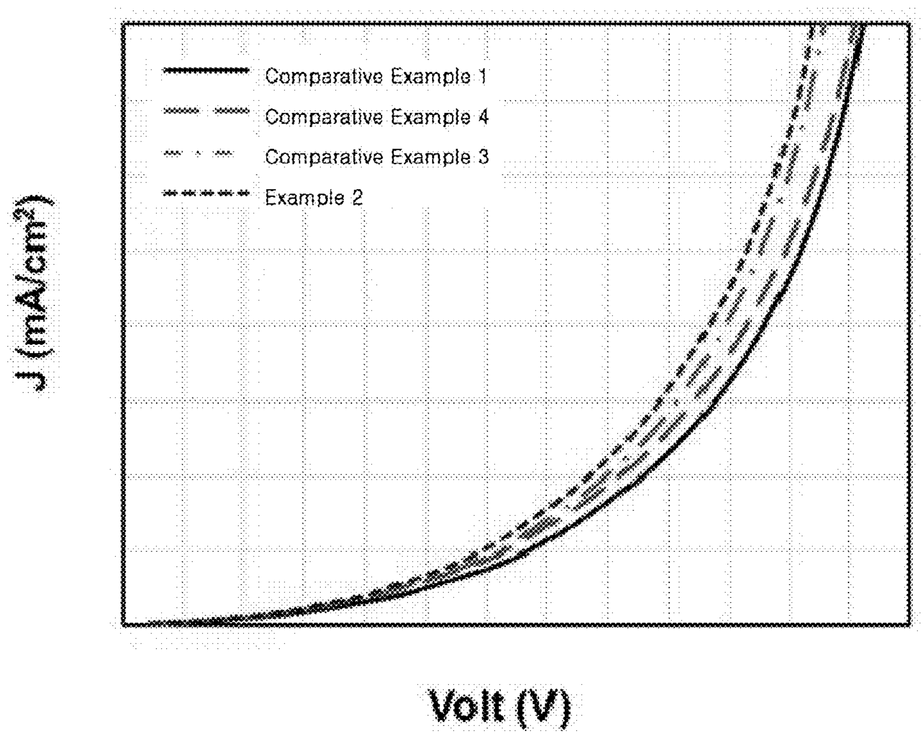
FIG. 6 to FIG. 8 are graphs showing results of determining current density, current efficiency, external quantum efficiency (EQE), and lifespan of tandem organic light emitting diodes fabricated in Example 2 and Comparative Examples 1, 2, and 4.
Figure 7:
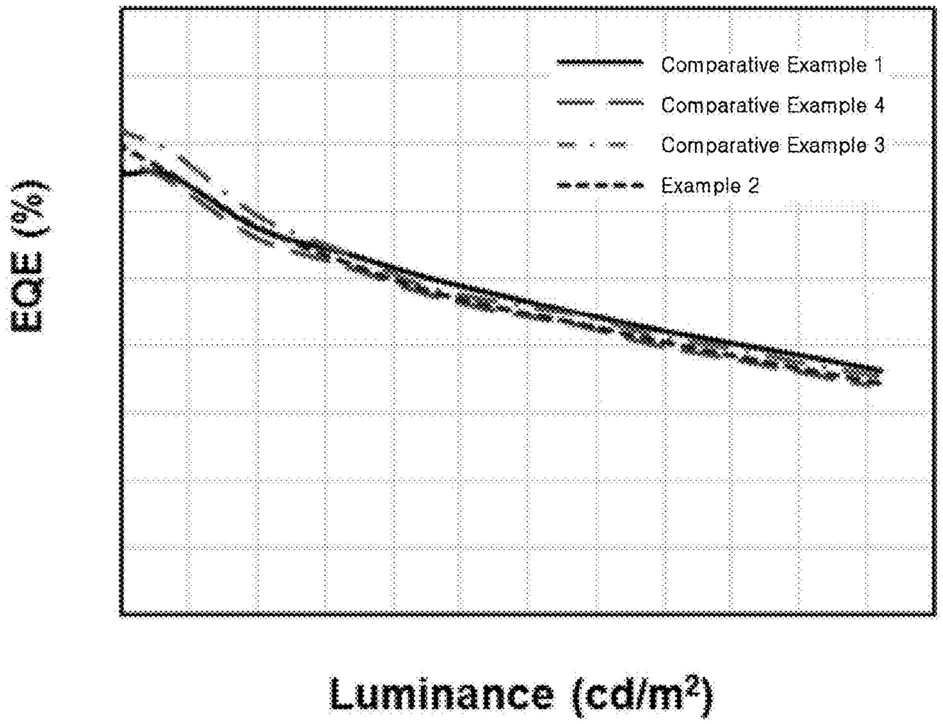
Figure 8:
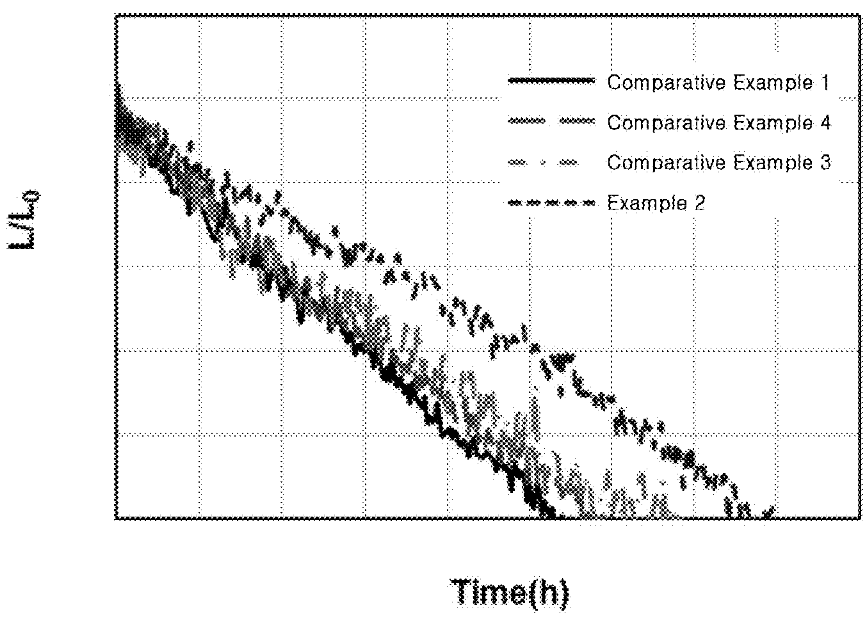

FIG. 6 to FIG. 8 are graphs showing results of Experimental Example 2 in which the organic light emitting diodes fabricated in Example 2 and Comparative Examples 1, 3, and 4 were evaluated as to voltage-current density, luminance-external quantum efficiency (EQE), and lifespan.

Therefore, it can be seen, the material for N-type charge generation layers and the material for P-type charge generation layers of the disclosure can secure low driving voltage and long lifespan of an organic light emitting diode when used in the organic light emitting diode Although the present disclosure has been described with reference to some embodiments in conjunction with the accompanying drawings, it should be understood that the foregoing embodiments are provided for illustration only and are not to be in any way construed as limiting the present disclosure, and that various modifications, changes, alterations, and equivalent embodiments can be made by those skilled in the art without departing from the spirit and scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

It is understood that each choice for substituents of Formulae 1, 2, 3 and 4 provide that all valences are satisfied.

What is claimed is:

1. An organic light emitting diode, comprising:

at least two light emitting stacks interposed between an anode and a cathode and comprising at least one light emitting material layer; and a charge generation layer interposed between the light emitting stacks, wherein the charge generation layer comprises an N-type charge generation layer and a P-type charge generation layer, the N-type charge generation layer is positioned between the anode and the P-type charge generation layer, and the P-type charge generation layer is positioned proximate to the cathode and the N-type charge generation layer, wherein the N-type charge generation layer comprises a compound represented by one of the following formulae wherein Ph is a phenyl group:

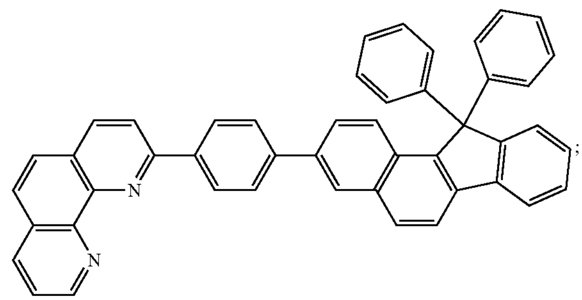
;

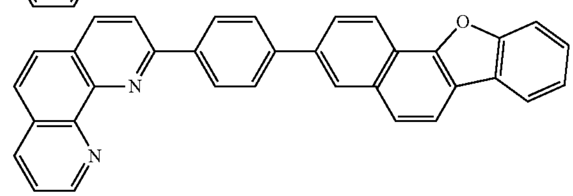
;

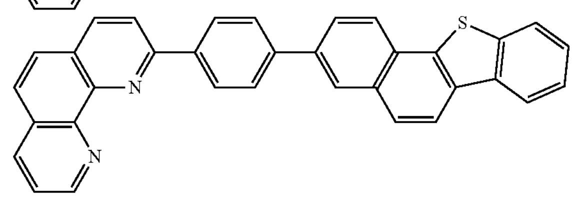
;

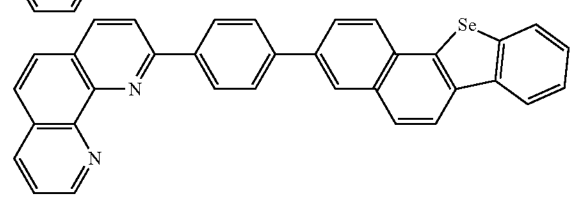
;

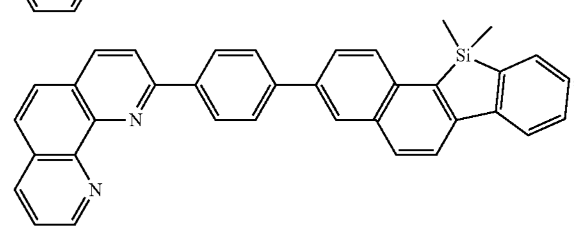
;

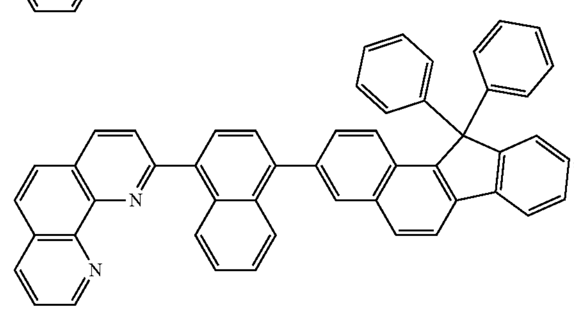
;

-continued
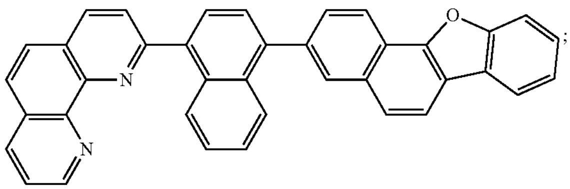
;
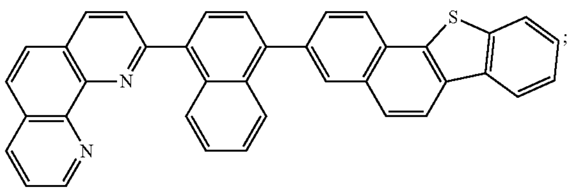
;
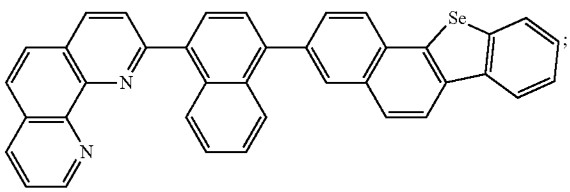
;
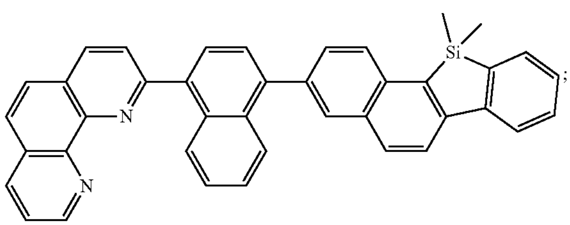
;
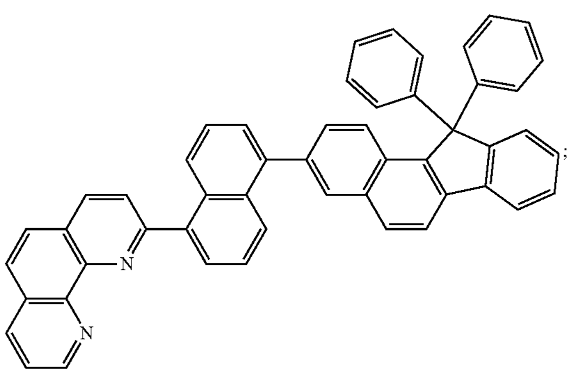
;
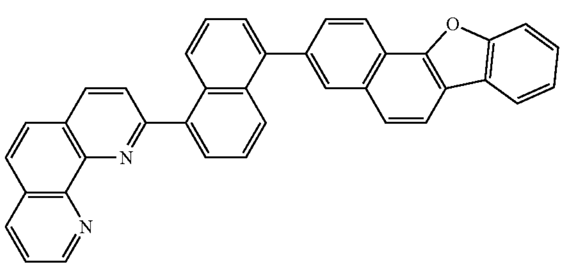
;
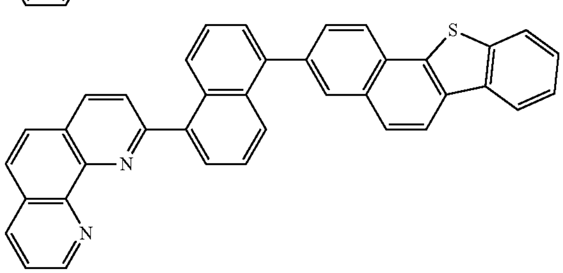
;
-continued
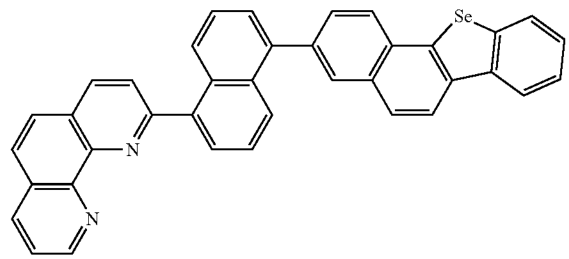
;
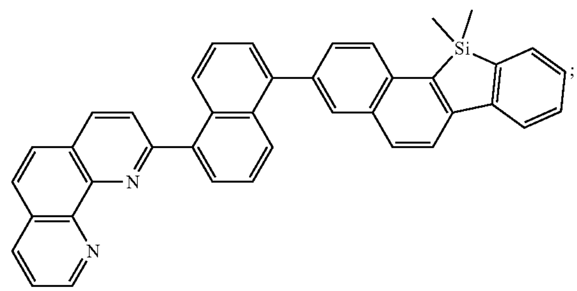
;
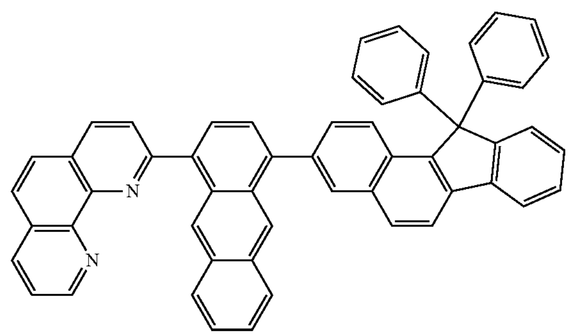
;
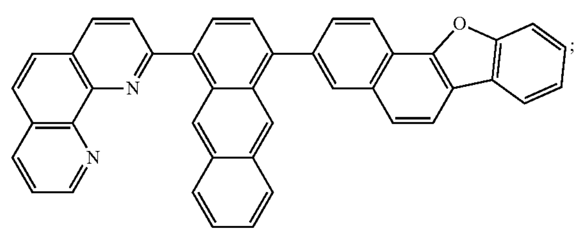
;
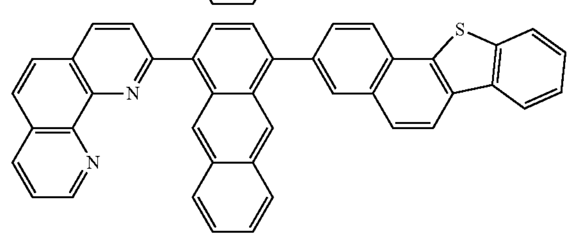
;
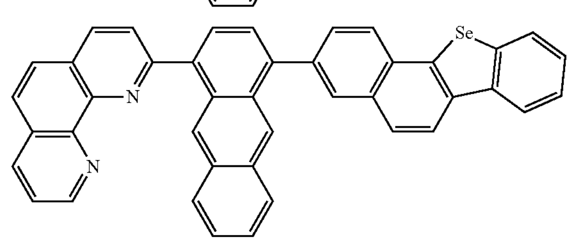
;

-continued
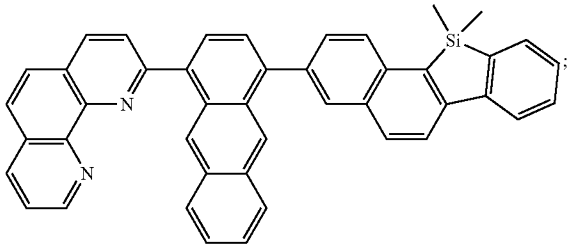
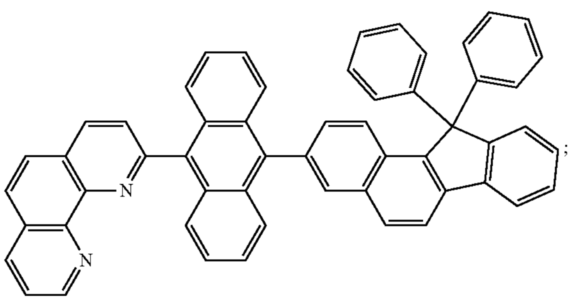
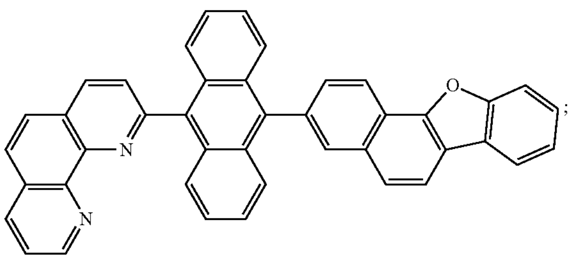
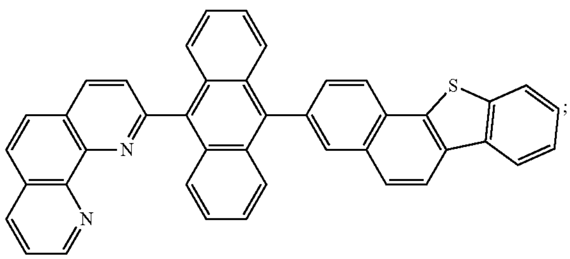
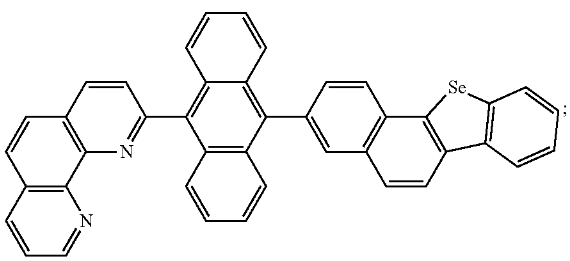
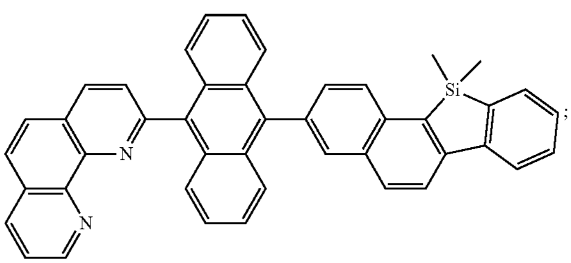
-continued
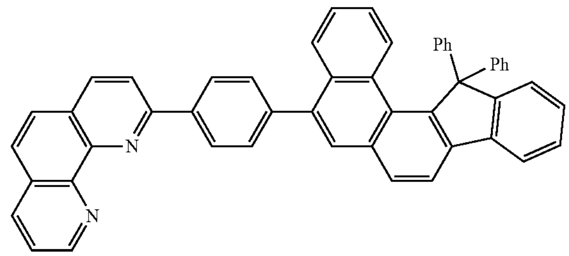
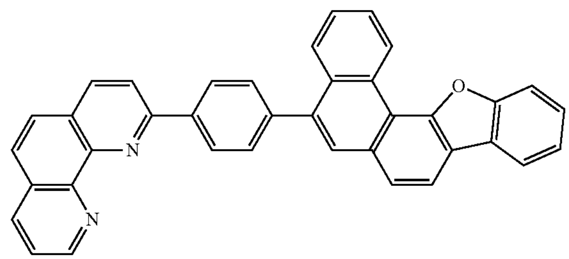
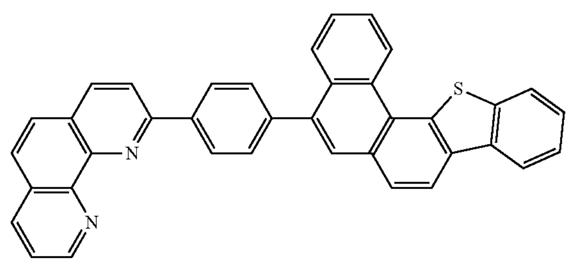
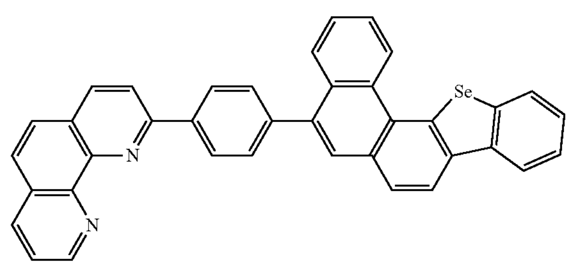
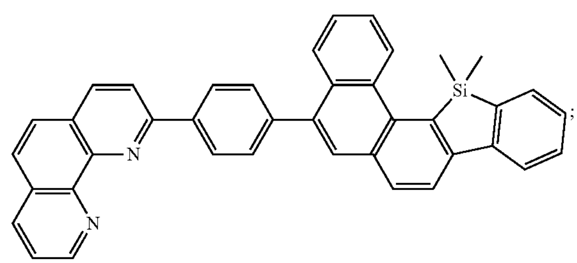
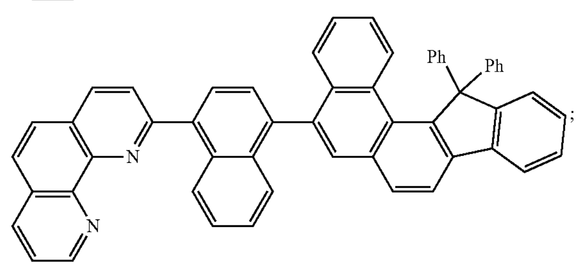

-continued
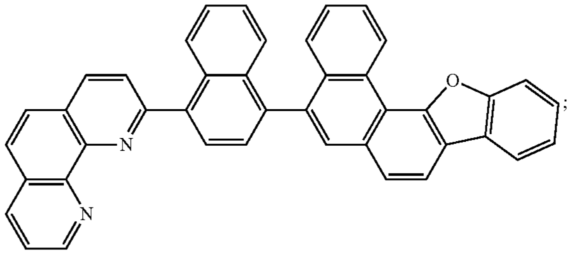
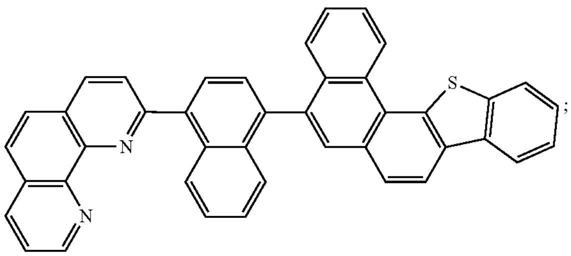
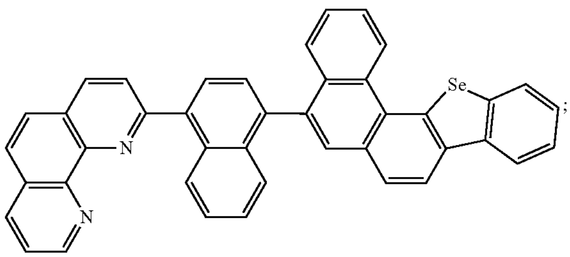
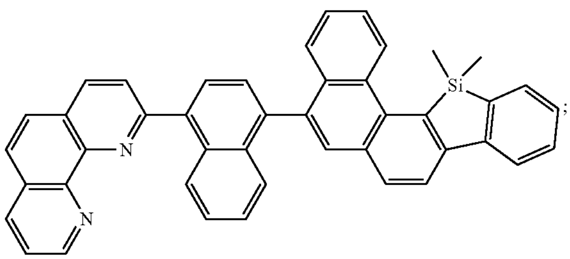
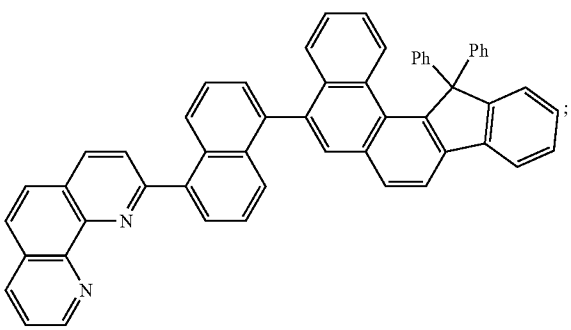
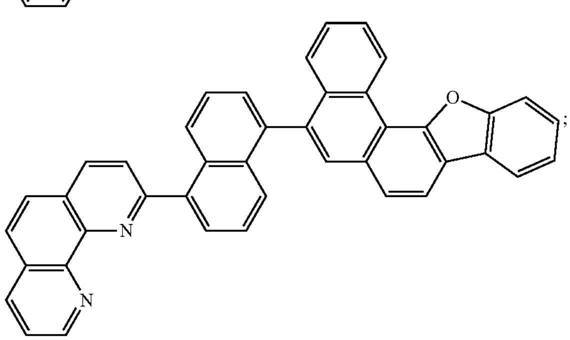
-continued
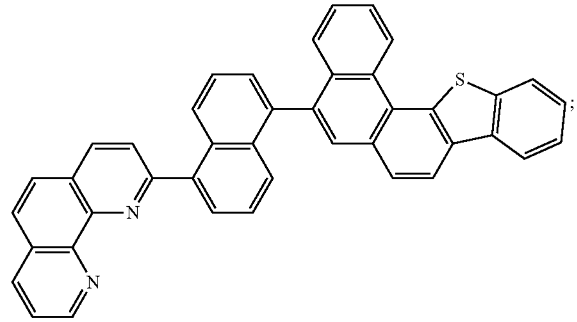
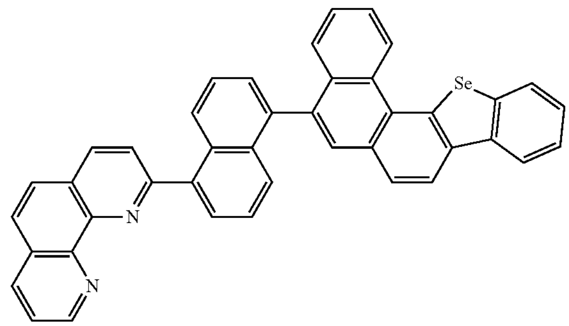
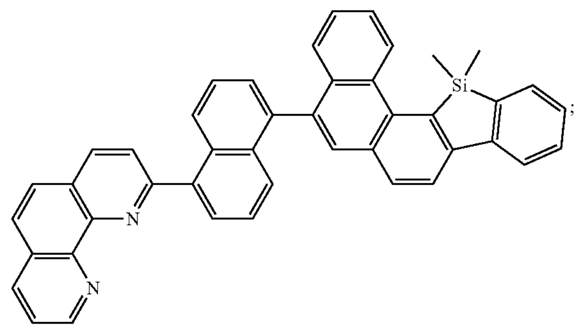
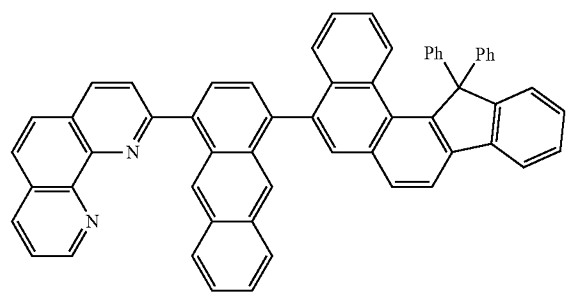
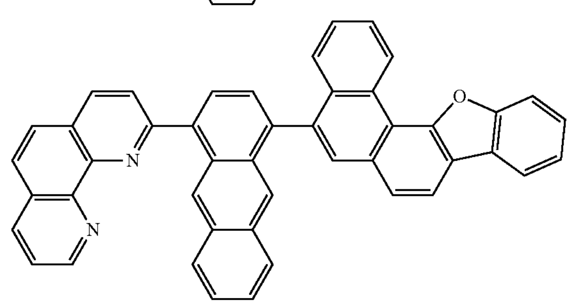

-continued
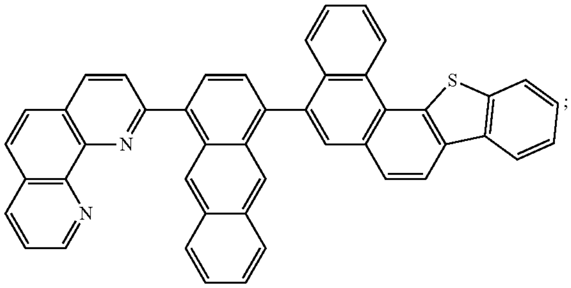
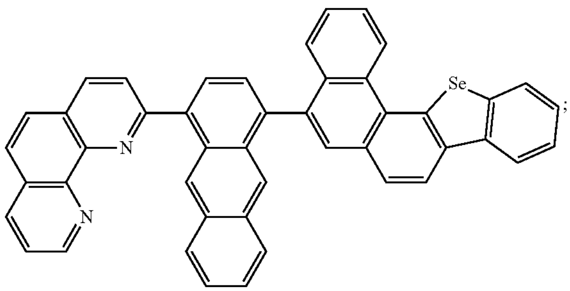
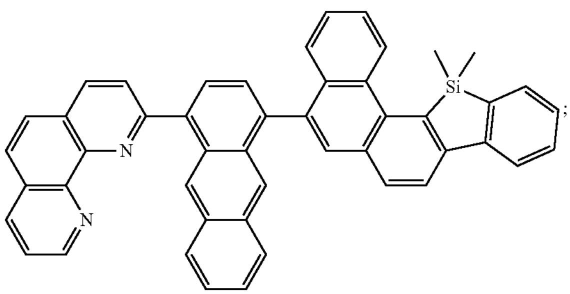
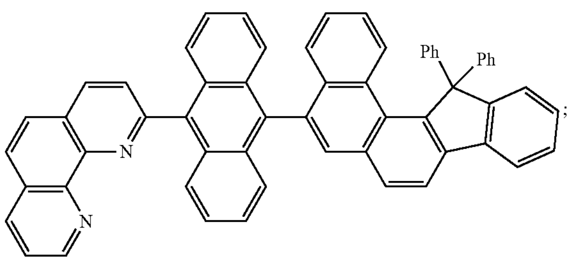
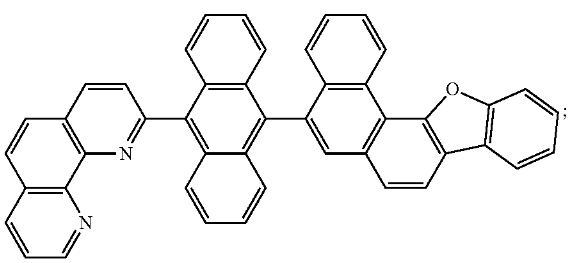
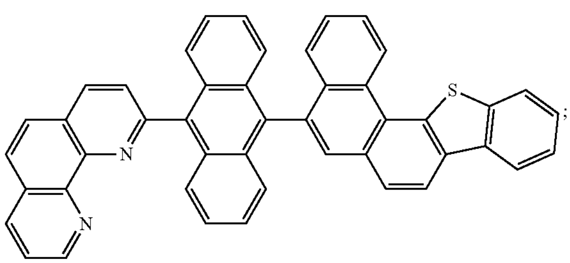
-continued
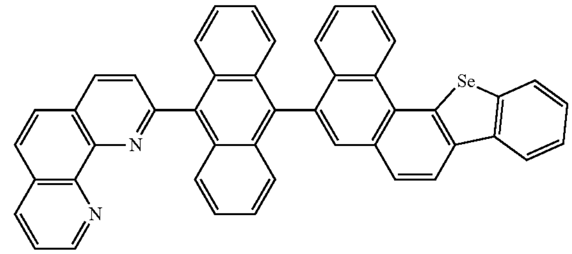
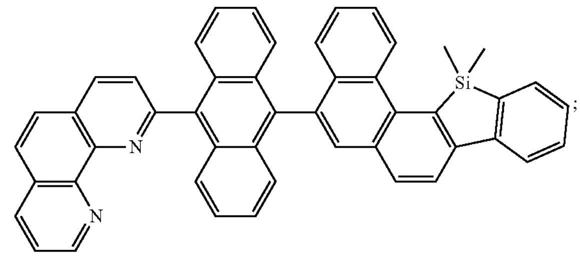
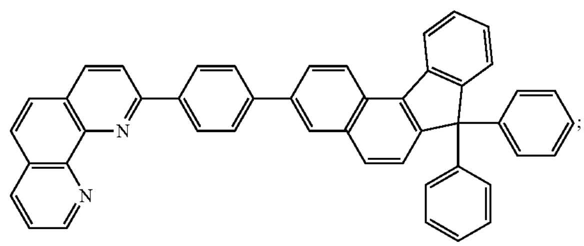
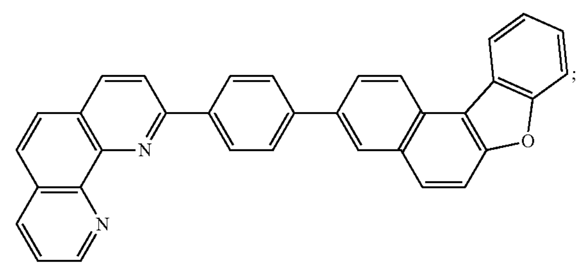
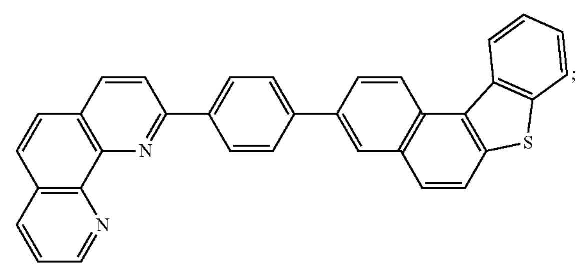
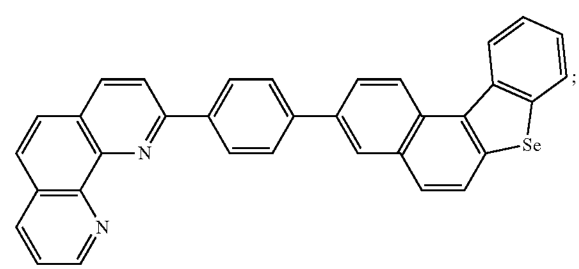

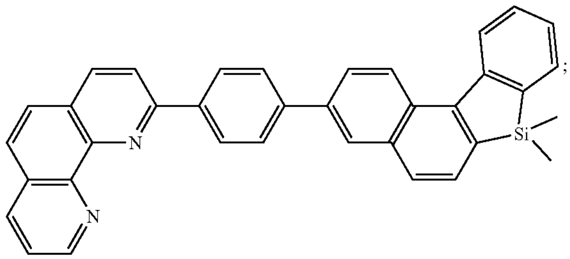
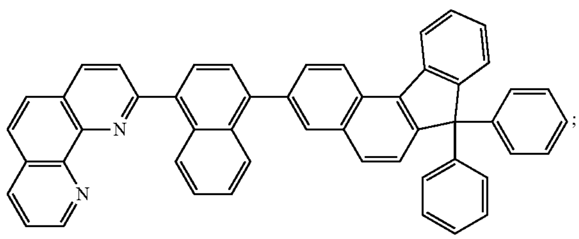
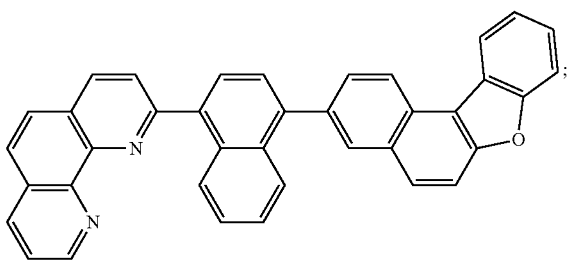
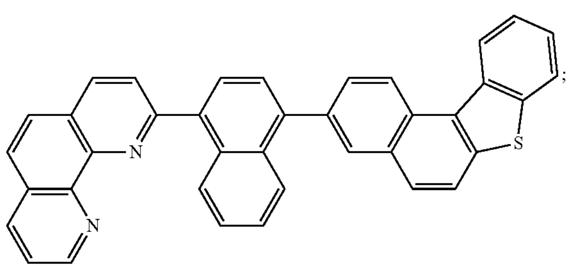
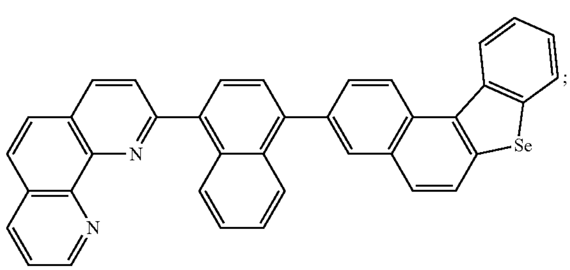
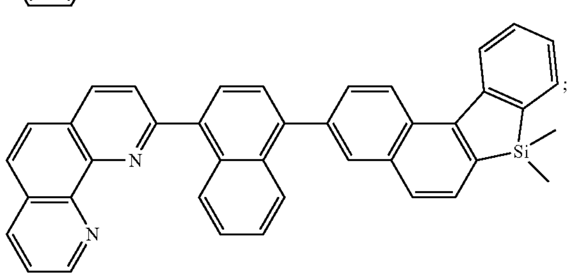
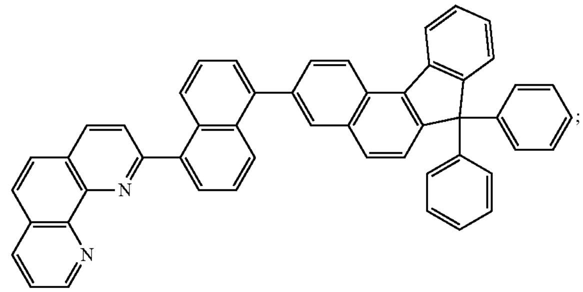
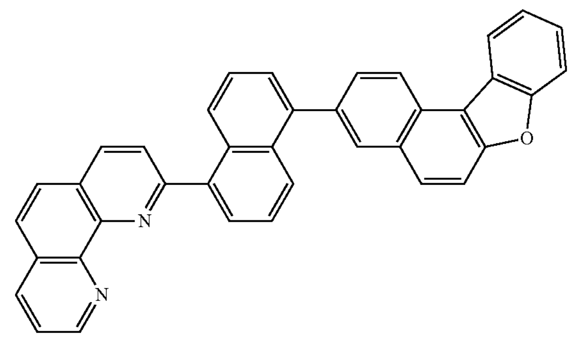
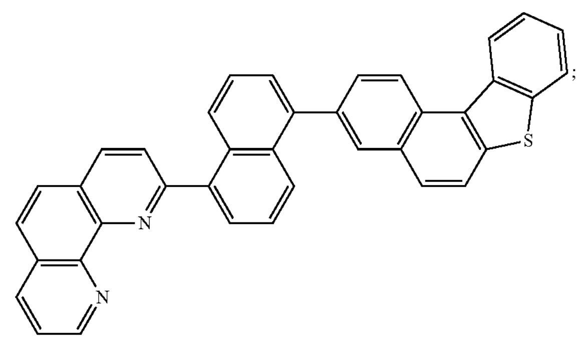
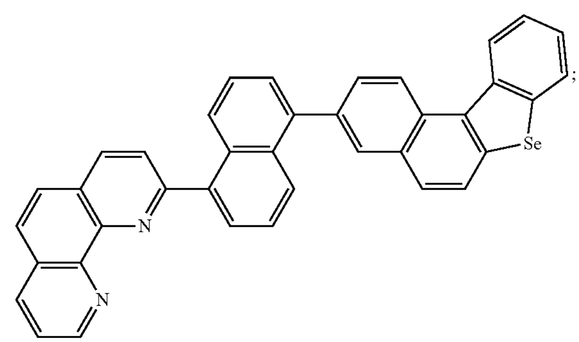
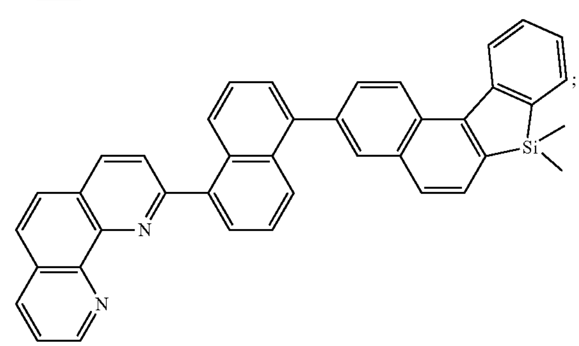

-continued
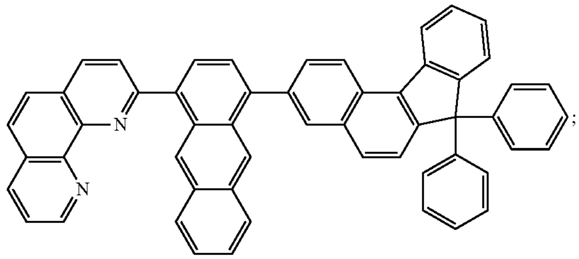
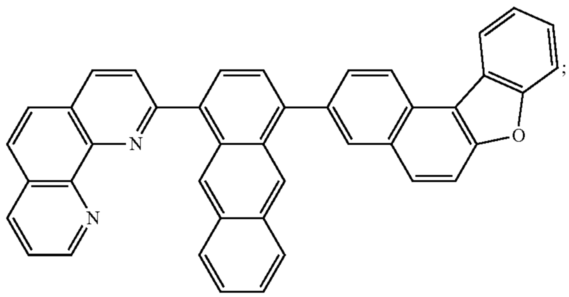
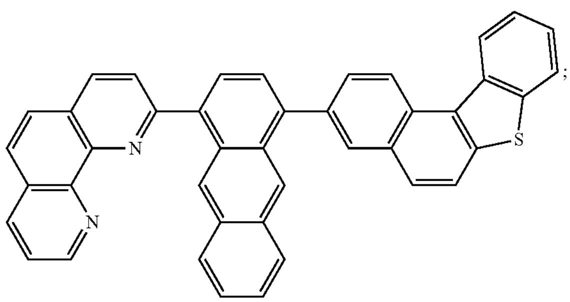
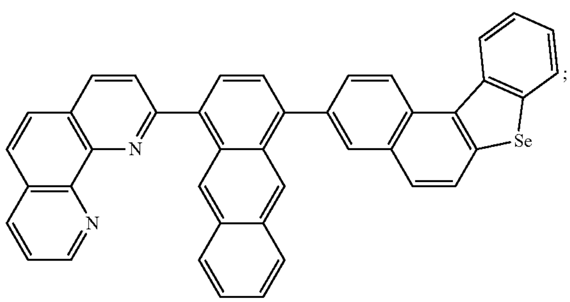
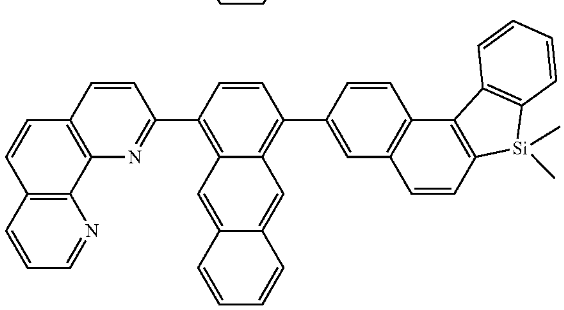
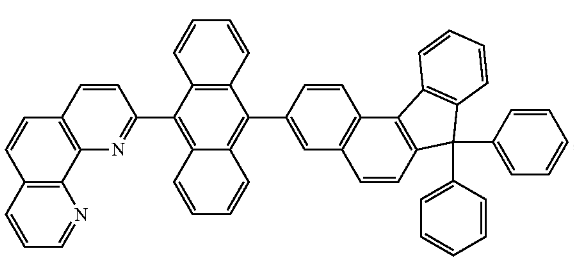
-continued
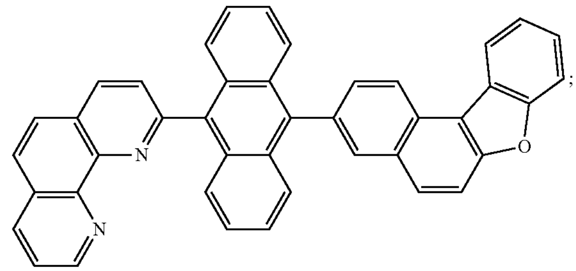
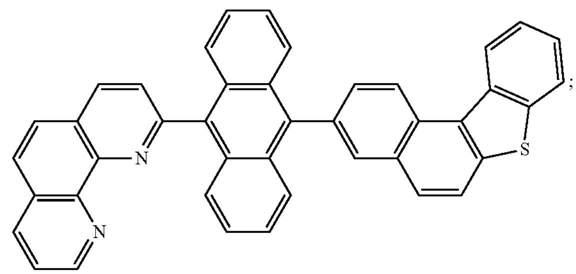
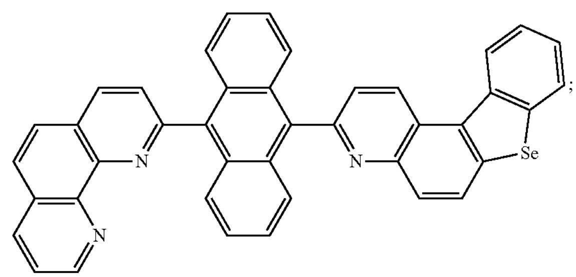
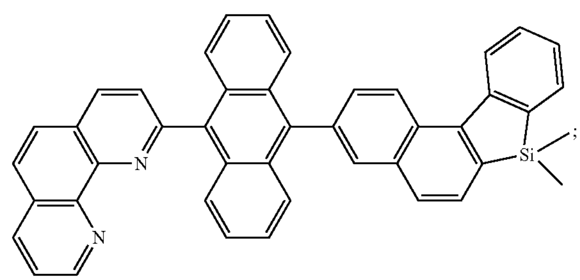
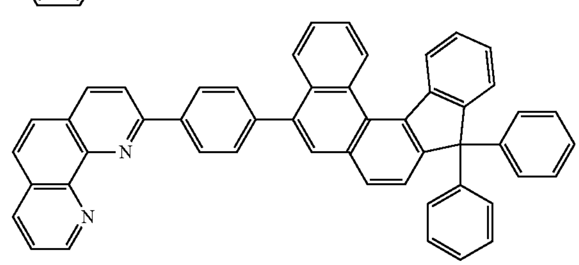
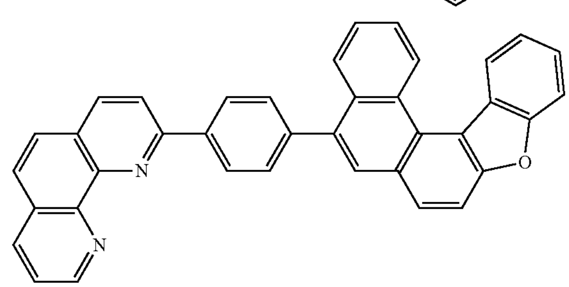

-continued
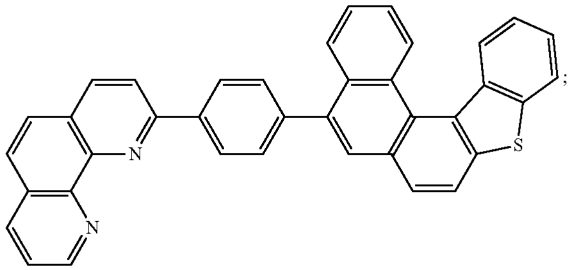
;
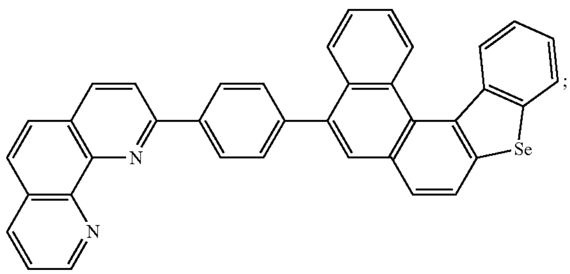
;
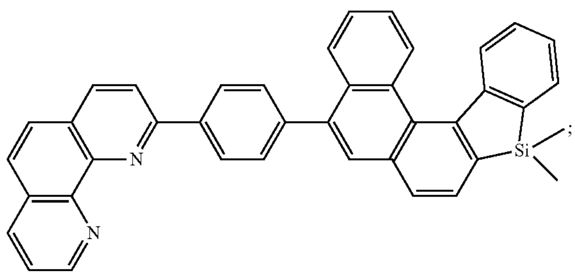
;
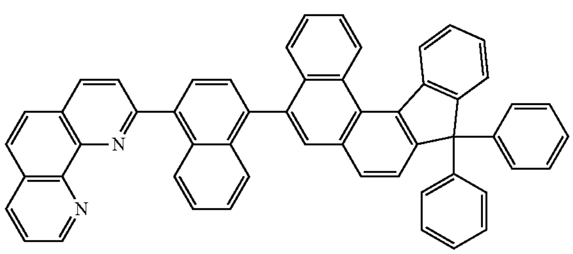
;
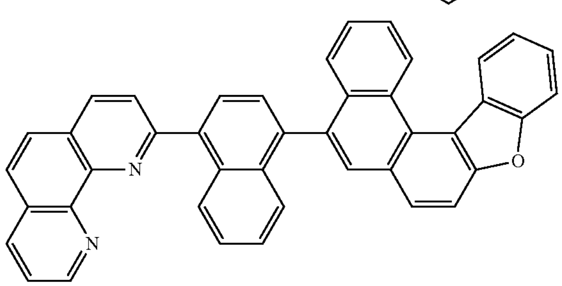
;
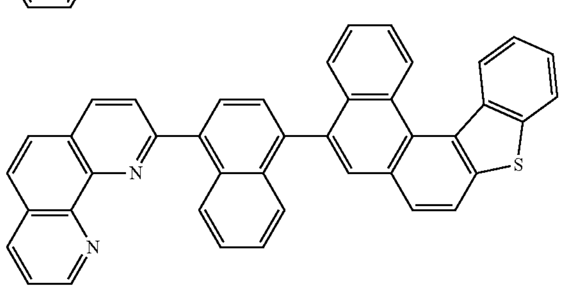
;
-continued
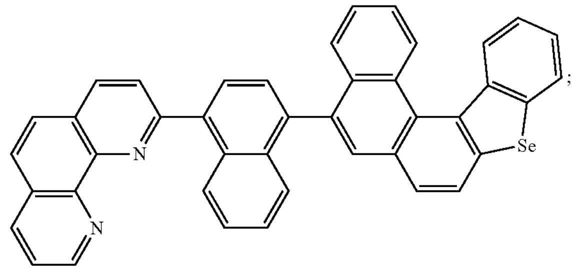
;
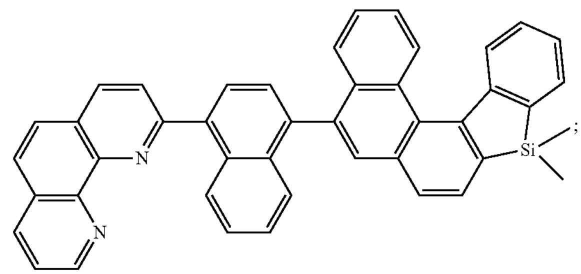
;
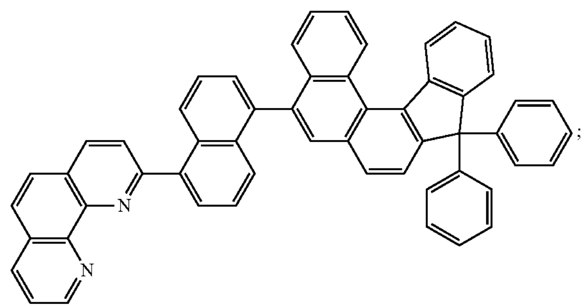
;
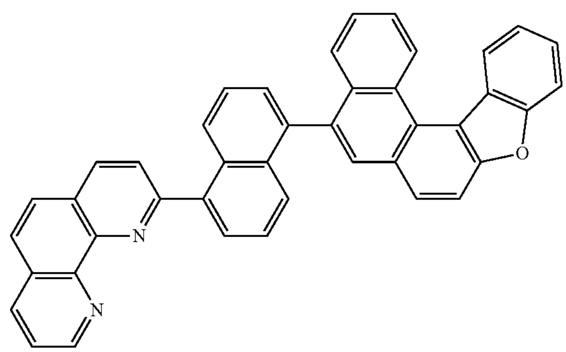
;
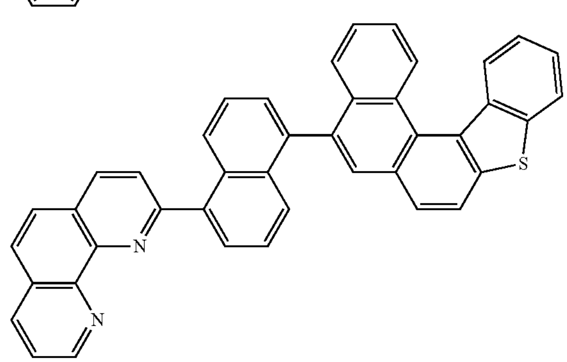
;

-continued
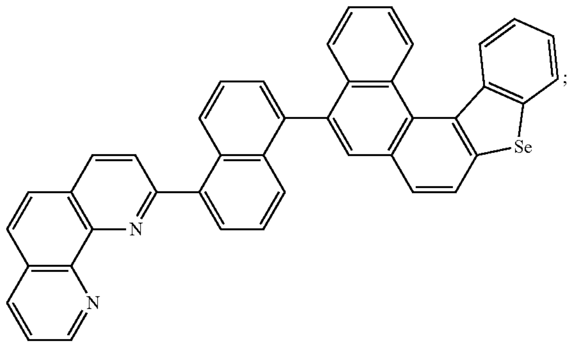
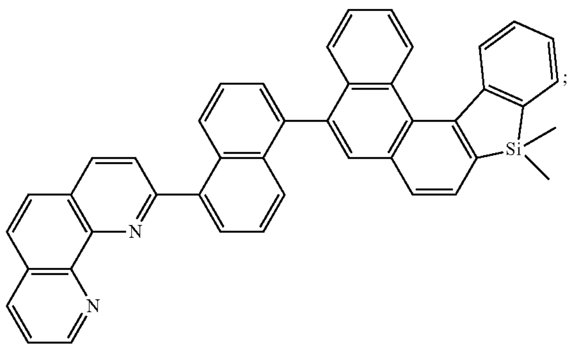
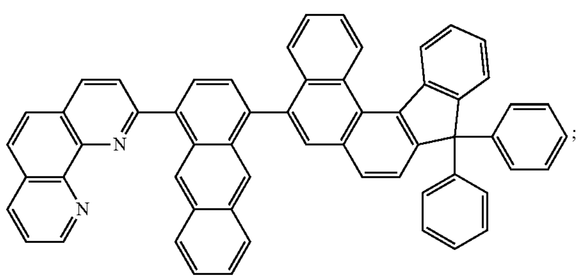
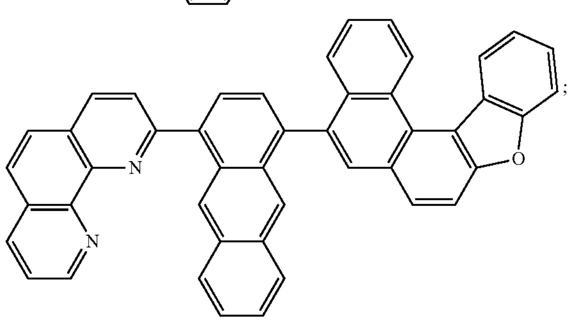
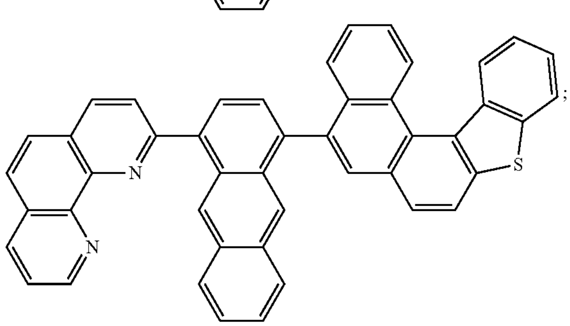
-continued
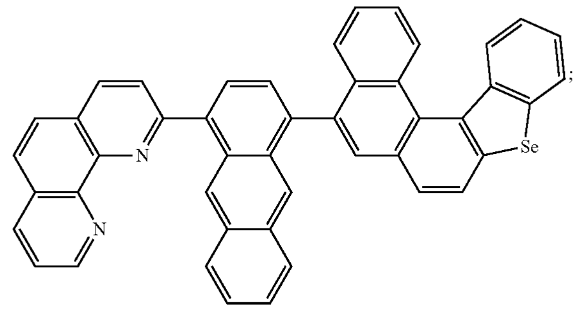
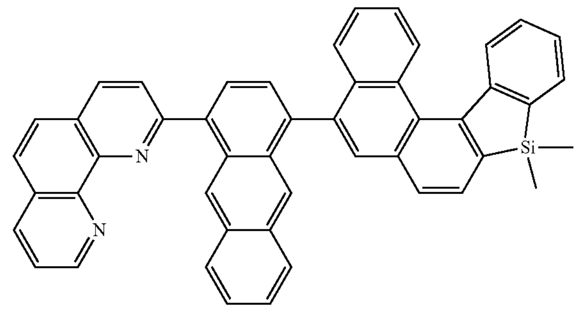
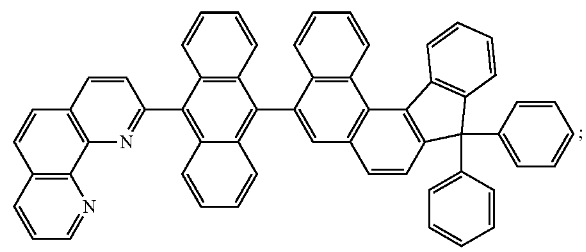
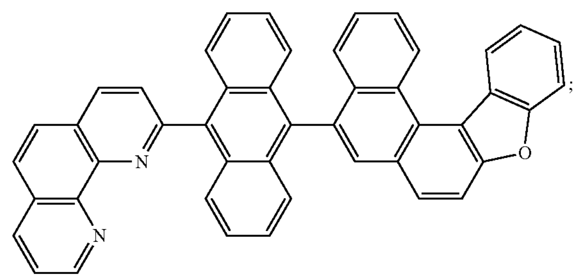
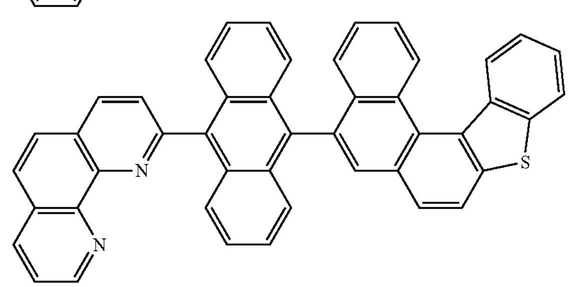
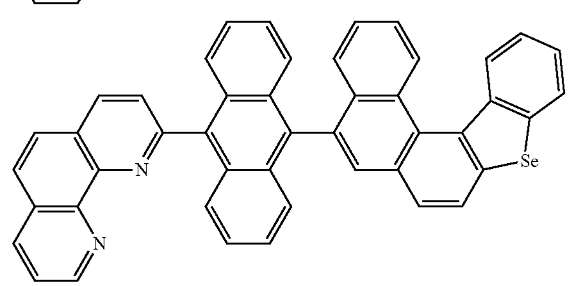

-continued
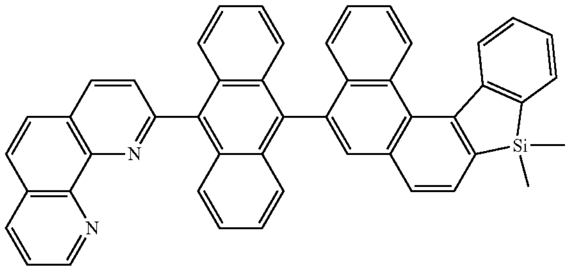
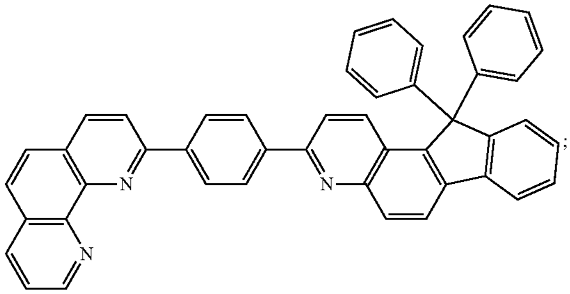
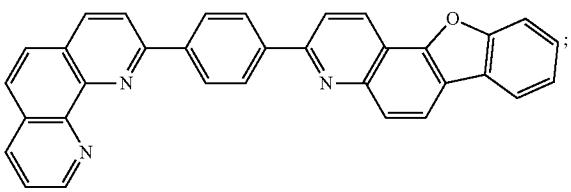
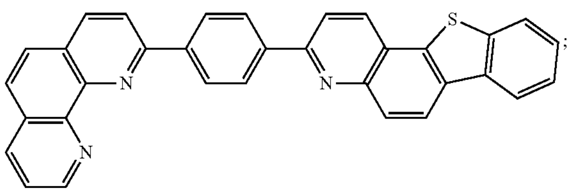
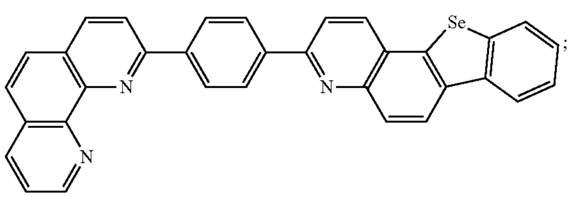
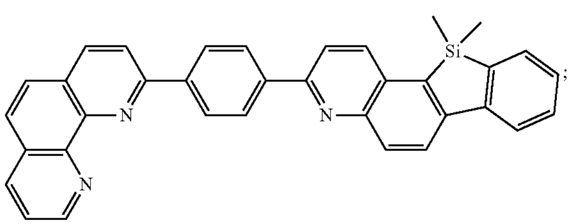
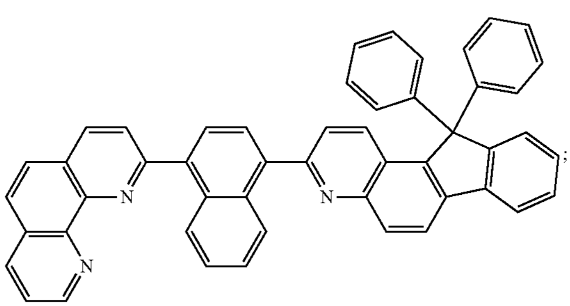
-continued
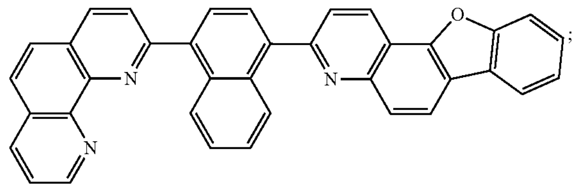
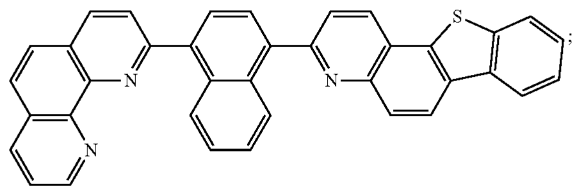
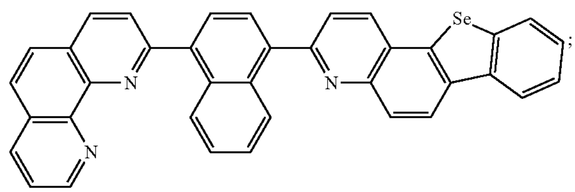
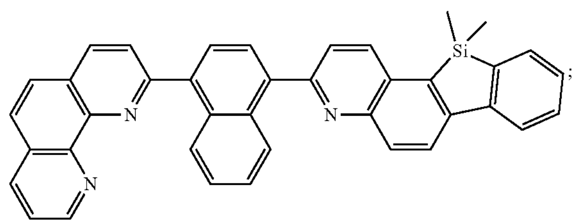
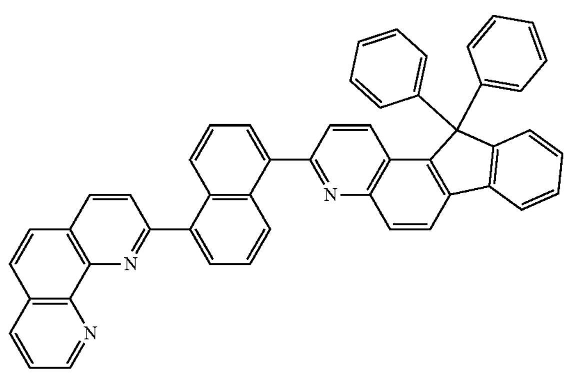
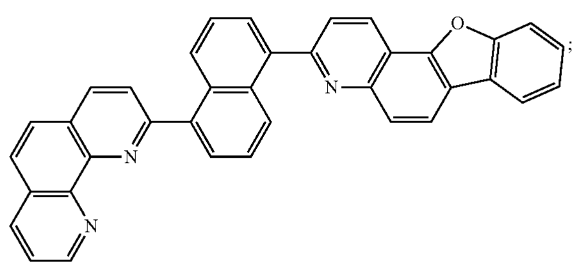
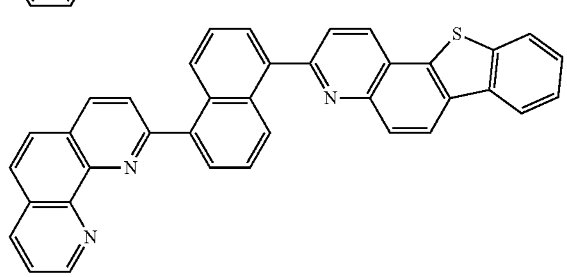

-continued
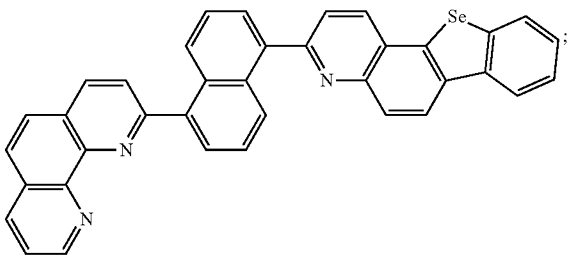
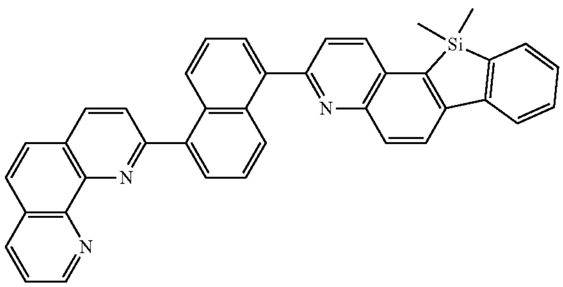
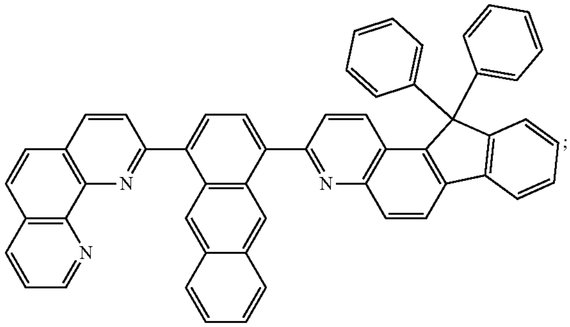
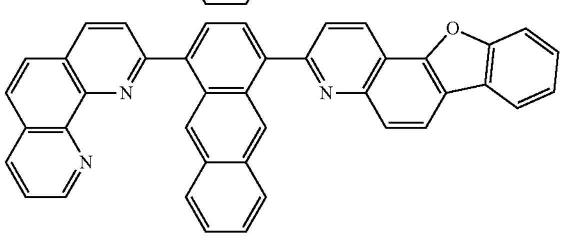
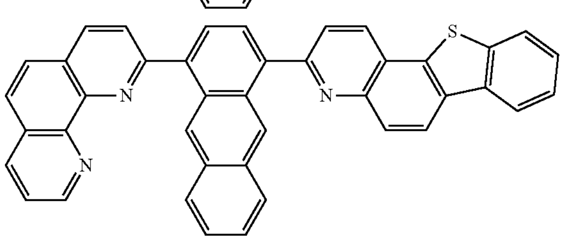
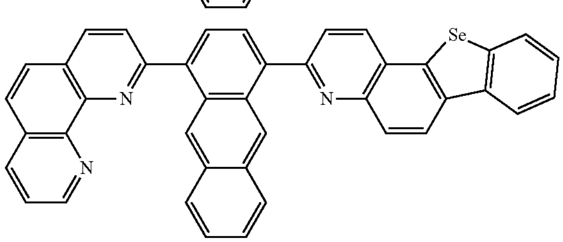
-continued
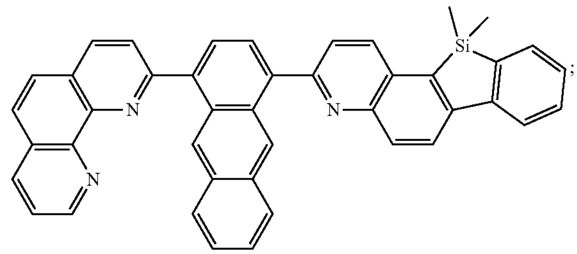
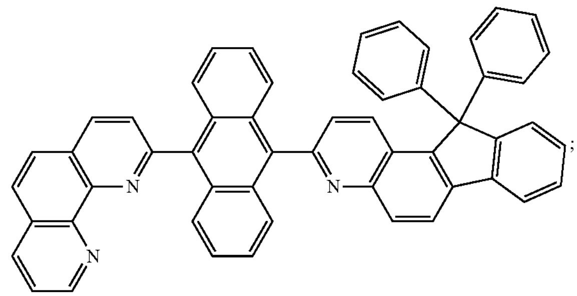
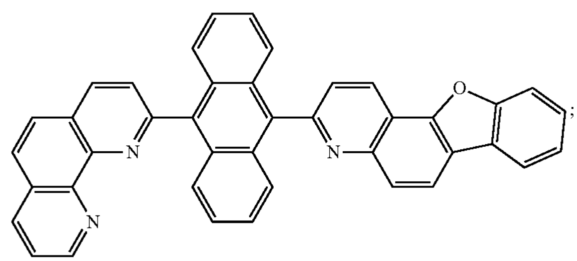
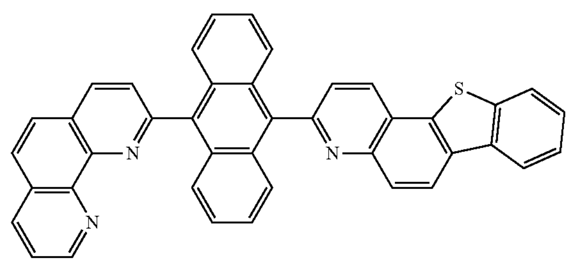
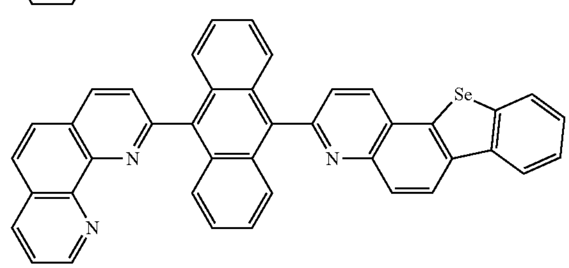
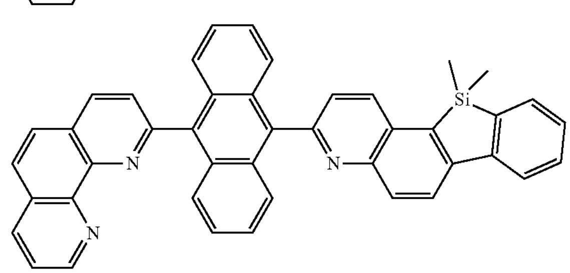

-continued
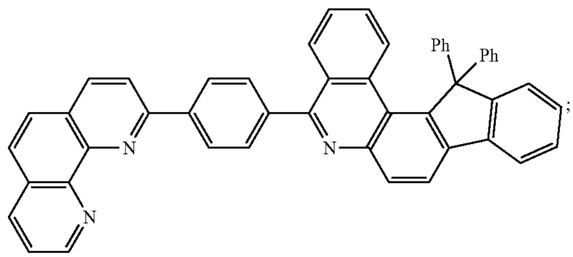
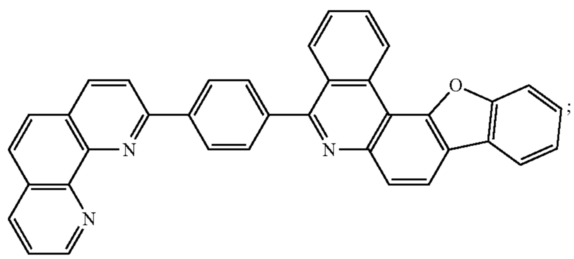
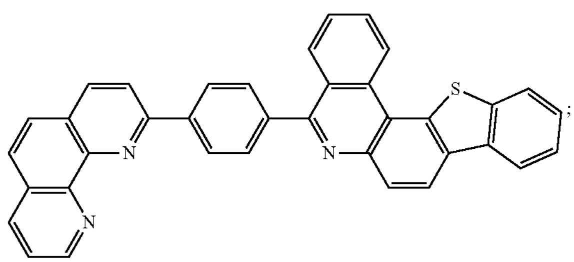
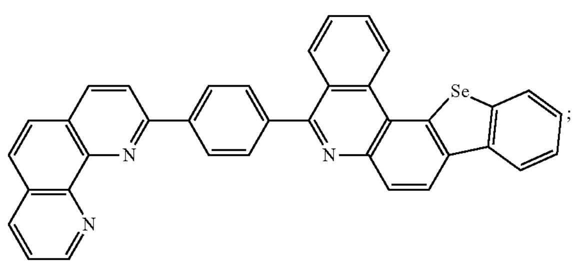
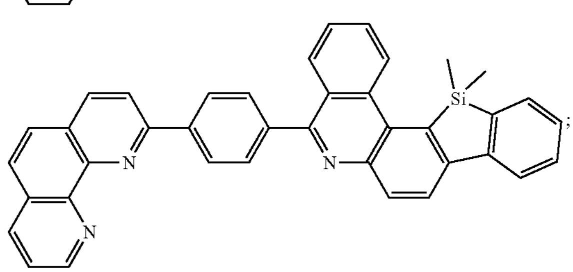
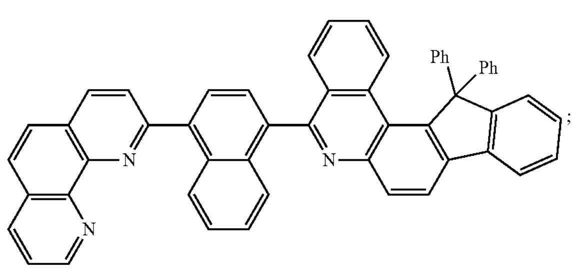
-continued
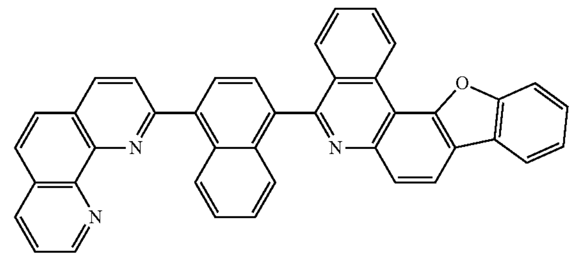
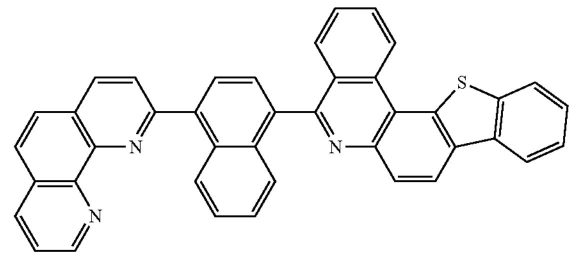
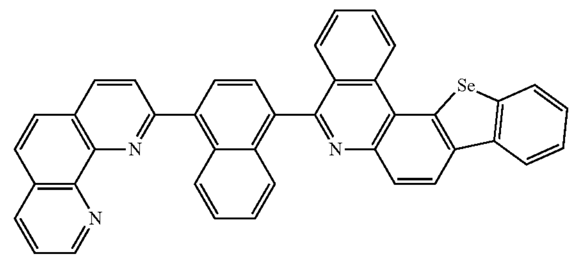
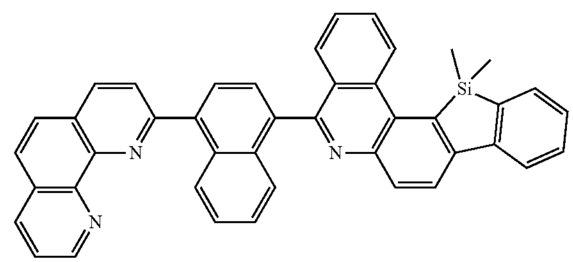
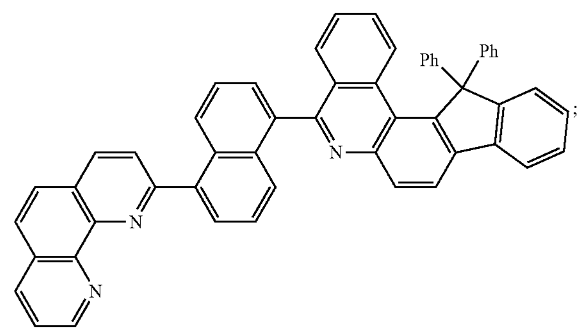
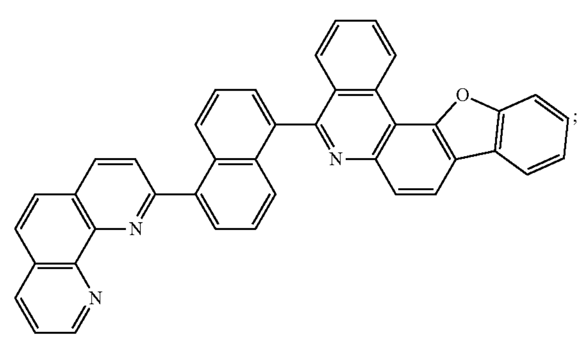

-continued
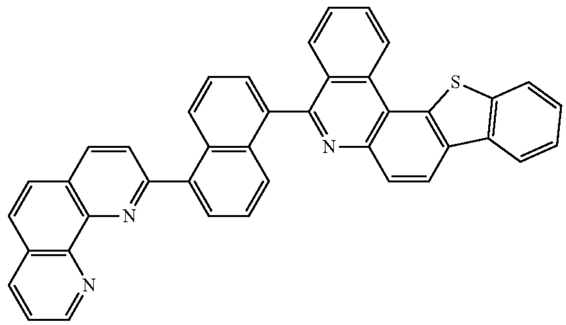
;
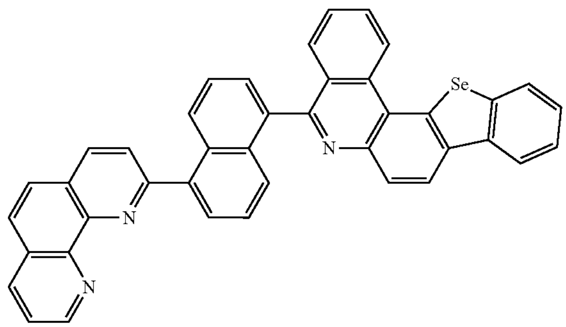
;
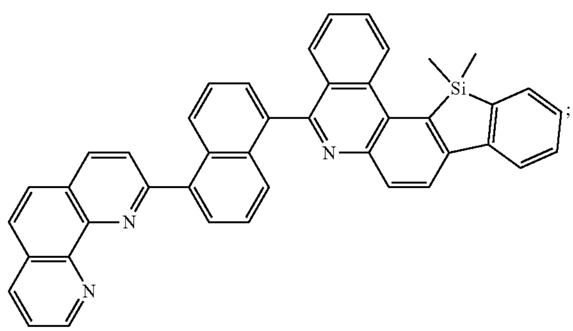
;
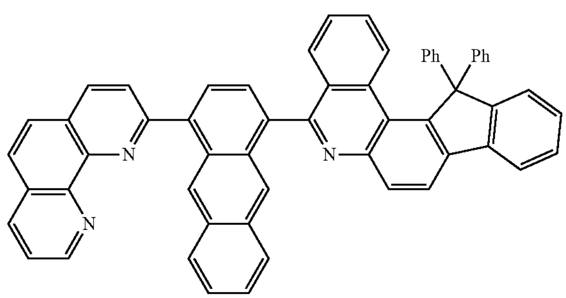
;
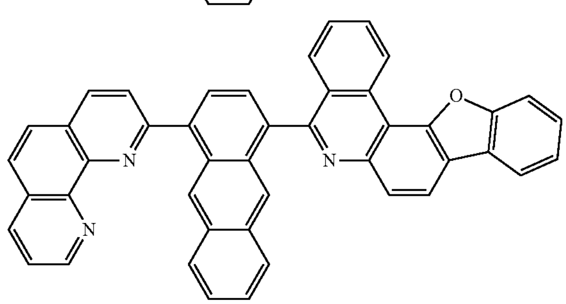
;
-continued
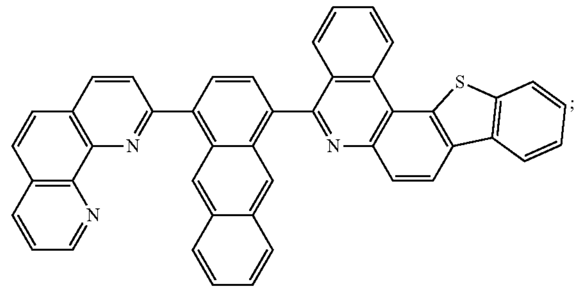
;
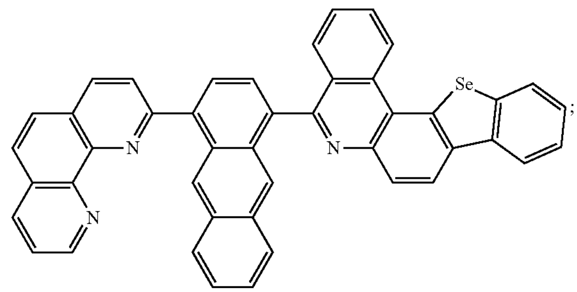
;
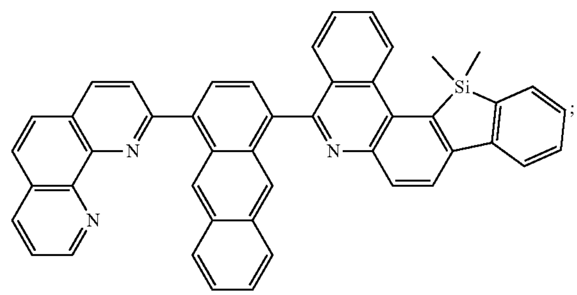
;
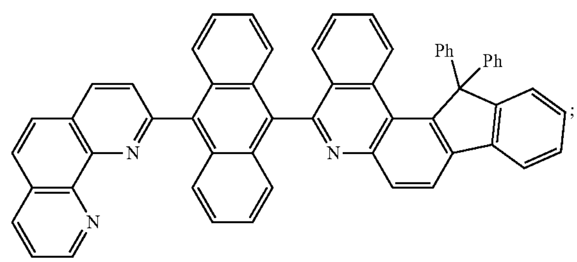
;
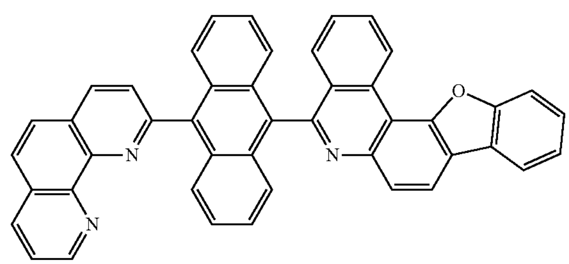
;
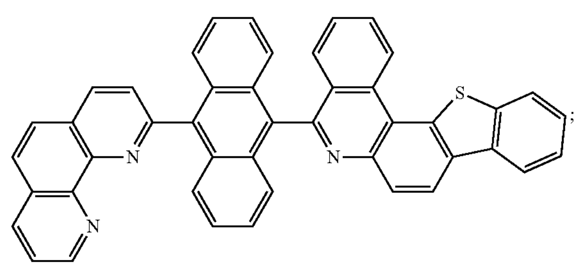
;

-continued
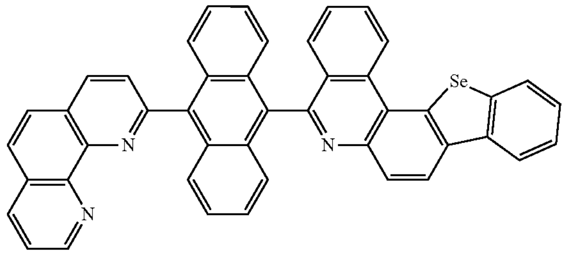
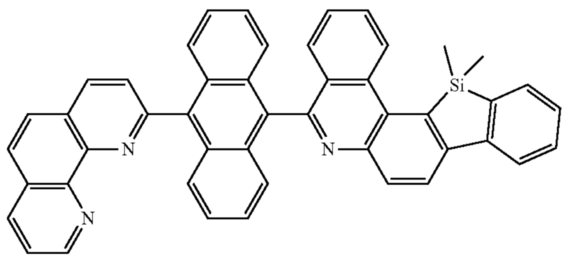
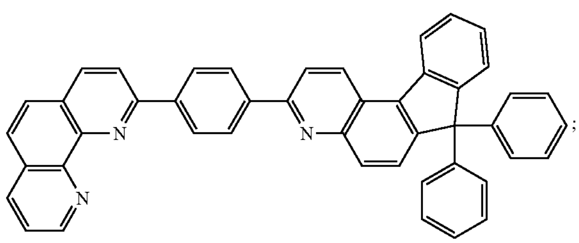
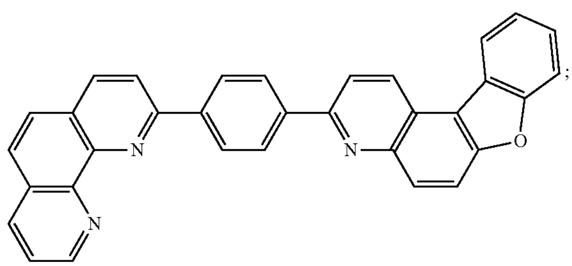
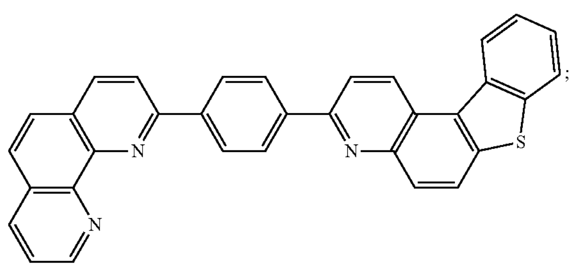
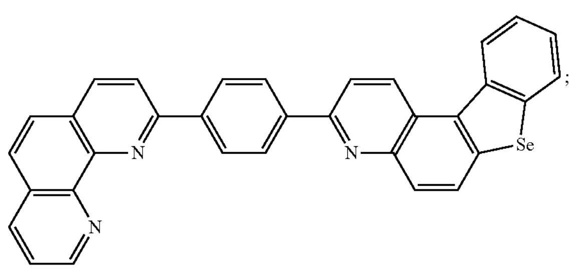
-continued
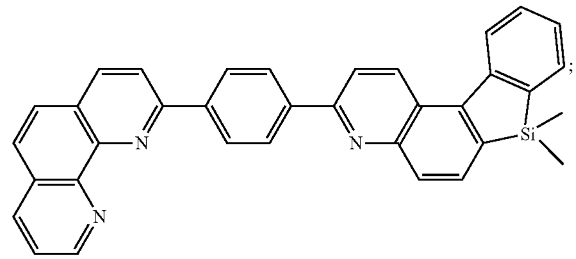
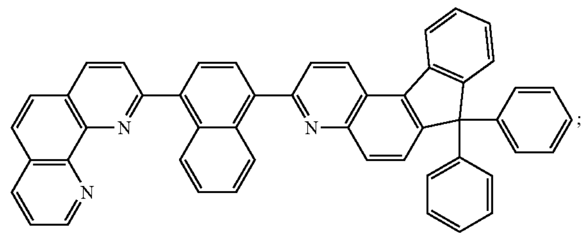
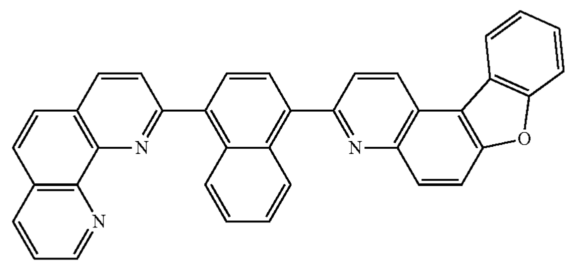
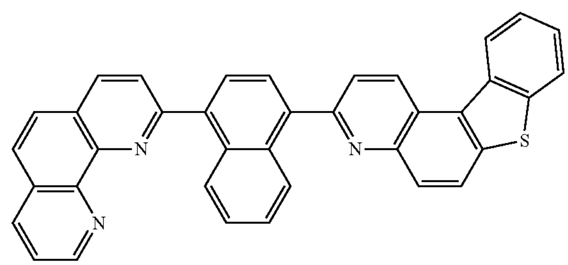
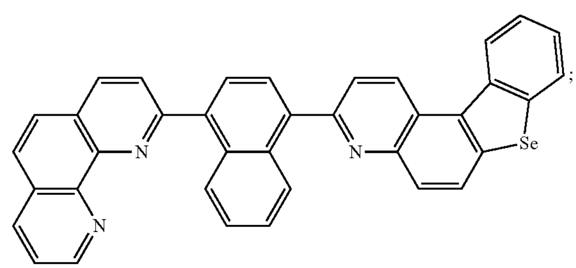
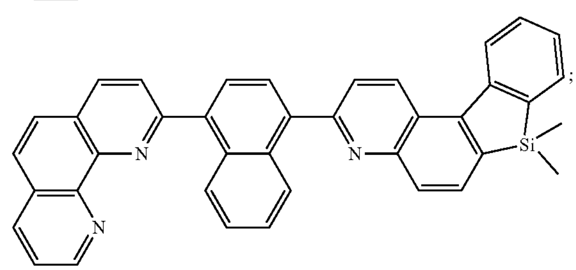

-continued
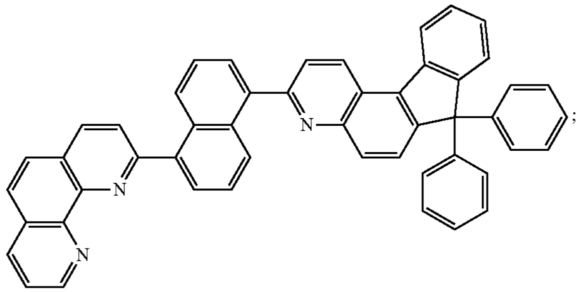
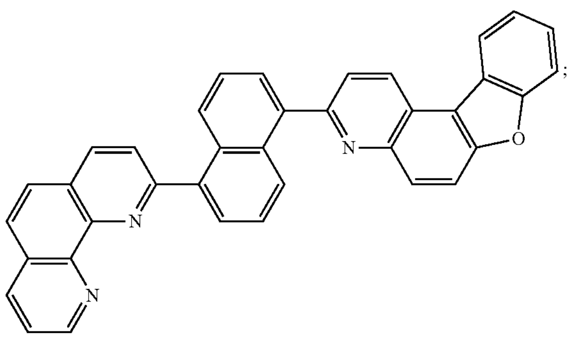
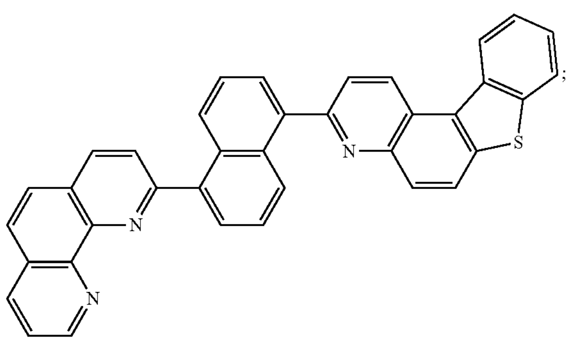
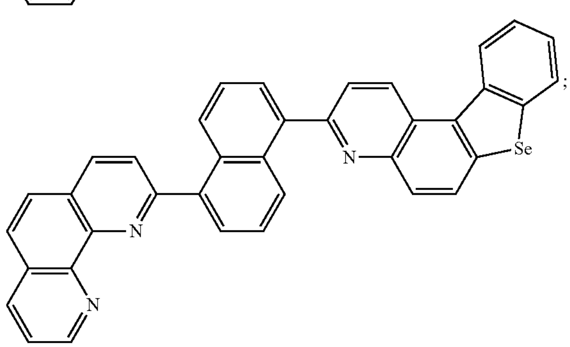
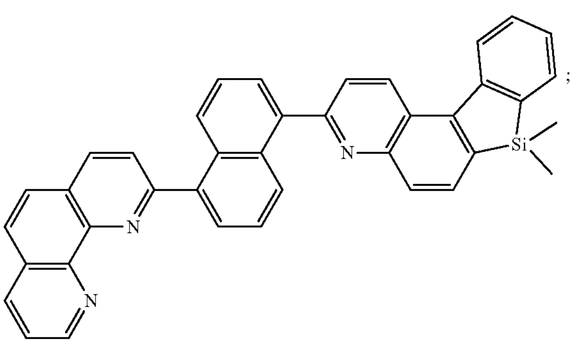
-continued
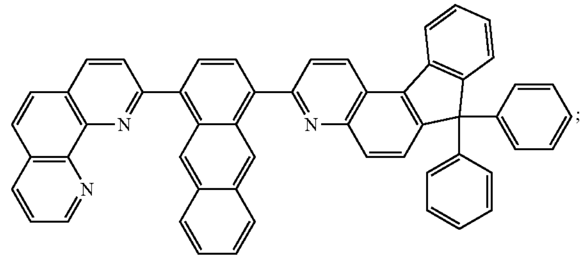
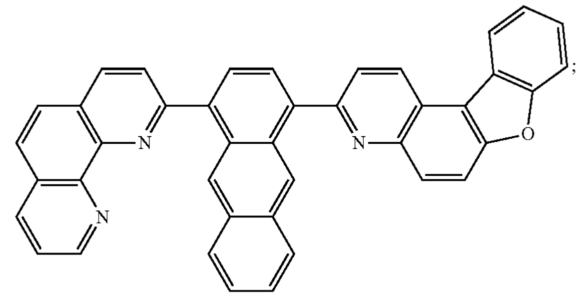
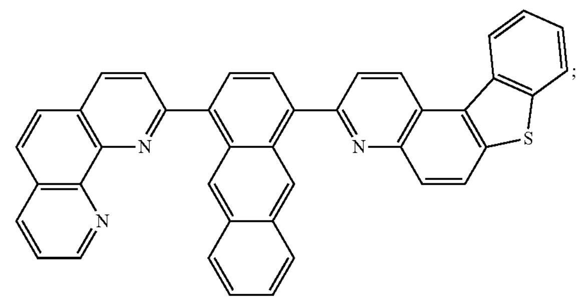
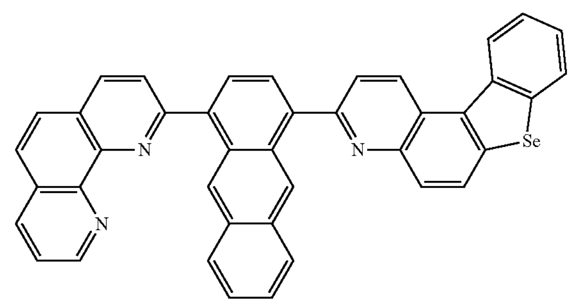
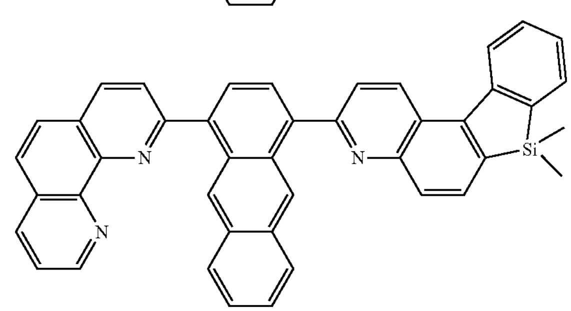
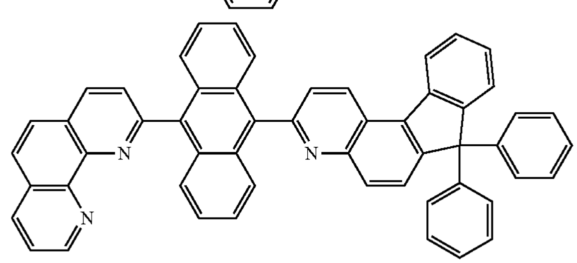

-continued
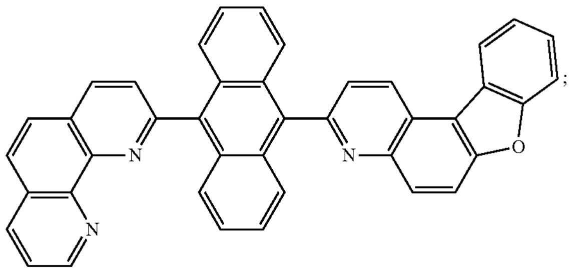
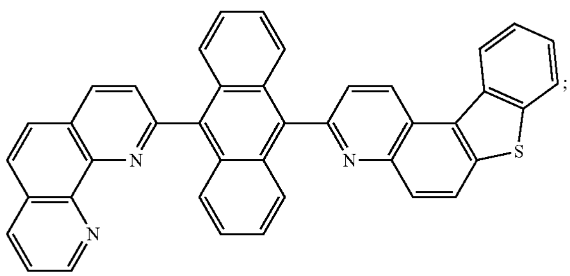
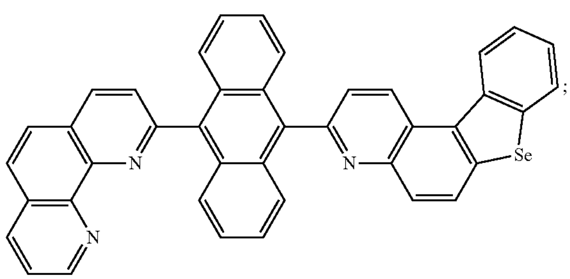
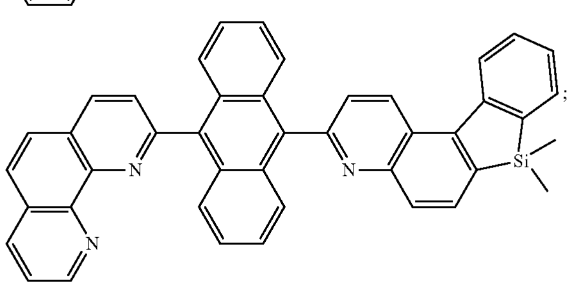
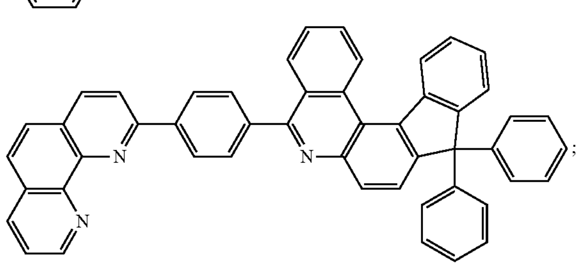
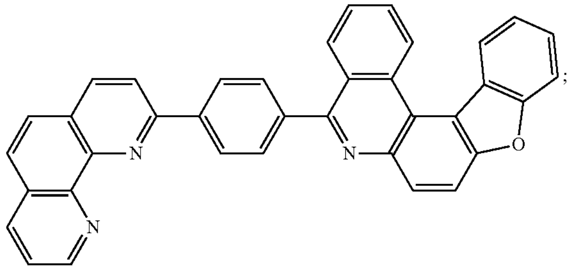
-continued
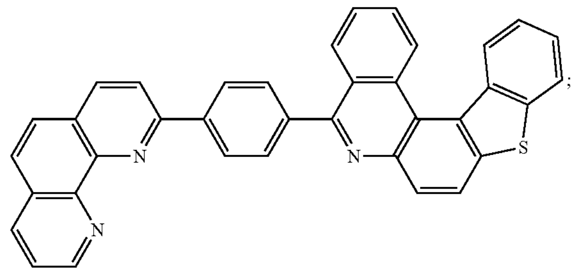
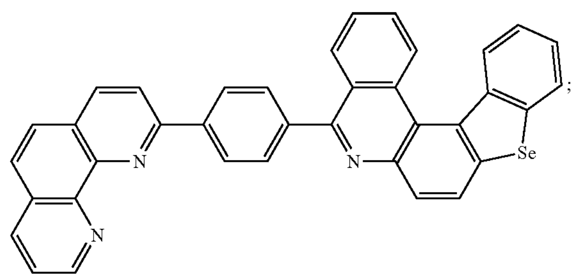
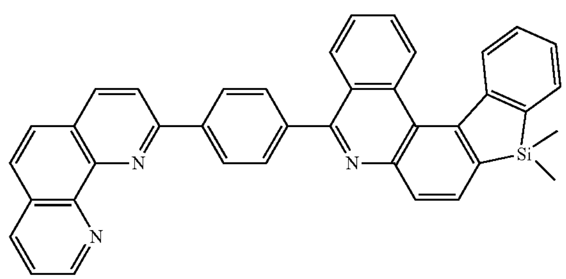
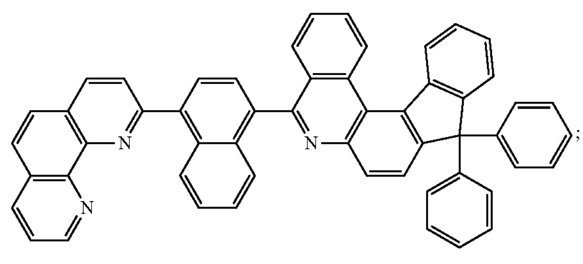
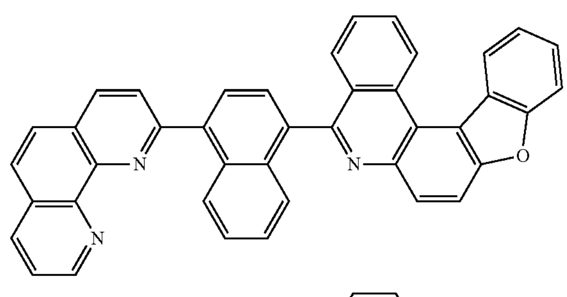
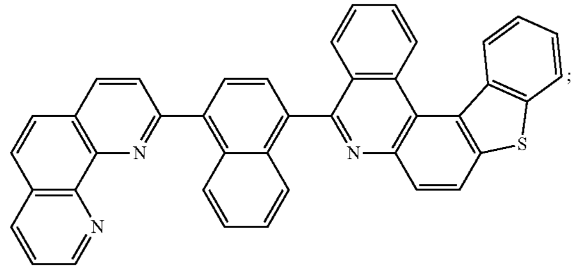

-continued
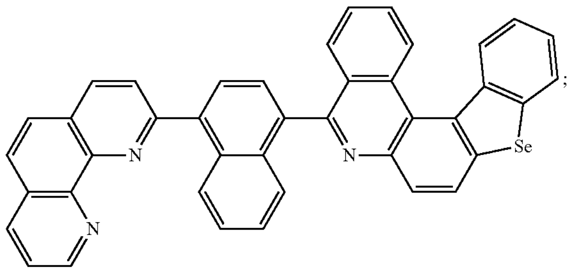
;
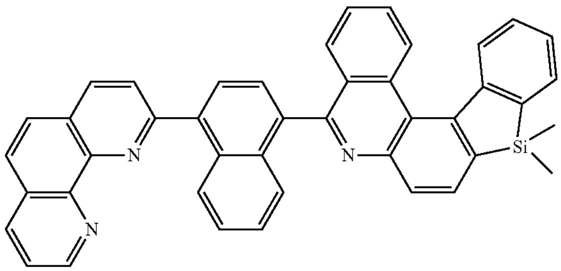
;
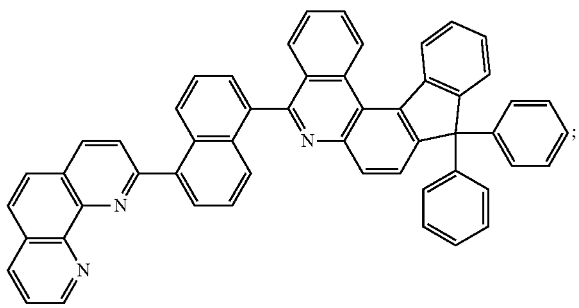
;
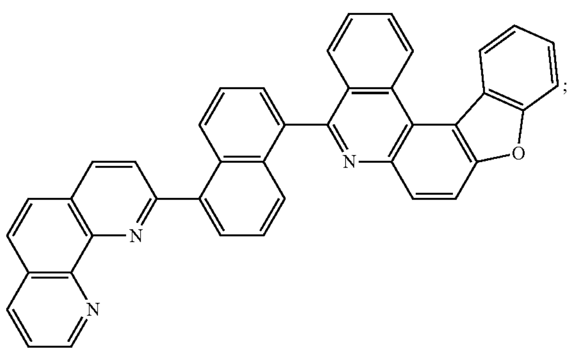
;
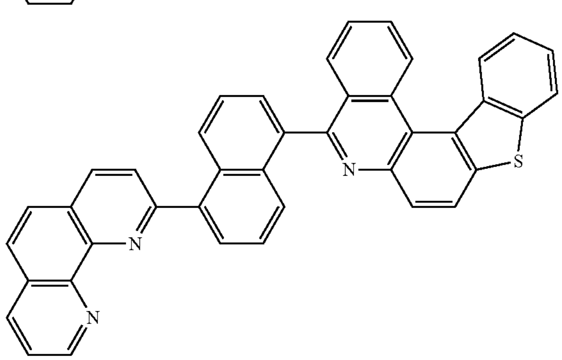
;
-continued
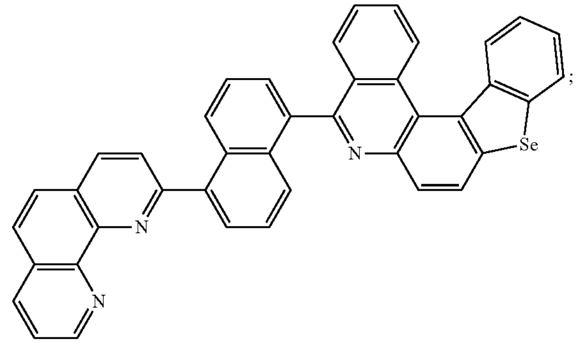
;
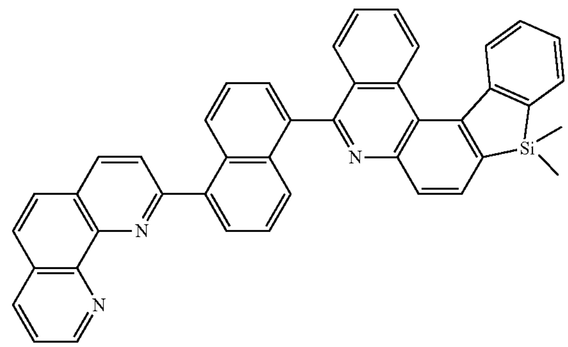
;
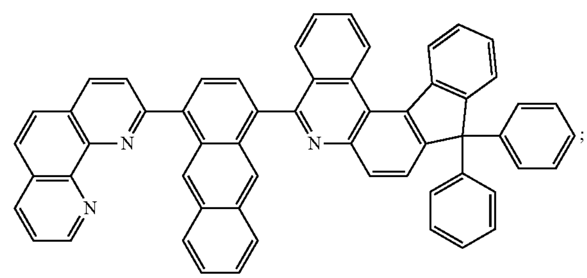
;
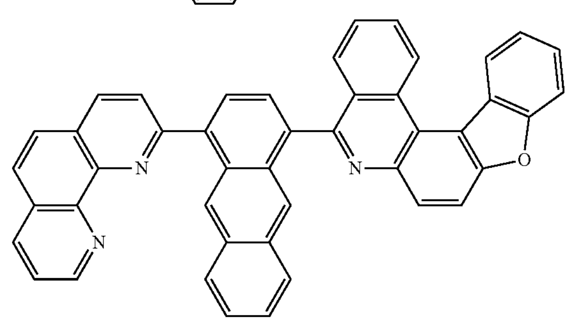
;
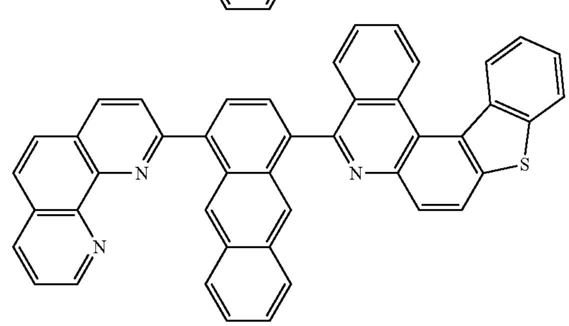
;

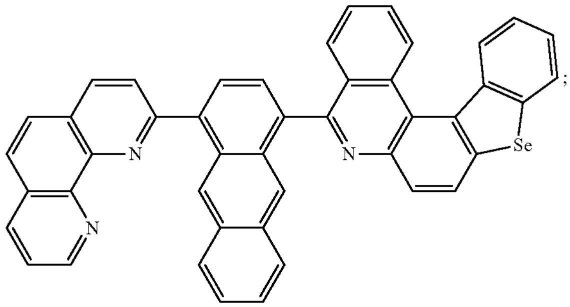
;
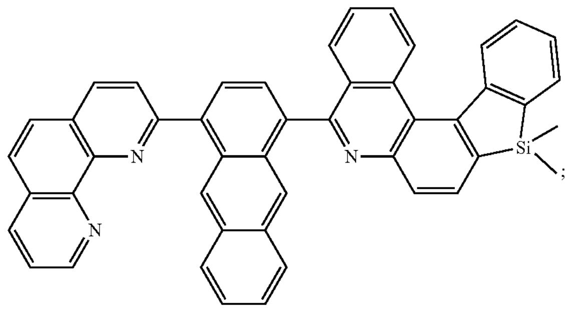
;
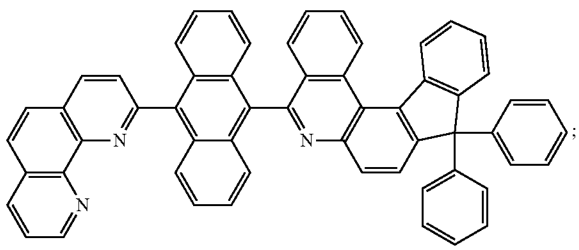
;
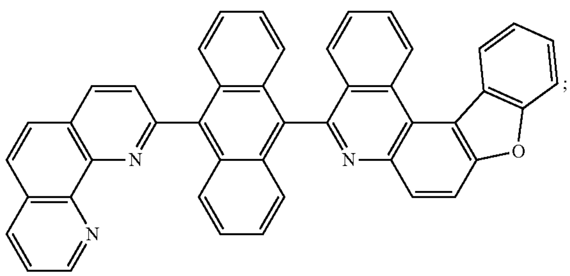
;
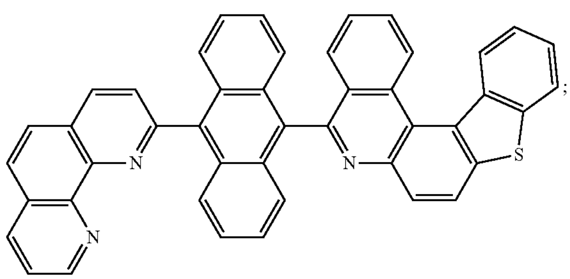
;
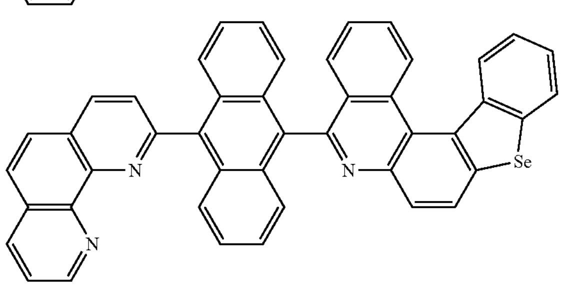
;
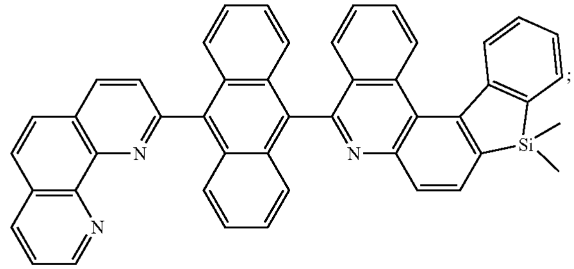
;
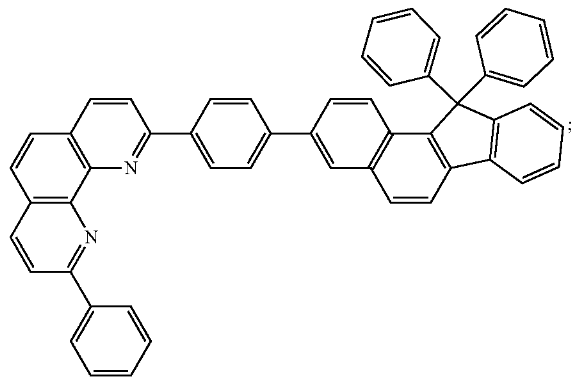
;
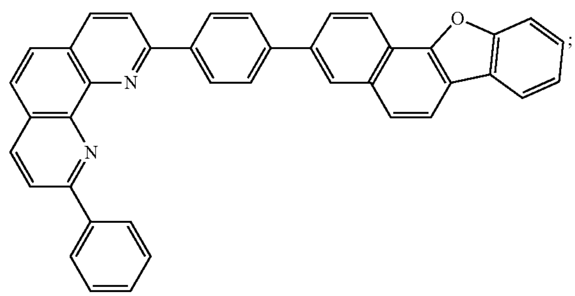
;
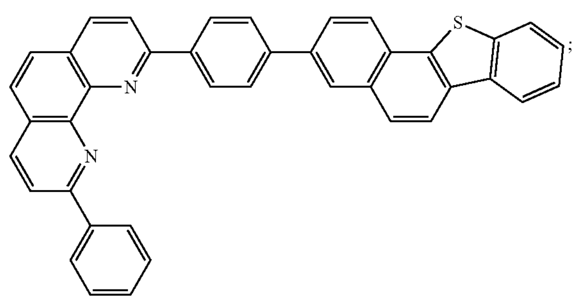
;
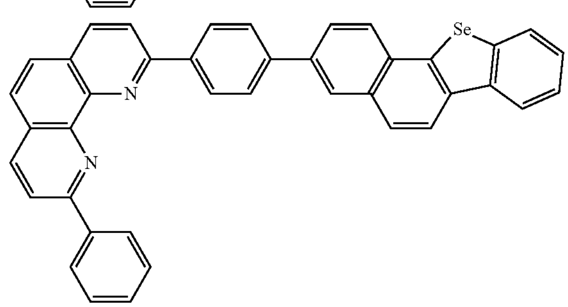
;

-continued
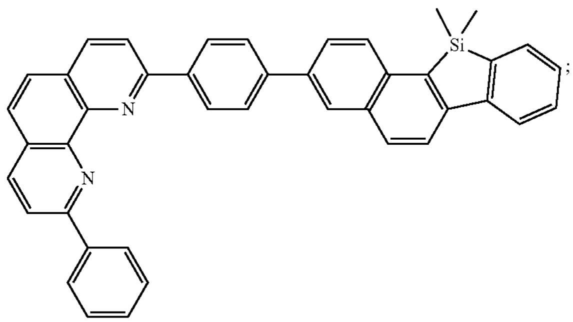
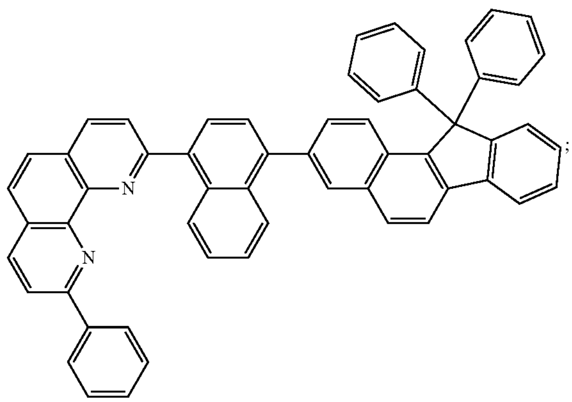
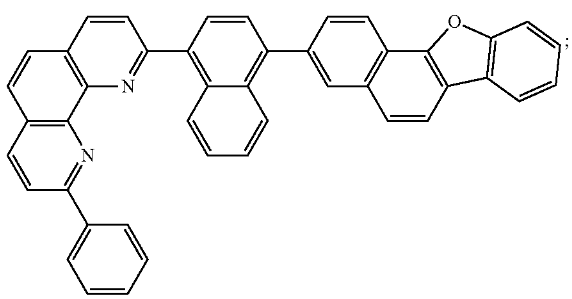
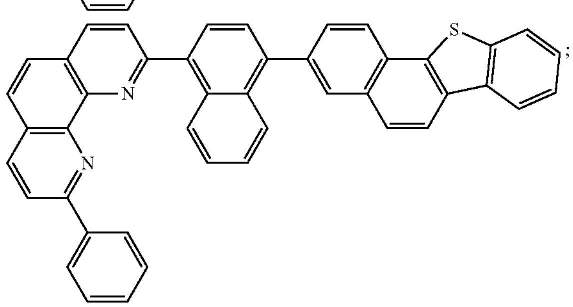
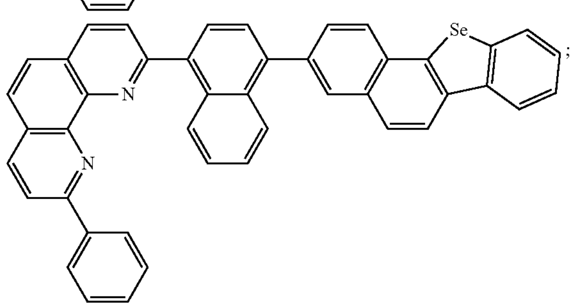
-continued
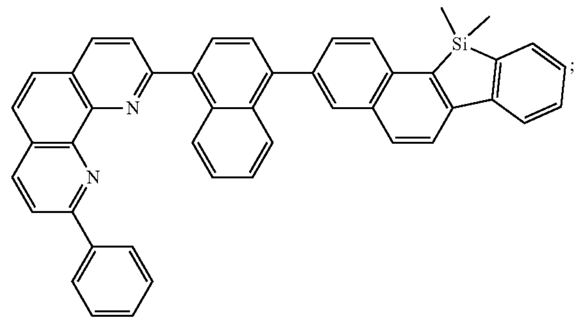
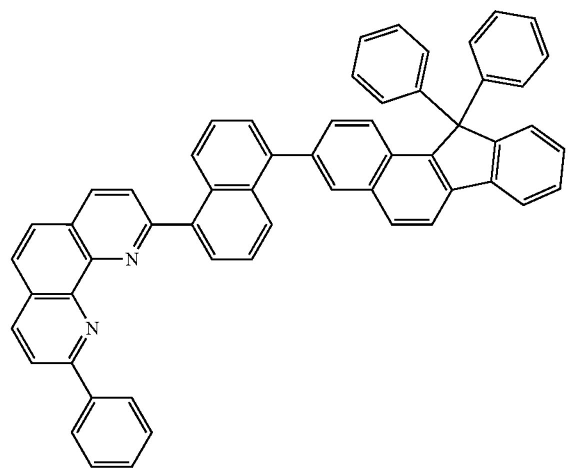
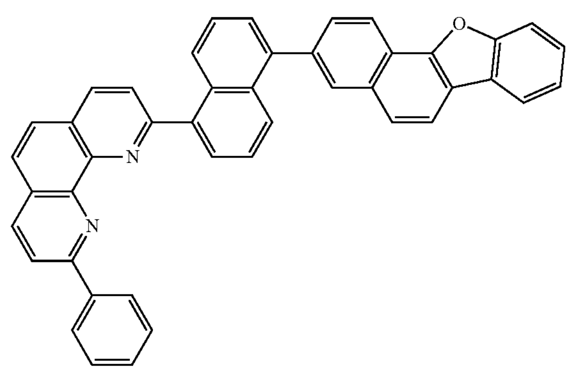
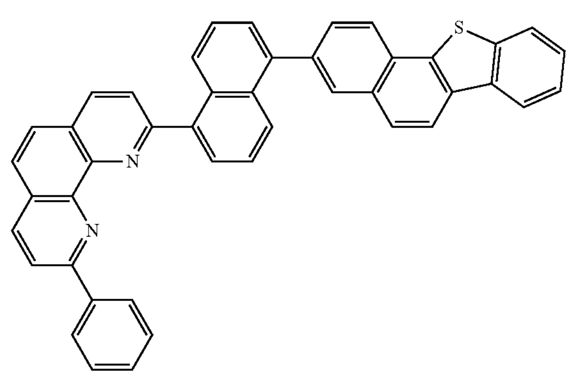

-continued
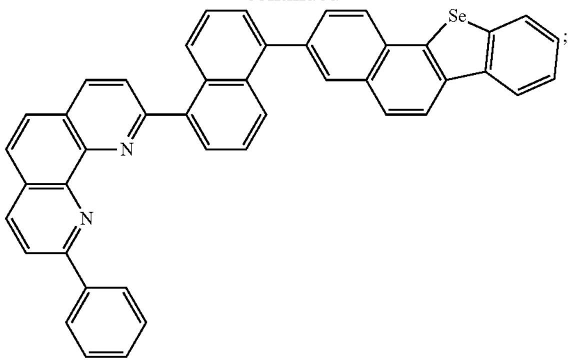
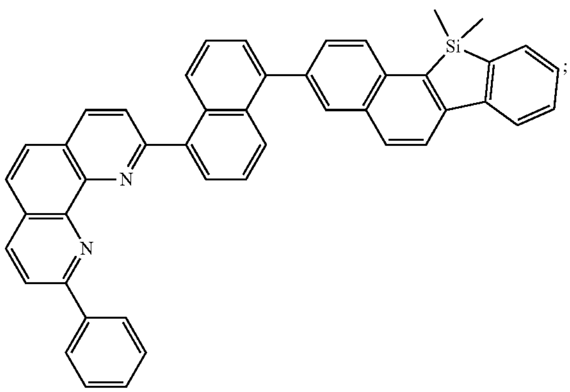
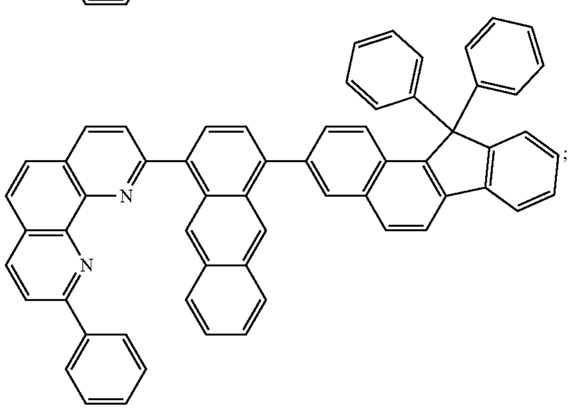
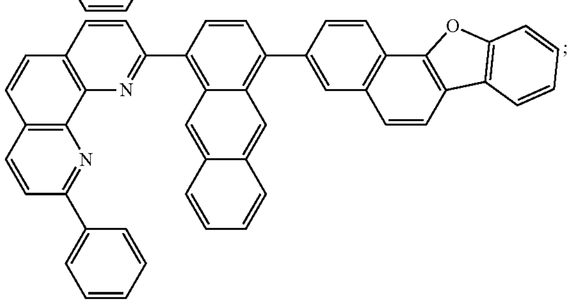
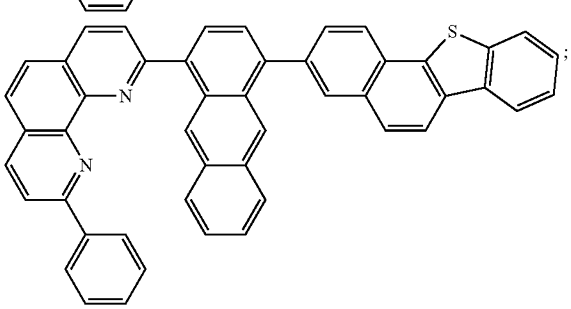
-continued
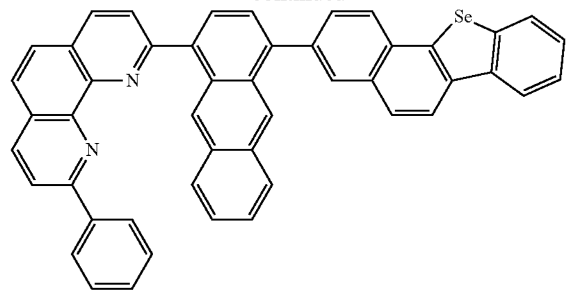
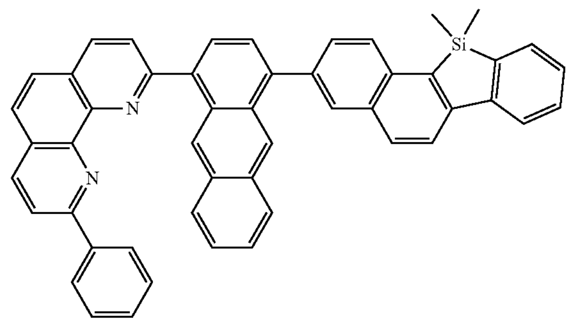
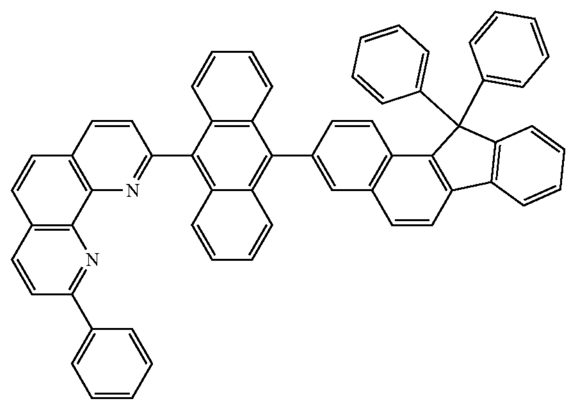
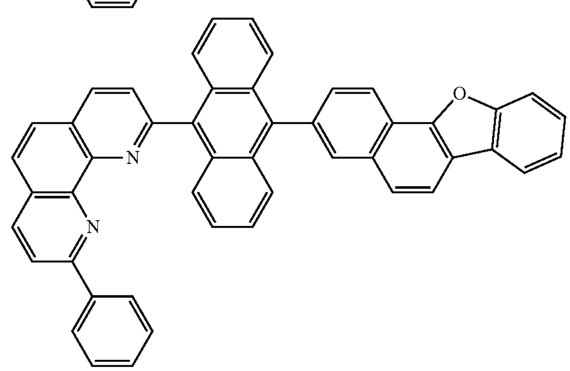
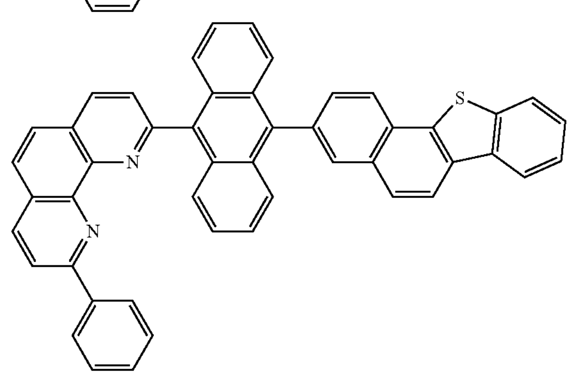

-continued
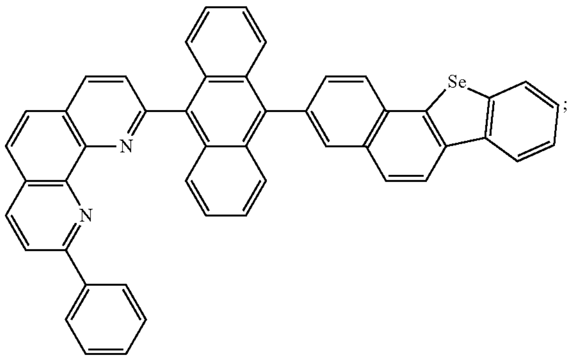
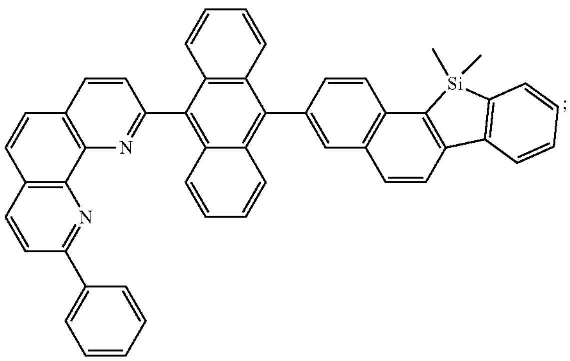
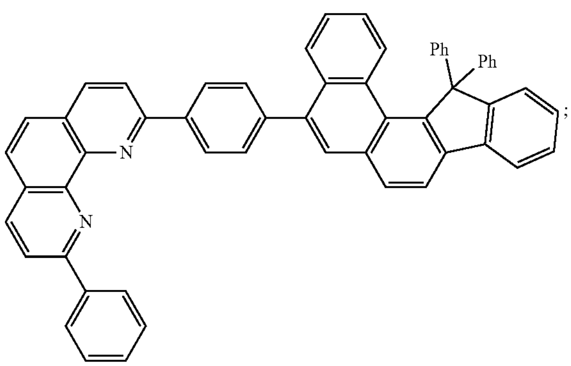
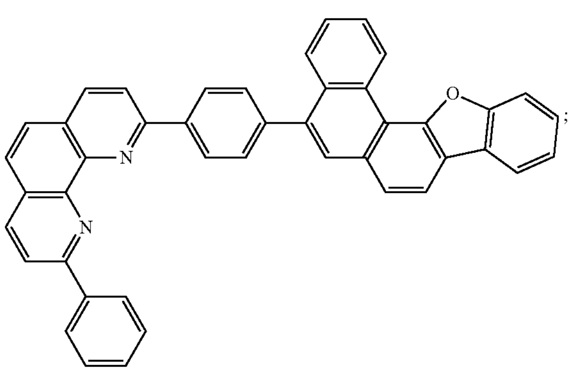
-continued
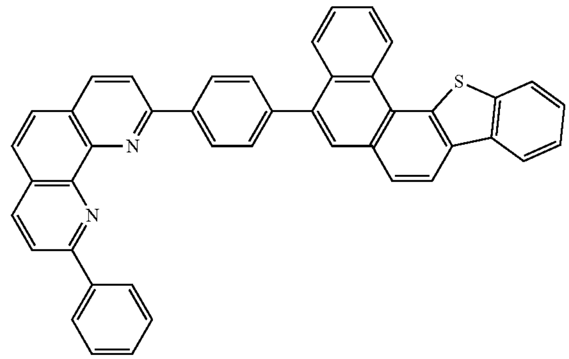
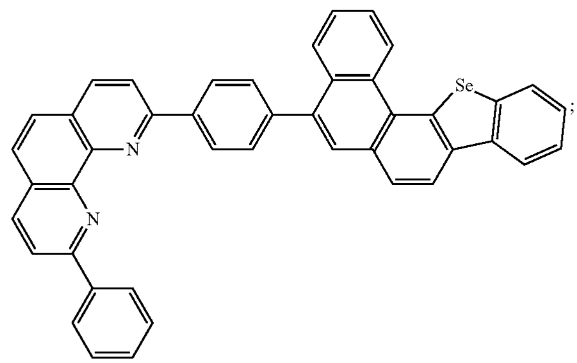
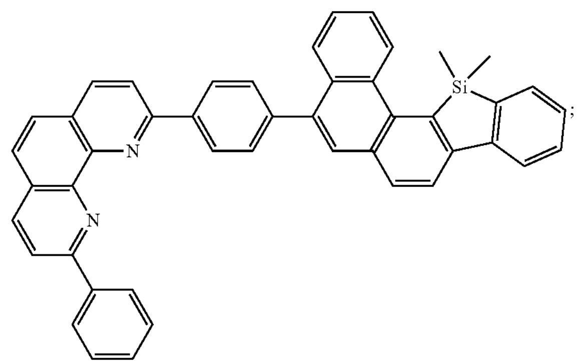
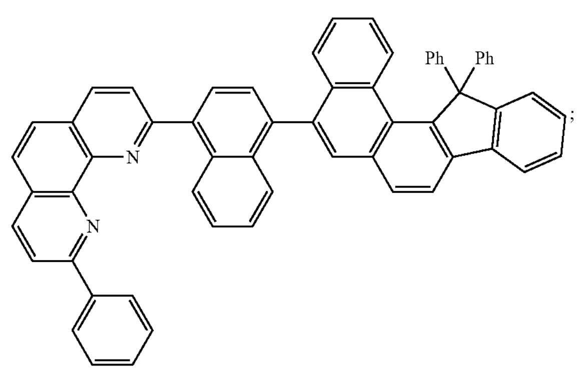

-continued
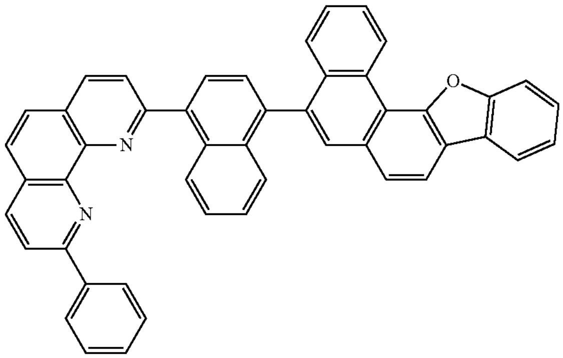
;
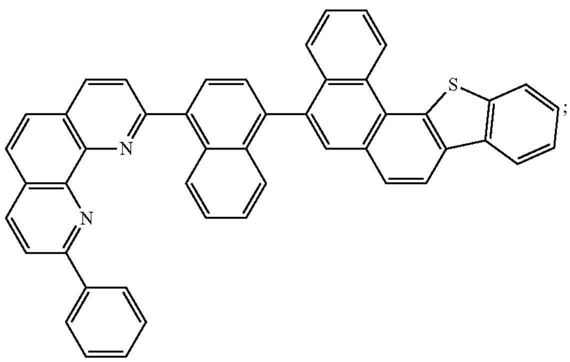
;
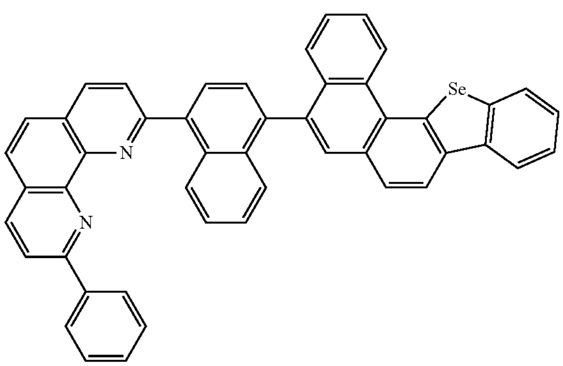
;
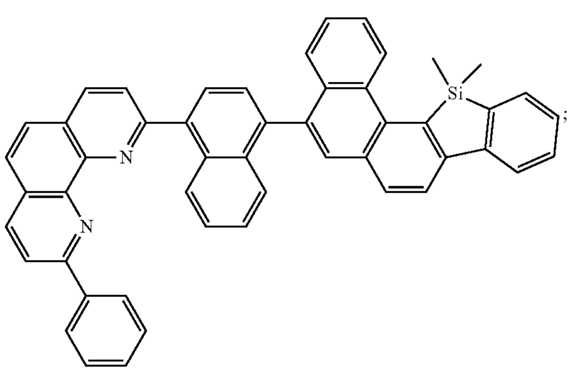
;
-continued
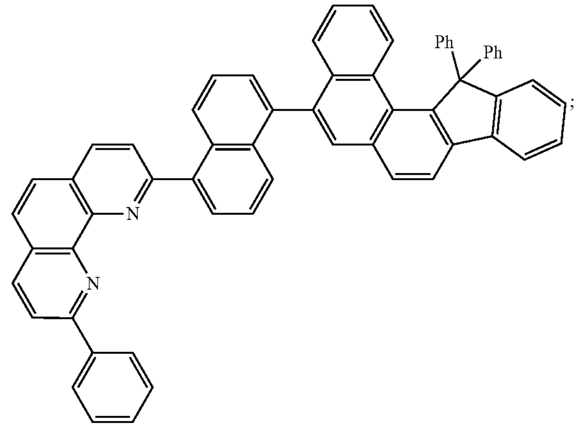
;
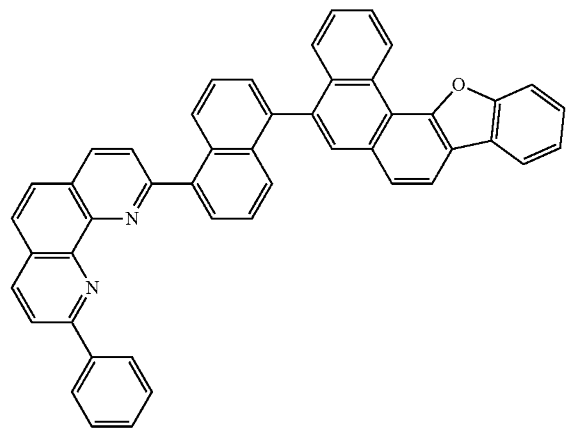
;
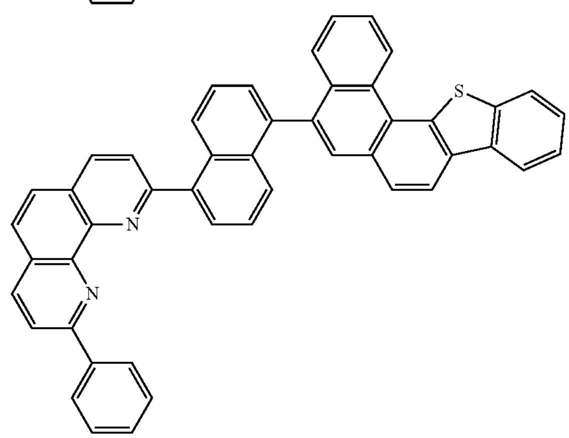
;
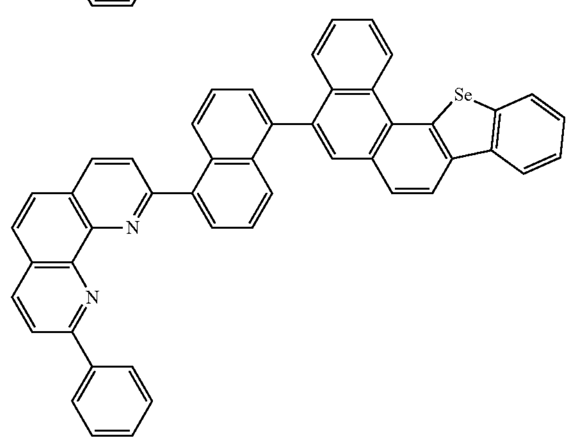
;

-continued
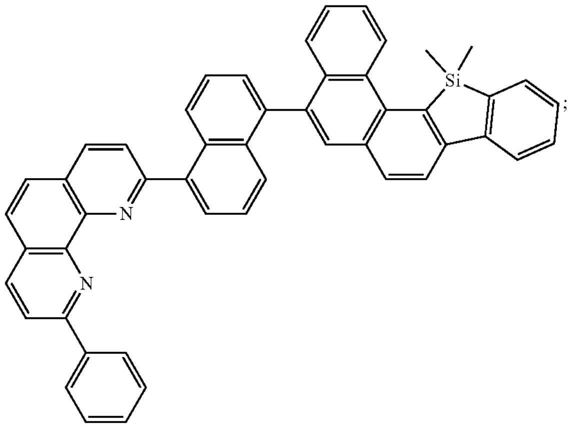
;
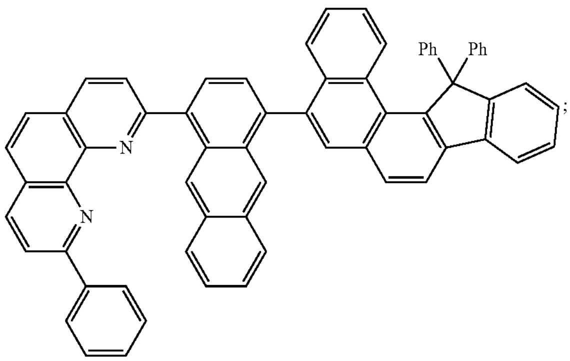
;
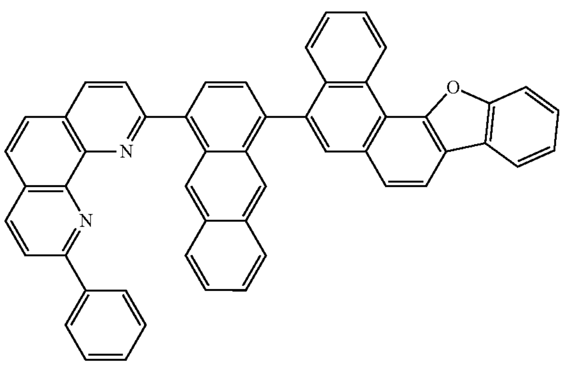
;
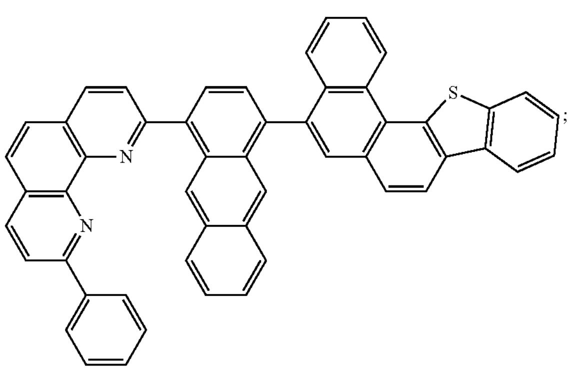
;
-continued
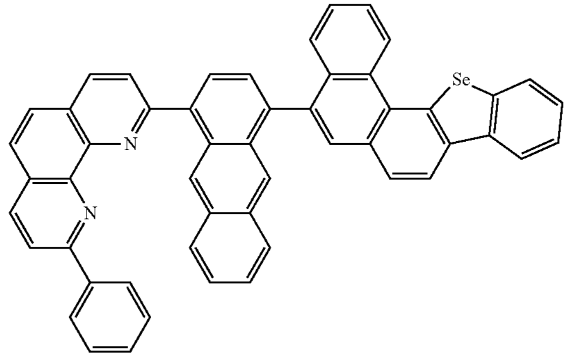
;
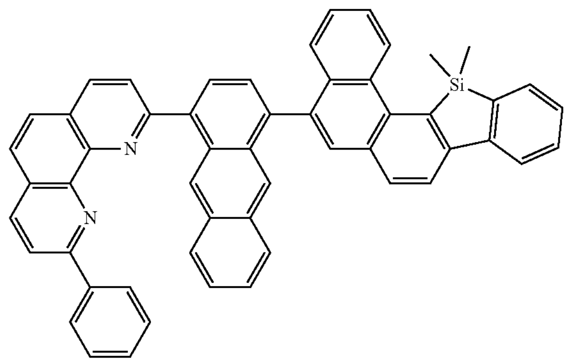
;
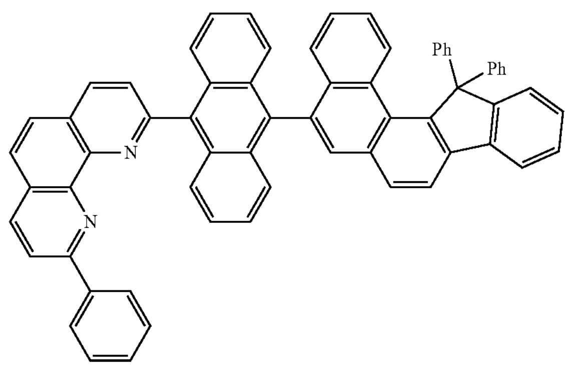
;
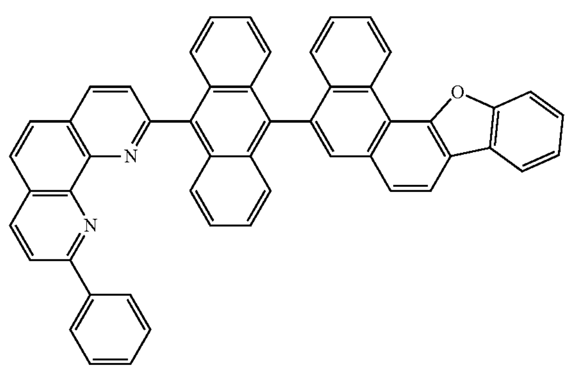
;

-continued
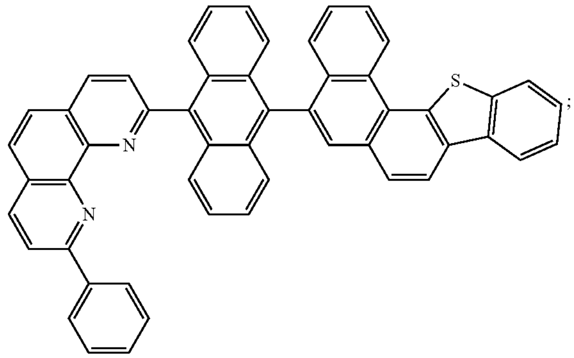
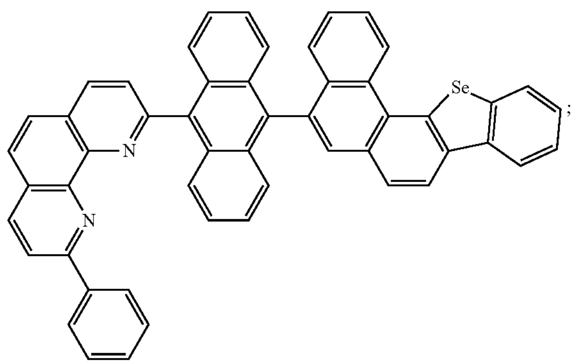
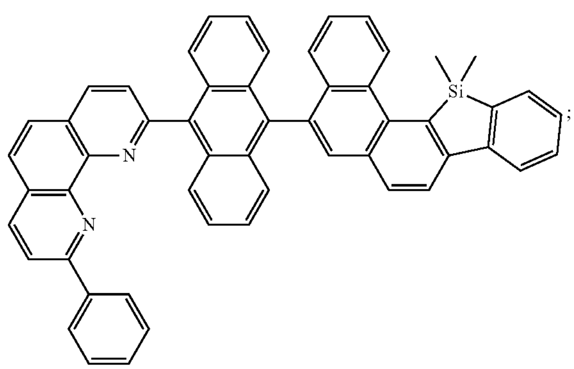
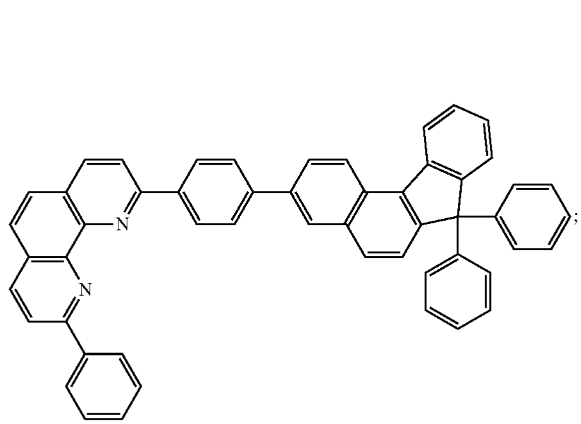
-continued
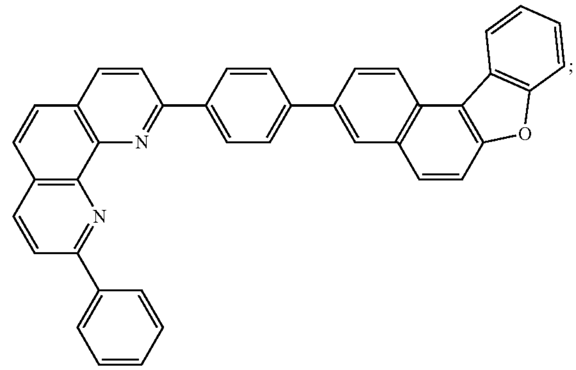
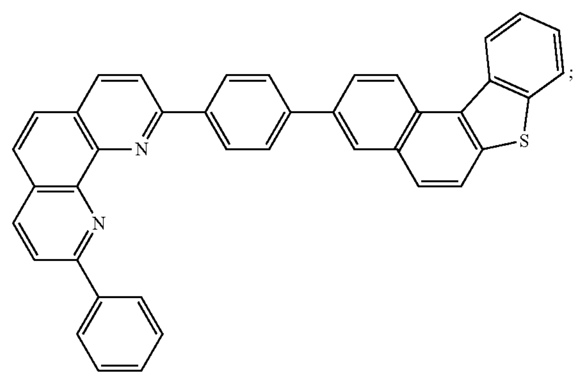
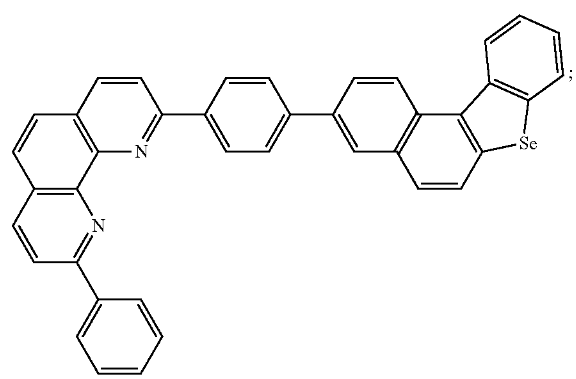
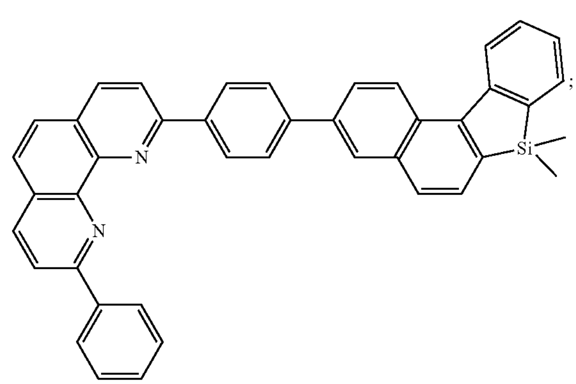

-continued
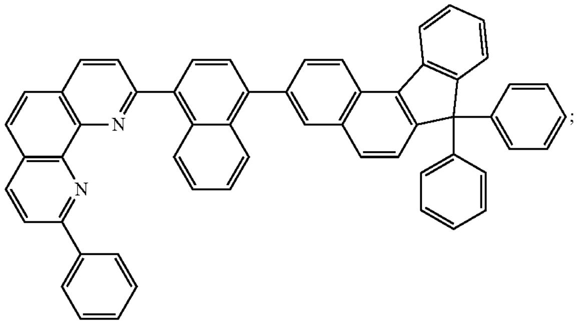
;
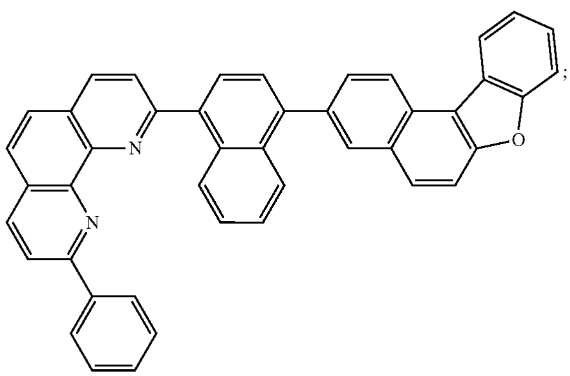
;
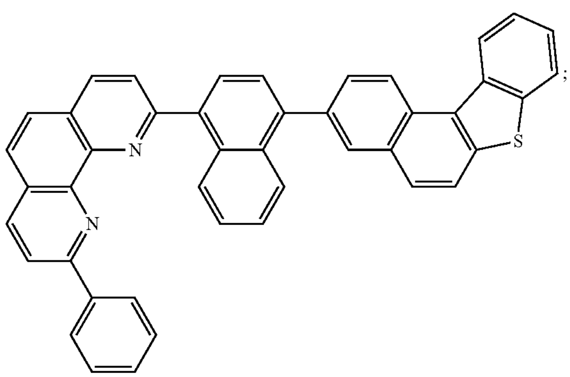
;
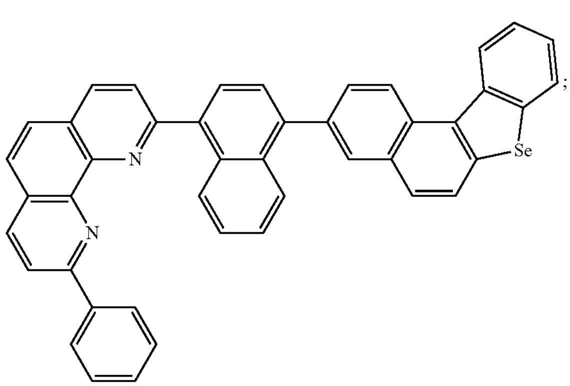
;
-continued
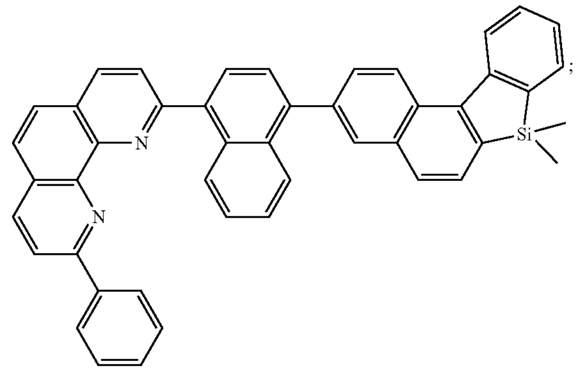
;
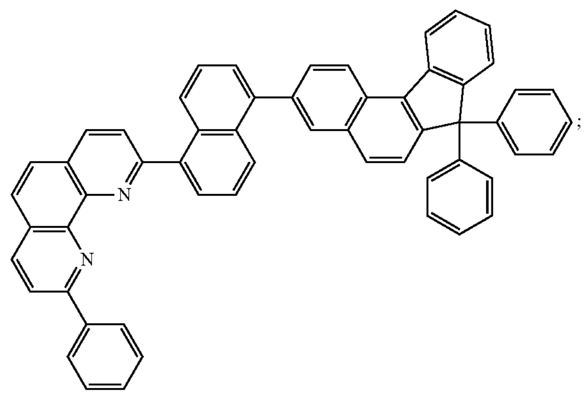
;
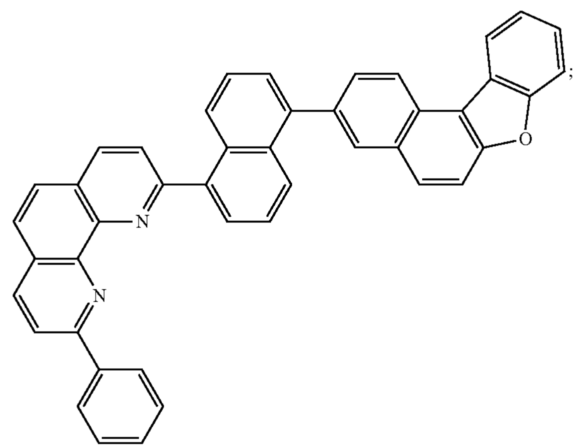
;
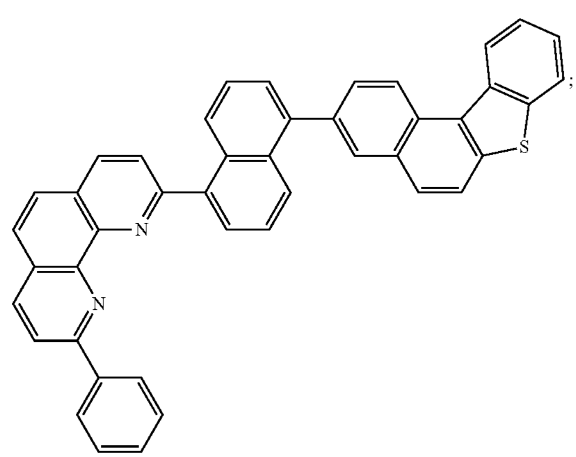
;

-continued
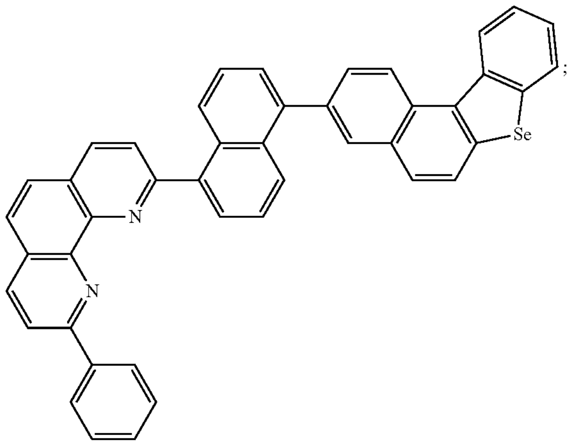
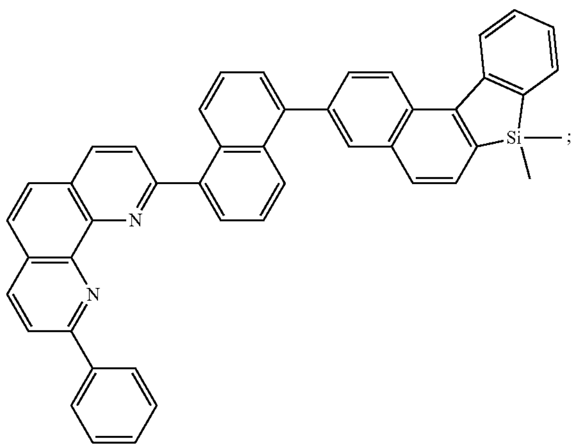
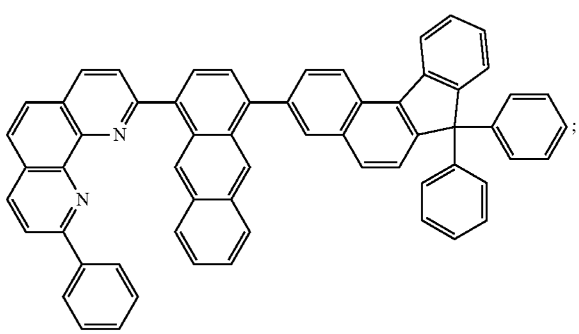
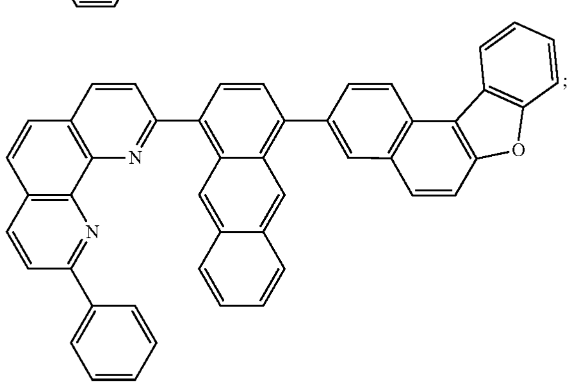
-continued
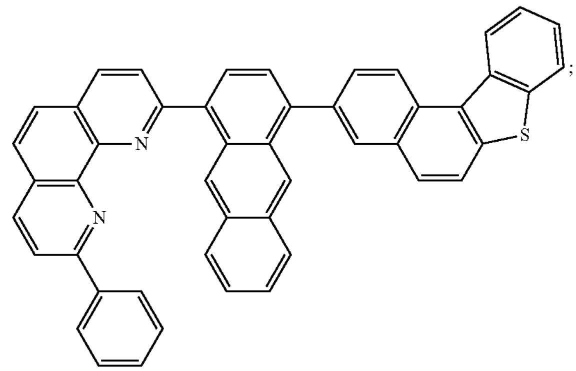
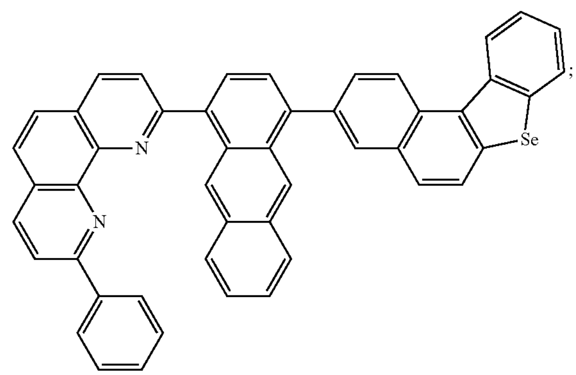
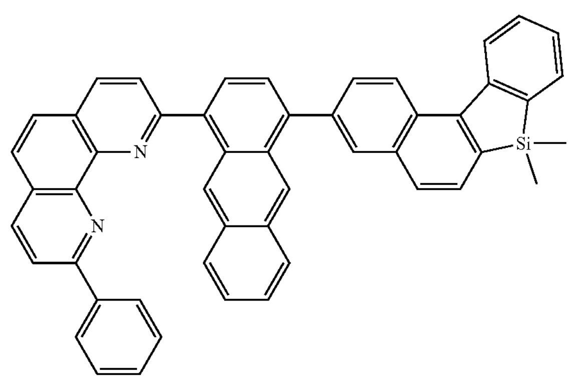
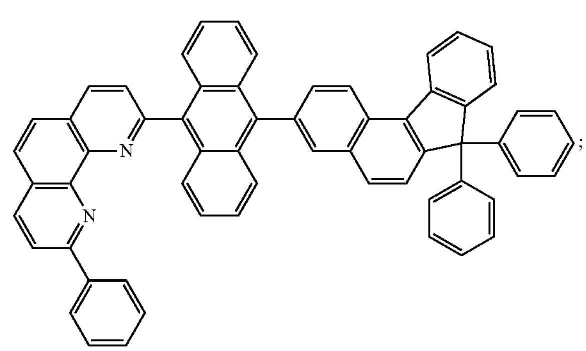

-continued
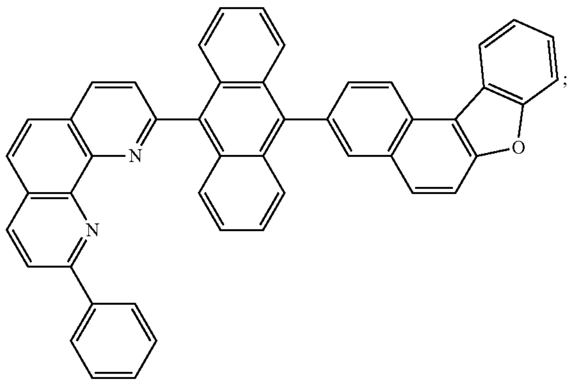
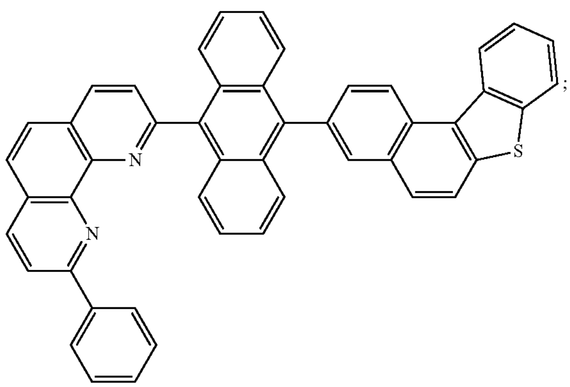
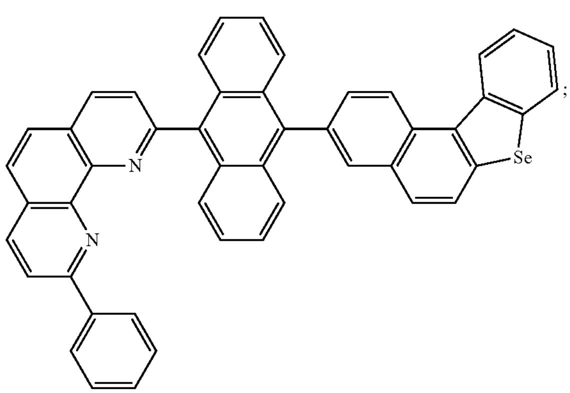
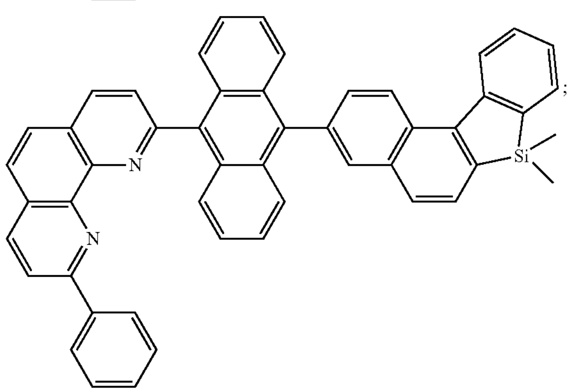
-continued
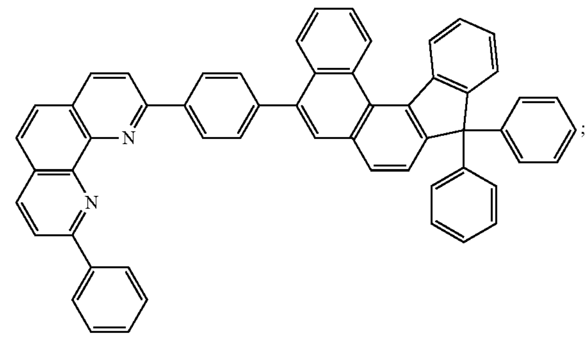
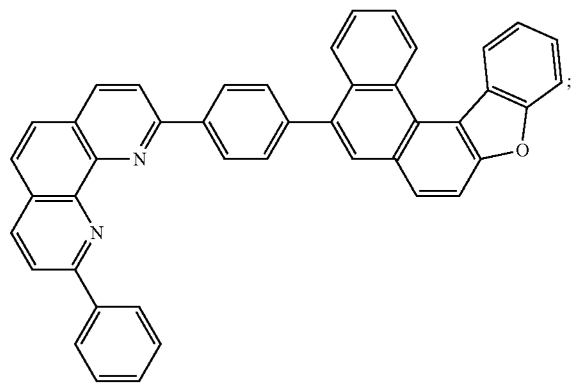
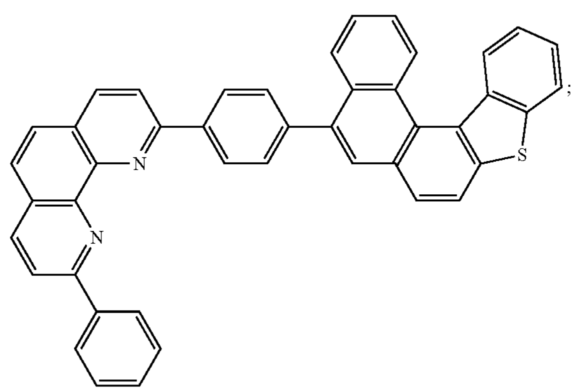
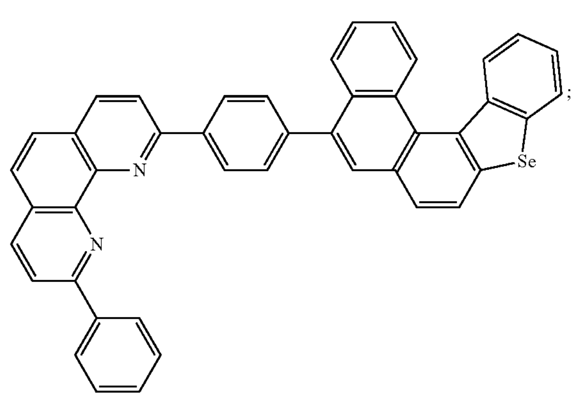

-continued
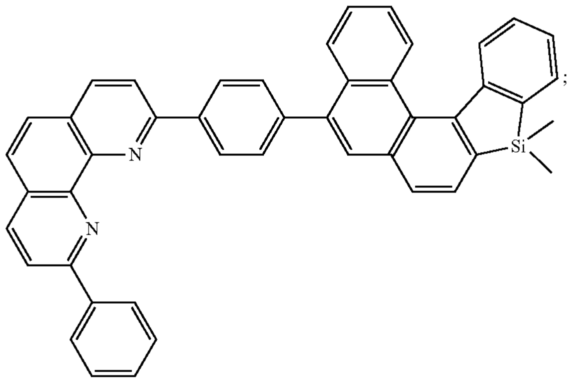
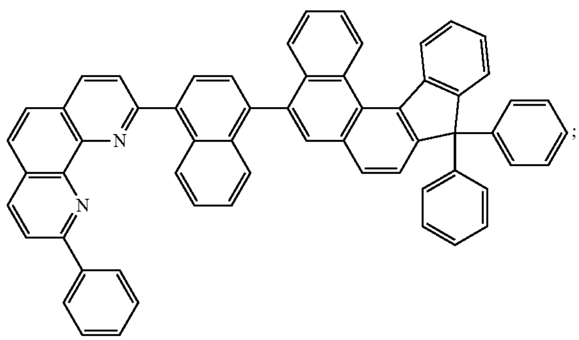
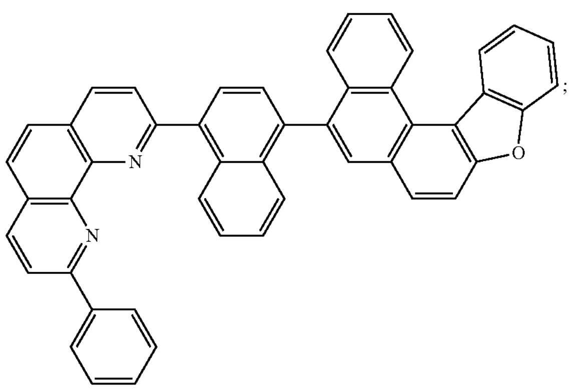
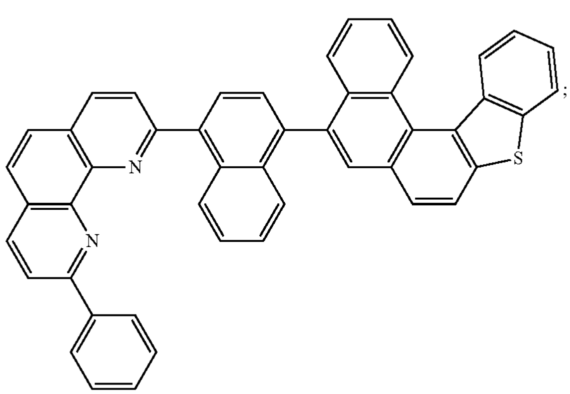
-continued
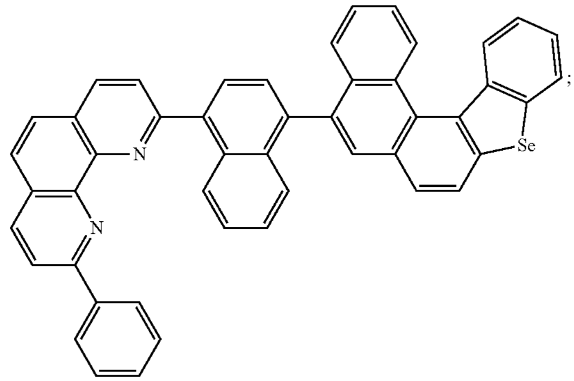
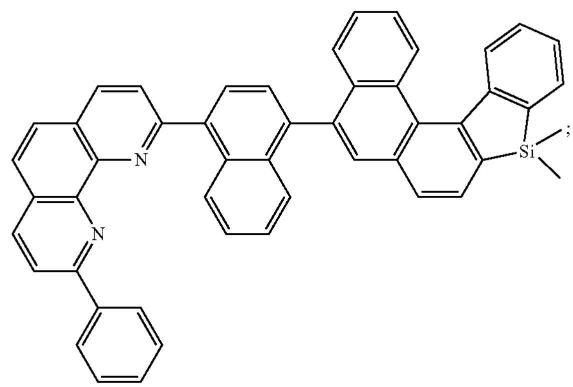
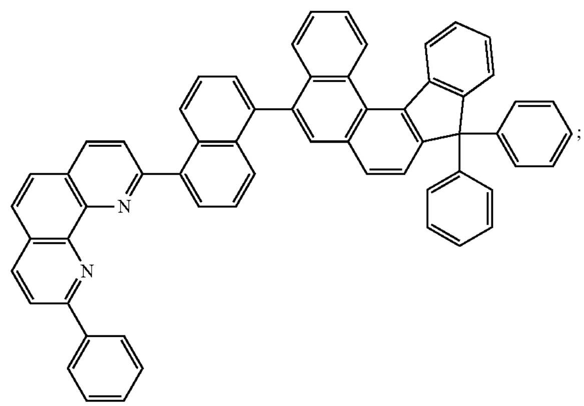
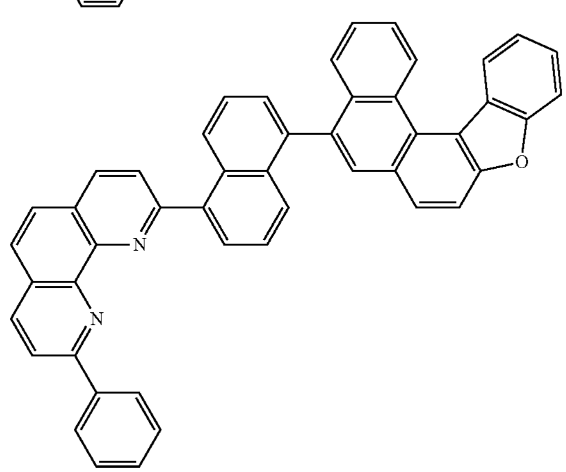

-continued
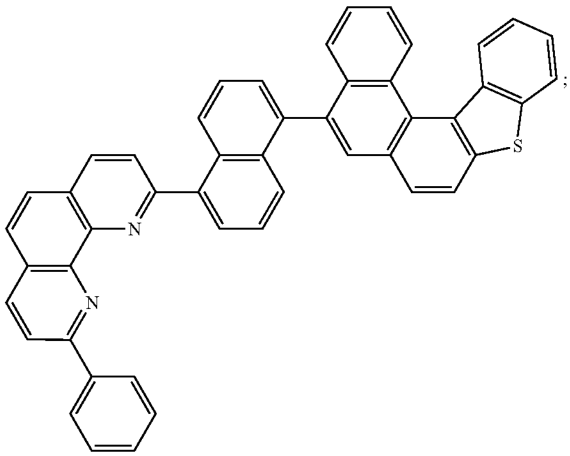
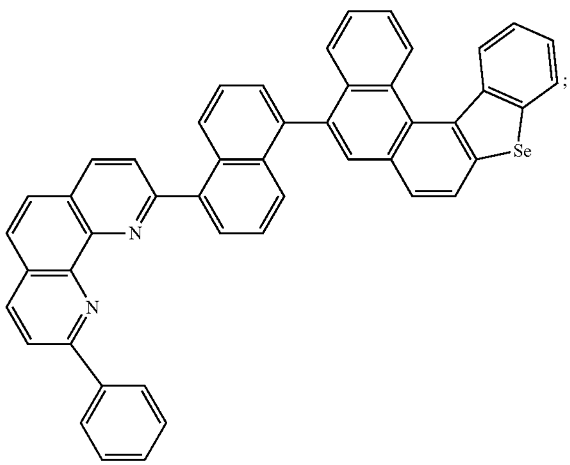
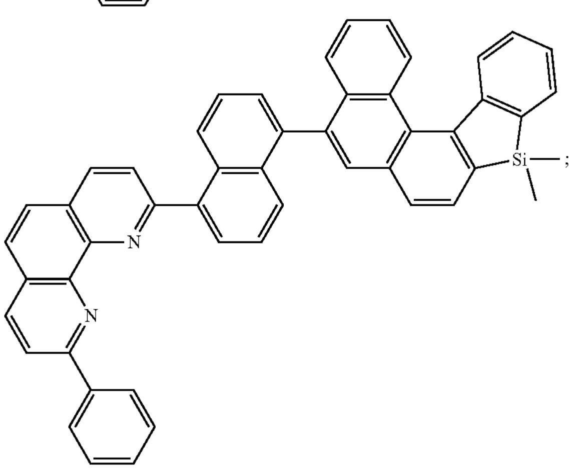
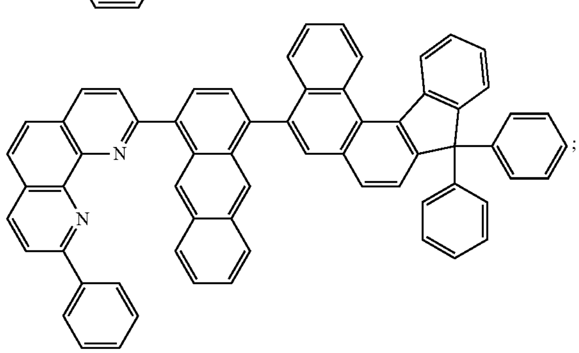
-continued
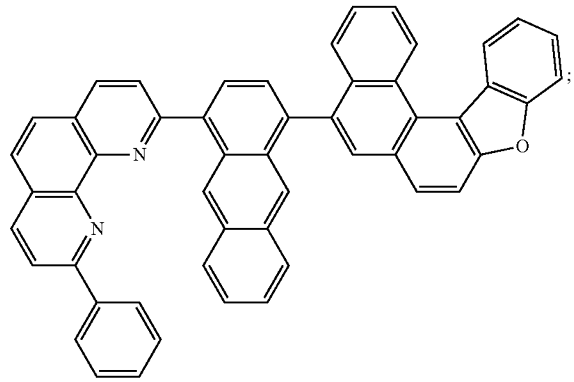
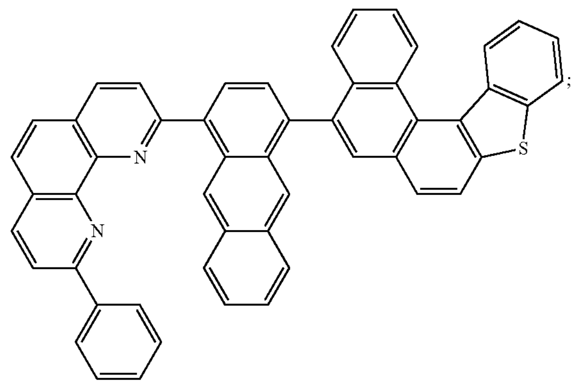
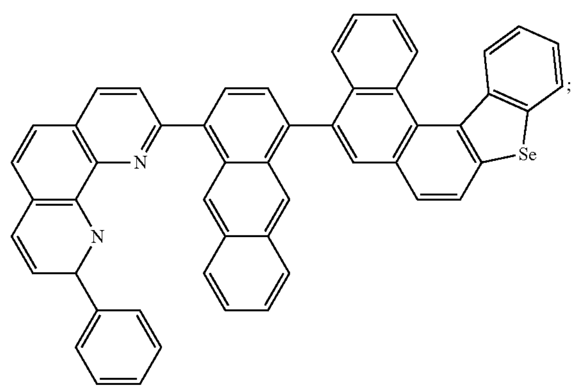
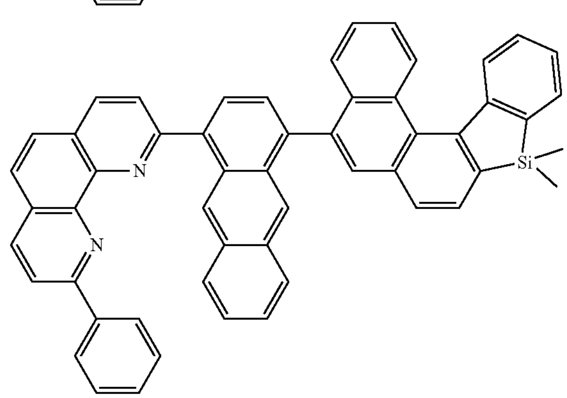

-continued
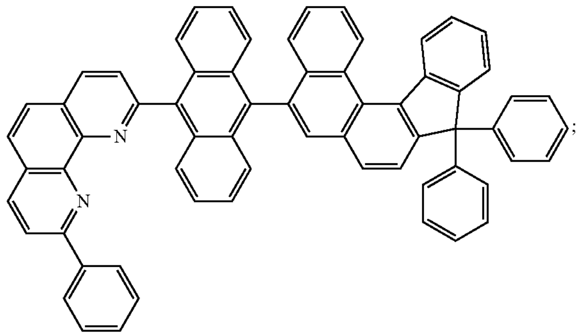
;
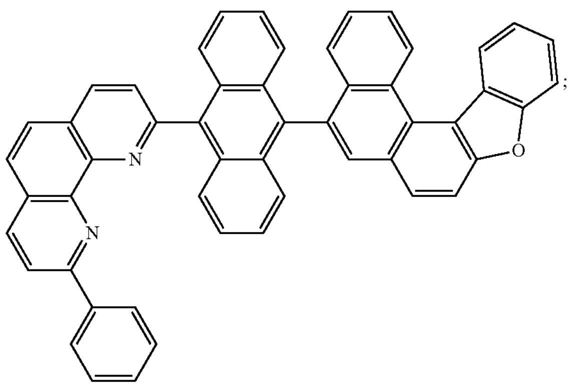
;
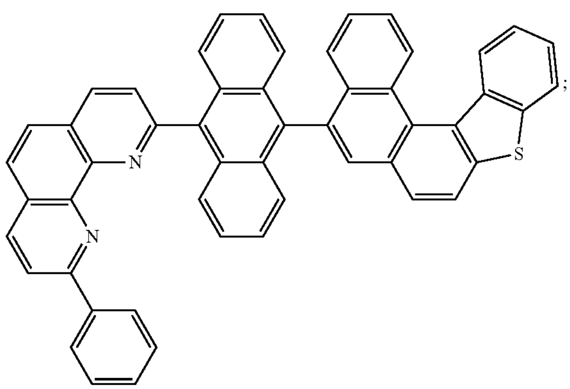
;
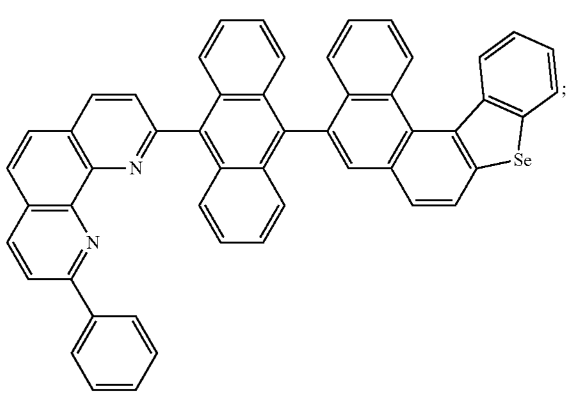
;
-continued
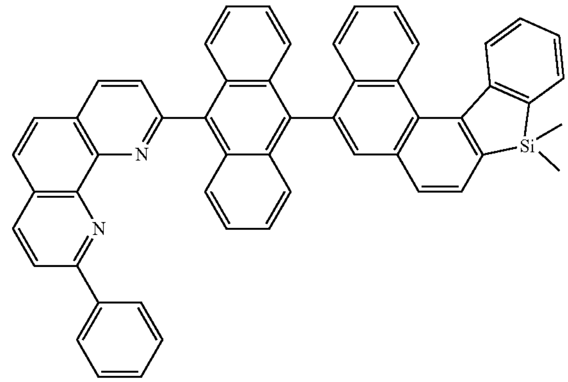
;
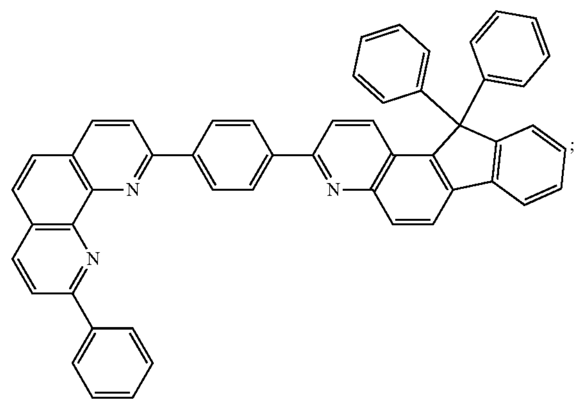
;
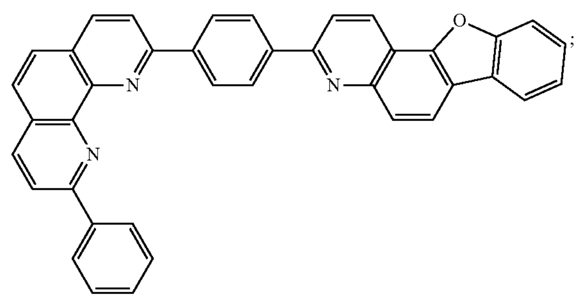
;
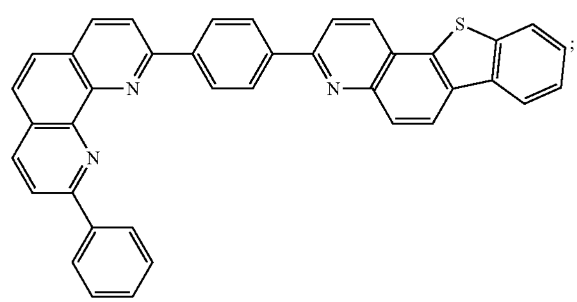
;
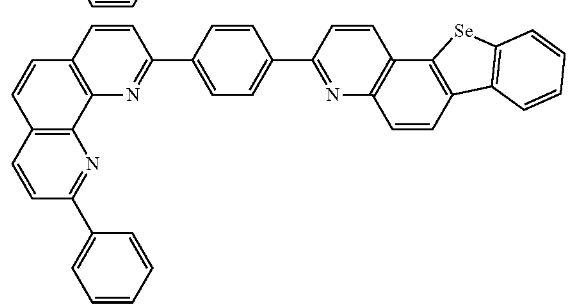
;

-continued
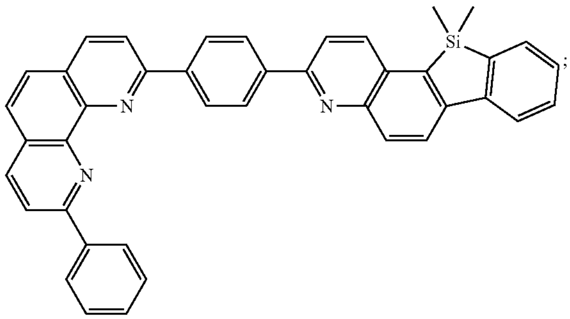
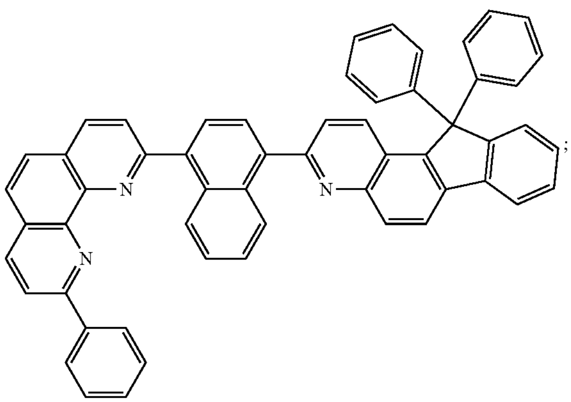
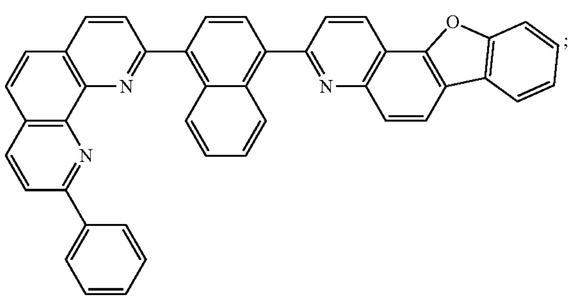
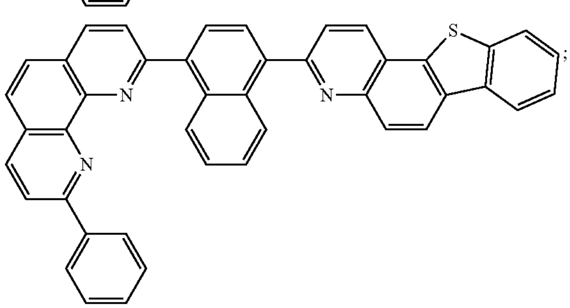
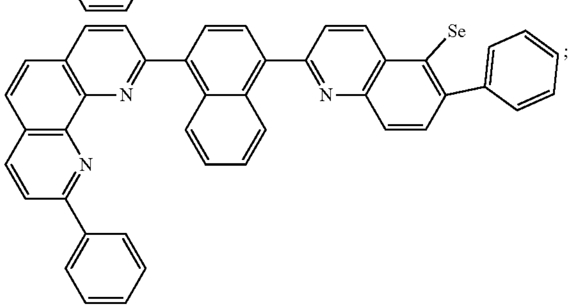
-continued
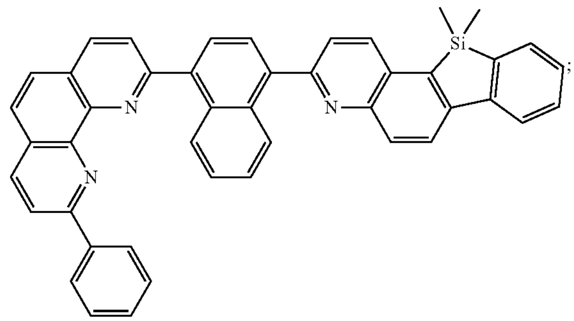
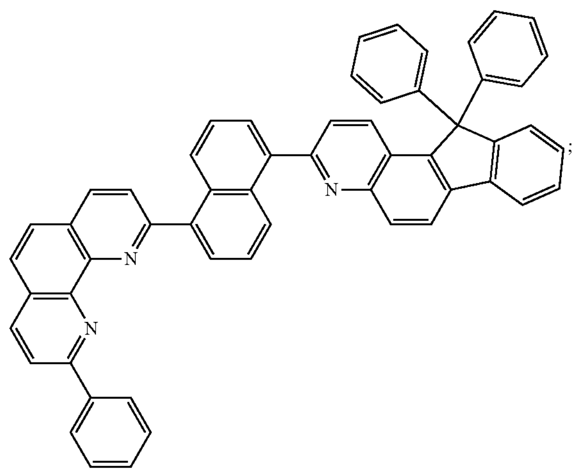
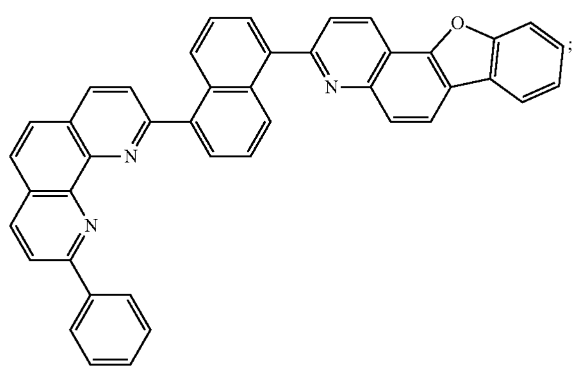
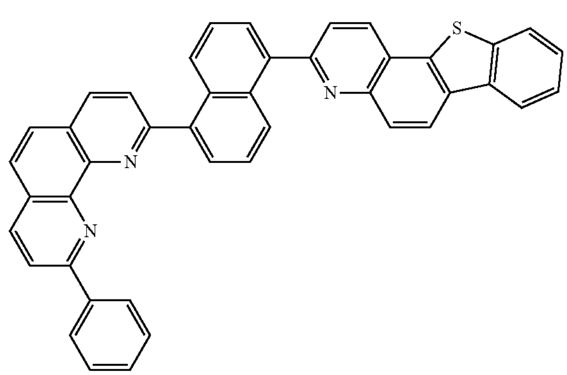

-continued
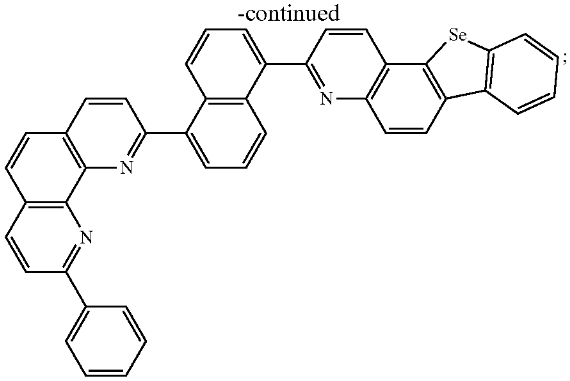
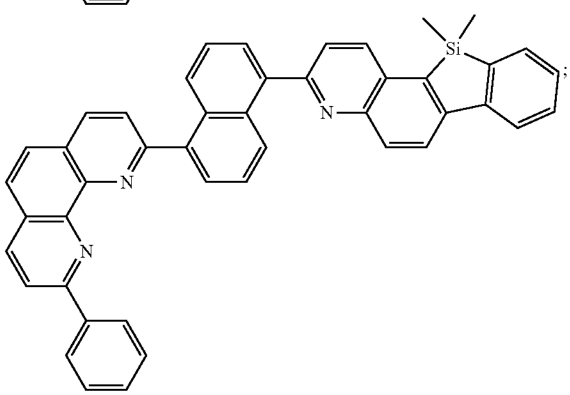
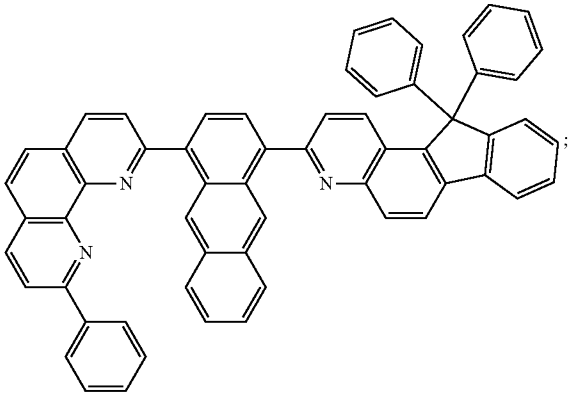
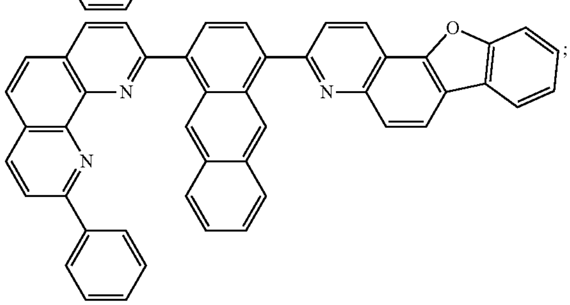
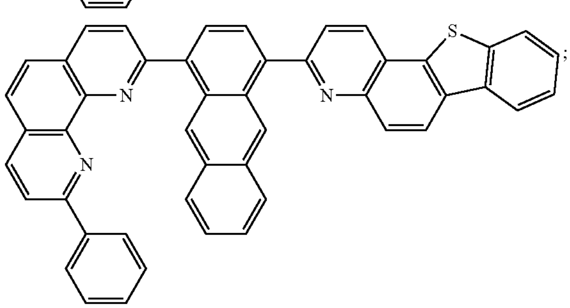
-continued
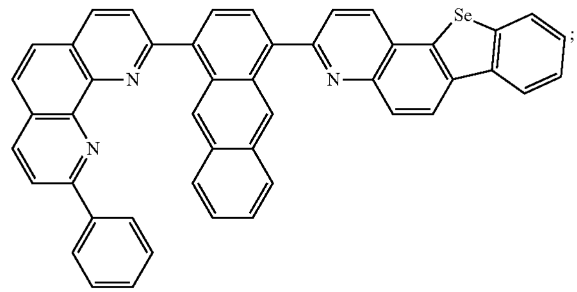
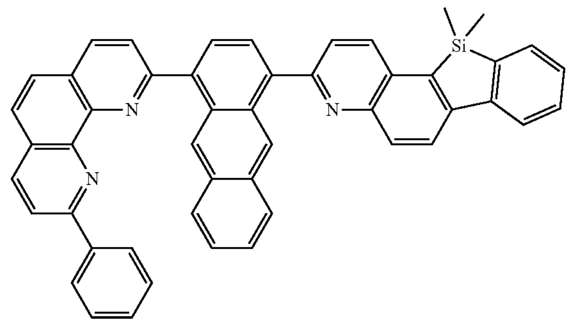
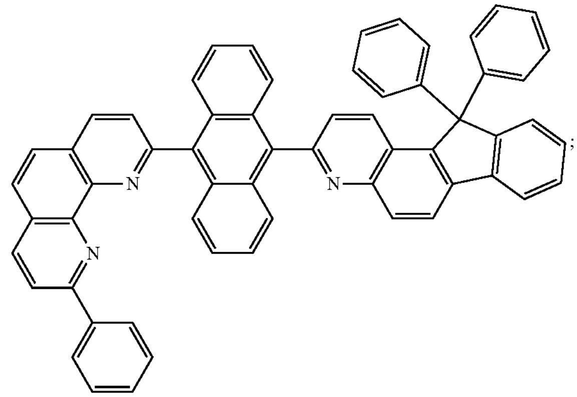
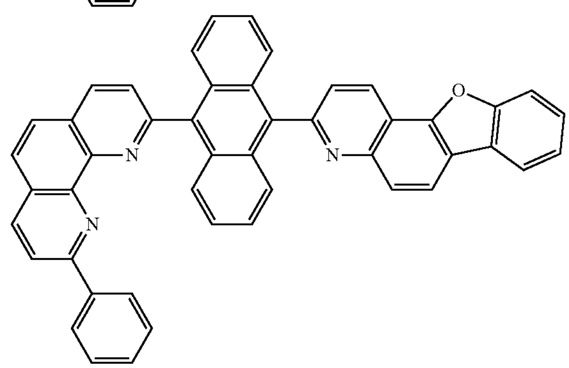
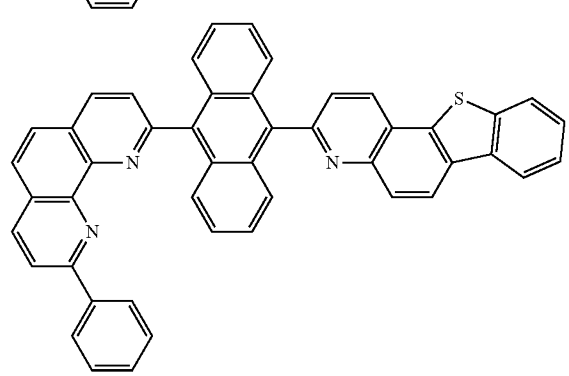

-continued
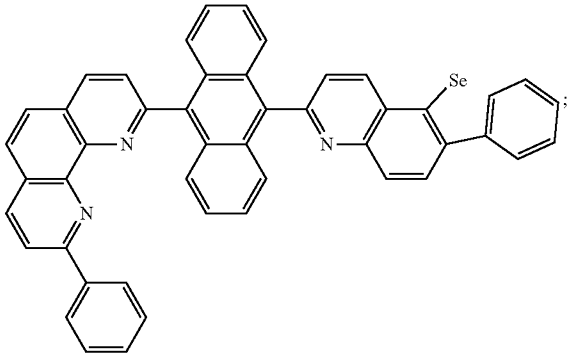
;
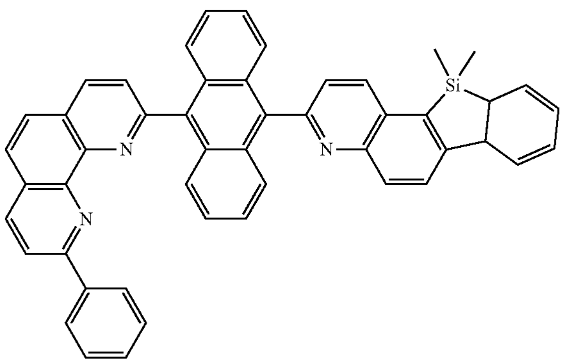
;
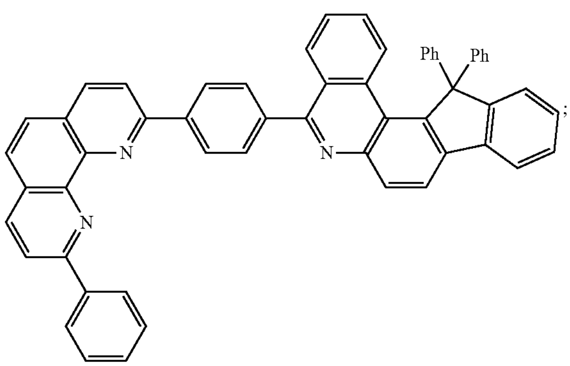
;
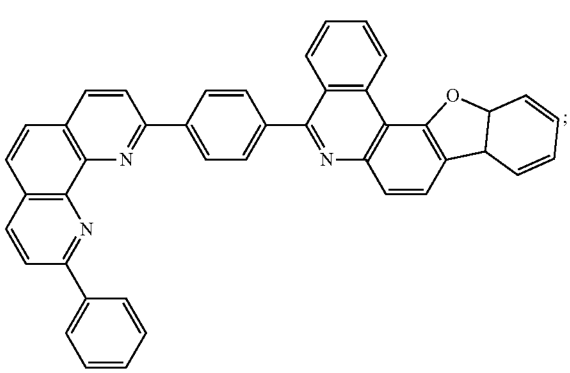
;
-continued
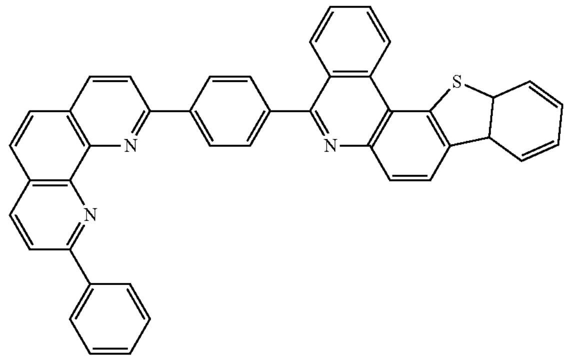
;
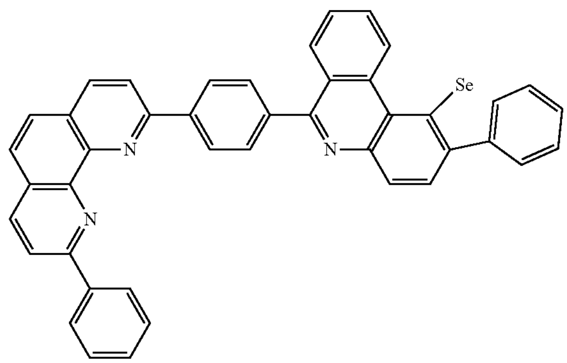
;
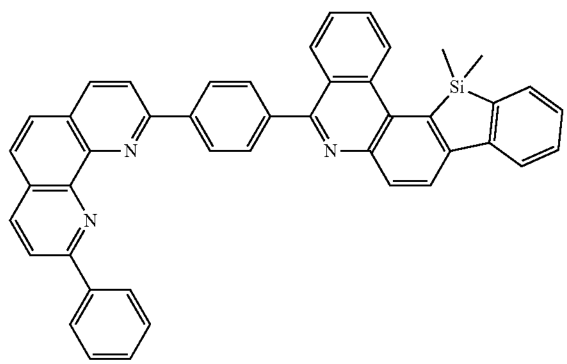
;
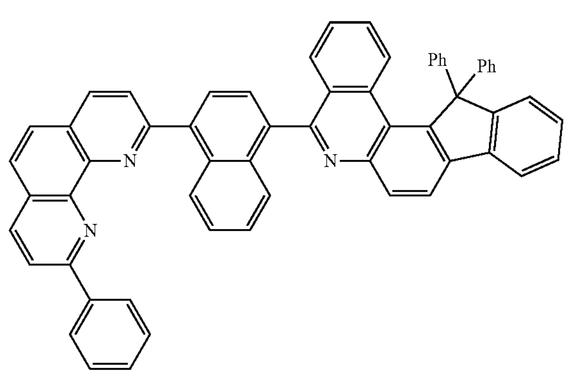
;

-continued
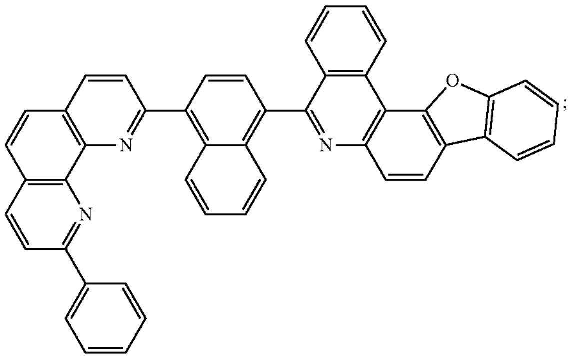
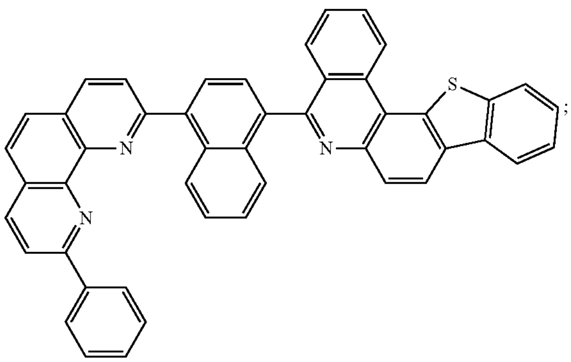
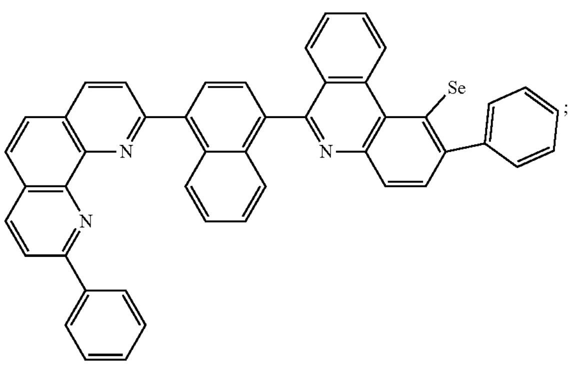
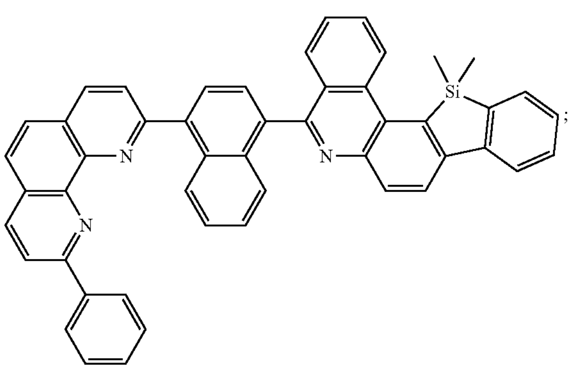
-continued
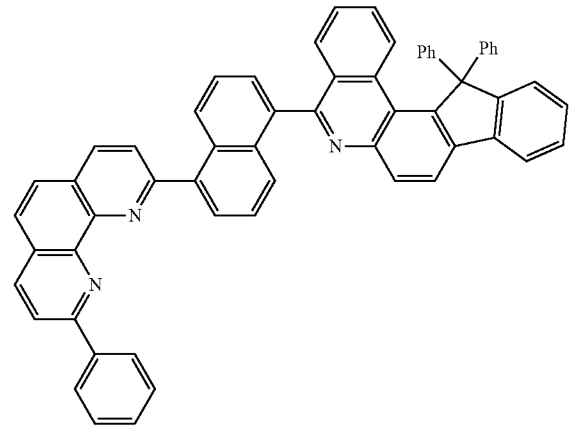
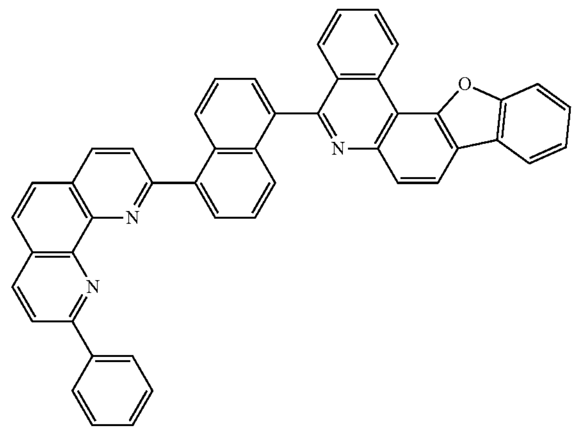
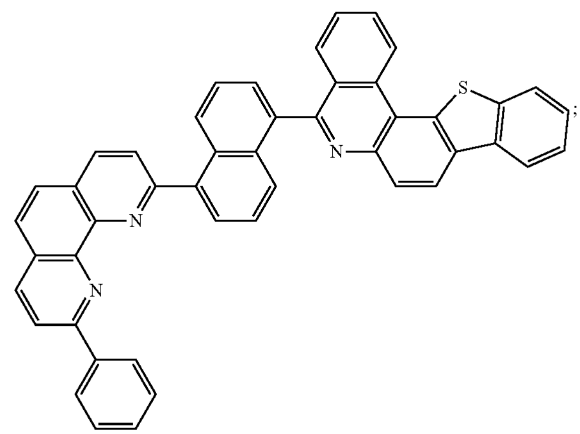
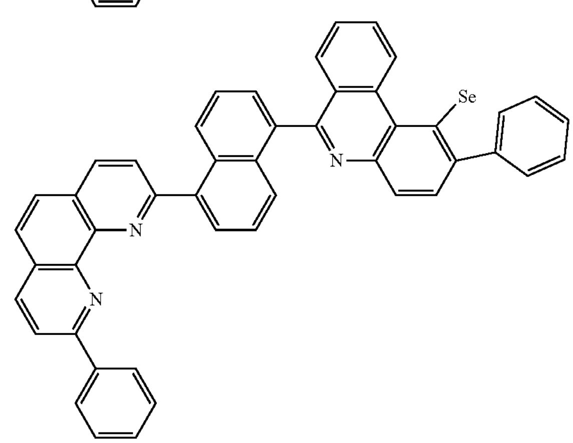

-continued
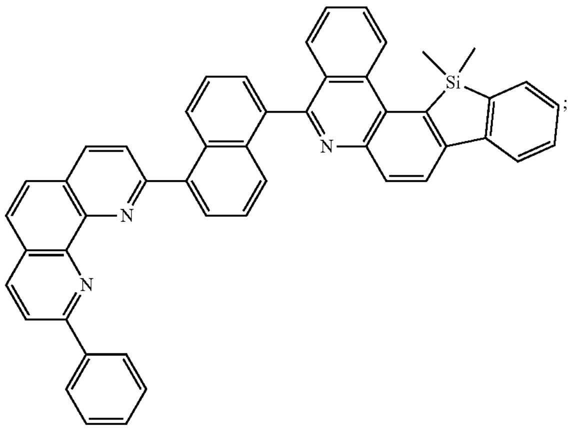
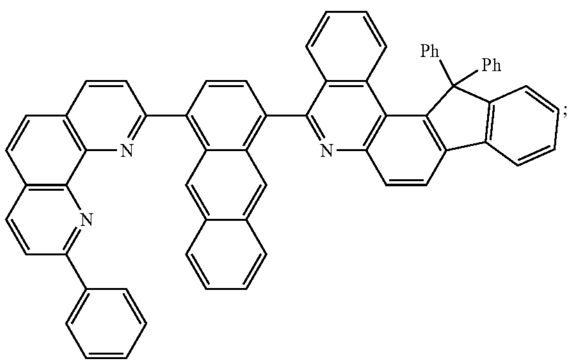
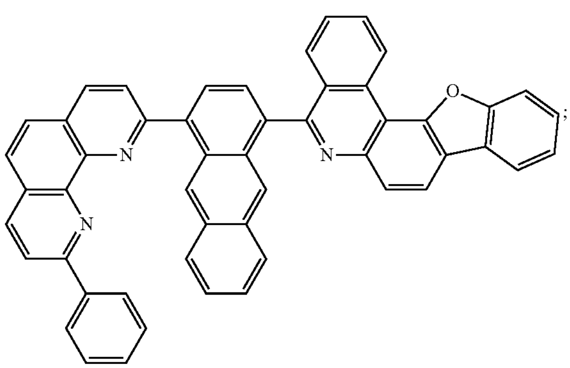
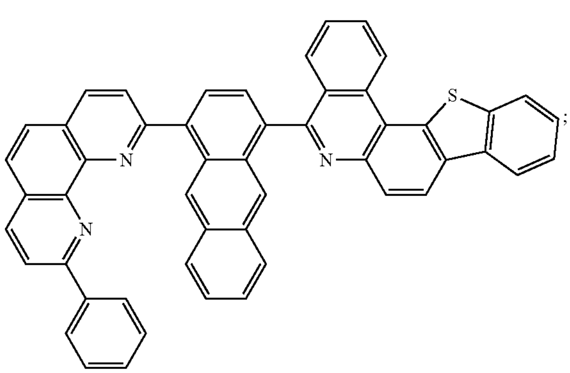 [SMILES: c1ccc(-c2ccc3ccc4ccc(-c5ccc(-c6nc7ccc8c9ccccc9oc8c7c7ccccc67)c6cc7ccccc7cc56)nc4c3n2)cc1]
-continued
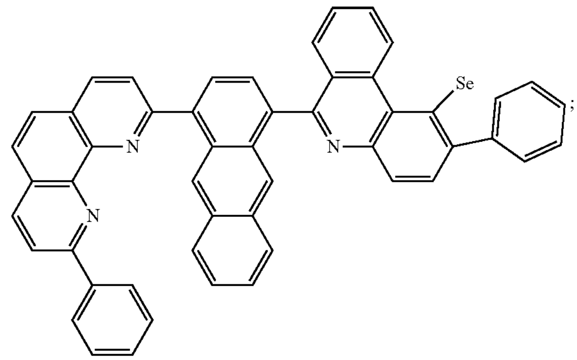
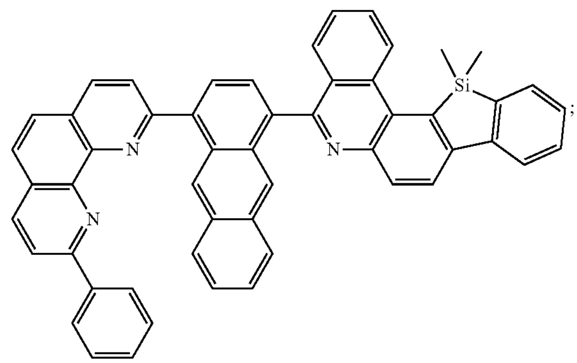
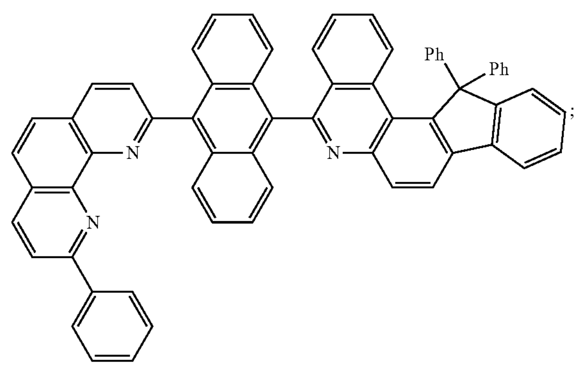
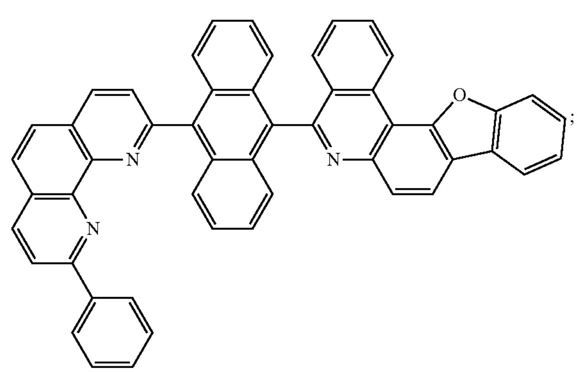

-continued
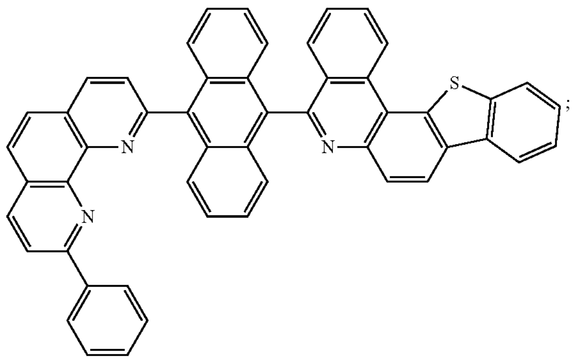
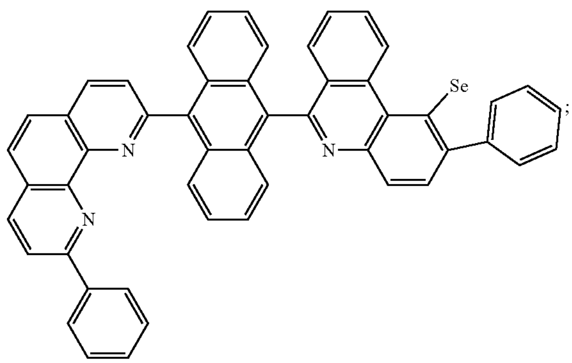
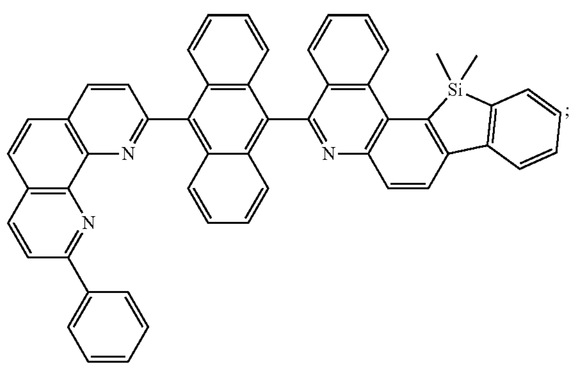
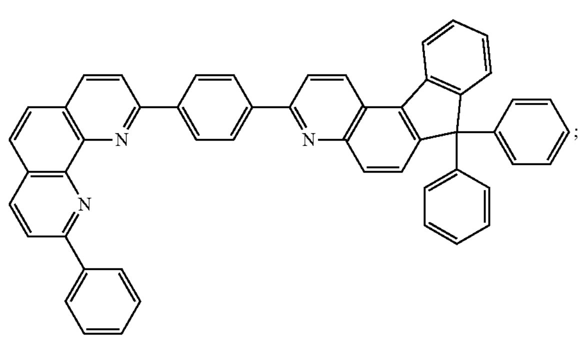
-continued
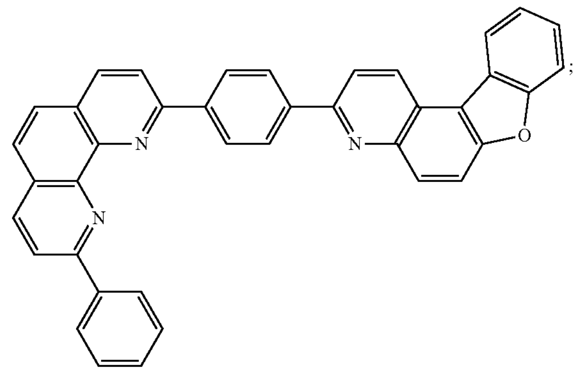
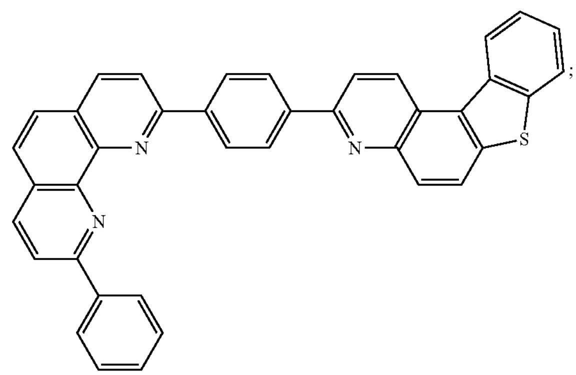
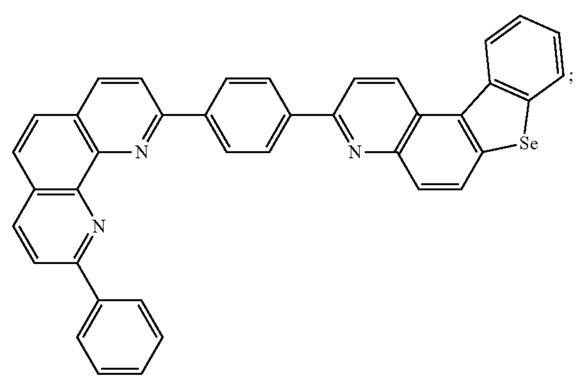
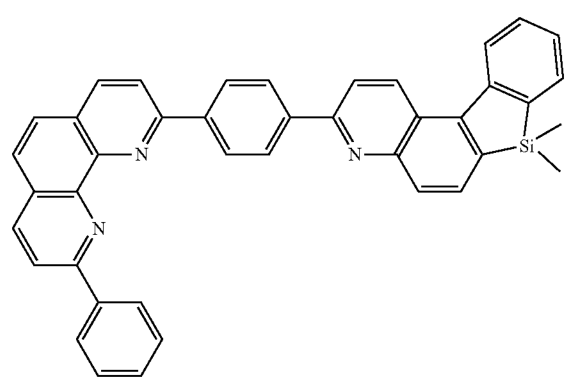

-continued
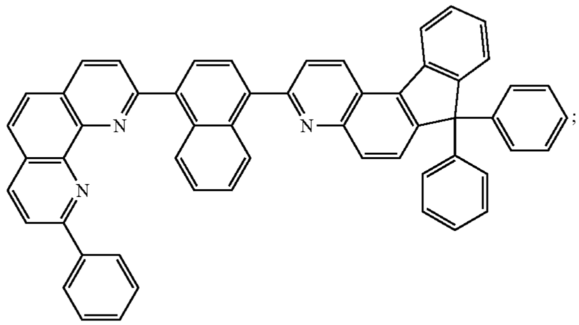
;
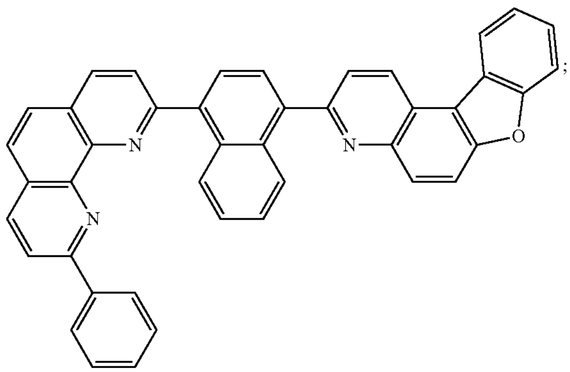
;
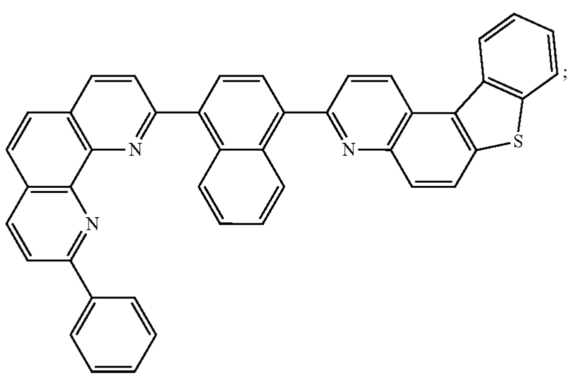
;
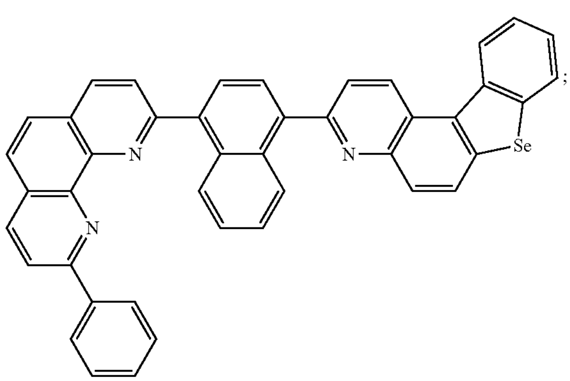
;
-continued
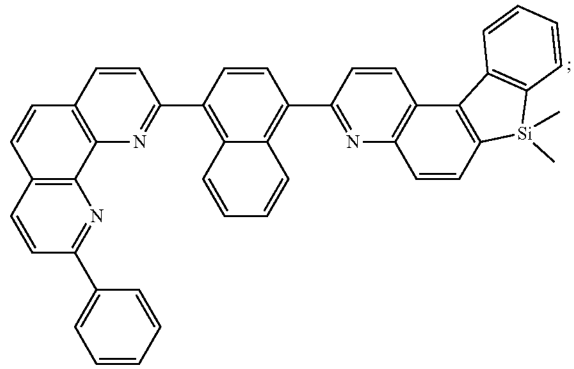
;
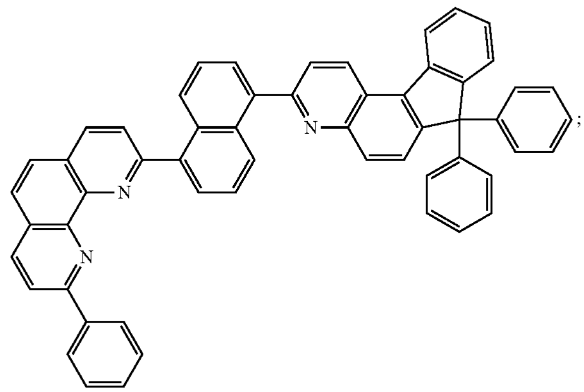
;
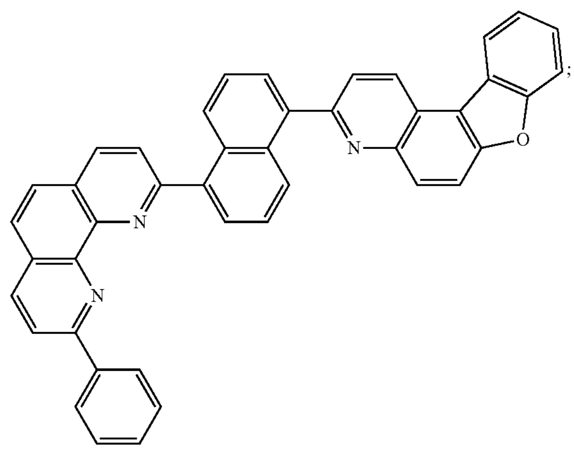
;
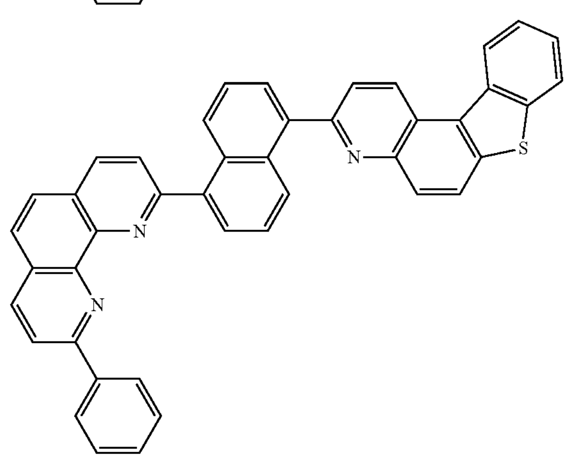
;

-continued
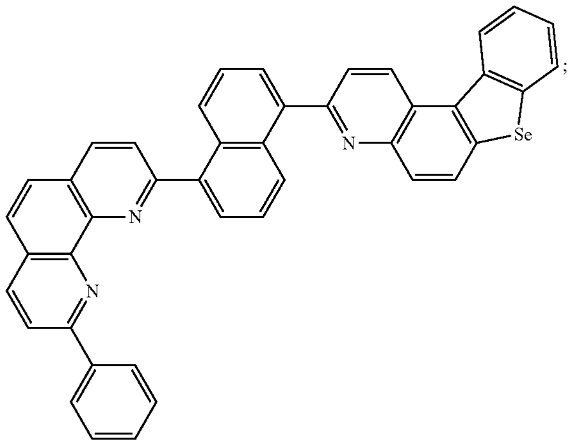
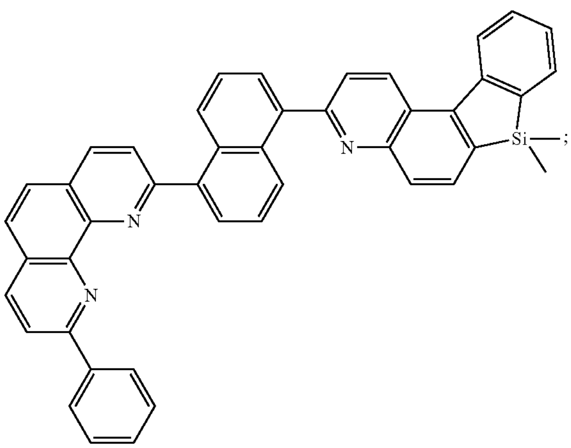
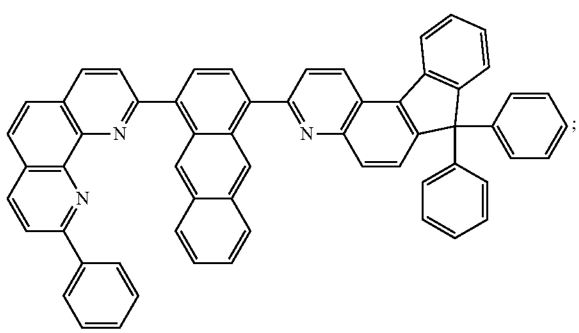
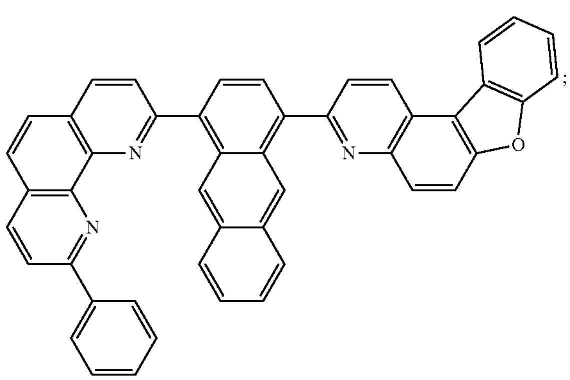
-continued
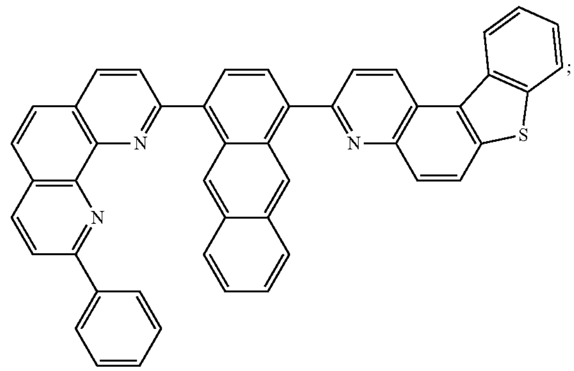
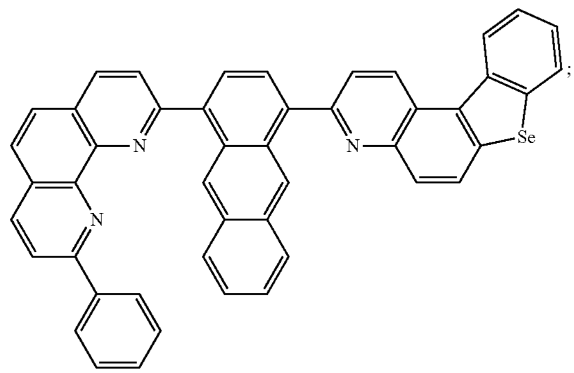
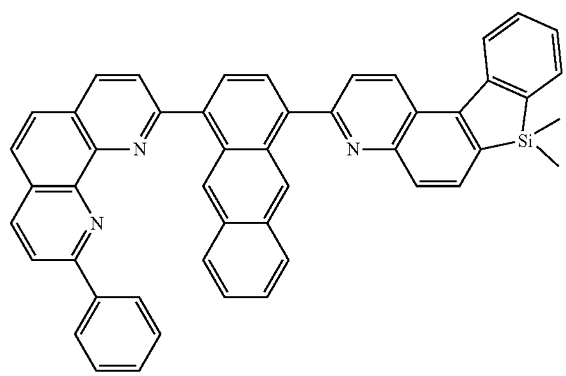
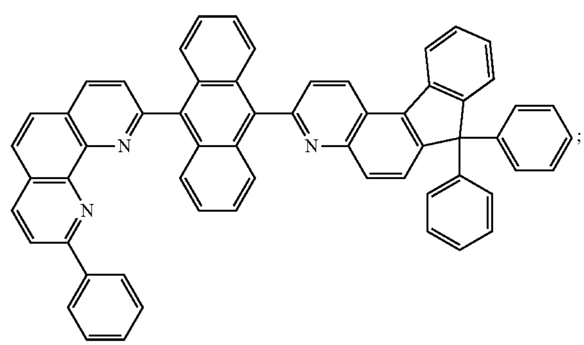

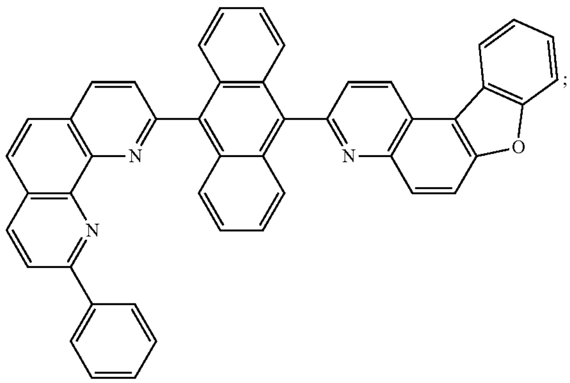
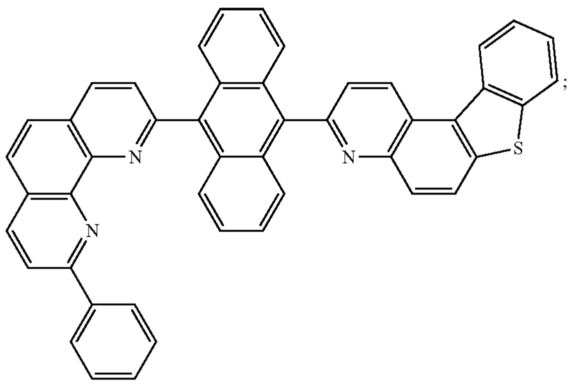
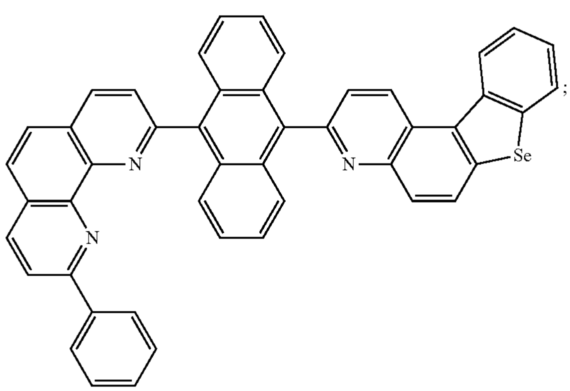
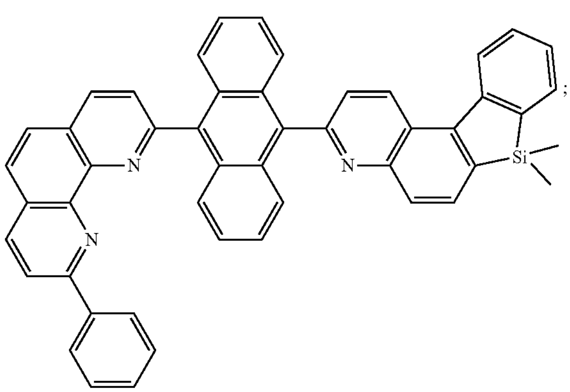
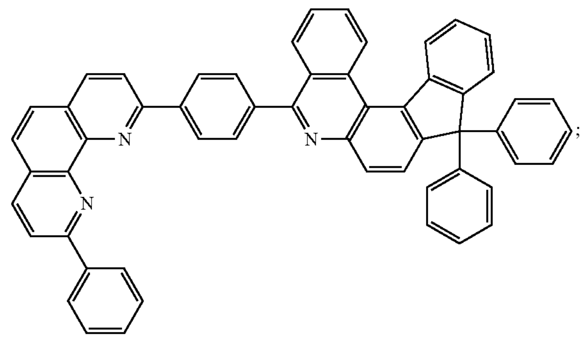
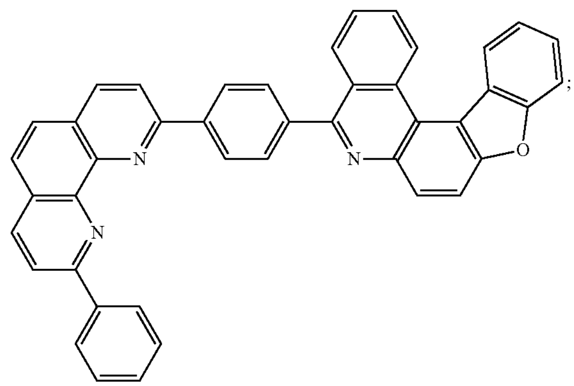
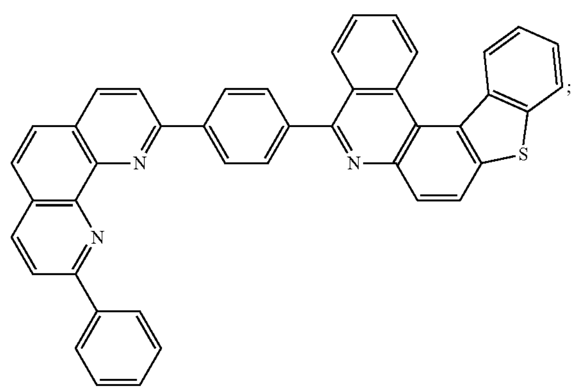
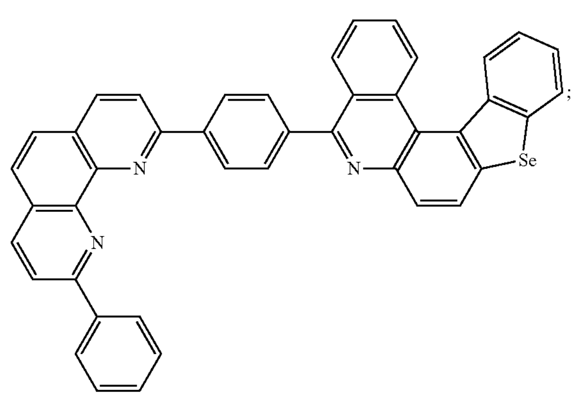

-continued
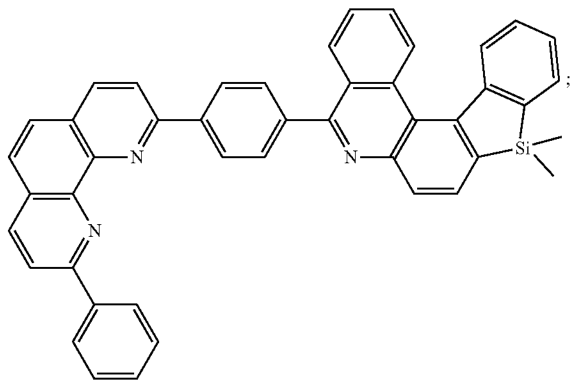
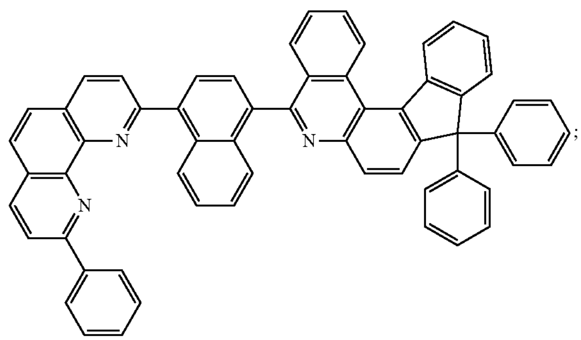
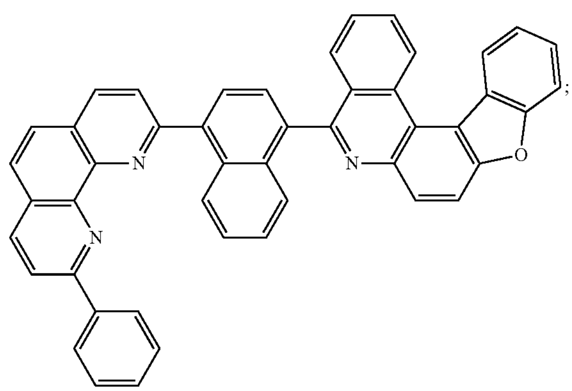
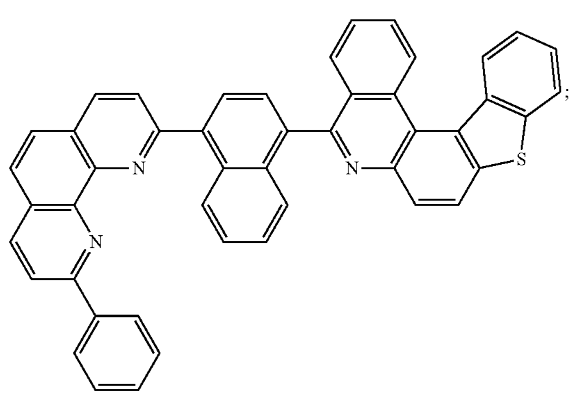
-continued
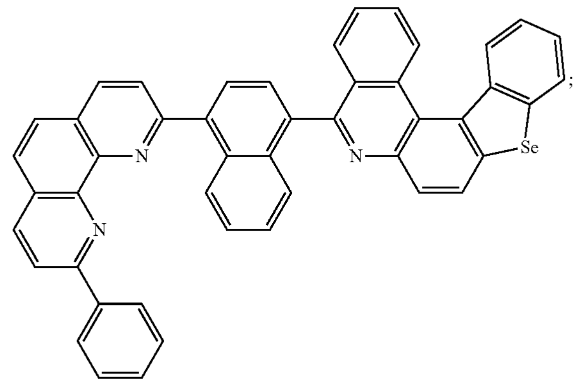
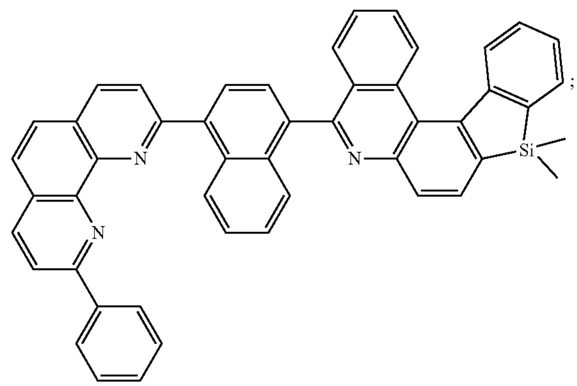
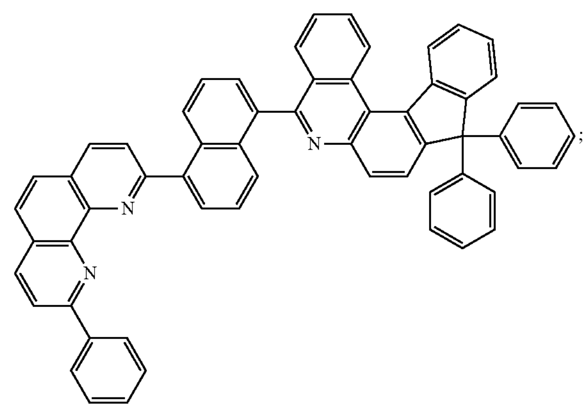
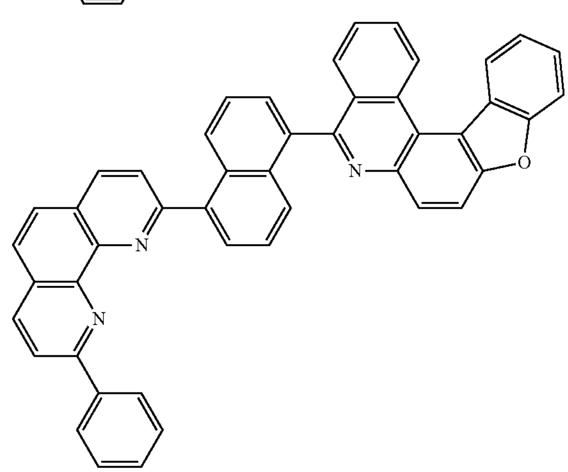

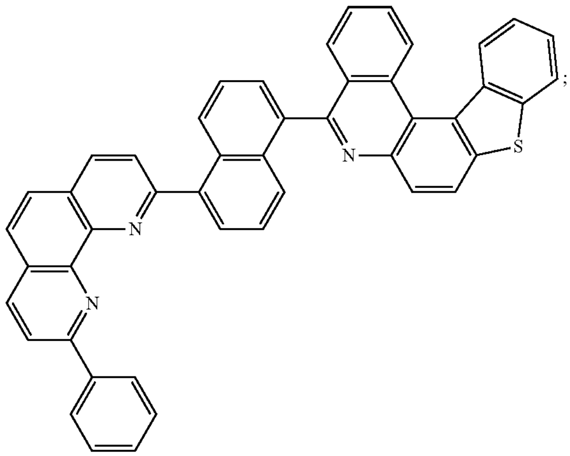
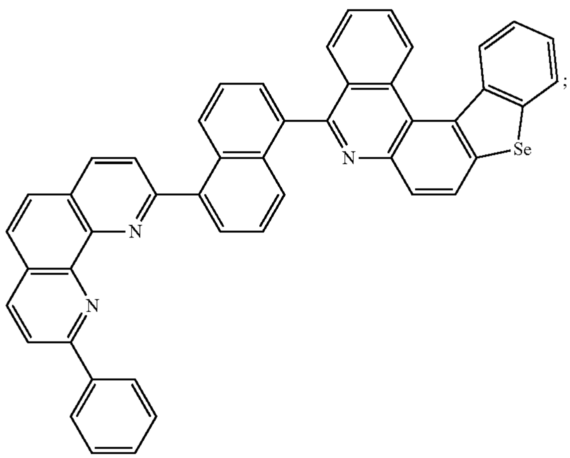
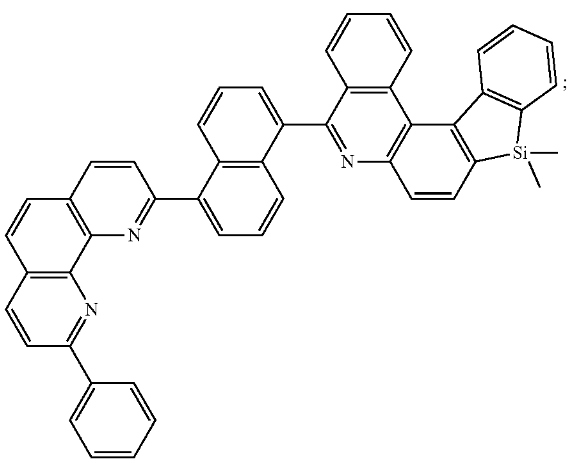
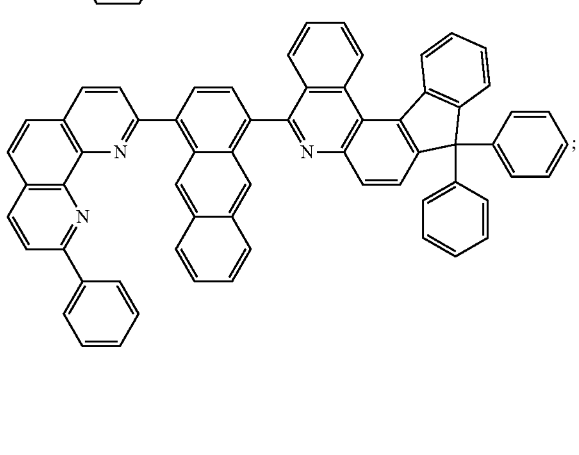
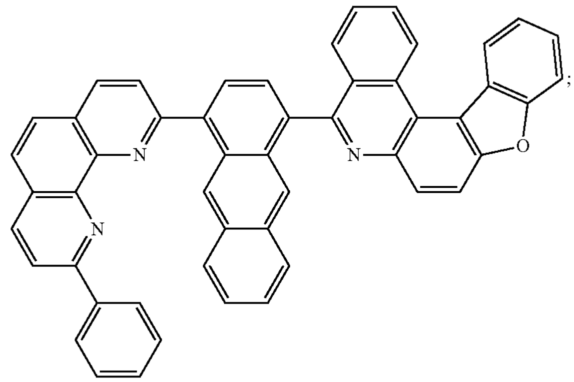
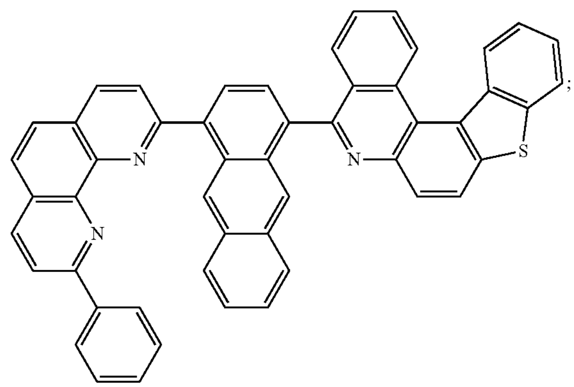
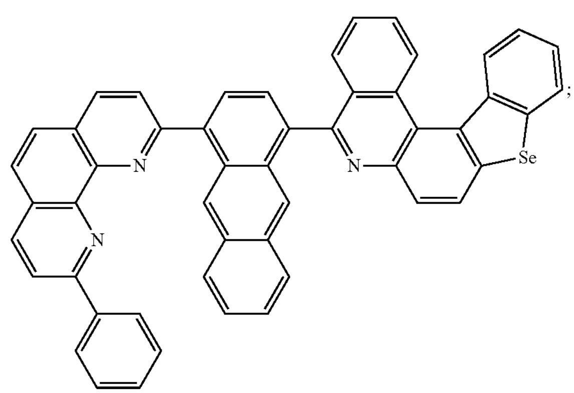
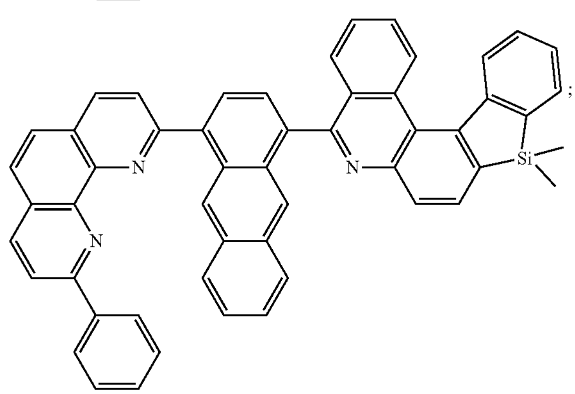

-continued

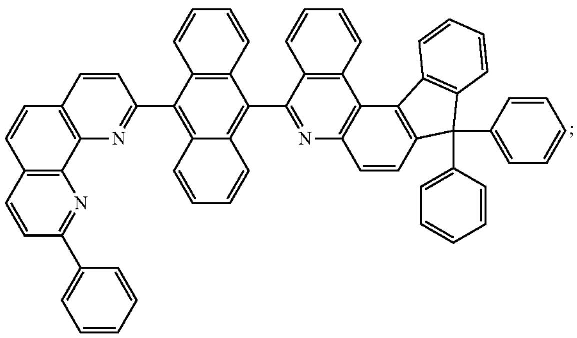

;

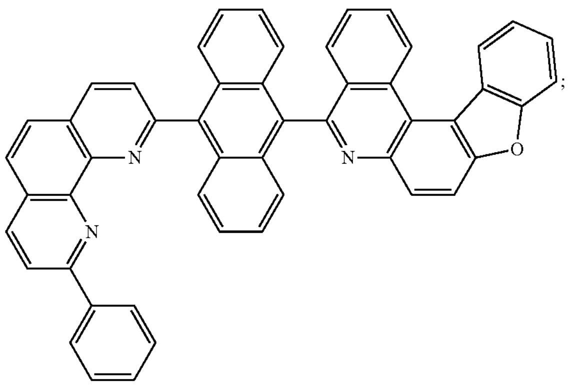

;

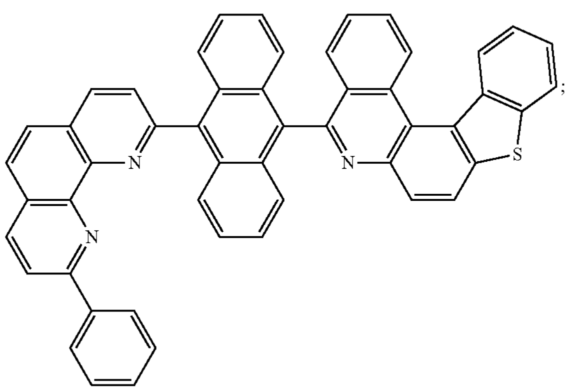

;

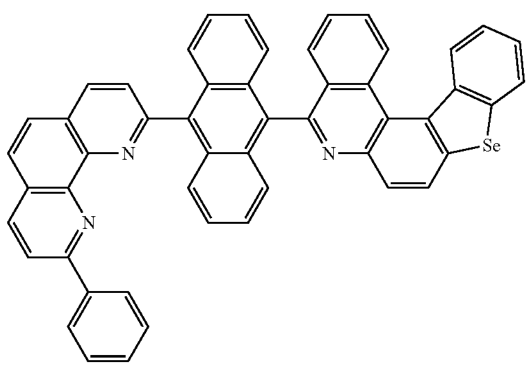

or

-continued

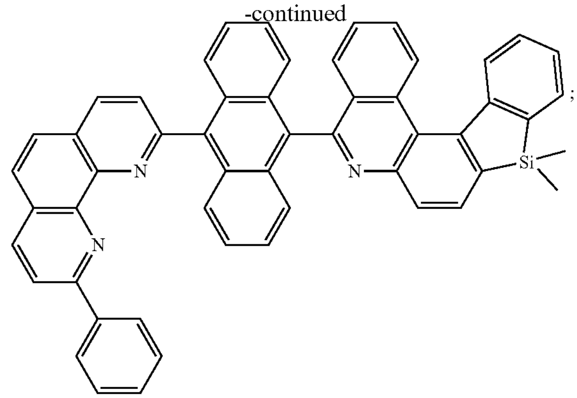

;

and wherein the P-type charge generation layer comprises a compound represented by the following Formula 3:

[Formula 3]

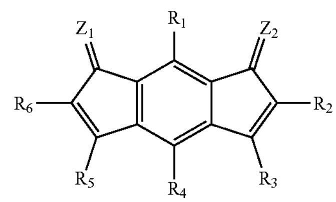

wherein $R_1$, $R_2$, $R_3$, $R_4$, $R_5$, and $R_6$ are each independently hydrogen, a substituted or unsubstituted $C_6$ to $C_{12}$ aryl group, a substituted or unsubstituted $C_2$ to $C_{12}$ heteroaryl group, a substituted or unsubstituted $C_1$ to $C_{12}$ alkyl group, a substituted or unsubstituted $C_1$ to $C_{12}$ alkoxy group, a substituted or unsubstituted $C_1$ to $C_{12}$ ether group, a cyano group, a fluorine group, a trifluoromethyl group, a trifluoromethoxy group, or a trimethylsilyl group, and at least one of $R_1$, $R_2$, $R_3$, $R_4$, $R_5$, and $R_6$ comprises a cyano group;

$Z_1$ and $Z_2$ are each independently represented by Formula 4:

[Formula 4]

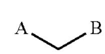

wherein A and B are each independently hydrogen, a substituted or unsubstituted $C_6$ to $C_{12}$ aryl group, a $C_3$ to $C_{12}$ heteroaryl group, a $C_1$ to $C_{12}$ alkyl group, a $C_1$ to $C_{12}$ alkoxy group, a $C_1$ to $C_{12}$ ether group, a cyano group, a fluorine group, a trifluoromethyl group, a trifluoromethoxy group, or a trimethylsilyl group.

2. The organic light emitting diode according to claim 1, wherein, in Formulae 3, or 4, a substituent of each of the aryl group, the heteroaryl group, the alkyl group, the alkoxy group, and the ether group is selected from the group consisting of a $C_1$ to $C_{12}$ alkyl group, a $C_6$ to $C_{15}$ aryl group, a $C_3$ to $C_{15}$ heteroaryl group, a cyano group, a fluorine group, a trifluoromethyl group, a trifluoromethoxy group, a trimethylsilyl group, and combinations thereof.

3. The organic light emitting diode according to claim 1, wherein the compound represented by Formula 3 is a compound represented by the following formulae:

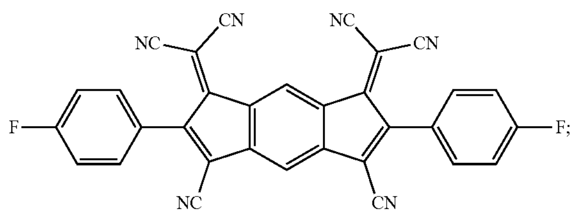
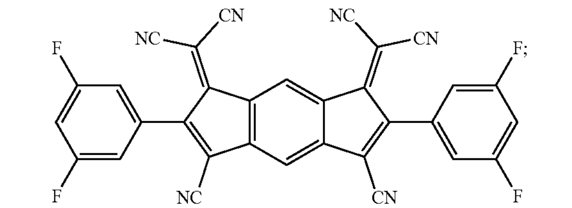
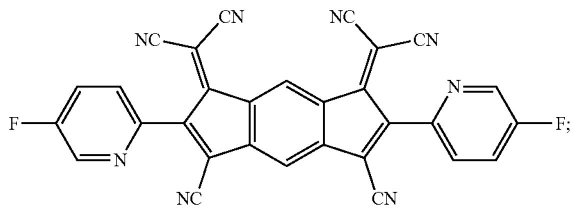
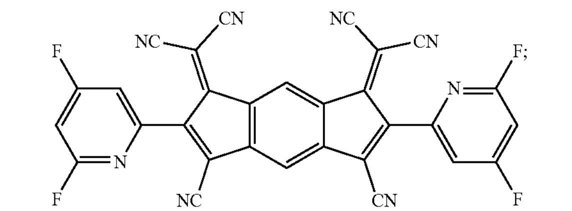
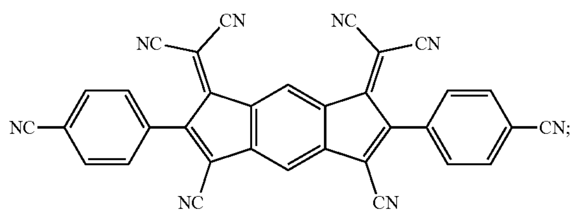
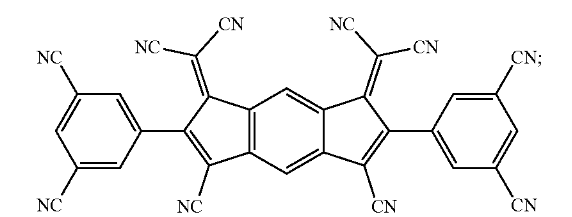
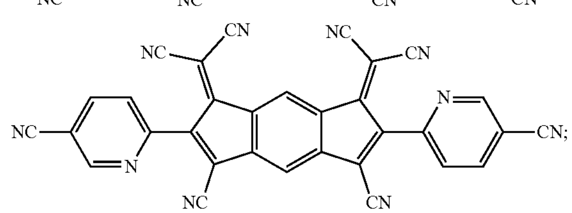
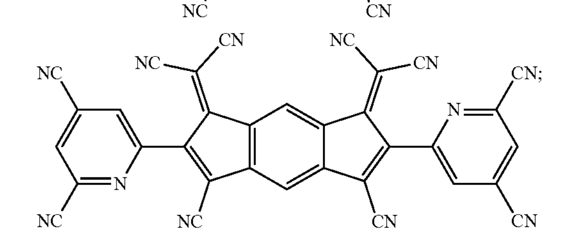
-continued
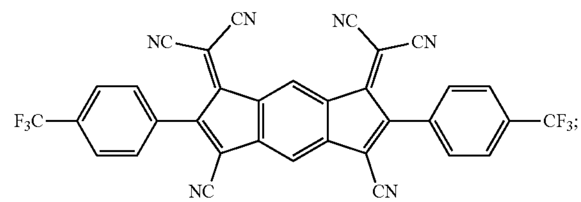
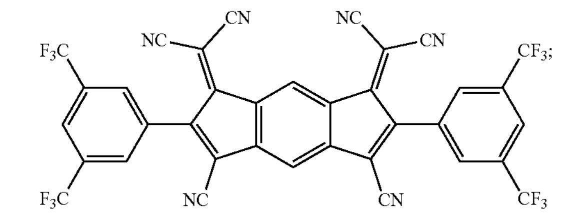
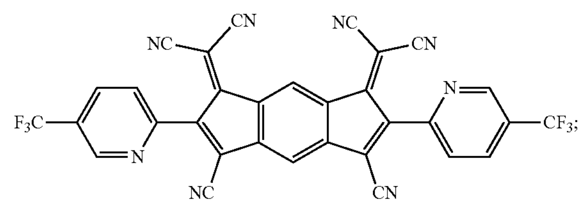
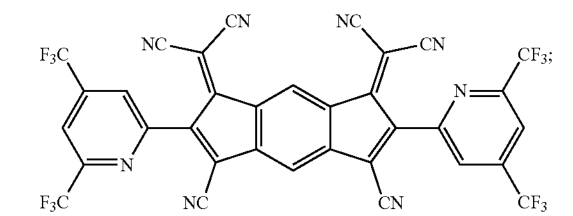
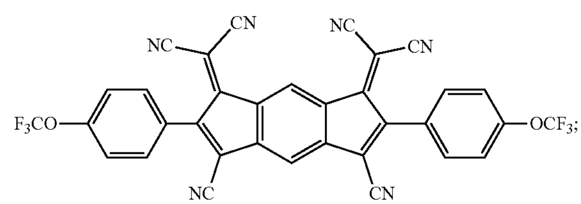
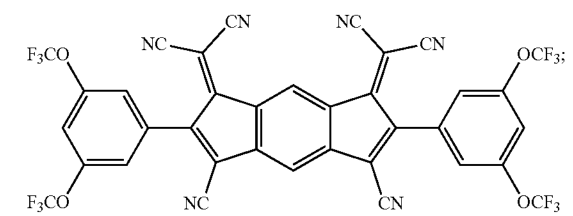
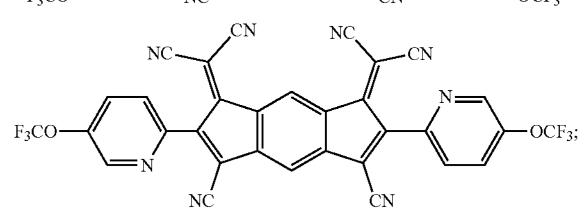
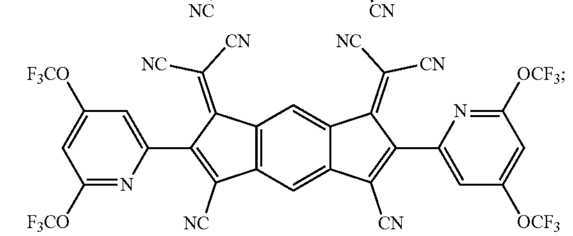

-continued

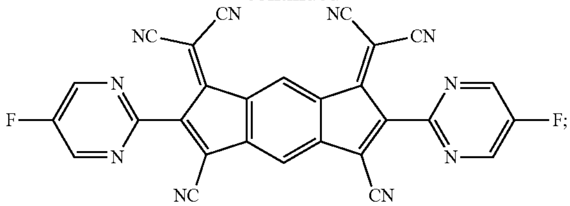

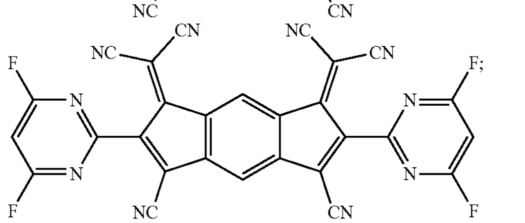

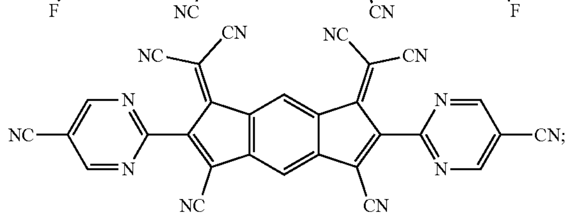

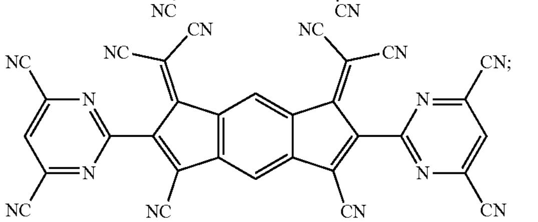

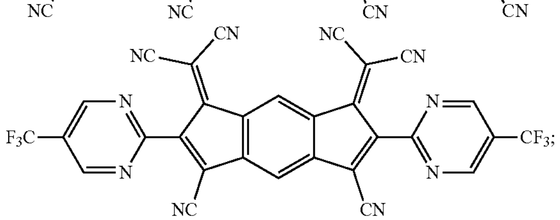

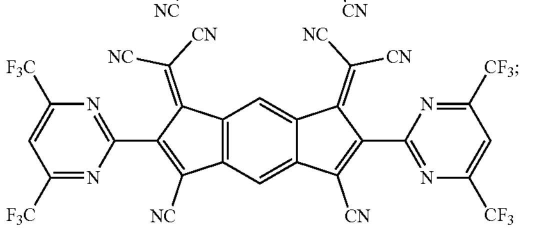

-continued

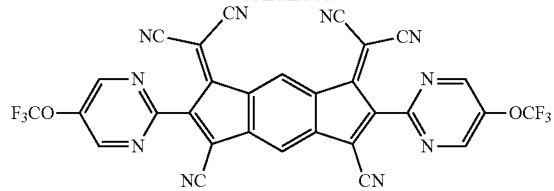

or

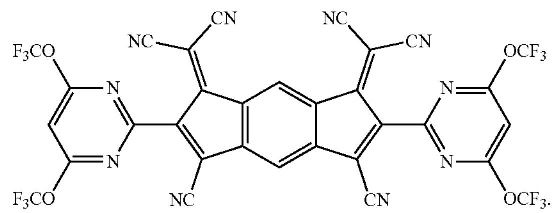

4. The organic light emitting diode according to claim 1, wherein the N-type charge generation layer is doped with 0.1 wt % to 5 wt % of a first material selected from the group consisting of an alkali metal, an alkali earth metal, and combinations thereof, and the P-type charge generation layer comprises 0.1 wt % to 40 wt % of a second material selected from the group consisting of the compound represented by Formula 3.

5. The organic light emitting diode according to claim 1, wherein the N-type charge generation layer has a thickness of 0.01% to 10% the overall thickness of the organic light emitting diode, and the P-type charge generation layer has a thickness of 0.005% to 10% the overall thickness of the organic light emitting diode.

6. The organic light emitting diode according to claim 1, wherein the P-type charge generation layer is formed of the compound represented by Formula 3 alone.

7. The organic light emitting diode according to claim 1, wherein a difference in LUMO energy level between the N-type charge generation layer and the P-type charge generation layer ranges from 2.5 eV to 4.5 eV.

* * * * *